(12) United States Patent
Glasscock et al.

(10) Patent No.: US 12,477,659 B2
(45) Date of Patent: Nov. 18, 2025

(54) SYSTEMS, METHODS, AND DEVICES FOR PRODUCING INTERCONNECTS ON DEFORMABLE SUBSTRATES OF ELECTRONIC DEVICES

(71) Applicant: Meta Platforms Technologies, LLC, Menlo Park, CA (US)

(72) Inventors: Cameron Elliot Glasscock, Redmond, WA (US); Zhenzhen Shen, Kirkland, WA (US); Felippe Jose Pavinatto, Lynnwood, WA (US); Omar Awartani, Redmond, WA (US); Allison Tuuri, Seattle, WA (US); Lichuan Chen, Kirkland, WA (US); Aleksey Reiderman, Erie, CO (US); Marcos Antonio Santana Andrade, Jr., Seattle, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 173 days.

(21) Appl. No.: 18/479,767

(22) Filed: Oct. 2, 2023

(65) Prior Publication Data
US 2024/0114630 A1   Apr. 4, 2024

Related U.S. Application Data

(60) Provisional application No. 63/412,331, filed on Sep. 30, 2022.

(51) Int. Cl.
*H05K 1/02* (2006.01)
*H05K 3/18* (2006.01)
*H05K 3/32* (2006.01)

(52) U.S. Cl.
CPC .......... *H05K 3/326* (2013.01); *H05K 1/0272* (2013.01); *H05K 1/028* (2013.01); *H05K 1/0289* (2013.01);
(Continued)

(58) Field of Classification Search
CPC .... H05K 1/0272; H05K 1/028; H05K 1/0289; H05K 3/326; H05K 3/181
(Continued)

(56) References Cited

U.S. PATENT DOCUMENTS

2020/0192431 A1\* 6/2020 Shin ...................... G06F 1/1626

FOREIGN PATENT DOCUMENTS

WO   WO-2019155390 A1 \*  8/2019 ......... A61B 5/02116

OTHER PUBLICATIONS

Elveflow, "How to Make an Expoxy Su-8 Mold? The SU-8 mold fabrication process: Tips and Tricks, " Sep. 27, 2023, 3 Pages, Retrieved from the Internet URL: https://www.elveflow.com/microfluidic-reviews/su-8-mold-lithography/.
(Continued)

*Primary Examiner* — Andargie M Aychillhum
(74) *Attorney, Agent, or Firm* — McDermott Will & Schulte LLP

(57) ABSTRACT

The present disclosure provides systems, methods, and devices for producing an interconnect. An electronic device of the present disclosure includes a deformable substrate including a circuit. The circuit includes a channel extending from a first portion of the deformable substrate to a second portion of the deformable substrate. A first circuit component is adjacent to the first portion of the deformable substrate. A second circuit component is adjacent to the second portion of the deformable substrate. A first metal material is formed overlaying a first portion of the deformable substrate including a first portion of the channel. A second metal material interfaces with the first metal material, thereby substantially occupying an interior volume of the channel.

20 Claims, 50 Drawing Sheets

(52) U.S. Cl.
CPC ..... *H05K 3/181* (2013.01); *H05K 2201/0344* (2013.01)

(58) Field of Classification Search
USPC ........................................................ 174/250
See application file for complete search history.

(56) References Cited

OTHER PUBLICATIONS

LPKF, "Specialist for Material-friendly Processing: LPKF ProtoLaser R4," LPKF Laser & Electronics, Sep. 27, 2023, 2 Pages, Retrieved from the Internet URL: https://www.lpkf.com/fileadmin/mediafiles/user_upload/products/pdf/DQ/flyer_lpkf_protolaser_r4_en.pdf.

* cited by examiner

400

*(402)* A method for forming a deformable electrical communication between a first circuit component and a second circuit component.

*(404)* The method comprises forming a layer of a first metal material on a first surface of a channel interposing between the first circuit component and the second circuit component of a deformable substrate. The channel comprises a first diameter.

*(406)* Prior to the forming the layer of the first metal material, exposing the first surface of the channel of deformable substrate.

*(408)* The forming the layer of the first metal material comprises impinging a plurality of ions of the first metal material at the first surface of the channel.

*(410)* The forming the layer of the first metal material comprises forming a coating of the layer of the first metal material over the first surface of the channel.

*(412)* The first metal material comprises copper, gold, silver, or a combination thereof.

*(414)* A thickness of the layer of the first metal material overlayed the first portion of the deformable substrate is between 1 microns (μm) and 5 μm.

*(416)* The first circuit component comprises an exterior surface comprising an electroless nickel immersion gold (ENIG).

*(418)* The first diameter of the channel is between 10 μm and 500 μm.

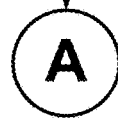

Figure 5A

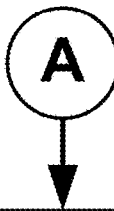

(420) Disposing a volume of a second metal material at a first pressure proximate to the first surface of the channel, thereby forming a partial interface in the channel between the first metal material and the second metal material. The partial interface comprises a second pressure less than the first pressure.

(422) A second diameter of the volume of the second metal material is greater than the first diameter of the channel.

(424) The first pressure is a laplace pressure of the second metal material.

(426) The second pressure is a laplace pressure of the partial interface between the first metal material and the second metal material.

(428) The disposing the volume of the second metal material utilizes an additive manufacturing mechanism.

(430) The additive manufacturing mechanism comprises a binder jetting mechanism, a material extrusion mechanism, a material jetting mechanism, a polyjet mechanism, a powder bed mechanism, a sheet lamination mechanism, vat photopolymerization mechanism, or a combination thereof.

Figure 5B

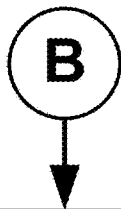

*(432)* Sealing the channel, thereby forming the deformable electrical communication between the first circuit component and the second circuit component.

*(434)* Prior to the sealing the channel, disrupting a second surface of the partial interface between the first metal material and the second metal material, thereby dispersing a layer of an oxidized second metal material formed at the second surface.

*(436)* A first thermal resistance per unit area of the oxide second metal material is greater than a second thermal resistance per unit area of the second metal material.

*(438)* The sealing the channel comprises encapsulating the channel with a third material different than the first metal material and the second metal material.

Figure 5C

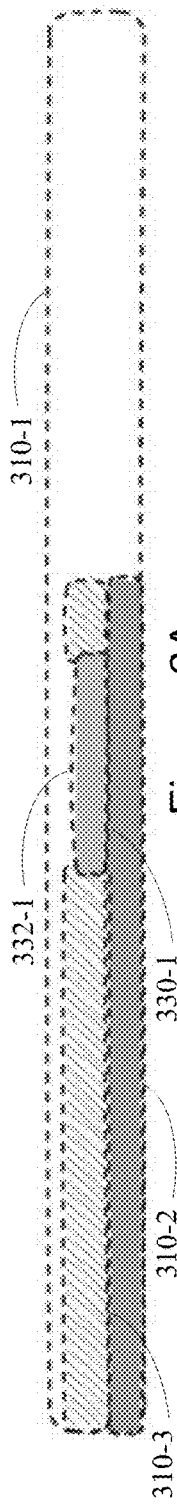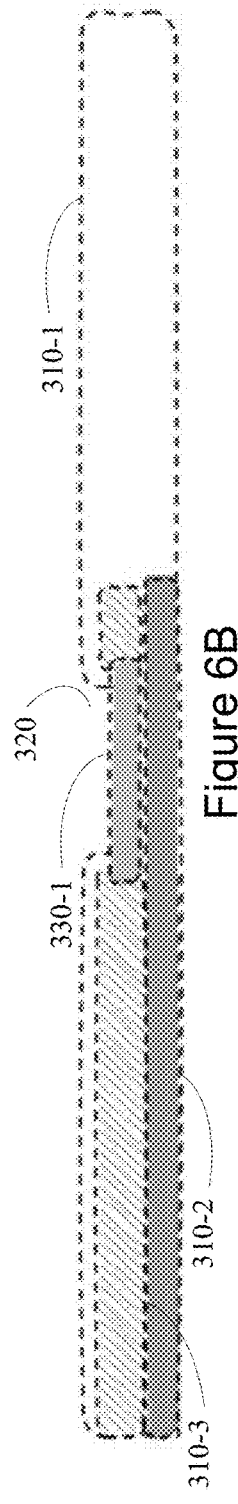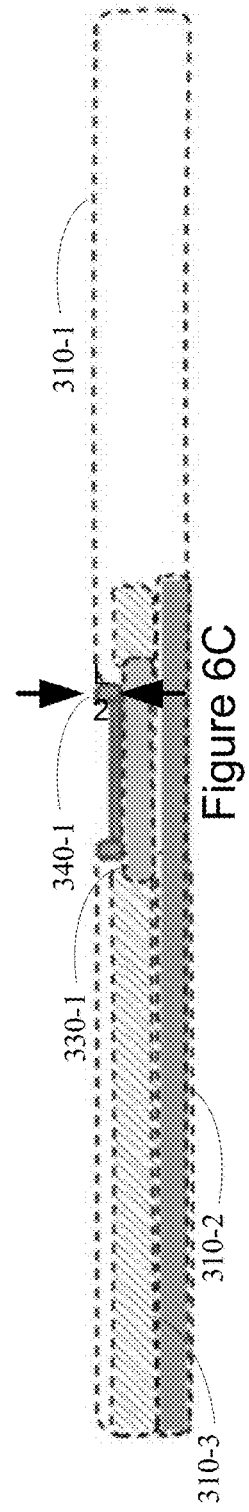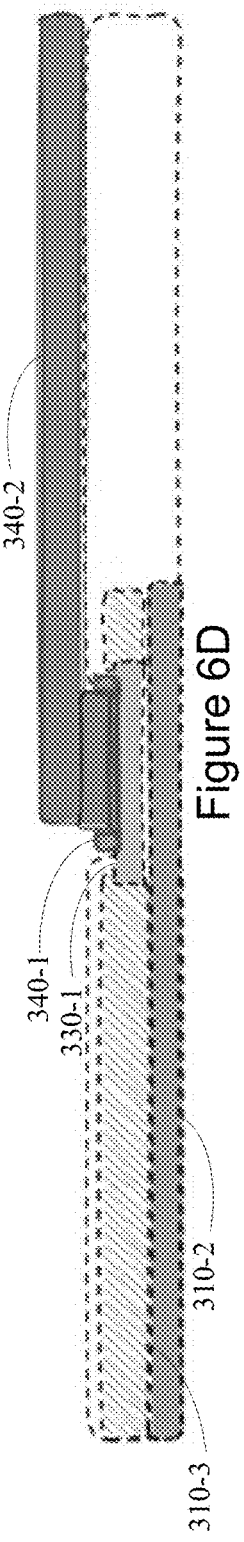

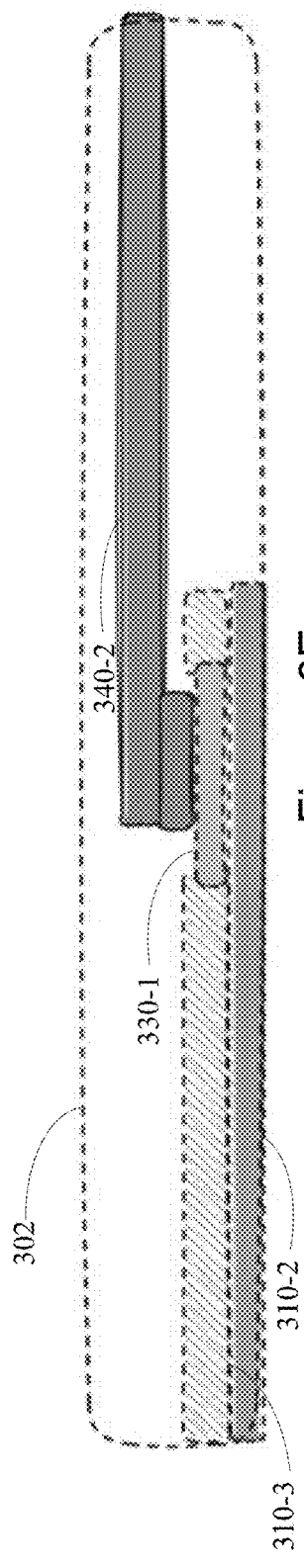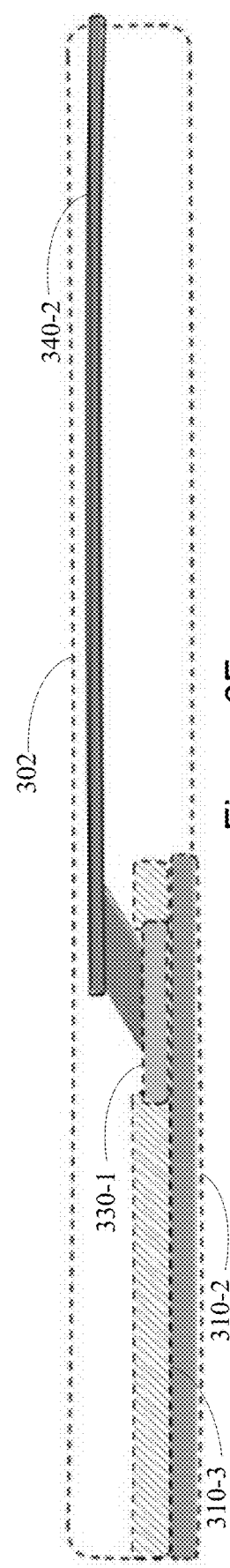

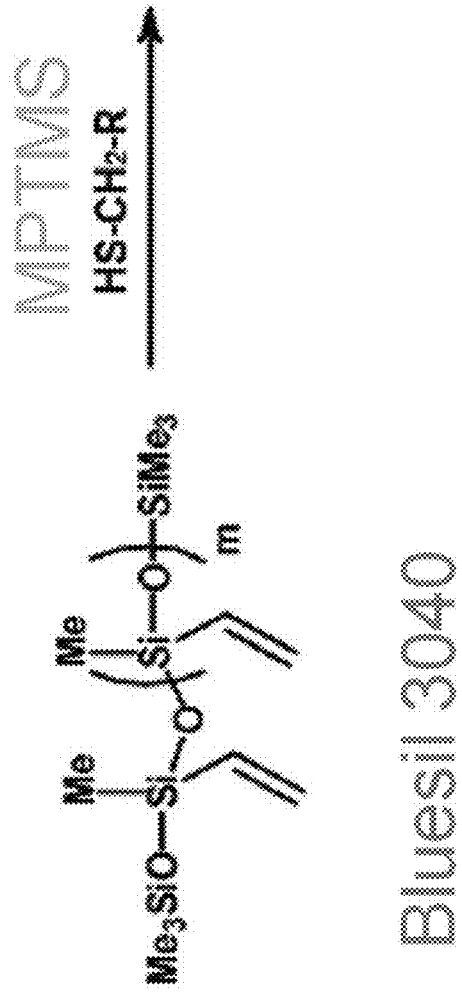
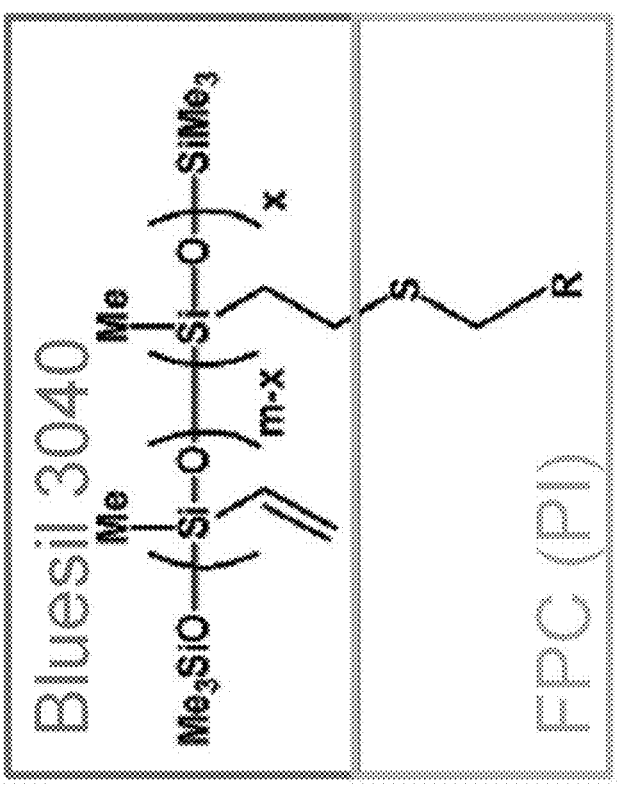
Figure 16A

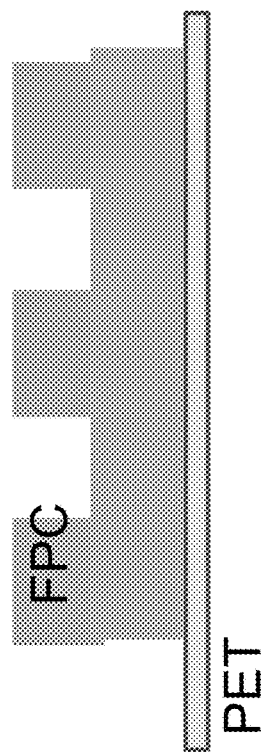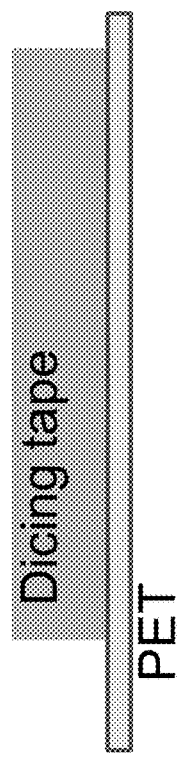
Figure 16B

A
| | Type | Logic function |
|---|---|---|
| 1 | 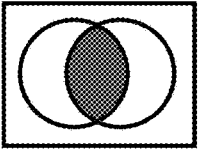 | $C = A \wedge B$ |
| 2 | 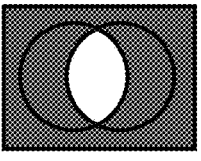 | $C = \sim(A \wedge B)$ |
| 3 | 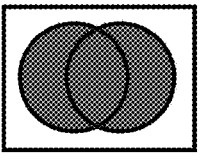 | $C = A \vee B$ |
| 4 | 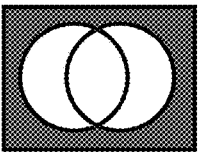 | $C = \sim(A \vee B)$ |
| 5 |  | $C = A \wedge \sim B,\ C = \sim A \wedge B$ |
| 6 | 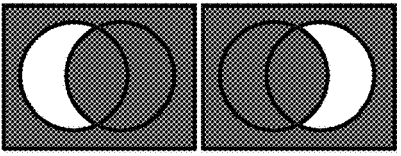 | $C = \sim A \vee B,\ C = A \vee \sim B$ |
| 7 | 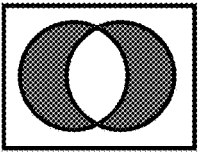 | $C = \sim(A \leftrightarrow B)$ |
| 8 | 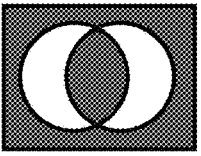 | $C = A \leftrightarrow B$ |
Figure 27

SYSTEMS, METHODS, AND DEVICES FOR PRODUCING INTERCONNECTS ON DEFORMABLE SUBSTRATES OF ELECTRONIC DEVICES

CROSS-REFERENCE TO RELATED APPLICATION

The present application claims priority to U.S. Provisional Patent Application No. 63/412,331, entitled "Systems, Methods, and Devices for Producing Interconnects," filed Sep. 30, 2022, which is hereby incorporated by reference in its entirety for all purposes.

TECHNICAL FIELD

This disclosure relates to additive manufacturing. More particularly, the present disclosure relates to using systems, methods, and devices for producing interconnects for providing electrical communication through a deformable substrate, and using systems, methods, and devices for producing electronic devices having deformable substrates including interconnects.

BACKGROUND

Flexible circuits have become a desirable product due to their ability for application with a wide variety of use capabilities for prolonged durations of time.

Conventional solutions for manufacturing interfacing conductive traces with either electronic devices or other traces are insufficient for use with flexible and stretchable electronics utilizing liquid metal. For instance, conventional solutions do not reliably delivery liquid metal into/through a via and/or throughout a channel in fluid communication with the via to enable multi-layer electrical communication. Moreover, conventional solutions fail product elastically deformable contacts or connections to prefabricated microelectronic devices.

Given the above background, systems, methods, and devices are needed that enable rapid manufacture of objects using flexible electronics. In particular, there is a need for enabling the manufacture of objects using flexible electronics that is rapidly and repeatedly deformable in order to produce higher quality devices.

SUMMARY

The present disclosure addresses the above-identified shortcomings.

The present disclosure is directed to systems, methods, and devices that facilitate an electrical communication through a circuit of a deformable substrate, in which the electrical communication is maintained when a force is applied to the circuit. This force includes a tensile force, a compressive force, a shear force, a torsional force, or a combination thereof. In some embodiments, this force is applied to the circuit upwards of 15,000 applications (cycles) during which the electrical communication is maintained through the circuit.

Liquid metal will wet to one or more surfaces of various metals and metallic alloys much more readily than silicone, which is utilized in the manufacture of circuit boards, such as printed circuit boards (PCB). In some embodiments, this wetting is leveraged by the systems, methods, and devices of the present disclosure, such as by coating a layer of a first metal material, such as a film layer, into and/or around a channel of the circuit, which forces a second metal material, such as the liquid metal, to wet through to into and/or around the channel of the circuit and, therefore, form a via interconnect with underlying circuit components or other liquid metal traces, such as a line interconnect of the present disclosure.

Furthermore, in some embodiments, the systems, methods, and devices of the present disclosure is used to create one or more patterns that act as an intermediary between the second metal material and other materials by using an additive manufacture apparatus, such as in a direct writing pattern, and/or metallic composites that will bridge trace and devices or other traces formed by the systems and methods of the present disclosure.

Moreover, in some embodiments, the systems, methods, and devices of the present disclosure are used to form a circuit including an interconnect interfacing a first circuit component and a second circuit component in order to provide a deformable substrate of an electronic device.

Turning to more specific aspects, one aspect of the present disclosure is directed to providing an electronic device. The electronic device includes a deformable substrate that further includes a circuit. Moreover, the circuit includes a channel that extends from a first portion of the deformable substrate to a second portion of the deformable substrate. The circuit further includes a first circuit component adjacent to the first portion of the deformable substrate. The circuit includes a second circuit component that is adjacent to the second portion of the deformable substrate. Furthermore, the circuit includes a first metal material that is formed overlaying a first portion of the deformable substrate. The first portion of the deformable substrate includes a first portion of the channel. Additionally, the circuit includes a second metal material interfacing with the first metal material, thereby substantially occupying an interior volume of the channel.

In some embodiments, the circuit includes a flexible printed circuit (FPC).

In some embodiments, the deformable substrate includes silicon.

In some embodiments, the circuit includes at least two layers including a first layer and a second layer. The first layer includes the first portion of the deformable substrate. Moreover, the second layer includes the second portion of the deformable substrate. The channel extends from a first terminal of the first layer to a second terminal of the second layer.

In some embodiments, the at least two layers further includes a third layer configured to overlay an opening of the channel, thereby sealing an end portion of the channel.

In some embodiments, the channel includes a diameter between 10 microns (μm) and 500 μm. In some embodiments, the length of the channel is between 50 μm and 100 μm.

In some embodiments, the first circuit component includes an exterior surface that includes an electroless nickel immersion gold (ENIG).

In some embodiments, the first metal material includes copper, gold, nickel, platinum, silver, or a combination thereof.

In some embodiments, the first metal material includes between 0.5 weight percent (w %) and 25 w % of the interface with the first metal material and the second metal material.

In some embodiments, the interface with the first metal material and the second metal material is an intermetallic interface.

In some embodiments, the second metal material includes a metal composite polymer.

In some embodiments, the second metal material includes gallium.

In some embodiments, the second metal material includes gallium indium alloy, gallium tin alloy, gallium indium tin alloy, gallium indium tin zinc alloy, or a combination thereof.

In some embodiments, the deformable substrate is configured to maintain conductivity through the circuit with a resistance under at most 100 Ohms per cm when subjected at least 15,000 cycles of 100% strain.

In some embodiments, the first portion of the channel overlaid by the first metal material includes an interior surface of the channel and/or an edge portion of the channel.

In some embodiments, the channel including the first metal material and the second metal material form an interconnect that has a width of less than 500 µm, less than 400 µm, less than 300 µm, less than 200 µm, less than 100 µm, less than 90 µm, less than 80 µm, less than 70 µm, less than 60 µm less than 50 µm, less than 40 µm, less than 30 µm, less than 20 µm, less than 10 µm, less than 5 µm or less than 1 µm, and the interconnect that has a thickness of less than 500 µm, less than 400 µm, less than 300 µm, less than 200 µm, less than 100 µm, less than 90 µm, less than 80 µm, less than 70 µm, less than 60 µm less than 50 µm, less than 40 µm, less than 30 µm, less than 20 µm, less than 10 µm, less than 5 µm or less than 1 µm.

In some embodiments, the first circuit component and the second circuit component form part of an active-matrix array.

In some embodiments, the partial interface is free of degradation in conductivity when the deformable substrate is bent around a cylinder that has a radius of between 2 centimeters (cm) and 10 cm for a period of time between 10 seconds and 5 minutes and then released.

Another aspect of the present disclosure is directed to providing an electronic device. The electronic device includes a deformable substrate that further includes a circuit. Moreover, the circuit includes a channel that extends from a first portion of the deformable substrate to a second portion of the deformable substrate. The circuit further includes a first circuit component adjacent to the first portion of the deformable substrate. The circuit includes a second circuit component that is adjacent to the second portion of the deformable substrate. Furthermore, the circuit includes a first metal material that is formed overlaying a first portion of the deformable substrate. The first portion of the deformable substrate includes a first portion of the channel. Additionally, the circuit includes a second metal material interfacing with the first metal material, thereby substantially occupying an interior volume of the channel and forming an interconnect through the channel. Moreover, the interconnect is free of degradation in conductivity when the deformable substrate is bent around a cylinder that has a radius of between 14 cm and 25 cm for a period of time between 10 seconds and 1 hour and then released.

BRIEF DESCRIPTION OF THE DRAWINGS

The implementations disclosed herein are illustrated by way of example, and not by way of limitation, in the figures of the accompanying drawings. Like reference numerals refer to corresponding parts throughout the drawings.

FIGS. 5A, 5B, and 5C collectively provide a flow chart illustrating exemplary methods for forming a deformable electrical communication between a first circuit component and a second circuit component, in accordance with an embodiment of the present disclosure, in which optional elements of embodiments are indicated by dashed boxes and/or lines;

FIGS. 6A, 6B, 6C, 6D, 6E, and 6F collectively provide another flow chart illustrating exemplary methods for forming a deformable electrical communication between a first circuit component and a second circuit component, in accordance with an embodiment of the present disclosure, in which optional elements of embodiments are indicated by dashed boxes and/or lines;

FIGS. 16A, 16B, 16C, and 16D collectively illustrate an exemplary method for fabricating a first layer of a circuit of a deformable substrate of an electronic device, in accordance with an embodiment of the present disclosure;

FIG. 27 illustrates various logic functions that are implemented in some embodiments of the present disclosure.

DETAILED DESCRIPTION

Figure 1:
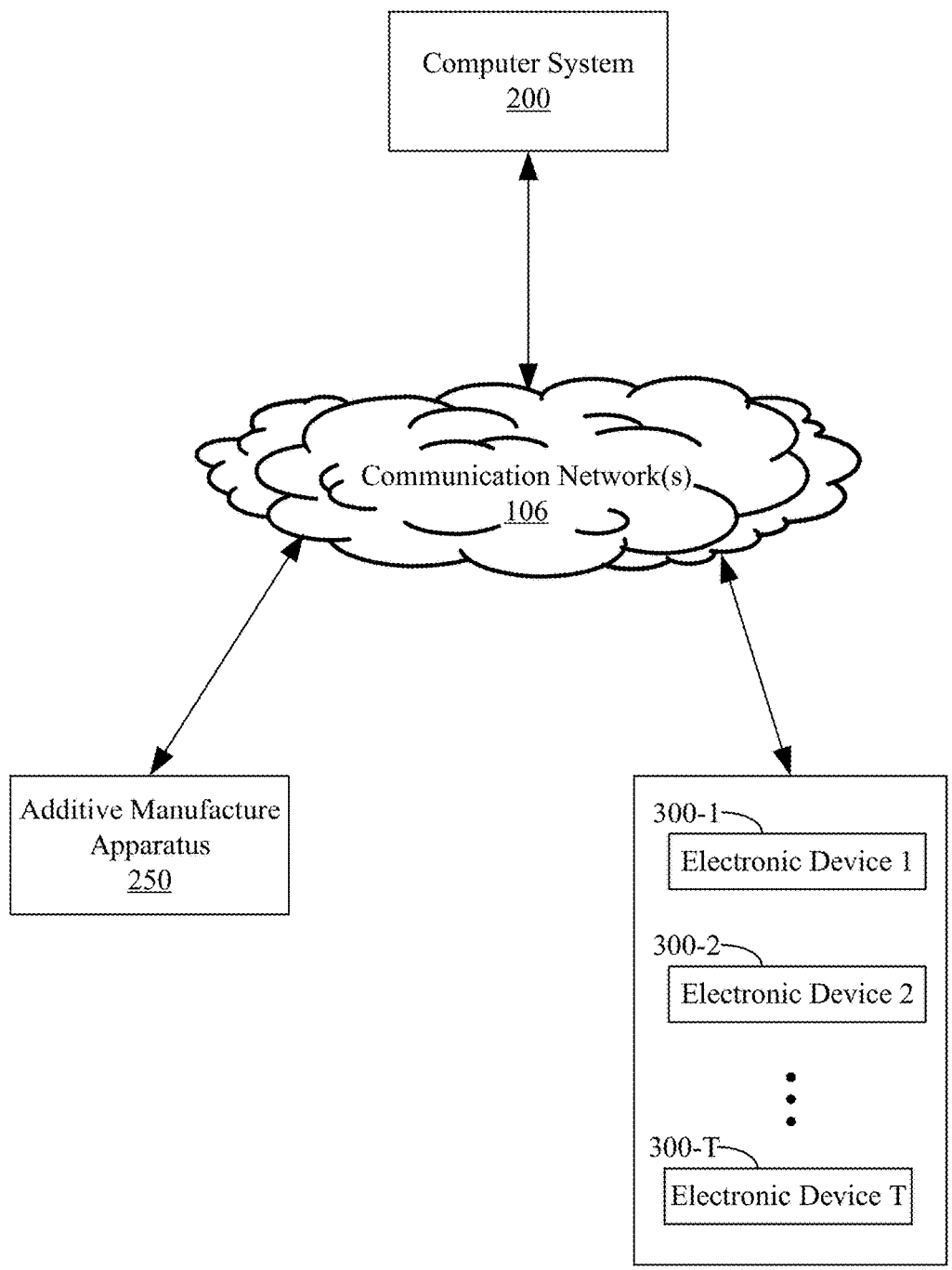
FIG. 1 illustrates an exemplary distributed additive manufacture system topology including a computer system and an additive manufacture system, in accordance with an embodiment of the present disclosure.

The present disclosure provides systems, methods, and devices for producing an interconnect that is capable of maintaining electrical communication through the interconnect when a force is applied to the interconnect. An electronic device of the present disclosure includes a deformable substrate including a circuit, which provides a structure for the interconnect of the present disclosure. The deformable substrate is configured to operate in a region of elastic deformation of a material of the deformable substrate, such that a shape of the deformable substrate is restored after removing the force applied to the interconnect of the present disclosure. The circuit includes a channel extending from a first portion of the deformable substrate to a second portion of the deformable substrate. For instance, in some embodiments, the channel forms a via interconnect or a line interconnect. A first circuit component is adjacent to the first portion of the deformable substrate, such as adjacent to a first portion of the channel. A second circuit component is adjacent to the second portion of the deformable substrate, such as adjacent to a second portion of the channel. A first metal material is formed overlaying a first portion of the deformable substrate including the first portion of the channel. Accordingly, the first metal material selectively wets the first portion of the channel. A second metal material interfaces with the first metal material, thereby causing the second metal material to substantially occupy an interior volume of the channel that otherwise would not occur without the selective wetting of the first portion of the channel. In some embodiments, the second metal material is a fluid material. Accordingly, with the second metal material occupy the interior volume of the channel, the second metal material interfaces with both the first circuit component and the second circuit component through the channel, which forms the electrical communication. Deformation of the electrical communication is thus allowed due to the fluidic properties of the second metal material and an ability of the second metal material to continuously deform when a force is applied thereto.

Reference will now be made in detail to embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, components, circuits, and networks have not been described in detail so as not to unnecessarily obscure aspects of the embodiments.

Plural instances may be provided for components, operations or structures described herein as a single instance. Finally, boundaries between various components, operations, and data stores are somewhat arbitrary, and particular operations are illustrated in the context of specific illustrative configurations. Other forms of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation(s).

It will also be understood that, although the terms "first," "second," etc. may be used herein to describe various elements, these elements should not be limited by these terms. These terms are only used to distinguish one element from another. For example, a first layer could be termed a second layer, and, similarly, a second layer could be termed a first layer, without departing from the scope of the present disclosure. The first layer and the layer are both layers, but they are not the same layer.

The terminology used herein is for the purpose of describing particular implementations only and is not intended to be limiting of the claims. As used in the description of the implementations and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The foregoing description included example systems, methods, techniques, instruction sequences, and computing machine program products that embody illustrative implementations. For purposes of explanation, numerous specific details are set forth in order to provide an understanding of various implementations of the inventive subject matter. It will be evident, however, to those skilled in the art that implementations of the inventive subject matter may be practiced without these specific details. In general, well-known instruction instances, protocols, structures and techniques have not been shown in detail.

The foregoing description, for purpose of explanation, has been described with reference to specific implementations. However, the illustrative discussions below are not intended to be exhaustive or to limit the implementations to the precise forms disclosed. Many modifications and variations are possible in view of the above teachings. The implementations are chosen and described in order to best explain the principles and their practical applications, to thereby enable others skilled in the art to best utilize the implementations and various implementations with various modifications as are suited to the particular use contemplated.

In the interest of clarity, not all of the routine features of the implementations described herein are shown and described. It will be appreciated that, in the development of any such actual implementation, numerous implementation-specific decisions are made in order to achieve the designer's specific goals, such as compliance with use case constraints, and that these specific goals will vary from one implementation to another and from one designer to another. Moreover, it will be appreciated that such a design effort might be complex and time-consuming, but nevertheless be a routine undertaking of engineering for those of ordering skill in the art having the benefit of the present disclosure.

For convenience in explanation and accurate definition in the appended claims, the terms "upper," "lower," "up," "down," "upwards," "downwards," "laterally," "longitudinally," "inner," "outer," "inside," "outside," "inwardly," "outwardly," "interior," "exterior," "front," "rear," "back," "forwards," and "backwards" are used to describe features of the exemplary embodiments with reference to the positions of such features as displayed in the figures.

Furthermore, when a reference number is given an "$i^{th}$" denotation, the reference number refers to a generic component, set, or embodiment. For instance, a circuit component "circuit component i" refers to the $i^{th}$ circuit component in a plurality of circuit components (e.g., a circuit component 330-$i$ in a plurality of circuit components 330).

As used herein, the term "mil" means a thousandth of an inch.

As used herein, the term "about" or "approximately" can mean within an acceptable error range for the particular value as determined by one of ordinary skill in the art, which can depend in part on how the value is measured or determined, e.g., the limitations of the measurement system. For example, "about" can mean within 1 or more than 1 standard deviation, per the practice in the art. "About" can mean a range of ±20%, ±10%, ±5%, or ±1% of a given value. Where particular values are described in the application and claims, unless otherwise stated, the term "about" means within an acceptable error range for the particular value. The term "about" can have the meaning as commonly understood by one of ordinary skill in the art. The term "about" can refer to ±10%. The term "about" can refer to ±5%.

In the present disclosure, unless expressly stated otherwise, descriptions of devices and systems will include implementations of one or more computers. For instance, and for purposes of illustration in FIG. 1, a computer system 200 is represented as single device that includes all the functionality of the computer system 200. However, the present disclosure is not limited thereto. For instance, the functionality of the computer system 200 may be spread across any number of networked computers and/or reside on each of several networked computers and/or by hosted on one or more virtual machines and/or containers at a remote location accessible across a communications network (e.g., communication networks 106). One skilled in the art of the present disclosure will appreciate that a wide array of different computer topologies is possible for the computer system 200, and other devices and systems of the preset disclosure, and that all such topologies are within the scope of the present disclosure.

In general, the present disclosure provides systems, methods, and devices for producing circuits with deformable substrates, in which the circuits have one or more interconnects for providing electronic communication between various circuit components of a circuit. In some embodiments, the systems, methods, and devices of the present disclosure provide deformable interconnects, such as one or more line interconnects and/or one or more via interconnects, that interface with a liquid metal material and/or a circuit component of a circuit.

Referring to FIGS. 1 through 4B and 16A through 21B, a system for producing an interconnect of a circuit is provided. More specifically, FIG. 1 depicts a block diagram of a distributed additive manufacture system (e.g., distributed additive manufacture system 100) according to some embodiments of the present disclosure. In some embodiments, the system 100 facilitates the manufacture, at least in part, of an electronic device (e.g., electronic device 300-1 of FIG. 1, electronic device 300 of FIG. 3A, electronic device 300 of FIG. 4A, electronic device 300 of FIG. 4B, electronic device 300 of FIG. 28, etc.) at a computer system (e.g., computer system 200 of FIG. 1, computer system 200 of FIG. 2, etc.).

Of course, other topologies of the system 100 are possible. For instance, in some embodiments, any of the illustrated devices and systems can in fact constitute several computer systems that are linked together in a network or be a virtual machine and/or container in a cloud-computing environment. Moreover, rather than relying on a physical communication network 106, the illustrated devices and systems may wirelessly transmit information between each other. As such, the exemplary topology shown in FIG. 1 merely serves to describe the features of an embodiment of the present disclosure in a manner that will be readily understood to one skilled in the art.

Referring to FIG. 1, in some embodiments, a distributed additive manufacture system 100 includes a computer system 200 that facilitates manufacture of an electronic device 300 in response to one or more instructions for manufacturing the electronic device 300. In some embodiments, the computer system 200 and an additive manufacture apparatus (e.g., additive manufacture apparatus 250 of FIG. 1, etc.) are in a single monolithic casing without a communication network 106. In other embodiments, the computer system 200 and the additive manufacture apparatus 250 are separated by some distance and are in electrical communication with each other over the communication network as illustrated in FIG. 1.

In some embodiments, the communication networks 106 optionally includes the Internet, one or more local area networks (LANs), one or more wide area networks (WANs), other types of networks, or a combination of such networks. Examples of communication networks 106 include the World Wide Web (WWW), an intranet and/or a wireless network, such as a cellular telephone network, a wireless local area network (LAN) and/or a metropolitan area network (MAN), and other devices by wireless communication. The wireless communication optionally uses any of a plurality of communications standards, protocols and technologies, including Global System for Mobile Communications (GSM), Enhanced Data GSM Environment (EDGE), high-speed downlink packet access (HSDPA), high-speed uplink packet access (HSUPA), Evolution, Data-Only (EV-DO), HSPA, HSPA+, Dual-Cell HSPA (DC-HSPDA), long term evolution (LTE), near field communication (NFC), wideband code division multiple access (W-CDMA), code division multiple access (CDMA), time division multiple access (TDMA), Bluetooth, Wireless Fidelity (Wi-Fi) (e.g., IEEE 802.11a, IEEE 802.11ac, IEEE 802.11ax, IEEE 802.11b, IEEE 802.11g and/or IEEE 802.11n), voice over Internet Protocol (VoIP), Wi-MAX, a protocol for e-mail (e.g., Internet message access protocol (IMAP) and/or post office protocol (POP)), instant messaging (e.g., extensible messaging and presence protocol (XMPP), Session Initiation Protocol for Instant Messaging and Presence Leveraging Extensions (SIMPLE), Instant Messaging and Presence Service (IMPS)), and/or Short Message Service (SMS), or any other suitable communication protocol, including communication protocols not yet developed as of the filing date of this document.

Now that a distributed additive manufacture system 100 has generally been described, an exemplary computer system 200 for controlling an additive manufacture apparatus 250 by providing one or more instructions, such as one or more non-transitory logics (e.g., logics of FIG. 27, etc.), for manufacture of an electronic device 300 will be described with reference to FIG. 2.

In various embodiments, the computer system 200 includes one or more processing units (CPUs) 274, a network or other communications interface 284, and memory 292.

The memory 292 includes high-speed random access memory, such as DRAM, SRAM, DDR RAM, or other random access solid state memory devices, and optionally also includes non-volatile memory, such as one or more magnetic disk storage devices, optical disk storage devices, flash memory devices, or other non-volatile solid state storage devices. The memory 292 may optionally include one or more storage devices remotely located from the CPU(s) 274. The memory 292, or alternatively the non-volatile memory device(s) within memory 292, includes a non-transitory computer readable storage medium. Access to memory 292 by other components of the computer system 200, such as the CPU(s) 274, is, optionally, controlled by a controller. In some embodiments, the memory 292 can include mass storage that is remotely located with respect to the CPU(s) 274. In other words, some data stored in the memory 292 may in fact be hosted on devices that are external to the computer system 200, but that can be electronically accessed by the computer system 200 over an Internet, intranet, or other form of communication network 106 or electronic cable using communication interface 284.

In some embodiments, the memory 292 of the computer system 200 for controlling an additive manufacture apparatus 250 to manufacture an electronic device 300 stores:

an optional operating system 202 (e.g., ANDROID, iOS, DARWIN, RTXC, LINUX, UNIX, OS X, WINDOWS, or an embedded operating system such as VxWorks) that includes procedures for handling various basic system services;

an electronic address 204 associated with the computer system 200 that identifies the computer system 200;

a material library 206 that stores a plurality of material properties 208 associated with a corresponding material that is utilized by the additive manufacture apparatus 250;

an object library 210 that stores a plurality of object properties 212 for manufacturing a corresponding object, such as a circuit (e.g., a layer of the circuit) and/or a circuit component at the additive manufacture apparatus 250; and a control module 214 that stores one or more non-transitory logics 216 that instruct a control of a manufacture the corresponding object at the additive manufacture apparatus 250.

In some embodiments, an electronic address 204 is associated with the computer system 200. The electronic address 204 is utilized to identify the computer system 200 at least uniquely from other devices and components of the distributed additive manufacture system 100 (e.g., uniquely identify computer system 200 from additive manufacture apparatus 250 of FIG. 1).

In some embodiments, a material library 206 is configured to store at least a plurality of materials properties 208 that is associated with a corresponding material (e.g., first plurality of material properties 208-1 is associated with a corresponding first material, second plurality of material properties 208-2 is associated with a corresponding second material, etc.). Each corresponding material associated with a respective plurality of material properties 208 is found at or produced by the additive manufacture apparatus 250. For instance, in some embodiments, the corresponding material associated with the plurality of material properties 208 is the resin 325 accommodated by the resin enclosure of the additive manufacture apparatus 250. In some embodiments, the corresponding material associated with the plurality of material properties 208 is a media 375 of the additive manufacture apparatus 250. Moreover, in some embodiments, the corresponding material associated with the plurality of material properties 208 is a material of the resin enclosure or a different component of the 3D printer system (e.g., outer glass container, temperature control system, etc.). For instance, in some such embodiments, the corresponding material associated with the plurality of material properties 208 is a coolant of a thermal control system associated with an additive manufacture apparatus 250.

In some embodiments, a respective material property 208 in the plurality of material properties 208 is associated with a physical property of the corresponding material. As a non-limiting example, in some such embodiments, the physical property of the corresponding material associated with the respective material property is a first model of a phase diagram of the corresponding material that includes an evaluation of a boiling point of the corresponding material, an evaluation of a melting point of the corresponding material, an evaluation of a critical point of the corresponding material, an evaluation of a supercritical fluidic phase region of the corresponding material, an evaluation of a glass transition temperature, or a combination thereof. As another non-limiting example, in some embodiments, the physical property of the corresponding material associated with the respective material property 208 is a second model of a viscosity of the corresponding material, a third model of an index of refraction of the corresponding material, a fourth model of an evaluation of a depth of curing of the corresponding material volumetric shrinkage of the corresponding material, a fifth model of a flexural strength of the corresponding material, or a combination thereof. In some embodiments, the physical property of the corresponding material is a thermal property, such as a sixth model of a thermal conductivity of the corresponding material, a seventh model of a thermal diffusivity of the corresponding material, an eight model of a specific heat capacity, a ninth model of a thermal effusivity of the corresponding model, a tenth model of a material density of the corresponding material, an eleventh model of a conductivity of the corresponding material, or a combination thereof.

In some embodiments, from the plurality of material properties 208 associated with the physical property of the corresponding material, a manufacture of an object, such as an interconnect of the present disclosure, is dynamically modifiable based on one or more material properties in the plurality of material properties 208, such as by changing a mass of the material deposited by an additive manufacture apparatus 250 when manufacturing the object.

For instance, in some embodiments, the respective material property in the plurality of material properties 208 is associated with the supply of the corresponding material at an additive manufacture apparatus 250, such as the amount (e.g., a weight, a volume, etc.) of a reservoir of the corresponding material at the additive manufacture apparatus 250. One skilled in the art of the present disclosure will appreciate that a wide domain of material properties 208 are applicable to the systems, methods, and devices of the present disclosure.

In some embodiments, the plurality of material properties 208 stored by the material library 206 includes between 5 material properties and 10,000 material properties, between 5 material properties and 5,000 material properties, between 5 material properties and 1,000 material properties, between 5 material properties and 700 material properties, between 5 material properties and 500 material properties, between 5 material properties and 400 material properties, between 5 material properties and 100 material properties, between 50 material properties and 10,000 material properties, between 50 material properties and 5,000 material properties, between 50 material properties and 1,000 material properties, between 50 material properties and 700 material properties, between 50 material properties and 500 material properties, between 50 material properties and 400 material properties, between 50 material properties and 100 material properties, between 350 material properties and 10,000 material properties, between 350 material properties and 5,000 material properties, between 350 material properties and 1,000 material properties, between 350 material properties and 700 material properties, between 350 material properties and 500 material properties, between 350 material properties and 400 material properties, between 1,250 material properties and 10,000 material properties, between 1,250 material properties and 5,000 material properties, or between 6,250 material properties and 10,000 material properties. In some embodiments, the plurality of material properties 208 stored by the material library 206 includes at least 5 material properties, at least 20 material properties, at least 50 material properties, at least 200 material properties, at least 500 material properties, at least 1,000 material properties, at least 3,000 material properties, at least 8,000 material properties, or at least 10,000 material properties. In some embodiments, the plurality of materials properties 208 stored by the material library 206 includes at most 5 material properties, at most 20 material properties, at most 50 material properties, at most 200 material properties, at most 500 material properties, at most 1,000 material properties, at most 3,000 material properties, at most 8,000 material properties, or at most 10,000 material properties.

Additional details and information regarding certain material properties is found at *Standard Handbook for Mechanical Engineers*, twelfth edition, 2018, McGraw-Hill, Inc, print, which is hereby incorporated by reference in its entirety for all purposes.

In some embodiments, the object library 210 is configured to store at least a plurality of object properties 212 that is associated with a corresponding object (e.g., first plurality of object properties 212-1 is associated with a corresponding first object, second plurality of material properties 212-2 is associated with a corresponding second object, etc.). In some embodiments, a respective object property 212 in the plurality of object properties 212 includes a set of non-transitory instructions for manufacturing the corresponding object at an additive manufacture apparatus 250 by way of one or more additive manufacturing techniques. For instance, in some embodiments, the first object property in a first plurality of object properties 212-1 includes a first set of non-transitory instructions for manufacturing a corresponding second object at a direct writing additive manufacture apparatus 250, the second object property in the first plurality of object properties 212-1 includes a second set of non-transitory instructions for manufacturing the corresponding second object at a screen printing additive manufacture apparatus 250, and the like.

In some embodiments, the plurality of object properties 212 stored by the object library 210 includes between 5 object properties and 10,000 object properties, between 5 object properties and 5,000 object properties, between 5 object properties and 1,000 object properties, between 5 object properties and 700 object properties, between 5 object properties and 500 object properties, between 5 object properties and 400 object properties, between 5 object properties and 100 object properties, between 50 object properties and 10,000 object properties, between 50 object properties and 5,000 object properties, between 50 object properties and 1,000 object properties, between 50 object properties and 700 object properties, between 50 object properties and 500 object properties, between 50 object properties and 400 object properties, between 50 object properties and 100 object properties, between 350 object properties and 10,000 object properties, between 350 object properties and 5,000 object properties, between 350 object properties and 1,000 object properties, between 350 object properties and 700 object properties and 500 object properties, between 350 object properties and 400 object properties, between 1,250 object properties and 10,000 object properties, between 1,250 object properties and 5,000 object properties, or between 6,250 object properties and 10,000 object properties. In some embodiments, the plurality of materials properties 208 stored by the material library 206 includes at least 5 object properties, at least 20 object properties, at least 50 object properties, at least 200 object properties, at least 500 object properties, at least 1,000 object properties, at least 3,000 object properties, at least 8,000 object properties, or at least 10,000 object properties. In some embodiments, the plurality of materials properties 208 stored by the material library 206 includes at most 5 object properties, at most 20 object properties, at most 50 object properties, at most 200 object properties, at most 500 object properties, at most 1,000 object properties, at most 3,000 object properties, at most 8,000 object properties, or at most 10,000 object properties.

Figure 2:
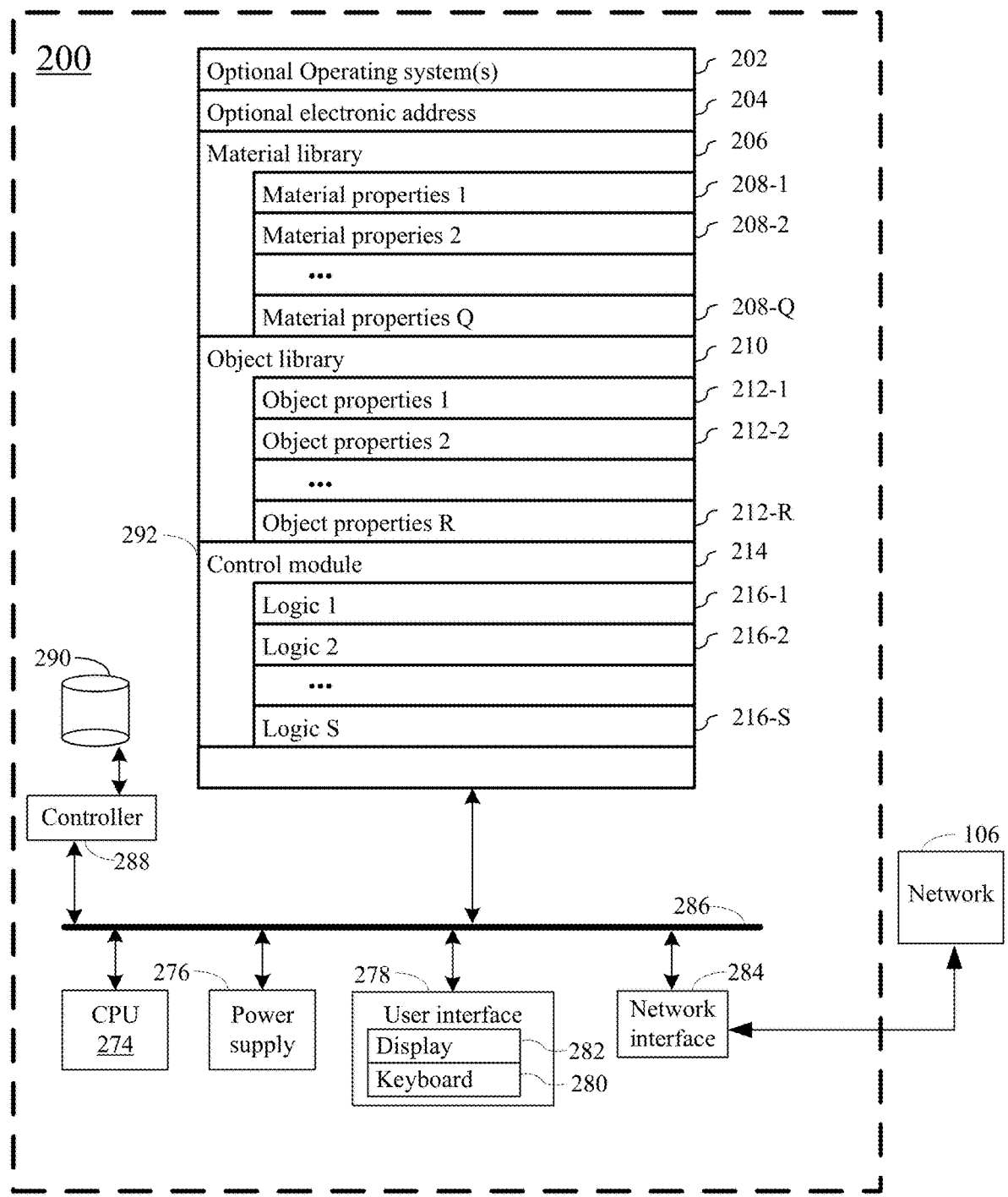
FIG. 2 illustrates various modules and/or components of a computer system, in accordance with an exemplary embodiment of the present disclosure.

In some embodiments, the control module 214 stores one or more non-transitory logics 216 (e.g., first non-transitory logic 216-1, second non-transitory logic 216-2, . . . , non-transitory logic S 216-S of FIG. 2). In some embodiments, each of the non-transitory logics 216 is configured to control an aspect of an additive manufacture apparatus 250 by one or more instructions for the additive manufacture apparatus 250. For instance, in some embodiments, a respective non-transitory logic 216 includes one or more instructions to modify a flow rate of a material disposed (e.g., extruded) by the additive manufacture apparatus 250, and the like. As another non-limiting example, in some embodiments, a respective non-transitory logic 216 is configured to switch the power state of the 3D printer system 100, such as the respective powered state (e.g., switch to/from a powered state, an unpowered stated, etc.) of a power supply of the additive manufacture apparatus 250, the respective powered state of a temperature control system of the additive manufacture apparatus 250, or a combination thereof.

In some embodiments, the object library 210 is subsumed by, or in communication with, the control module 214. For instance, in some embodiments, the non-transitory logic 216 of the control module 214 includes a geometric slicer for translating slicing a corresponding object for manufacture at an additive manufacture apparatus 250.

Figure 7A:
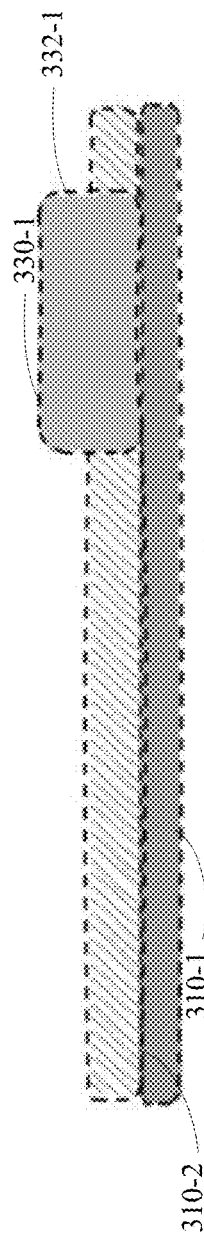
FIGS. 7A, 7B, 7C, and 7D collectively provide a flow chart illustrating exemplary methods for forming a deformable electrical communication between a first circuit component and a second circuit component, in accordance with an embodiment of the present disclosure, in which optional elements of embodiments are indicated by dashed boxes and/or lines.
Figure 7B:
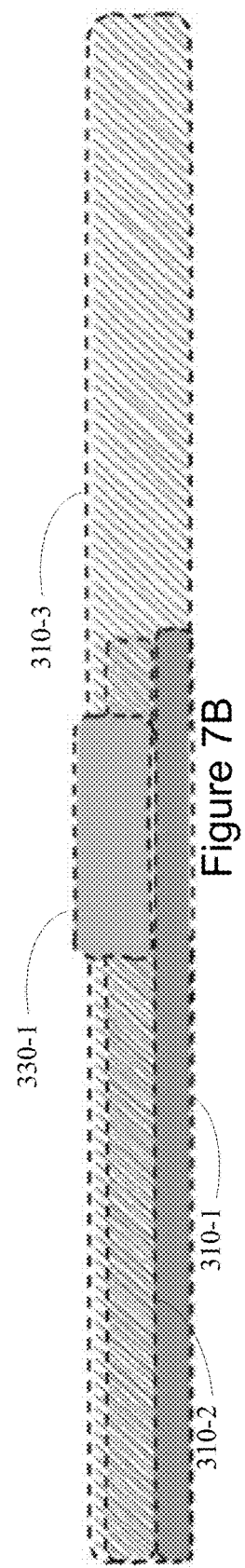
Figure 7C:
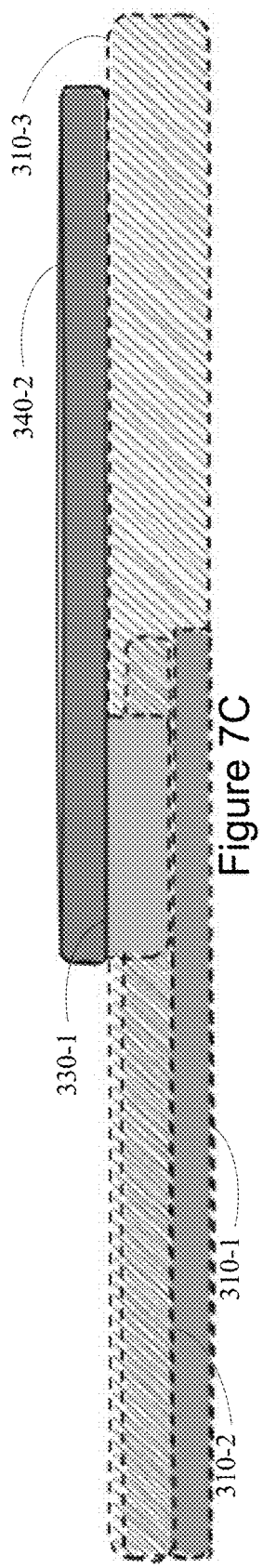
Figure 7D:
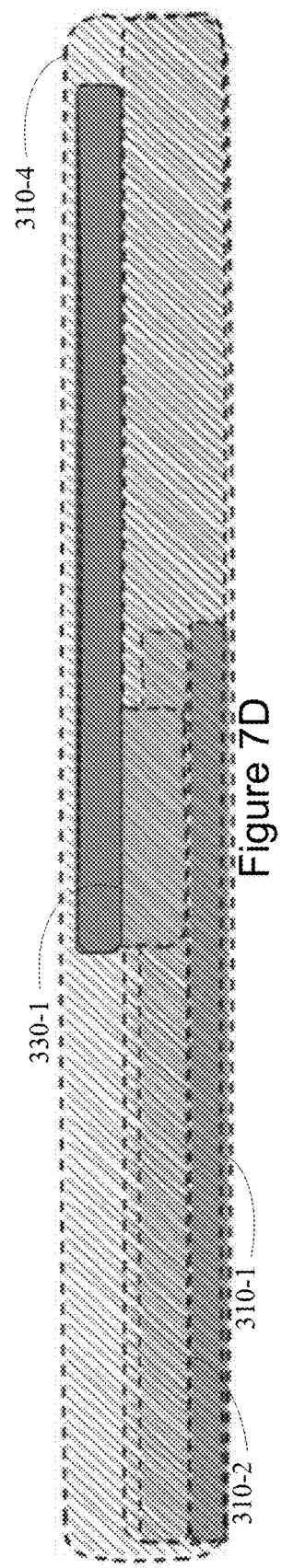
Figure 8:
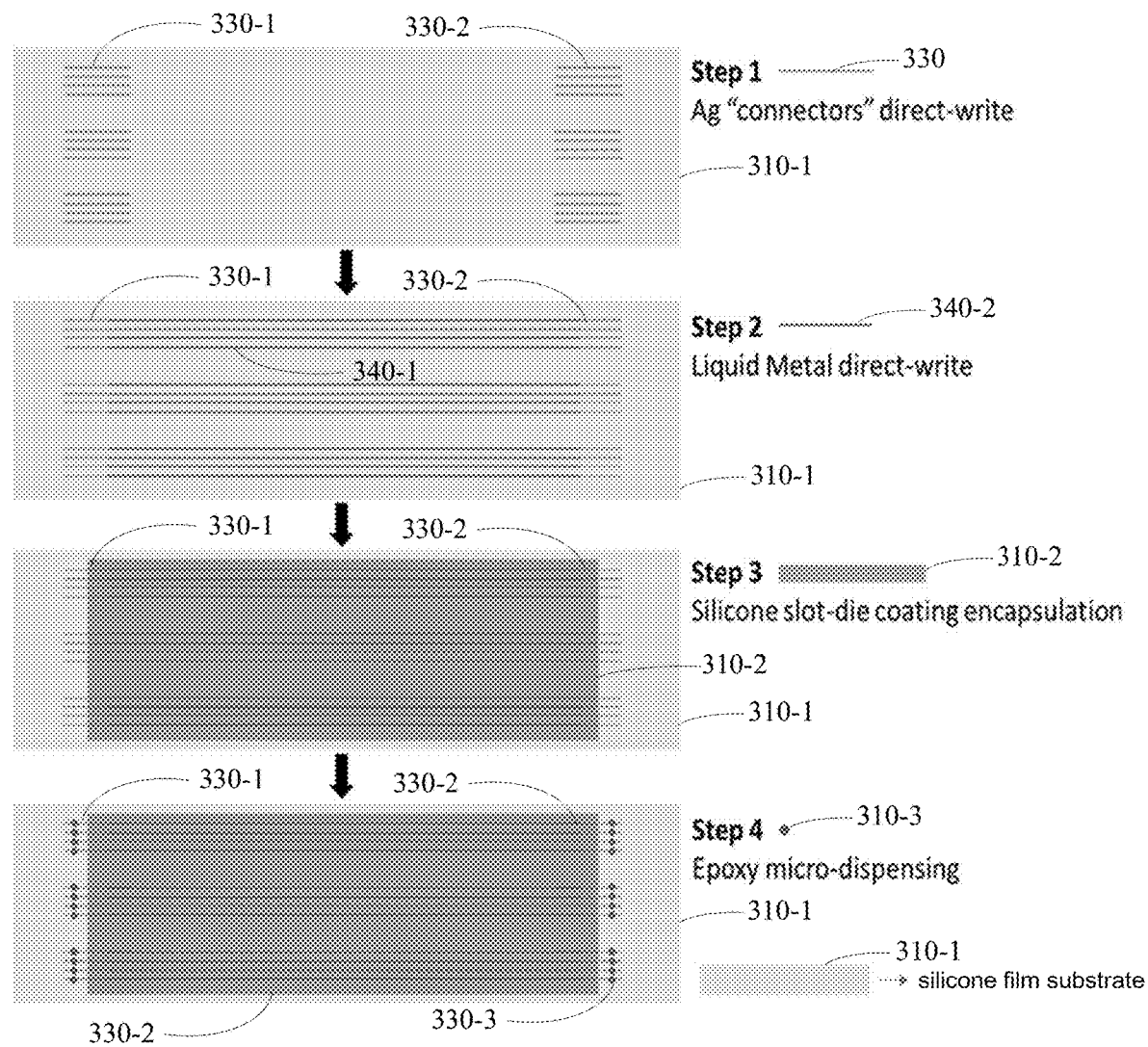
FIG. 8 is yet another flow chart illustrating exemplary methods for forming a deformable electrical communication between a first circuit component and a second circuit component, in accordance with an embodiment of the present disclosure, in which optional elements of embodiments are indicated by dashed boxes and/or lines.

Each of the above identified modules and applications correspond to a set of executable instructions for performing one or more functions described above and the methods described in the present disclosure (e.g., the computer-implemented methods and other information processing methods described herein; method 400 of FIGS. 5A through 5C; method 500 of FIGS. 6A through 6E; method 600 of FIGS. 7A through 7D; method 700 of FIG. 8; etc.). These modules (e.g., sets of instructions) need not be implemented as separate software programs, procedures or modules, and thus various subsets of these modules are, optionally, combined or otherwise re-arranged in various embodiments of the present disclosure. In some embodiments, the memory 292 optionally stores a subset of the modules and data structures identified above. Furthermore, in some embodiments, the memory 292 stores additional modules and data structures not described above.

It should be appreciated that the computer system 200 of FIG. 2 is only one example of a computer system 200, and that the computer system 200 optionally has more or fewer components than shown, optionally combines two or more components, or optionally has a different configuration or arrangement of the components. The various components shown in FIG. 2 are implemented in hardware, software, firmware, or a combination thereof, including one or more signal processing and/or application specific integrated circuits.

Referring to FIGS. 3A-4B and 16A-22B, an electronic device (e.g., electronic device 300 of FIG. 1, electronic device 300 of FIG. 3A, electronic device 300 of FIG. 4A, electronic device 300 of FIG. 4B, electronic device 300 of method 400 of FIGS. 5A through 5C; electronic device 300 of method 500 of FIGS. 6A through 6E, electronic device 300 of method 600 of FIGS. 7A through 7D, electronic device of method 700 of FIG. 8, electronic device 300 of FIG. 28, etc.) in accordance with some embodiments with some embodiments of the present disclosure is provided. For instance, referring briefly to FIG. 28, in some embodiments, the electronic device 300 is a garment that is worn by a subject, such as around a wrist, a hand, a finger, or a combination thereof of the subject. However, the present disclosure is not limited thereto.

Figure 3A:
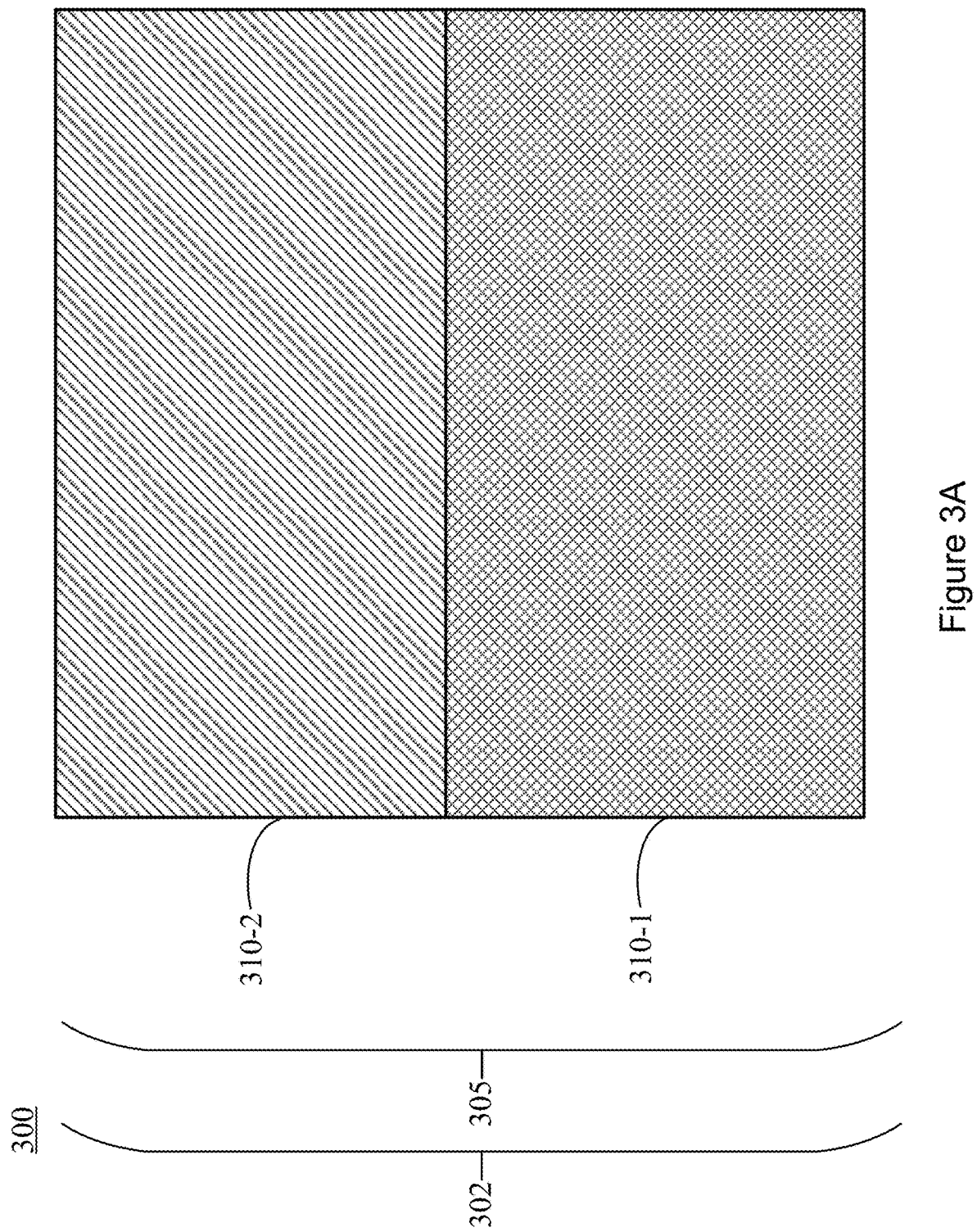
FIGS. 3A, 3B, 3C, 3D, and 3E illustrate a cross-sectional side view of an electronic device, in accordance with an embodiment of the present disclosure.
Figure 4A:
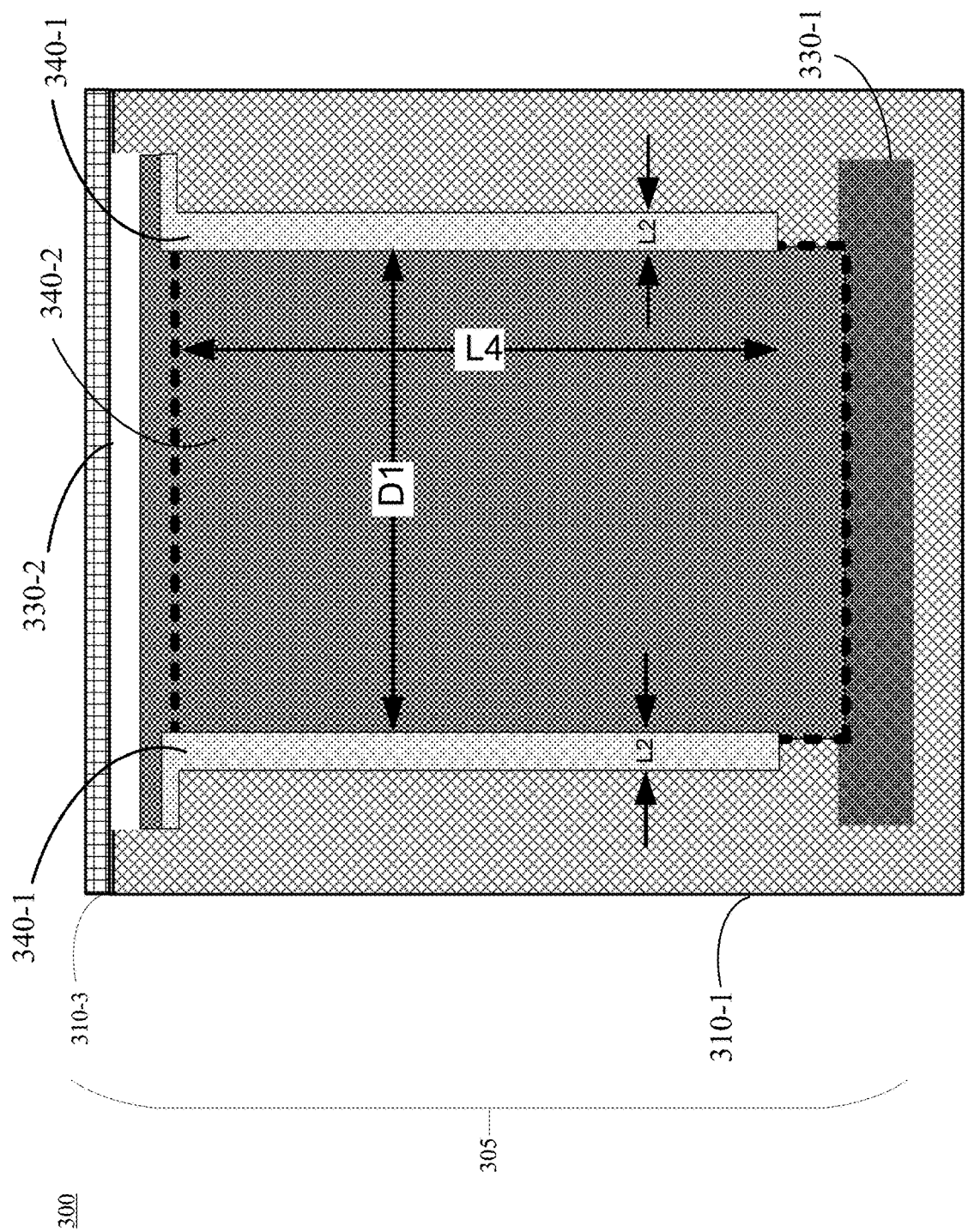
FIG. 4A illustrates another cross-sectional side view of an electronic device, in accordance with an embodiment of the present disclosure.

The electronic device 300 includes a deformable substrate (e.g., deformable substrate 302 of FIG. 3A, deformable substrate 302 of FIG. 4A, deformable substrate 302 of FIG. 6A, deformable substrate 302 of FIG. 6B, deformable substrate 302 of FIG. 6C, deformable substrate 302 of FIG. 6D, deformable substrate 302 of FIG. 6E, deformable substrate 302 of FIG. 6F, deformable substrate 302 of FIG. 7A, deformable substrate 302 of FIG. 7B, deformable substrate 302 of FIG. 7C, deformable substrate 302 of FIG. 7D, deformable substrate 302 of FIG. 8, etc.).

In some embodiments, the deformable substrate 302 includes a supporting material upon which or within which an object (e.g., an electronic circuit) is fabricated or attached to or is on. In some embodiments, the deformable substrate 302 or a portion of the deformable substrate 302 is processed (e.g., patterned) during manufacture of the object. In some embodiments, the deformable substrate remains substantially unchanged when the object is formed upon or within the deformable substrate 302.

The deformable substrate 302 includes a planar surface, a substantially planar surface, a curved surface, a round surface (e.g., an edge having a radius of curvature greater than zero), one or more sharp edges, or any combination thereof.

In some embodiments, the deformable substrate 302 is rigid or flexible, stretchable or non-stretchable, thick or thin (e.g., in form of a sheet or a film), removable (e.g., the substrate functions as a sacrificial layer that can be at least partially removed when desired or needed) or non-removable, or any combination thereof. In some embodiments, the deformable substrate 302 is a monolayer. As used herein, the term "deformable substrate" refers to a substrate or a portion of it (e.g., a layer) capable of altering its shape subject to pressure or stress.

For instance, in some embodiments, the substrate 302 or at least a portion of it is flexible, bendable, stretchable, inflatable, or the like. For instance, in some embodiments, the deformable substrate 302 or at least a portion of it (e.g., a layer) is made with a material having a Young's Modulus lower than about 0.5 Giga-Pascals (GPa), lower than about 0.4 GPa, lower than about 0.3 GPa, or lower than about 0.2 GPa. Such a material allows the substrate or a portion of it to deform (e.g., bend, stretch, elongate, rotate, or the like) under pressure, strain, torsion, or a combination. In some embodiments, the deformable substrate 302 or at least a portion of the deformable substrate 302 is made of a material having Young's Modulus lower than about 0.1 GPa to provide enhanced flexibility and tackability. Examples of materials with low Young's Modulus include, but are not limited to elastomeric materials, viscoelastic polymeric materials, synthetic resins having low sliding performance, high corrosion resistance and high strength, such as silicone, medical grade polyurethane, polyethylene terephthalate (PET), polyimide (PI), polyphenylene sulfide (PPS) or fluorine-containing resin.

In some embodiments, the deformable substrate 302 includes a layer or a portion made of a relatively rigid material. For instance, in some embodiments, the deformable substrate includes a layer or a portion made of a material having Young's Modulus higher than about 0.5 GPa, higher than about 1.0 GPa, higher than about 2.0 GPa, higher than about 3.0 GPa, higher than about 4.0 GPa, or higher than about 5.0 GPa. Examples of materials with relatively higher Young's Modulus include, but are not limited to, polyethylene, PEEK, polyester, aramid, composite, glass epoxy, polyethylene napthalate, and polyimide. As a non-limiting example, in some embodiments, the electronic device 300 includes one or more circuit components that include a substrate formed from a first material, such as a polyimide (PI), which forms a first layer of the deformable substrate 302. However, the present disclosure is not limited thereto.

Figure 3B:
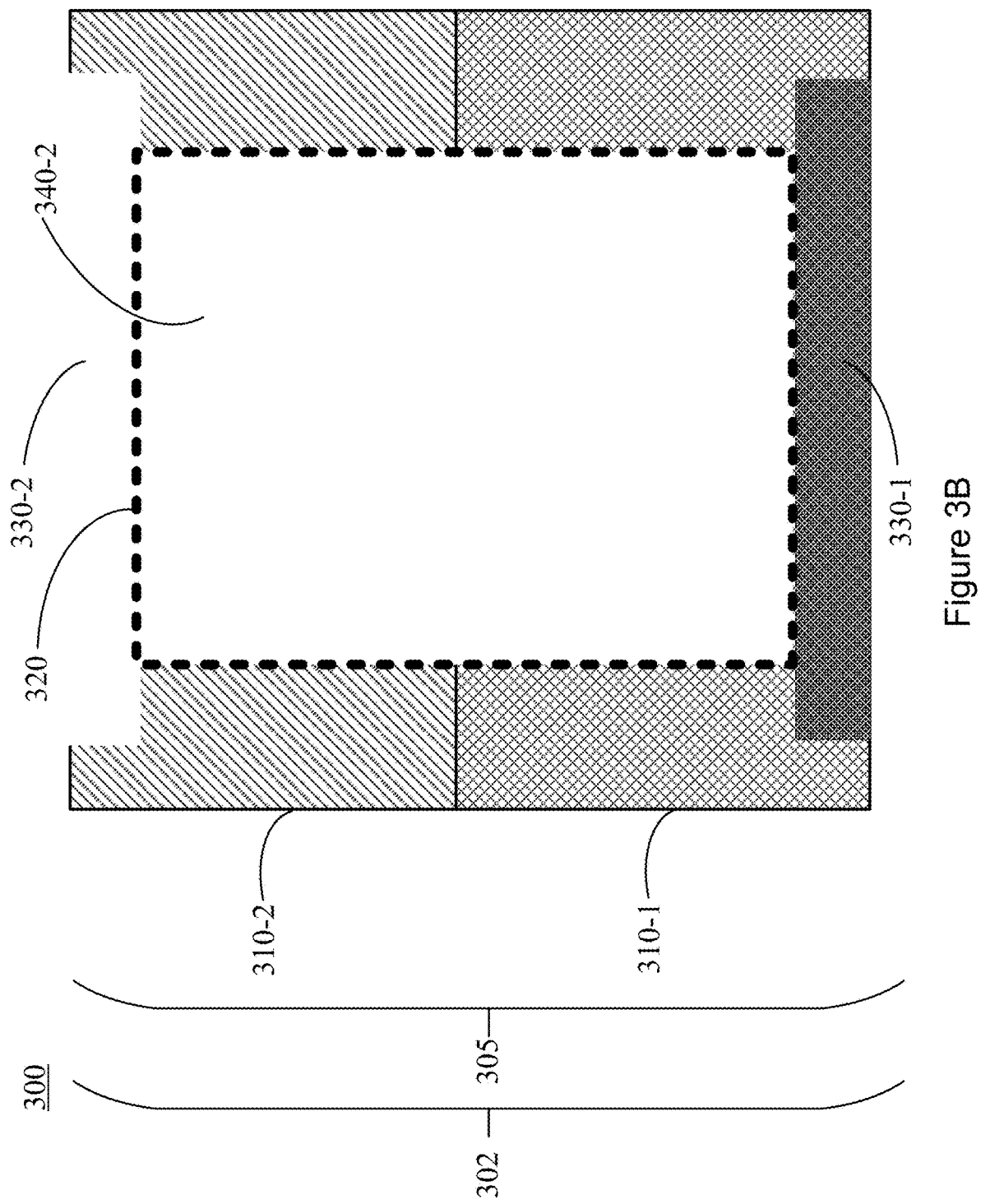
Figure 3C:
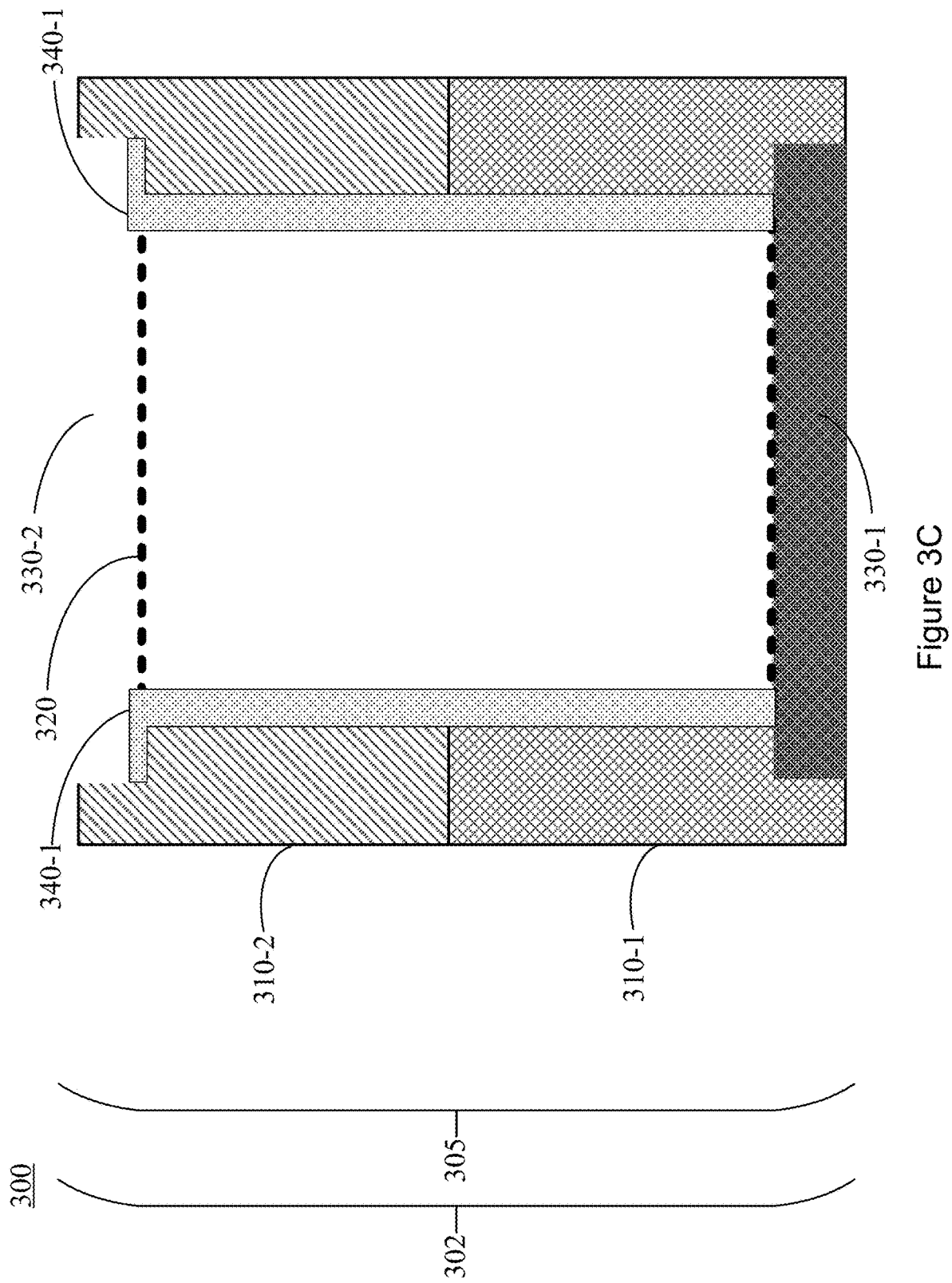
Figure 3D:
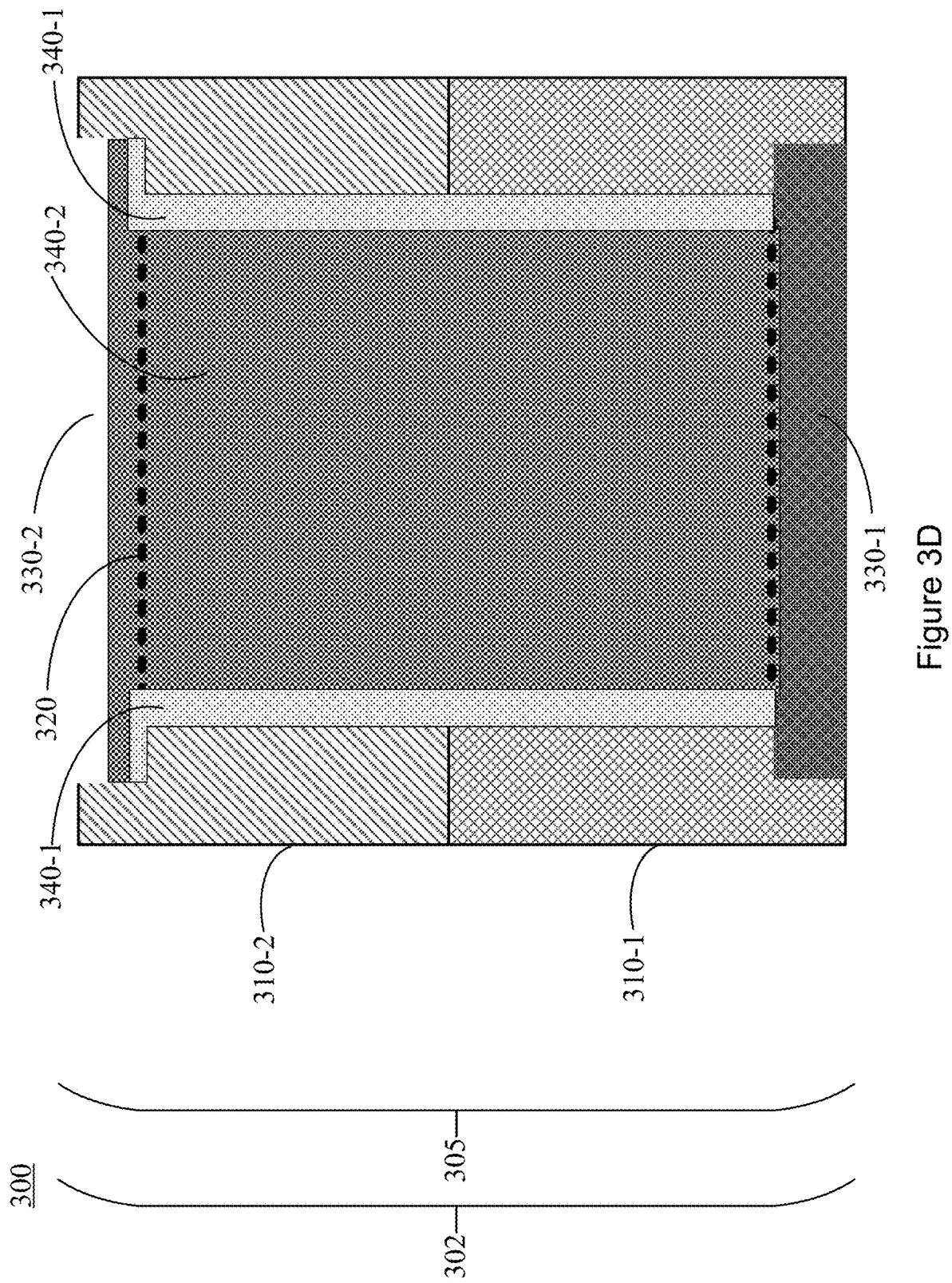
Figure 3E:
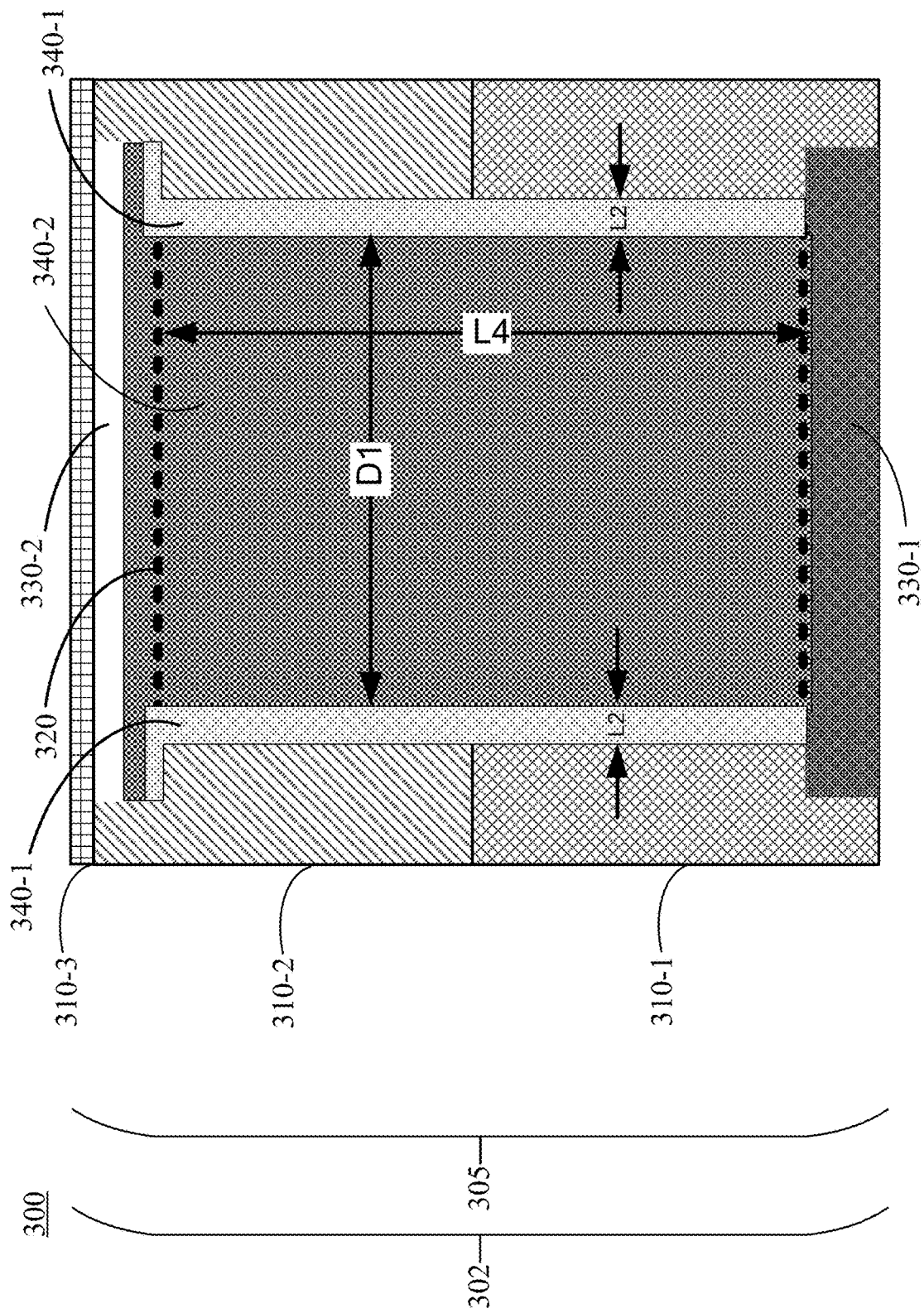

The deformable substrate 302 includes a circuit (e.g., circuit 305 of FIG. 3E, circuit 305 of FIG. 4A, etc.). In some embodiments, the circuit 305 includes a printed circuit board (PCB). For instance, in some embodiments, the circuit 305 includes one or more flexible printed circuits (FPCs) (e.g., FPC 306-1 and/or FPC 306-2 of FIG. 24A, etc.). By utilizing the FPC with the circuit 305, the electronic device 300 of the present disclosure is provided with improved durability since substantially all of the electronic device 300 is formed of or on a deformable material. However, the present disclosure is not limited thereto. Moreover, in some embodiments, by utilizing one or more FPCs with the circuit 305, the electronic device 300 of the present disclosure is capable of incorporated one or more conventional FPC components that benefit from the additional stretchability (e.g., elastic elongation) gained through interfacing with the deformable substrate 302 of the present disclosure.

In some embodiments, the circuit 305 includes a plurality of layers (e.g., first layer 310-1 of circuit 305, second layer 310-2 of circuit 305, third layer 310-3 of circuit 305, etc.), which yields a multilayer circuit 305 and, thus, adding additional dimensionality to the circuit 305. For instance, in some embodiments, the circuit 305 includes between 1 layer and 10 layers, between 1 layer and 8 layers, between 1 layer and 6 layers, between 1 layer and 4 layers, between 1 layer and 3 layers, between 1 layer and 2 layers, between 2 layers and 10 layers, between 2 layers and 8 layers, between 2 layers and 6 layers, between 2 layers and 4 layers, between 2 layers and 3 layers, between 3 layers and 10 layers, between 3 layers and 8 layers, between 3 layers and 6 layers, between 3 layers and 4 layers, between 4 layers and 10 layers, between 4 layers and 8 layers, between 4 layers and 6 layers, between 5 layers and 10 layers, between 5 layers and 8 layers, between 5 layers and 6 layers, between 6 layers and 10 layers, between 6 layers and 8 layers, between 7 layers and 10 layers, between 7 layers and 8 layers, between 8 layers and 10 layers, or between 9 layers and 10 layers. In some embodiments, the circuit 305 includes at least 1 layer, at least 2 layers, at least 3 layers, at least 4 layers, at least 5 layers, at least 6 layers, at least 7 layers, at least 8 layers, at least 9 layers, or at least 10 layers. In some embodiments, the circuit 305 includes at most 1 layer, at most 2 layers, at most 3 layers, at most 4 layers, at most 5 layers, at most 6 layers, at most 7 layers, at most 8 layers, at most 9 layers, or at most 10 layers. For instance, in some embodiments, the circuit 305 includes a stretchable first layer 310-1 and a rigid second layer 310-2. In some embodiments, a first layer 310-1 of the circuit 305 is capable of elastic elongation and a second layer 310-2 of the circuit 305 is capable of plastic elongation only. However, the present disclosure in not limited thereto.

In some embodiments, the one or more layers 310 of the circuit 305 and the deformable substrate 302 have a one-to-one relationship, such that each layer of the circuit 305 is a layer of the deformable substrate 302. However, the present disclosure is not limited thereto. For instance, in some embodiments, the one or more layers 310 of the circuit 305 and the deformable substrate 302 have a many-to-one relationship, such as two or more layers 310 of the circuit 305 formed on a single layer of the deformable substrate 302 (e.g., first layer 310-1 of circuit 305 formed on a first surface of a first layer of deformable substrate 302 and a first layer 310-2 of circuit 305 formed of a second surface of the first layer of the deformable substrate 302, in which the second surface is opposite the first surface).

Moreover, the circuit 305 includes a channel (e.g., channel 320 of FIG. 3B, channel 320 of FIG. 4A, channel 320 of FIG. 6B, channel 320 of FIG. 6C, channel 320 of FIG. 6D, channel 320 of FIG. 6E, channel 320 of FIG. 6F, channel 320 of FIG. 7A, channel 320 of FIG. 7B, channel 320 of FIG. 7C, channel 320 of FIG. 7D, etc.). In some embodiments, the channel 320 extends from a first portion of the deformable substrate 302 to a second portion of the deformable substrate 302. For instance, referring to FIG. 3B, in some embodiments, the circuit 305 includes at least two layers 310 including a first layer 310-1 and a second layer 310-2. In some embodiments, the circuit 305 includes at least three layers 310 including the first layer 310-1, the second layer 310-2, and a third layer 310-3. However, the present disclosure is not limited thereto. In some such embodiments, the channel 320 extends from a first portion of the first layer 310-1 to a second portion of the second layer 310-2. In some embodiments, the channel 320 extends from the first portion of the first layer 310-1 to a third portion of the first layer 310-1. However, the present disclosure is not limited thereto.

Referring to FIG. 3B, the first layer 310-1 includes the first portion of the deformable substrate 302. Moreover, the second layer 310-2 includes the second portion of the deformable substrate 302. Accordingly, in some embodiments, the channel 320 extends from a first terminal of the first layer 310-1 to a second terminal of the second layer 310-2. Accordingly, the channel 320 of the circuit 305 extends through at least two layers 310 of the circuit 305, which allows for providing electrical communication between the at least two layers 310. Said otherwise, in some embodiments, the channel 320 is, or forms, a via interconnect of the circuit 305 providing electrical communication between one or more circuit components 330 of the first layer 310-1 and one or more circuit components of the second layer 310-2 of the circuit 305. However, the present disclosure is not limited thereto.

In some embodiments, the first portion of the deformable substrate 302 and the second portion of the deformable substrate 302 form part of a planar surface of the deformable substrate 302. For instance, referring to FIG. 8, in some embodiments, the channel 320 is a line interconnect utilized to provide electrical communication between one or more circuit components 330 at the first portion of the planar surface of the deformable substrate 302 and one or more circuit components of the second layer 310-2 at the second portion of the planar surface of the deformable substrate 302.

In some embodiments, the circuit 305 further includes two or more circuit components (e.g., first circuit component 330-1 of FIG. 3B, second circuit component 330-2 of FIG. 3B, first circuit component 330-1 of FIG. 4A, second circuit component 330-2 of FIG. 4A, first circuit component 330-1 of method 400, second circuit component 330-2 of method 400, first circuit component 330-1 of method 500, first circuit component 330-1 of FIG. 6A, first circuit component 330-1 of FIG. 6B, first circuit component 330-1 of FIG. 6C, first circuit component 330-1 of FIG. 6D, first circuit component 330-1 of FIG. 6E, first circuit component 330-1 of FIG. 6F first circuit component 330-1 of method 600, first circuit component 330-1 of FIG. 7A, first circuit component 330-1 of FIG. 7B, first circuit component 330-1 of FIG. 7C, first circuit component 330-1 of FIG. 7D, first circuit component 330-1 of method 700, second circuit component 330-2 of method 700, etc.). For instance, in some embodiments, a circuit component 330 of the circuit 305 includes a terminal, an energy source (e.g., power supply), an interconnect (e.g., a line interconnect, such as a wire), a load (e.g., a device, a sensor, etc.), a controller (e.g., switch), or a combination thereof. As a non-limiting example, in some embodiments, the circuit component 330 includes a terminal, resistor, a transistor, a capacitor, an inductor, a transformer, a diode, a sensor (e.g., sensor 330-1, sensor 330-2, . . . , sensor 330-T of FIG. 28, etc.) or a combination thereof. In some embodiments, the first circuit component 330-1 is the same type of component as the second circuit component 330-1 (e.g., both the first circuit component 330-1 and the second circuit component 330-2 include a load, both the first circuit component 330-1 and the second circuit component 330-2 include a conductor, etc.). However, the present disclosure is not limited thereto.

In some embodiments, the first circuit component 330-1 and the second circuit component 330-2 form part of an active-matrix array. For instance, in some embodiments, the first circuit component 330-1 or the second circuit component 330-2 is a transistor, an electrode, or a capacitor disposed on the deformable substrate 302, and the other of the first circuit component 330-1 or the second circuit component 330-2 is different than the transistor, the electrode, or the capacitor of the first circuit component 330-1 or the second circuit component 330-2.

In some embodiments, the first circuit component 330-1 and the second circuit component 330-2 are part of a transistor switch. For instance, in some embodiments, the transistor switch is configured to control an electronical communication through the circuit 305 using a logic function, such as an OR logic function based on either a cutoff or saturation of the electronical communication. In some embodiments, two or more transistor switches are arranged (e.g., in series and/or parallel) in order to implement a logic function, such as one or more logic functions of FIG. 27.

In some embodiments, the circuit 305 includes between 2 and 10 million circuit components 330 (e.g., first circuit component 330-1, second circuit component 330-2, . . . , circuit component N 330-N), between 2 and 1 million circuit components 330, between 2 and 100,000 circuit components 330, between 2 and 10,000 circuit components 330, between 2 and 1,000 circuit components 330, between 2 and 100 circuit components 330, between 2 and 10 circuit components 330, between 5 and 10 million circuit components 330, between 5 and 1 million circuit components 330, between 5 and 100,000 circuit components 330, between 5 and 10,000 circuit components 330, between 5 and 1,000 circuit components 330, between 5 and 100 circuit components 330, between 5 and 10 circuit components 330, between 10 and 10 million circuit components 330 (e.g., first circuit component 330-1, second circuit component 330-10, . . . , circuit component N 330-N), between 10 and 1 million circuit components 330, between 10 and 100,000 circuit components 330, between 10 and 10,000 circuit components 330, between 10 and 1,000 circuit components 330, between 10 and 100 circuit components 330, between 500 and 10 million circuit components 330 (e.g., first circuit component 330-1, second circuit component 330-500, . . . , circuit component N 330-N), between 500 and 1 million circuit components 330, between 500 and 100,000 circuit components 330, between 500 and 10,000 circuit components 330, between 500 and 1,000 circuit components 330, between 5,000 and 10 million circuit components 330 (e.g., first circuit component 330-1, second circuit component 330-2, . . . , circuit component N 330-N, in which N is less than or equal to 10 million), between 5,000 and 1 million circuit components 330, between 5,000 and 100,000 circuit components 330, or between 5,000 and 10,000 circuit components 330.

In some embodiments, the circuit 305 includes at least 2 circuit components 330, at least 3 circuit components 330, at least 5 circuit components 330, at least 10 circuit components 330, at least 50 circuit components 330, at least 100 circuit components 330, at least 500 circuit components 330, at least 1,000 circuit components 330, at least 5,000 circuit components 330, at least 10,000 circuit components 330, at least 25,000 circuit components 330, at least 40,000 circuit components 330, at least 100,000 circuit components 330, at least 250,000 circuit components 330, at least 500,000 circuit components 330, at least 1 million circuit components 330, at least 5 million circuit components 330, or at least 10 million circuit components 330. In some embodiments, the circuit 305 includes at most 2 circuit components 330, at most 3 circuit components 330, at most 5 circuit components 330, at most 10 circuit components 330, at most 50 circuit components 330, at most 100 circuit components 330, at most 500 circuit components 330, at most 1,000 circuit components 330, at most 5,000 circuit components 330, at most 10,000 circuit components 330, at most 25,000 circuit components 330, at most 40,000 circuit components 330, at most 100,000 circuit components 330, at most 250,000 circuit components 330, at most 500,000 circuit components 330, at most 1 million circuit components 330, at most 5 million circuit components 330, or at most 10 million circuit components 330.

Accordingly, the circuit 305 of the present disclosure is capable of incorporating a variety of numbers of circuit components 330, which allows providing electronic devices 300 of high complexity, such as wearable garment electronic devices 300, with deformable substrates 302 that permit continuous electronic communication between two or more circuit components 330 of the circuit 305 when the electronic device 300 is physically deformed.

In some embodiments, each respective circuit component 330 is disposed adjacent to, on, (not shown in FIG. 3B) or within a corresponding portion of the deformable substrate 302. For instance, referring to FIG. 3B, in some embodiments, the circuit 305 includes a first circuit component 330-1 that is disposed within a first portion of the deformable substrate 302. Moreover, in some embodiments, the circuit 305 includes a second circuit component 330-2 that is adjacent to, on, or within the second portion of the deformable substrate 302. Accordingly, the first portion and the second portion of the deformable substrate 302 and/or one or more layers between the first portion and the second portion of the deformable substrate 302, or any combination thereof (e.g., both the first and second portion of the deformable substrate 302 as illustrated in FIG. 3A) include a gap, or span, that requires carrying electrical communication therethrough between the first circuit component 330-1 and the second circuit component 330-2.

Furthermore, as illustrated in FIG. 3C, the circuit 305 includes a first metal material (e.g., first metal material 340-1 of FIG. 3A, first metal material 340-1 of FIG. 4A, first metal material 340-1 of FIG. 6C, first metal material 340-1 of FIG. 6D, first metal material 340-1 of FIG. 7, etc.). As a non-limiting example, in some embodiments, the first metal material 340-1 includes copper (Cu), gold (Au), platinum (Pt), nickel (Ni), silver (Ag), any combination thereof, or any alloy thereof. Accordingly, in some embodiments, the first metal material 340-1 is utilized to wet a portion or surface of the circuit 305 in order to increase a wettability of the portion or surface of the circuit 305. Thus, the portion or surface of the circuit is selectively wetted by the first metal material 340-1 based on a position of the first metal material 340-1 disposed on the surface. In some embodiments, a material wets a surface (e.g., surface of deformable substrate 302) when the adhesion of molecules of the material at the surface of the metal material 340 is greater than the cohesion of the molecules at an interior of the material.

For instance, referring to FIG. 3C, in some embodiments, the electronic device 300 includes the first metal material 340-1 overlaying a first portion of the deformable substrate 302 (e.g., overlaying a first portion of the circuit 305). In some embodiments, the first portion of the deformable substrate 302 includes a first portion of the channel 320. In some embodiments, the first portion of the channel 320 includes an interior surface of the channel 320, an edge of the channel 320, a rim of the channel 320, a brim of the channel 320, or a combination thereof (e.g., as illustrated in FIG. 3A). Accordingly, by selectively wetting the interior surface of the channel 320, the edge of the channel 320, the rim of the channel 320, the brim of the channel 320, or the combination thereof with the first metal material 340-1, forcing a liquid metal material, such as a second liquid metal (e.g., second metal material 340-2 of FIG. 3C, second metal material 340-2 of FIG. 4A, second metal material 340-2 of method 400, second metal material 340-2 of FIG. 6C, second metal material 340-2 of FIG. 6D, second metal material 340-2 of FIG. 7, etc.), to wet throughout and/or to an opening of the interior volume of the channel 320, such as a first electronic component 330-1 underlying or accommodated by the channel 320.

Additionally, referring to FIG. 3D, (where FIGS. 3A, 3B, 3C, and 3D show the progression in forming circuit 305), the circuit 305 includes the second metal material 340-2. In some embodiments, the second metal material 340-2 is configured to interface with the first metal material 340-1. For instance, in some embodiments, the interface with the first metal material and the second metal material is an intermetallic interface, such as an intermetallic matrix including the first metal material 340-1 and the second metal material 340-2. In some embodiments, the second metal material 340-2 is miscible with the first metal material 340-1. In some embodiments, by interfacing with the first metal material 340-1, the second metal material 340-2 and/or a partial interface of the first metal material 340-1 and the second metal material 340-2 occupies, or substantially occupies, an interior volume of the channel 320. For instance, in some embodiments, without interfacing the first metal material 340-1 and the second metal material 340-2 in order to form the partial interface, the second metal material 340-2 would otherwise not be able to occupy, or substantially occupy, the interior volume of the channel 320.

In some embodiments, the at least two layers 310 of the circuit 305 further includes a third layer (e.g., third layer 310-3 of FIG. 3E, third layer 310-3 of FIG. 4A, etc.). In some embodiments, the third layer 310-3 is configured to overlay an opening of the channel 320, such as by covering a rim of the channel 320, an edge of the channel 320, or the like, in order to seal an end portion of the channel 320.

In some embodiments, the first circuit component 330-1 includes an exterior surface (e.g., exterior surface 332-1 of FIG. 3A, exterior surface 332-1 of FIG. 4A, exterior surface 332-1 of FIG. 6A, exterior surface 332-1 of FIG. 7A, etc.) that includes electroless nickel immersion gold (ENIG). In some embodiments, the exterior surface 332 includes a top surface, a front surface, a side surface, a rear surface, a face, an edge, or a combination thereof of the first circuit component. In some embodiments, the exterior surface 332 of the first circuit component 330-1 includes tin (Sn) (e.g., immersion tin (ISn). In some embodiments, the exterior surface 332 of the first circuit component 330-1 includes electroless nickel immersion silver (ENInAg).

In some embodiments, the first metal material 340-1 and/or the second metal material 340-2 is configured to form an interconnect, such a line interconnect or a via interconnect. In some embodiments, the thickness of the interconnect is between 1 μm and 500 μm, between 1 μm and 450 μm, between 1 μm and 400 μm, between 1 μm and 350 μm, between 1 μm and 300 μm, between 1 μm and 250 μm, between 1 μm and 200 μm, between 1 μm and 150 μm, between 1 μm and 100 μm, between 1 μm and 50 μm, between 1 μm and 10 μm, between 2 μm and 500 μm, between 2 μm and 450 μm, between 2 μm and 400 μm, between 2 μm and 350 μm, between 2 μm and 300 μm, between 2 μm and 250 μm, between 2 μm and 200 μm, between 2 μm and 150 μm, between 2 μm and 100 μm, between 2 μm and 50 μm, between 2 μm and 10 μm, between 3 μm and 500 μm, between 3 μm and 450 μm, between 3 μm and 400 μm, between 3 μm and 350 μm, between 3 μm and 300 μm, between 3 μm and 250 μm, between 3 μm and 200 μm, between 3 μm and 150 μm, between 3 μm and 100 μm, between 3 μm and 50 μm, between 3 μm and 10 μm, between 4 μm and 500 μm, between 4 μm and 450 μm, between 4 μm and 400 μm, between 4 μm and 350 μm, between 4 μm and 300 μm, between 4 μm and 250 μm, between 4 μm and 200 μm, between 4 μm and 150 μm, between 4 μm and 100 μm, between 4 μm and 50 μm, between 4 μm and 10 μm, between 5 μm and 500 μm, between 5 μm and 450 μm, between 5 μm and 400 μm, between 5 μm and 350 μm, between 5 μm and 300 μm, between 5 μm and 250 μm, between 5 μm and 200 μm, between 5 μm and 150 μm, between 5 μm and 100 μm, between 5 μm and 50 μm, between 5 μm and 10 μm, between 6 μm and 500 μm, between 6 μm and 450 μm, between 6 μm and 400 μm, between 6 μm and 350 μm, between 6 μm and 300 μm, between 6 μm and 250 μm, between 6 μm and 200 μm, between 6 μm and 150 μm, between 6 μm and 100 μm, between 6 μm and 50 μm, between 6 μm and 10 μm, between 10 μm and 500 μm, between 10 μm and 450 μm, between 10 μm and 400 μm, between 10 μm and 350 μm, between 10 μm and 300 μm, between 10 μm and 250 μm, between 10 μm and 200 μm, between 10 μm and 150 μm, between 10 μm and 100 μm, between 10 μm and 90 μm, between 10 μm and 50 μm, between 75 μm and 500 μm, between 75 μm and 450 μm, between 75 μm and 400 μm, between 75 μm and 350 μm, between 75 μm and 300 μm, between 75 μm and 250

μm, between 75 μm and 200 μm, between 75 μm and 150 μm, between 75 μm and 100 μm, between 150 μm and 500 μm, between 150 μm and 450 μm, between 150 μm and 400 μm, between 150 μm and 350 μm, between 150 μm and 300 μm, between 150 μm and 250 μm, between 150 μm and 200 μm, between 225 μm and 500 μm, between 225 μm and 450 μm, between 225 μm and 400 μm, between 225 μm and 350 μm, between 225 μm and 300 μm, between 225 μm and 250 μm, between 300 μm and 550 μm, between 300 μm and 500 μm, between 300 μm and 450 μm, between 300 μm and 400 μm, between 300 μm and 350 μm between 375 μm and 500 μm, between 375 μm and 450 μm, between 375 μm and 400 μm, or between 450 μm and 500 μm.

In some embodiments, the thickness of the interconnect changes as a function of length and/or depth of the interconnect. For instance, in some embodiments, the width of the interconnect is at least 1, 2, 3, 5, 10, 15, 20, or 25 percent larger at one point in the length of the interconnect as it is at a second point in the length of the interconnect. In some embodiments, the first point in the length of the interconnect is the first point at which the interconnect has the largest cross-section and the second point is the point at which the interconnect has the smallest cross-section. In some embodiments, the thickness of the interconnect does not appreciably or measurably change as a function of length and/or depth of the interconnect.

In some embodiments, the thickness of the interconnect is at least 1 μm, at least 2 μm, at least 3 μm, at least 4 μm, at least 5 μm, at least 6 μm, at least 10 μm, at least 15 μm, at least 20 μm, at least 25 μm, at least 30 μm, at least 35 μm, at least 40 μm, at least 45 μm, at least 50 μm, at least 55 μm, at least 60 μm, at least 65 μm, at least 70 μm, at least 75 μm, at least 80 μm, at least 85 μm, at least 90 μm, at least 95 μm, at least 100 μm, at least 105 μm, at least 110 μm, at least 115 μm, at least 120 μm, at least 125 μm, at least 130 μm, at least 135 μm, at least 140 μm, at least 145 μm, at least 150 μm, at least 155 μm, at least 160 μm, at least 165 μm, at least 170 μm, at least 175 μm, at least 180 μm, at least 185 μm, at least 190 μm, at least 195 μm, at least 200 μm, at least 205 μm, at least 210 μm, at least 215 μm, at least 220 μm, at least 225 μm, at least 230 μm, at least 235 μm, at least 240 μm, at least 245 μm, at least 250 μm, at least 255 μm, at least 260 μm, at least 265 μm, at least 270 μm, at least 275 μm, at least 280 μm, at least 285 μm, at least 290 μm, at least 295 μm, at least 300 μm, at least 305 μm, at least 310 μm, at least 315 μm, at least 320 μm, at least 325 μm, at least 330 μm, at least 335 μm, at least 340 μm, at least 345 μm, at least 350 μm, at least 355 μm, at least 360 μm, at least 365 μm, at least 370 μm, at least 375 μm, at least 380 μm, at least 385 μm, at least 390 μm, at least 395 μm, at least 400 μm, at least 405 μm, at least 410 μm, at least 415 μm, at least 420 μm, at least 425 μm, at least 430 μm, at least 435 μm, at least 440 μm, at least 445 μm, at least 450 μm, at least 455 μm, at least 460 μm, at least 465 μm, at least 470 μm, at least 475 μm, at least 480 μm, at least 485 μm, at least 490 μm, at least 495 μm, or at least 500 μm.

In some embodiments, the thickness of the interconnect is at most 1 μm, at most 2 μm, at most 3 μm, at most 4 μm, at most 5 μm, at most 6 μm, at most 10 μm, at most 15 μm, at most 20 μm, at most 25 μm, at most 30 μm, at most 35 μm, at most 40 μm, at most 45 μm, at most 50 μm, at most 55 μm, at most 60 μm, at most 65 μm, at most 70 μm, at most 75 μm, at most 80 μm, at most 85 μm, at most 90 μm, at most 95 μm, at most 100 μm, at most 105 μm, at most 110 μm, at most 115 μm, at most 120 μm, at most 125 μm, at most 130 μm, at most 135 μm, at most 140 μm, at most 145 μm, at most 150 μm, at most 155 μm, at most 160 μm, at most 165 μm, at most 170 μm, at most 175 μm, at most 180 μm, at most 185 μm, at most 190 μm, at most 195 μm, at most 200 μm, at most 205 μm, at most 210 μm, at most 215 μm, at most 220 μm, at most 225 μm, at most 230 μm, at most 235 μm, at most 240 μm, at most 245 μm, at most 250 μm, at most 255 μm, at most 260 μm, at most 265 μm, at most 270 μm, at most 275 μm, at most 280 μm, at most 285 μm, at most 290 μm, at most 295 μm, at most 300 μm, at most 305 μm, at most 310 μm, at most 315 μm, at most 320 μm, at most 325 μm, at most 330 μm, at most 335 μm, at most 340 μm, at most 345 μm, at most 350 μm, at most 355 μm, at most 360 μm, at most 365 μm, at most 370 μm, at most 375 μm, at most 380 μm, at most 385 μm, at most 390 μm, at most 395 μm, at most 400 μm, at most 405 μm, at most 410 μm, at most 415 μm, at most 420 μm, at most 425 μm, at most 430 μm, at most 435 μm, at most 440 μm, at most 445 μm, at most 450 μm, at most 455 μm, at most 460 μm, at most 465 μm, at most 470 μm, at most 475 μm, at most 480 μm, at most 485 μm, at most 490 μm, at most 495 μm, or at most 500 μm.

In some embodiments, the width of the interconnect is between 1 μm and 500 μm, between 1 μm and 450 μm, between 1 μm and 400 μm, between 1 μm and 350 μm, between 1 μm and 300 μm, between 1 μm and 250 μm, between 1 μm and 200 μm, between 1 μm and 150 μm, between 1 μm and 100 μm, between 1 μm and 50 μm, between 1 μm and 10 μm, between 2 μm and 500 μm, between 2 μm and 450 μm, between 2 μm and 400 μm, between 2 μm and 350 μm, between 2 μm and 300 μm, between 2 μm and 250 μm, between 2 μm and 200 μm, between 2 μm and 150 μm, between 2 μm and 100 μm, between 2 μm and 50 μm, between 2 μm and 10 μm, between 3 μm and 500 μm, between 3 μm and 450 μm, between 3 μm and 400 μm, between 3 μm and 350 μm, between 3 μm and 300 μm, between 3 μm and 250 μm, between 3 μm and 200 μm, between 3 μm and 150 μm, between 3 μm and 100 μm, between 3 μm and 50 μm, between 3 μm and 10 μm, between 4 μm and 500 μm, between 4 μm and 450 μm, between 4 μm and 400 μm, between 4 μm and 350 μm, between 4 μm and 300 μm, between 4 μm and 250 μm, between 4 μm and 200 μm, between 4 μm and 150 μm, between 4 μm and 100 μm, between 4 μm and 50 μm, between 4 μm and 10 μm, between 5 μm and 500 μm, between 5 μm and 450 μm, between 5 μm and 400 μm, between 5 μm and 350 μm, between 5 μm and 300 μm, between 5 μm and 250 μm, between 5 μm and 200 μm, between 5 μm and 150 μm, between 5 μm and 100 μm, between 5 μm and 50 μm, between 5 μm and 10 μm, between 6 μm and 500 μm, between 6 μm and 450 μm, between 6 μm and 400 μm, between 6 μm and 350 μm, between 6 μm and 300 μm, between 6 μm and 250 μm, between 6 μm and 200 μm, between 6 μm and 150 μm, between 6 μm and 100 μm, between 6 μm and 50 μm, between 6 μm and 10 μm, between 10 μm and 500 μm, between 10 μm and 450 μm, between 10 μm and 400 μm, between 10 μm and 350 μm, between 10 μm and 300 μm, between 10 μm and 250 μm, between 10 μm and 200 μm, between 10 μm and 150 μm, between 10 μm and 100 μm, between 10 μm and 90 μm, between 10 μm and 50 μm, between 75 μm and 500 μm, between 75 μm and 450 μm, between 75 μm and 400 μm, between 75 μm and 350 μm, between 75 μm and 300 μm, between 75 μm and 250 μm, between 75 μm and 200 μm, between 75 μm and 150 μm, between 75 μm and 100 μm, between 150 μm and 500 μm, between 150 μm and 450 μm, between 150 μm and 400 μm, between 150 μm and 350 μm, between 150 μm and 300 μm, between 150 μm and 250 μm, between 150 μm and 200 μm, between 225 μm and 500 μm, between 225 μm and 450 μm, between 225 μm and 400 μm, between 225 μm and 350

μm, between 225 μm and 300 μm, between 225 μm and 250 μm, between 300 μm and 550 μm, between 300 μm and 500 μm, between 300 μm and 450 μm, between 300 μm and 400 μm, between 300 μm and 350 μm between 375 μm and 500 μm, between 375 μm and 450 μm, between 375 μm and 400 μm, or between 450 μm and 500 μm.

In some embodiments, the width of the interconnect changes as a function of length and/or depth of the interconnect. For instance, in some embodiments, the width of the interconnect is at least 1, 2, 3, 5, 10, 15, 20, or 25 percent larger at one point in the length of the interconnect as it is at a second point in the length of the interconnect. In some embodiments, the first point in the length of the interconnect is the first point at which the interconnect has the largest cross-section and the second point is the point at which the interconnect has the smallest cross-section. In some embodiments, the in width of the interconnect does not appreciably or measurably change as a function of length and/or depth of the interconnect.

In some embodiments, the width of the interconnect is at least 1 μm, at least 2 μm, at least 3 μm, at least 4 μm, at least 5 μm, at least 6 μm, at least 10 μm, at least 15 μm, at least 20 μm, at least 25 μm, at least 30 μm, at least 35 μm, at least 40 μm, at least 45 μm, at least 50 μm, at least 55 μm, at least 60 μm, at least 65 μm, at least 70 μm, at least 75 μm, at least 80 μm, at least 85 μm, at least 90 μm, at least 95 μm, at least 100 μm, at least 105 μm, at least 110 μm, at least 115 μm, at least 120 μm, at least 125 μm, at least 130 μm, at least 135 μm, at least 140 μm, at least 145 μm, at least 150 μm, at least 155 μm, at least 160 μm, at least 165 μm, at least 170 μm, at least 175 μm, at least 180 μm, at least 185 μm, at least 190 μm, at least 195 μm, at least 200 μm, at least 205 μm, at least 210 μm, at least 215 μm, at least 220 μm, at least 225 μm, at least 230 μm, at least 235 μm, at least 240 μm, at least 245 μm, at least 250 μm, at least 255 μm, at least 260 μm, at least 265 μm, at least 270 μm, at least 275 μm, at least 280 μm, at least 285 μm, at least 290 μm, at least 295 μm, at least 300 μm, at least 305 μm, at least 310 μm, at least 315 μm, at least 320 μm, at least 325 μm, at least 330 μm, at least 335 μm, at least 340 μm, at least 345 μm, at least 350 μm, at least 355 μm, at least 360 μm, at least 365 μm, at least 370 μm, at least 375 μm, at least 380 μm, at least 385 μm, at least 390 μm, at least 395 μm, at least 400 μm, at least 405 μm, at least 410 μm, at least 415 μm, at least 420 μm, at least 425 μm, at least 430 μm, at least 435 μm, at least 440 μm, at least 445 μm, at least 450 μm, at least 455 μm, at least 460 μm, at least 465 μm, at least 470 μm, at least 475 μm, at least 480 μm, at least 485 μm, at least 490 μm, at least 495 μm, or at least 500 μm.

In some embodiments, the width of the interconnect is at most 1 μm, at most 2 μm, at most 3 μm, at most 4 μm, at most 5 μm, at most 6 μm, at most 10 μm, at most 15 μm, at most 20 μm, at most 25 μm, at most 30 μm, at most 35 μm, at most 40 μm, at most 45 μm, at most 50 μm, at most 55 μm, at most 60 μm, at most 65 μm, at most 70 μm, at most 75 μm, at most 80 μm, at most 85 μm, at most 90 μm, at most 95 μm, at most 100 μm, at most 105 μm, at most 110 μm, at most 115 μm, at most 120 μm, at most 125 μm, at most 130 μm, at most 135 μm, at most 140 μm, at most 145 μm, at most 150 μm, at most 155 μm, at most 160 μm, at most 165 μm, at most 170 μm, at most 175 μm, at most 180 μm, at most 185 μm, at most 190 μm, at most 195 μm, at most 200 μm, at most 205 μm, at most 210 μm, at most 215 μm, at most 220 μm, at most 225 μm, at most 230 μm, at most 235 μm, at most 240 μm, at most 245 μm, at most 250 μm, at most 255 μm, at most 260 μm, at most 265 μm, at most 270 μm, at most 275 μm, at most 280 μm, at most 285 μm, at most 290 μm, at most 295 μm, at most 300 μm, at most 305 μm, at most 310 μm, at most 315 μm, at most 320 μm, at most 325 μm, at most 330 μm, at most 335 μm, at most 340 μm, at most 345 μm, at most 350 μm, at most 355 μm, at most 360 μm, at most 365 μm, at most 370 μm, at most 375 μm, at most 380 μm, at most 385 μm, at most 390 μm, at most 395 μm, at most 400 μm, at most 405 μm, at most 410 μm, at most 415 μm, at most 420 μm, at most 425 μm, at most 430 μm, at most 435 μm, at most 440 μm, at most 445 μm, at most 450 μm, at most 455 μm, at most 460 μm, at most 465 μm, at most 470 μm, at most 475 μm, at most 480 μm, at most 485 μm, at most 490 μm, at most 495 μm, or at most 500 μm.

In some embodiments, the deformable substrate 302 is configured to maintain conductivity through the circuit 305, including through channel 320, with a resistance under at most 50 Ohms per cm ($\Omega$/cm), at most 100 Ohms per cm ($\Omega$/cm), or at most 150 Ohms per cm ($\Omega$/cm) when subjected to 100% strain. Accordingly, in some such embodiments, since the deformable substrate 302 is capable of maintaining conductivity through the circuit 305 when subjected to 100% strain, the deformable substrate 302 is capable of being utilized in a wearable electronic device 300 that physically deforms when worn by a subject.

For instance, in some embodiments, the circuit 305 is configured to maintain conductivity with a resistance of between 0.1 $\Omega$/cm and 100 $\Omega$/cm, between 0.1 $\Omega$/cm and 90 $\Omega$/cm, between 0.1 $\Omega$/cm and 700 $\Omega$/cm, between 0.1 $\Omega$/cm and 50 $\Omega$/cm, between 0.1 $\Omega$/cm and 40 $\Omega$/cm, between 0.1 $\Omega$/cm and 30 $\Omega$/cm, between 0.1 $\Omega$/cm and 25 $\Omega$/cm, between 0.1 $\Omega$/cm and 20 $\Omega$/cm, between 0.1 $\Omega$/cm and 10 $\Omega$/cm, between 0.1 $\Omega$/cm and 5 $\Omega$/cm, between 0.1 $\Omega$/cm and 3 $\Omega$/cm, between 0.5 $\Omega$/cm and 100 $\Omega$/cm, between 0.5 $\Omega$/cm and 90 $\Omega$/cm, between 0.5 $\Omega$/cm and 70 $\Omega$/cm, between 0.5 $\Omega$/cm and 50 $\Omega$/cm, between 0.5 $\Omega$/cm and 40 $\Omega$/cm, between 0.5 $\Omega$/cm and 30 $\Omega$/cm, between 0.5 $\Omega$/cm and 25 $\Omega$/cm, between 0.5 $\Omega$/cm and 20 $\Omega$/cm, between 0.5 $\Omega$/cm and 10 $\Omega$/cm, between 0.5 $\Omega$/cm and 5 $\Omega$/cm, between 0.5 $\Omega$/cm and 3 $\Omega$/cm, between 1 $\Omega$/cm and 100 $\Omega$/cm, between 1 $\Omega$/cm and 90 $\Omega$/cm, between 1 $\Omega$/cm and 70 $\Omega$/cm, between 1 $\Omega$/cm and 50 $\Omega$/cm, between 1 $\Omega$/cm and 40 $\Omega$/cm, between 1 $\Omega$/cm and 30 $\Omega$/cm, between 1 $\Omega$/cm and 25 $\Omega$/cm, between 1 $\Omega$/cm and 20 $\Omega$/cm, between 1 $\Omega$/cm and 10 $\Omega$/cm, between 1 $\Omega$/cm and 5 $\Omega$/cm, between 1 $\Omega$/cm and 3 $\Omega$/cm, between 2.5 $\Omega$/cm and 100 $\Omega$/cm, between 2.5 $\Omega$/cm and 90 $\Omega$/cm, between 2.5 $\Omega$/cm and 70 $\Omega$/cm, between 2.5 $\Omega$/cm and 50 $\Omega$/cm, between 2.5 $\Omega$/cm and 40 $\Omega$/cm, between 2.5 $\Omega$/cm and 30 $\Omega$/cm, between 2.5 $\Omega$/cm and 25 $\Omega$/cm, between 2.5 $\Omega$/cm and 20 $\Omega$/cm, between 2.5 $\Omega$/cm and 10 $\Omega$/cm, between 2.5 $\Omega$/cm and 5 $\Omega$/cm, between 2.5 $\Omega$/cm and 3 $\Omega$/cm, between 8 $\Omega$/cm and 100 $\Omega$/cm, between 8 $\Omega$/cm and 90 $\Omega$/cm, between 8 $\Omega$/cm and 70 $\Omega$/cm, between 8 $\Omega$/cm and 50 $\Omega$/cm, between 8 $\Omega$/cm and 40 $\Omega$/cm, between 8 $\Omega$/cm and 30 $\Omega$/cm, between 8 $\Omega$/cm and 25 $\Omega$/cm, between 8 $\Omega$/cm and 20 $\Omega$/cm, between 8 $\Omega$/cm and 10 $\Omega$/cm, between 13 $\Omega$/cm and 100 $\Omega$/cm, between 13 $\Omega$/cm and 90 $\Omega$/cm, between 13 $\Omega$/cm and 70 $\Omega$/cm, between 13 $\Omega$/cm and 50 $\Omega$/cm, between 13 $\Omega$/cm and 40 $\Omega$/cm, between 13 $\Omega$/cm and 30 $\Omega$/cm, between 13 $\Omega$/cm and 25 $\Omega$/cm, between 13 $\Omega$/cm and 20 $\Omega$/cm, between 25 $\Omega$/cm and 100 $\Omega$/cm, between 25 $\Omega$/cm and 90 $\Omega$/cm, between 25 $\Omega$/cm and 70 $\Omega$/cm, between 25 $\Omega$/cm and 50 $\Omega$/cm, between 25 $\Omega$/cm and 40 $\Omega$/cm, between 25 $\Omega$/cm and 30 $\Omega$/cm, between 45 $\Omega$/cm and 100 $\Omega$/cm, between 45 $\Omega$/cm and 90 $\Omega$/cm, between 45 $\Omega$/cm and 70 $\Omega$/cm, between 45 $\Omega$/cm and 50 $\Omega$/cm, between 60 $\Omega$/cm and 100 $\Omega$/cm, between 60 $\Omega$/cm and 90 $\Omega$/cm, between 60 Ω/cm and 70 Ω/cm, between 85 Ω/cm and 100 Ω/cm, or between 85 Ω/cm and 90 Ω/cm when subjected to 100% strain.

In some embodiments, the circuit 305 is configured to maintain conductivity, including through channel 320, with a resistance of at least 0.1 Ω/cm, at least 0.4 Ω/cm, at least 0.8 Ω/cm, at least 1 Ω/cm, at least 1.5 Ω/cm, at least 2 Ω/cm, at least 2.5 Ω/cm, at least 3 Ω/cm, at least 3.5 Ω/cm, at least 4 Ω/cm, at least 4.5 Ω/cm, at least 5 Ω/cm, at least 5.5 Ω/cm, at least 6 Ω/cm, at least 6.5 Ω/cm, at least 7 Ω/cm, at least 7.5 Ω/cm, at least 8 Ω/cm, at least 8.5 Ω/cm, at least 9 Ω/cm, at least 9.5 Ω/cm, at least 10 Ω/cm, at least 10.5 Ω/cm, at least 11 Ω/cm, at least 11.5 Ω/cm, at least 12 Ω/cm, at least 12.5 Ω/cm, at least 13 Ω/cm, at least 13.5 Ω/cm, at least 14 Ω/cm, at least 14.5 Ω/cm, at least 15 Ω/cm, at least 15.5 Ω/cm, at least 16 Ω/cm, at least 16.5 Ω/cm, at least 17 Ω/cm, at least 17.5 Ω/cm, at least 18 Ω/cm, at least 18.5 Ω/cm, at least 19 Ω/cm, at least 19.5 Ω/cm, at least 20 Ω/cm, at least 20.5 Ω/cm, at least 21 Ω/cm, at least 21.5 Ω/cm, at least 22 Ω/cm, at least 22.5 Ω/cm, at least 23 Ω/cm, at least 23.5 Ω/cm, at least 24 Ω/cm, at least 24.5 Ω/cm, at least 25 Ω/cm, at least 25.5 Ω/cm, at least 26 Ω/cm, at least 26.5 Ω/cm, at least 27 Ω/cm, at least 27.5 Ω/cm, at least 28 Ω/cm, at least 28.5 Ω/cm, at least 29 Ω/cm, at least 29.5 Ω/cm, at least 30 Ω/cm, at least 30.5 Ω/cm, at least 31 Ω/cm, at least 31.5 Ω/cm, at least 32 Ω/cm, at least 32.5 Ω/cm, at least 33 Ω/cm, at least 33.5 Ω/cm, at least 34 Ω/cm, at least 34.5 Ω/cm, at least 35 Ω/cm, at least 35.5 Ω/cm, at least 36 Ω/cm, at least 36.5 Ω/cm, at least 37 Ω/cm, at least 37.5 Ω/cm, at least 38 Ω/cm, at least 38.5 Ω/cm, at least 39 Ω/cm, at least 39.5 Ω/cm, at least 40 Ω/cm, at least 40.5 Ω/cm, at least 41 Ω/cm, at least 41.5 Ω/cm, at least 42 Ω/cm, at least 42.5 Ω/cm, at least 43 Ω/cm, at least 43.5 Ω/cm, at least 44 Ω/cm, at least 44.5 Ω/cm, at least 45 Ω/cm, at least 45.5 Ω/cm, at least 46 Ω/cm, at least 46.5 Ω/cm, at least 47 Ω/cm, at least 47.5 Ω/cm, at least 48 Ω/cm, at least 48.5 Ω/cm, at least 49 Ω/cm, at least 49.5 Ω/cm, at least 50 Ω/cm, at least 50.5 Ω/cm, at least 51 Ω/cm, at least 51.5 Ω/cm, at least 52 Ω/cm, at least 52.5 Ω/cm, at least 53 Ω/cm, at least 53.5 Ω/cm, at least 54 Ω/cm, at least 54.5 Ω/cm, at least 55 Ω/cm, at least 55.5 Ω/cm, at least 56 Ω/cm, at least 56.5 Ω/cm, at least 57 Ω/cm, at least 57.5 Ω/cm, at least 58 Ω/cm, at least 58.5 Ω/cm, at least 59 Ω/cm, at least 59.5 Ω/cm, at least 60 Ω/cm, at least 60.5 Ω/cm, at least 61 Ω/cm, at least 61.5 Ω/cm, at least 62 Ω/cm, at least 62.5 Ω/cm, at least 63 Ω/cm, at least 63.5 Ω/cm, at least 64 Ω/cm, at least 64.5 Ω/cm, at least 65 Ω/cm, at least 65.5 Ω/cm, at least 66 Ω/cm, at least 66.5 Ω/cm, at least 67 Ω/cm, at least 67.5 Ω/cm, at least 68 Ω/cm, at least 68.5 Ω/cm, at least 69 Ω/cm, at least 69.5 Ω/cm, at least 70 Ω/cm, at least 70.5 Ω/cm, at least 71 Ω/cm, at least 71.5 Ω/cm, at least 72 Ω/cm, at least 72.5 Ω/cm, at least 73 Ω/cm, at least 73.5 Ω/cm, at least 74 Ω/cm, at least 74.5 Ω/cm, at least 75 Ω/cm, at least 75.5 Ω/cm, at least 76 Ω/cm, at least 76.5 Ω/cm, at least 77 Ω/cm, at least 77.5 Ω/cm, at least 78 Ω/cm, at least 78.5 Ω/cm, at least 79 Ω/cm, at least 79.5 Ω/cm, at least 80 Ω/cm, at least 80.5 Ω/cm, at least 81 Ω/cm, at least 81.5 Ω/cm, at least 82 Ω/cm, at least 82.5 Ω/cm, at least 83 Ω/cm, at least 83.5 Ω/cm, at least 84 Ω/cm, at least 84.5 Ω/cm, at least 85 Ω/cm, at least 85.5 Ω/cm, at least 86 Ω/cm, at least 86.5 Ω/cm, at least 87 Ω/cm, at least 87.5 Ω/cm, at least 88 Ω/cm, at least 88.5 Ω/cm, at least 89 Ω/cm, at least 89.5 Ω/cm, at least 90 Ω/cm, at least 90.5 Ω/cm, at least 91 Ω/cm, at least 91.5 Ω/cm, at least 92 Ω/cm, at least 92.5 Ω/cm, at least 93 Ω/cm, at least 93.5 Ω/cm, at least 94 Ω/cm, at least 94.5 Ω/cm, at least 95 Ω/cm, at least 95.5 Ω/cm, at least 96 Ω/cm, at least 96.5 Ω/cm, at least 97 Ω/cm, at least 97.5 Ω/cm, at least 98 Ω/cm, at least 98.5 Ω/cm, at least 99 Ω/cm, at least 99.5 Ω/cm, or at least 100 Ω/cm when subjected to 100% strain.

In some embodiments, the circuit 305 is configured to maintain conductivity with a resistance, including through channel 320, of at most 0.1 Ω/cm, at most 0.4 Ω/cm, at most 0.8 Ω/cm, at most 1 Ω/cm, at most 1.5 Ω/cm, at most 2 Ω/cm, at most 2.5 Ω/cm, at most 3 Ω/cm, at most 3.5 Ω/cm, at most 4 Ω/cm, at most 4.5 Ω/cm, at most 5 Ω/cm, at most 5.5 Ω/cm, at most 6 Ω/cm, at most 6.5 Ω/cm, at most 7 Ω/cm, at most 7.5 Ω/cm, at most 8 Ω/cm, at most 8.5 Ω/cm, at most 9 Ω/cm, at most 9.5 Ω/cm, at most 10 Ω/cm, at most 10.5 Ω/cm, at most 11 Ω/cm, at most 11.5 Ω/cm, at most 12 Ω/cm, at most 12.5 Ω/cm, at most 13 Ω/cm, at most 13.5 Ω/cm, at most 14 Ω/cm, at most 14.5 Ω/cm, at most 15 Ω/cm, at most 15.5 Ω/cm, at most 16 Ω/cm, at most 16.5 Ω/cm, at most 17 Ω/cm, at most 17.5 Ω/cm, at most 18 Ω/cm, at most 18.5 Ω/cm, at most 19 Ω/cm, at most 19.5 Ω/cm, at most 20 Ω/cm, at most 20.5 Ω/cm, at most 21 Ω/cm, at most 21.5 Ω/cm, at most 22 Ω/cm, at most 22.5 Ω/cm, at most 23 Ω/cm, at most 23.5 Ω/cm, at most 24 Ω/cm, at most 24.5 Ω/cm, at most 25 Ω/cm, at most 25.5 Ω/cm, at most 26 Ω/cm, at most 26.5 Ω/cm, at most 27 Ω/cm, at most 27.5 Ω/cm, at most 28 Ω/cm, at most 28.5 Ω/cm, at most 29 Ω/cm, at most 29.5 Ω/cm, at most 30 Ω/cm, at most 30.5 Ω/cm, at most 31 Ω/cm, at most 31.5 Ω/cm, at most 32 Ω/cm, at most 32.5 Ω/cm, at most 33 Ω/cm, at most 33.5 Ω/cm, at most 34 Ω/cm, at most 34.5 Ω/cm, at most 35 Ω/cm, at most 35.5 Ω/cm, at most 36 Ω/cm, at most 36.5 Ω/cm, at most 37 Ω/cm, at most 37.5 Ω/cm, at most 38 Ω/cm, at most 38.5 Ω/cm, at most 39 Ω/cm, at most 39.5 Ω/cm, at most 40 Ω/cm, at most 40.5 Ω/cm, at most 41 Ω/cm, at most 41.5 Ω/cm, at most 42 Ω/cm, at most 42.5 Ω/cm, at most 43 Ω/cm, at most 43.5 Ω/cm, at most 44 Ω/cm, at most 44.5 Ω/cm, at most 45 Ω/cm, at most 45.5 Ω/cm, at most 46 Ω/cm, at most 46.5 Ω/cm, at most 47 Ω/cm, at most 47.5 Ω/cm, at most 48 Ω/cm, at most 48.5 Ω/cm, at most 49 Ω/cm, at most 49.5 Ω/cm, at most 50 Ω/cm, at most 50.5 Ω/cm, at most 51 Ω/cm, at most 51.5 Ω/cm, at most 52 Ω/cm, at most 52.5 Ω/cm, at most 53 Ω/cm, at most 53.5 Ω/cm, at most 54 Ω/cm, at most 54.5 Ω/cm, at most 55 Ω/cm, at most 55.5 Ω/cm, at most 56 Ω/cm, at most 56.5 Ω/cm, at most 57 Ω/cm, at most 57.5 Ω/cm, at most 58 Ω/cm, at most 58.5 Ω/cm, at most 59 Ω/cm, at most 59.5 Ω/cm, at most 60 Ω/cm, at most 60.5 Ω/cm, at most 61 Ω/cm, at most 61.5 Ω/cm, at most 62 Ω/cm, at most 62.5 Ω/cm, at most 63 Ω/cm, at most 63.5 Ω/cm, at most 64 Ω/cm, at most 64.5 Ω/cm, at most 65 Ω/cm, at most 65.5 Ω/cm, at most 66 Ω/cm, at most 66.5 Ω/cm, at most 67 Ω/cm, at most 67.5 Ω/cm, at most 68 Ω/cm, at most 68.5 Ω/cm, at most 69 Ω/cm, at most 69.5 Ω/cm, at most 70 Ω/cm, at most 70.5 Ω/cm, at most 71 Ω/cm, at most 71.5 Ω/cm, at most 72 Ω/cm, at most 72.5 Ω/cm, at most 73 Ω/cm, at most 73.5 Ω/cm, at most 74 Ω/cm, at most 74.5 Ω/cm, at most 75 Ω/cm, at most 75.5 Ω/cm, at most 76 Ω/cm, at most 76.5 Ω/cm, at most 77 Ω/cm, at most 77.5 Ω/cm, at most 78 Ω/cm, at most 78.5 Ω/cm, at most 79 Ω/cm, at most 79.5 Ω/cm, at most 80 Ω/cm, at most 80.5 Ω/cm, at most 81 Ω/cm, at most 81.5 Ω/cm, at most 82 Ω/cm, at most 82.5 Ω/cm, at most 83 Ω/cm, at most 83.5 Ω/cm, at most 84 Ω/cm, at most 84.5 Ω/cm, at most 85 Ω/cm, at most 85.5 Ω/cm, at most 86 Ω/cm, at most 86.5 Ω/cm, at most 87 Ω/cm, at most 87.5 Ω/cm, at most 88 Ω/cm, at most 88.5 Ω/cm, at most 89 Ω/cm, at most 89.5 Ω/cm, at most 90 Ω/cm, at most 90.5 Ω/cm, at most 91 Ω/cm, at most 91.5 Ω/cm, at most 92 Ω/cm, at most 92.5 Ω/cm, at most 93

Ω/cm, at most 93.5 Ω/cm, at most 94 Ω/cm, at most 94.5 Ω/cm, at most 95 Ω/cm, at most 95.5 Ω/cm, at most 96 Ω/cm, at most 96.5 Ω/cm, at most 97 Ω/cm, at most 97.5 Ω/cm, at most 98 Ω/cm, at most 98.5 Ω/cm, at most 99 Ω/cm, at most 99.5 Ω/cm, or at most 100 Ω/cm when subjected to 100% strain.

In some embodiments, the circuit 305 including the composition 340 is free of degradation in conductivity when the deformable substrate 302 is bent, such as bent around a cylinder. In some embodiments, the circuit including the composition 340 is free of degradation in conductivity when the deformable substrate 302 is that has a radius of between 2 and 25 centimeters (cm), between 2 cm and 10 cm, between 2 cm and 8 cm, between 2 cm and 6 cm, between 2 cm and 4 cm, 4 cm and 10 cm, between 4 cm and 8 cm, between 4 cm and 6 cm, between 6 cm and 10 cm, between 6 cm and 8 cm, between 8 cm and 10 cm, between 10 cm and 25 cm, between 10 cm and 20 cm, between 15 cm and 25 cm, or between 15 cm and 20 cm for a period of time and then released. In some embodiments, the radius of the cylinder is at least 2 cm, at least 3 cm, at least 4 cm, at least 5 cm, at least 6 cm, at least 7 cm, at least 8 cm, at least 9 cm, at least 10 cm, at least 11 cm, at least 12 cm, at least 13 cm, at least 14 cm, at least 15 cm, at least 16 cm, at least 17 cm, at least 18 cm, at least 19 cm, at least 20 cm, at least 21 cm, at least 22 cm, at least 23 cm, at least 24 cm, or at least 25 cm. In some embodiments, the radius of the cylinder is at most 2 cm, at most 3 cm, at most 4 cm, at most 5 cm, at most 6 cm, at most 7 cm, at most 8 cm, at most 9 cm, at most 10 cm, at most 11 cm, at most 12 cm, at most 13 cm, at most 14 cm, at most 15 cm, at most 16 cm, at most 17 cm, at most 18 cm, at most 19 cm, at most 20 cm, at most 21 cm, at most 22 cm, at most 23 cm, at most 24 cm, or at most 25 cm. In some embodiments, the cylinder is similar or substantially similar to a size of a human wrist, such as a first diameter associated with an adult male wrist size or a second diameter associated with an adult woman wrist size. For instance, in some embodiments, the cylinder has a diameter of about 17.42 plus or minus (±) 0.83 cm, or 15.12 cm±0.69 cm, in which the diameter of the cylinder is determined at a point perpendicular to the longitudinal axis of the cylinder.

In some embodiments, the period of time is between 10 seconds and 5 minutes, between 10 seconds and 4 minutes, between 10 seconds and 3 minutes, between 10 seconds and 2 minutes, between 10 seconds and 1 minute, between 10 seconds and 30 seconds, between 30 seconds and 5 minutes, between 10 seconds and 4 minutes, between 10 seconds and 3 minutes, between 10 seconds and 2 minutes, between 10 seconds and 1 minute, between 1 minute and 5 minutes, between 1 minute and 4 minutes, between 1 minute and 3 minutes, between 1 minute and 2 minutes, or between 3 minutes and 5 minutes. In some embodiments, the period of time is at least 10 seconds, at least 20 seconds, at least 30 seconds, at least 60 seconds, at least 1.5 minutes, at least 2 minutes, at least 2.5 minutes, at least 3 minutes, at least 3.5 minutes, at least 4 minutes, at least 4.5 minutes, or at least 5 minutes. In some embodiments, the period of time is at most 10 seconds, at most 20 seconds, at most 30 seconds, at most 60 seconds, at most 1.5 minutes, at most 2 minutes, at most 2.5 minutes, at most 3 minutes, at most 3.5 minutes, at most 4 minutes, at most 4.5 minutes, or at most 5 minutes. However, the present disclosure is not limited thereto. In some embodiments, the period of time is between 5 minutes and 2 hours, between 30 minutes and 2 hours, or between 45 minutes and 90 minutes. Accordingly, the circuit 305 of the present disclosure is capable of providing electronic communication free of degradation in conductivity when subjected to prolonged elongation for an extended period of time, which allows for the circuit 305 to be incorporated into every-day use electronic devices 300.

In some embodiments, the circuit 305 including the composition 340 is free of degradation in conductivity when a first conductivity of the circuit 305 including the composition 340 before bending and a second conductivity of the circuit including the composition 340 after or during bending is substantially the same. For instance, in some embodiments, the circuit including the composition 340 is free of degradation when the second conductivity satisfies a threshold ratio in comparison against the first conductivity of the circuit including the composition 340. In some embodiments, the threshold ratio is between 0.99 and 1.01, between 0.995 and 1.005, or between 0.999 and 1.001. In some embodiments, the threshold ratio is at least 0.95, at least 0.96, at least 0.97, at least 0.98, at least 0.99, at least 0.999, at least 0.9999, at least 1, at least 1.0001, at least 1.001, at least 1.01, at least 1.02, at least 1.03, at least 1.04, at least 1.05, or at least 1.1. In some embodiments, the threshold ratio is at most 0.95, at most 0.96, at most 0.97, at most 0.98, at most 0.99, at most 0.999, at most 0.9999, at most 1, at most 1.0001, at most 1.001, at most 1.01, at most 1.02, at most 1.03, at most 1.04, at most 1.05, or at most 1.1.

In some embodiments, the strain (ε) is defined as a function of a change in a gauge length (δ) against an original gauge length (L), such as: $\varepsilon = \delta/L$. For instance, in some embodiments, a strain of X % means a change in length of the deformable substrate 302 as a function of an original length of the deformable substrate 302, where X is a number between 0 and 100. In some embodiments, the strain of X % means a change in width of the deformable substrate 302 as a function of an original width of the deformable substrate 302. In some embodiments, the strain of X % means a change in depth of the deformable substrate 302 as a function of an original depth of the deformable substrate 302. As a non-limiting example, if an original length of the deformable substrate is 10 cm and is subjected to 100% strain to stretch to a new length of 20 cm. However, the present disclosure is not limited thereto.

Furthermore, in some embodiments, the deformable substrate 302 is configured to maintain conductivity through the circuit 305, including through channel 320, when at a temperature between 10° C. and 40° C., between 10° C. and 36° C., between 10° C. and 32° C., between 10° C. and 28° C., between 10° C. and 24° C., between 10° C. and 20° C., between 10° C. and 16° C., between 10° C. and 12° C., between 14° C. and 40° C., between 14° C. and 36° C., between 14° C. and 32° C., between 14° C. and 28° C., between 14° C. and 24° C., between 14° C. and 20° C., between 14° C. and 16° C., between 18° C. and 40° C., between 18° C. and 36° C., between 18° C. and 32° C., between 18° C. and 28° C., between 18° C. and 24° C., between 18° C. and 20° C., between 22° C. and 40° C., between 22° C. and 36° C., between 22° C. and 32° C., between 22° C. and 28° C., between 22° C. and 24° C., between 26° C. and 40° C., between 26° C. and 36° C., between 26° C. and 32° C., between 26° C. and 28° C., between 30° C. and 40° C., between 30° C. and 36° C., between 30° C. and 32° C., between 30° C. and 28° C., between 30° C. and 24° C., between 30° C. and 20° C., between 30° C. and 16° C., between 30° C. and 12° C., between 34° C. and 40° C., between 34° C. and 36° C., or between 38° C. and 40° C.

In some embodiments, the deformable substrate 302 is configured to maintain conductivity through the circuit 305, including through channel 320, when at a temperature of at least 10° C., at least 11° C., at least 12° C., at least 13° C., at least 14° C., at least 15° C., at least 16° C., at least 17° C., at least 18° C., at least 19° C., at least 20° C., at least 21° C., at least 22° C., at least 23° C., at least 24° C., at least 25° C., at least 26° C., at least 27° C., at least 28° C., at least 29° C., at least 30° C., at least 31° C., at least 32° C., at least 33° C., at least 34° C., at least 35° C., at least 36° C., at least 37° C., at least 38° C., at least 39° C., or at least 40° C. In some embodiments, the deformable substrate 302 is configured to maintain conductivity through the circuit 305 when at a temperature of at most 10° C., at most 11° C., at most 12° C., at most 13° C., at most 14° C., at most 15° C., at most 16° C., at most 17° C., at most 18° C., at most 19° C., at most 20° C., at most 21° C., at most 22° C., at most 23° C., at most 24° C., at most 25° C., at most 26° C., at most 27° C., at most 28° C., at most 29° C., at most 30° C., at most 31° C., at most 32° C., at most 33° C., at most 34° C., at most 35° C., at most 36° C., at most 37° C., at most 38° C., at most 39° C., or at most 40° C.

In some embodiments, the deformable substrate 302 is configured to maintain conductivity through the circuit 305, including through channel 320, when subjected to at least 15,000 strain cycles.

For instance, in some embodiments, the deformable substrate 302 is configured to maintain conductivity through the circuit 305, including through channel 320, when subjected to between 2 strain cycles and 30,000 strain cycles, between 2 strain cycles and 20,000 strain cycles, between 2 strain cycles and 15,000 strain cycles, between 2 strain cycles and 10,000 strain cycles, between 2 strain cycles and 6,000 strain cycles, between 2 strain cycles and 4,000 strain cycles, between 2 strain cycles and 1,000 strain cycles, between 2 strain cycles and 700 strain cycles, between 2 strain cycles and 500 strain cycles, between 2 strain cycles and 100 strain cycles, between 50 strain cycles and 30,000 strain cycles, between 50 strain cycles and 20,000 strain cycles, between 50 strain cycles and 15,000 strain cycles, between 50 strain cycles and 10,000 strain cycles, between 50 strain cycles and 6,000 strain cycles, between 50 strain cycles and 4,000 strain cycles, between 50 strain cycles and 1,000 strain cycles, between 50 strain cycles and 700 strain cycles, between 50 strain cycles and 500 strain cycles, between 50 strain cycles and 100 strain cycles, between 850 strain cycles and 30,000 strain cycles, between 850 strain cycles and 20,000 strain cycles, between 850 strain cycles and 15,000 strain cycles, between 850 strain cycles and 10,000 strain cycles, between 850 strain cycles and 6,000 strain cycles, between 850 strain cycles and 4,000 strain cycles, between 850 strain cycles and 1,000 strain cycles, between 2,000 strain cycles and 30,000 strain cycles, between 2,000 strain cycles and 20,000 strain cycles, between 2,000 strain cycles and 15,000 strain cycles, between 2,000 strain cycles and 10,000 strain cycles, between 2,000 strain cycles and 6,000 strain cycles, between 2,000 strain cycles and 4,000 strain cycles, between 7,000 strain cycles and 30,000 strain cycles, between 7,000 strain cycles and 20,000 strain cycles, between 7,000 strain cycles and 15,000 strain cycles, between 7,000 strain cycles and 10,000 strain cycles, between 12,000 strain cycles and 30,000 strain cycles, between 12,000 strain cycles and 20,000 strain cycles, between 12,000 strain cycles and 15,000 strain cycles, between 17,000 strain cycles and 30,000 strain cycles, or between 17,000 strain cycles and 20,000 strain cycles.

In some embodiments, the deformable substrate 302 is configured to maintain conductivity through the circuit 305, including through channel 320, when subjected to at least 10 cycles, at least 50 cycles, at least 100 cycles, at least 200 cycles, at least 500 cycles, at least 1,000 cycles, at least 2,000 cycles, at least 3,000 cycles, at least 4,000 cycles, at least 5,000 cycles, at least 6,000 cycles, at least 7,000 cycles, at least 8,000 cycles, at least 9,000 cycles, at least 10,000 cycles, at least 11,000 cycles, at least 12,000 cycles, at least 13,000 cycles, at least 14,000 cycles, at least 15,000 cycles, at least 16,000 cycles, at least 17,000 cycles, at least 18,000 cycles, at least 19,000 cycles, at least 20,000 cycles, at least 21,000 cycles, at least 22,000 cycles, at least 23,000 cycles, at least 24,000 cycles, at least 25,000 cycles, at least 26,000 cycles, at least 27,000 cycles, at least 28,000 cycles, at least 29,000 cycles, or at least 30,000 cycles. In some embodiments, the deformable substrate 302 is configured to maintain conductivity through the circuit 305 when subjected to at most 10 cycles, at most 50 cycles, at most 100 cycles, at most 200 cycles, at most 500 cycles, at most 1,000 cycles, at most 2,000 cycles, at most 3,000 cycles, at most 4,000 cycles, at most 5,000 cycles, at most 6,000 cycles, at most 7,000 cycles, at most 8,000 cycles, at most 9,000 cycles, at most 10,000 cycles, at most 11,000 cycles, at most 12,000 cycles, at most 13,000 cycles, at most 14,000 cycles, at most 15,000 cycles, at most 16,000 cycles, at most 17,000 cycles, at most 18,000 cycles, at most 19,000 cycles, at most 20,000 cycles, at most 21,000 cycles, at most 22,000 cycles, at most 23,000 cycles, at most 24,000 cycles, at most 25,000 cycles, at most 26,000 cycles, at most 27,000 cycles, at most 28,000 cycles, at most 29,000 cycles, or at most 30,000 cycles.

In some embodiments, a cycle is completed when the deformable substrate 302 satisfies a threshold strain. In some embodiments, the threshold strain is between 25% and 200%, between 25% and 195%, between 25% and 190%, between 25% and 185%, between 25% and 180%, between 25% and 175%, between 25% and 170%, between 25% and 165%, between 25% and 160%, between 25% and 155%, between 25% and 150%, between 25% and 145%, between 25% and 140%, between 25% and 135%, between 25% and 130%, between 25% and 125%, between 25% and 120%, between 25% and 115%, between 25% and 110%, between 25% and 105%, between 25% and 100%, between 25% and 95%, between 25% and 90%, between 25% and 85%, between 25% and 80%, between 25% and 75%, between 25% and 70%, between 25% and 65%, between 25% and 60%, between 25% and 55%, between 25% and 50%, between 25% and 100%, between 25% and 95%, between 25% and 90%, between 25% and 85%, between 25% and 80%, between 25% and 75%, between 25% and 70%, between 25% and 65%, between 25% and 60%, between 25% and 55%, between 25% and 50%, between 35% and 200%, between 35% and 195%, between 35% and 190%, between 35% and 185%, between 35% and 180%, between 35% and 175%, between 35% and 170%, between 35% and 165%, between 35% and 160%, between 35% and 155%, between 35% and 150%, between 35% and 145%, between 35% and 140%, between 35% and 135%, between 35% and 130%, between 35% and 125%, between 35% and 120%, between 35% and 115%, between 35% and 110%, between 35% and 105%, between 35% and 100%, between 35% and 95%, between 35% and 90%, between 35% and 85%, between 35% and 80%, between 35% and 75%, between 35% and 70%, between 35% and 65%, between 35% and 60%, between 35% and 55%, between 35% and 50%, between 45% and 200%, between 45% and 195%, between 45% and 190%, between 45% and 185%, between 45% and 180%, between 45% and 175%, between 45% and 170%, between 45% and 165%, between 45% and 160%, between 45% and 155%, between 45% and 150%, between 45% and 145%, between 45% and 140%, between 45% and 135%, between 45% and 130%, between 45% and 125%, between 45% and 120%, between 45% and 115%, between 45% and 110%, between 45% and 105%, between 45% and 100%, between 45% and 95%, between 45% and 90%, between 45% and 85%, between 45% and 80%, between 45% and 75%, between 45% and 70%, between 45% and 65%, between 45% and 60%, between 45% and 55%, between 45% and 50%, between 55% and 200%, between 55% and 195%, between 55% and 190%, between 55% and 185%, between 55% and 180%, between 55% and 175%, between 55% and 170%, between 55% and 165%, between 55% and 160%, between 55% and 155%, between 55% and 150%, between 55% and 145%, between 55% and 140%, between 55% and 135%, between 55% and 130%, between 55% and 125%, between 55% and 120%, between 55% and 115%, between 55% and 110%, between 55% and 105%, between 55% and 100%, between 55% and 95%, between 55% and 90%, between 55% and 85%, between 55% and 80%, between 55% and 75%, between 55% and 70%, between 55% and 65%, between 55% and 60%, between 65% and 200%, between 65% and 195%, between 65% and 190%, between 65% and 185%, between 65% and 180%, between 65% and 175%, between 65% and 170%, between 65% and 165%, between 65% and 160%, between 65% and 155%, between 65% and 150%, between 65% and 145%, between 65% and 140%, between 65% and 135%, between 65% and 130%, between 65% and 125%, between 65% and 120%, between 65% and 115%, between 65% and 110%, between 65% and 105%, between 65% and 100%, between 65% and 95%, between 65% and 90%, between 65% and 85%, between 65% and 80%, between 65% and 75%, between 65% and 70%, between 75% and 200%, between 75% and 195%, between 75% and 190%, between 75% and 185%, between 75% and 180%, between 75% and 175%, between 75% and 170%, between 75% and 165%, between 75% and 160%, between 75% and 155%, between 75% and 150%, between 75% and 145%, between 75% and 140%, between 75% and 135%, between 75% and 130%, between 75% and 125%, between 75% and 120%, between 75% and 115%, between 75% and 110%, between 75% and 105%, between 75% and 100%, between 75% and 95%, between 75% and 90%, between 75% and 85%, between 75% and 80%, between 85% and 200%, between 85% and 195%, between 85% and 190%, between 85% and 185%, between 85% and 180%, between 85% and 175%, between 85% and 170%, between 85% and 165%, between 85% and 160%, between 85% and 155%, between 85% and 150%, between 85% and 145%, between 85% and 140%, between 85% and 135%, between 85% and 130%, between 85% and 125%, between 85% and 120%, between 85% and 115%, between 85% and 110%, between 85% and 105%, between 85% and 100%, between 85% and 95%, between 85% and 90%, between 95% and 200%, between 95% and 195%, between 95% and 190%, between 95% and 185%, between 95% and 180%, between 95% and 175%, between 95% and 170%, between 95% and 165%, between 95% and 160%, between 95% and 155%, between 95% and 150%, between 95% and 145%, between 95% and 140%, between 95% and 135%, between 95% and 130%, between 95% and 125%, between 95% and 120%, between 95% and 115%, between 95% and 110%, between 95% and 105%, between 95% and 100%, between 140% and 200%, between 140% and 195%, between 140% and 190%, between 140% and 185%, between 140% and 180%, between 140% and 175%, between 140% and 170%, between 140% and 165%, between 140% and 160%, between 140% and 155%, between 140% and 150%, between 140% and 145%, between 180% and 200%, between 180% and 195%, between 180% and 190%, or between 180% and 185%.

In some embodiments, the threshold strain is at least 25%, at least 30%, at least 35%, at least 40%, at least 45%, at least 50%, at least 55%, at least 60%, at least 65%, at least 70%, at least 75%, at least 80%, at least 85%, at least 90%, at least 95%, at least 99%, or at least 100%, at least 125%, at least 130%, at least 135%, at least 140%, at least 145%, at least 150%, at least 155%, at least 160%, at least 165%, at least 170%, at least 175%, at least 180%, at least 185%, at least 190%, at least 195%, at least 199%, or at least 200%. In some embodiments, the threshold strain is at most 25%, at most 30%, at most 35%, at most 40%, at most 45%, at most 50%, at most 55%, at most 60%, at most 65%, at most 70%, at most 75%, at most 80%, at most 85%, at most 90%, at most 95%, at most 99%, at most 100%, at most 125%, at most 130%, at most 135%, at most 140%, at most 145%, at most 150%, at most 155%, at most 160%, at most 165%, at most 170%, at most 175%, at most 180%, at most 185%, at most 190%, at most 195%, at most 199%, or at most 200%.

Now that a general topology of the distributed additive manufacture system 100 has been described in accordance with various embodiments of the present disclosures, details regarding some processes in accordance with FIGS. 5A, 5B, and 5C will be described. Specifically, FIGS. 5A, 5B, and 5C illustrates a flow chart of methods (e.g., method 400) for forming a deformable electrical communication, in accordance with embodiments of the present disclosure.

Various modules in the memory 292 of the computer system 200 perform certain processes of the methods 400 described in FIGS. 5A, 5B, and 5C, unless expressly stated otherwise. Furthermore, it will be appreciated that the processes in FIGS. 5A, 5B, and 5C can be encoded in a single module or any combination of modules.

Block 402. Referring to block 402 of FIG. 5A, a method 400 for forming a deformable electrical communication is provided.

In some embodiments, the method 400 is performed at a computer system (e.g., computer system 200 of FIG. 2, additive manufacture apparatus 250 of FIG. 1). The computer system 200 includes one or more processors (e.g., CPU 274 of FIG. 2), and a first memory (e.g., memory 292 of FIG. 2) that is coupled to the one or more processors 274. The first memory 292 stores one or more programs (e.g., material library 206, object library 210, control module 214, or a combination thereof of FIG. 2) that is executed by the one or more processors 274. The one or more programs includes one or more instructions (e.g., block 404 of FIG. 5A, block 420 of FIG. 5B, block 432 of FIG. 5C, etc.) for performing the method 400.

As such, portions of the method 400 require a computer (e.g., computer system 200 of FIG. 2, additive manufacture apparatus 250 of FIG. 1) to be used because the considerations used by the systems, methods, and apparatuses of the present disclosure, on the scale performed by the systems, methods, and apparatuses of the present disclosure, cannot be mentally performed. In other words, the systems, methods, and apparatuses of the present disclosure have outputs that need to be determined using the computer rather than mentally in such embodiments.

More particularly, in some embodiments, the deformable electrical communication provided by the method 400 is formed between a first circuit component and a second circuit component of the present disclosure.

Block 404. Referring to block 404, the method 400 includes forming a layer of a first metal material (e.g., first metal material 340-1 of FIG. 3C, first metal material 340-1 of FIG. 4A, first metal material 340-1 of FIG. 6A, first metal material 340-1 of FIG. 7A, etc.). In some embodiments, the layer of the first metal material 340-1 is formed on a first surface and/or a first portion of a channel (e.g., channel 320 of FIG. 3A, channel 320 of FIG. 4A, channel 320 of FIG. 6B, etc.) of the circuit 305 of the deformable substrate 302. For instance, in some embodiments, the channel 320 interposes between the first circuit component 310-1 and the second circuit component 310-2 of a deformable substrate (e.g., deformable substrate 302 of FIG. 3A, etc.).

In some embodiments, the first portion of the channel 320 includes an interior surface of the channel 320 and/or an edge portion of the channel 320. In some embodiments, a thickness of the first metal material on the interior surface of the first portion of the channel is between 1 µm and 25 µm.

In some embodiments, a depth of the first portion (e.g., L4 of FIG. 3E, L4 of FIG. 5B, etc.) of the channel 320 is between 0.5 µm and 10 µm. For instance, in some embodiments, the depth L4 of the first portion of the channel 320 is between 0.5 µm and 12 µm, between 0.5 µm and 10 µm, between 0.5 µm and 8 µm, between 0.5 µm and 6 µm, between 0.5 µm and 4 µm, between 0.5 µm and 2 µm, between 0.5 µm and 1 µm, between 1 µm and 12 µm, between 1 µm and 10 µm, between 1 µm and 8 µm, between 1 µm and 6 µm, between 1 µm and 4 µm, between 1 µm and 2 µm, between 1.5 µm and 12 µm, between 1.5 µm and 10 µm, between 1.5 µm and 8 µm, between 1.5 µm and 6 µm, between 1.5 µm and 4 µm, between 1.5 µm and 2 µm, between 2 µm and 12 µm, between 2 µm and 10 µm, between 2 µm and 8 µm, between 2 µm and 6 µm, between 2 µm and 4 µm, between 3 µm and 12 µm, between 3 µm and 10 µm, between 3 µm and 8 µm, between 3 µm and 6 µm, between 3 µm and 4 µm, between 4 µm and 12 µm, between 4 µm and 10 µm, between 4 µm and 8 µm, between 4 µm and 6 µm, between 5 µm and 12 µm, between 5 µm and 10 µm, between 5 µm and 8 µm, between 5 µm and 6 µm, between 6 µm and 12 µm, between 6 µm and 10 µm, between 6 µm and 8 µm, between 7 µm and 12 µm, between 7 µm and 10 µm, between 7 µm and 8 µm, between 8 µm and 12 µm, between 8 µm and 10 µm, between 9 µm and 12 µm, between 9 µm and 10 µm, between 10 µm and 12 µm, or between 11 µm and 12 µm.

In some embodiments, the depth L4 of the first portion of the channel is at least 0.5 µm, at least 1 µm, at least 1.2 µm, at least 1.5 µm, at least 1.7 µm, at least 2 µm, at least 2.2 µm, at least 2.5 µm, at least 2.7 µm, at least 3 µm, at least 3.2 µm, at least 3.5 µm, at least 3.7 µm, at least 4 µm, at least 4.2 µm, at least 4.5 µm, at least 4.7 µm, at least 5 µm, at least 5.2 µm, at least 5.5 µm, at least 5.7 µm, at least 6 µm, at least 6.2 µm, at least 6.5 µm, at least 6.7 µm, at least 7 µm, at least 7.2 µm, at least 7.5 µm, at least 7.7 µm, at least 8 µm, at least 8.2 µm, at least 8.5 µm, at least 8.7 µm, at least 9 µm, at least 9.2 µm, at least 9.5 µm, at least 9.7 µm, at least 10 µm, at least 10.2 µm, at least 10.5 µm, at least 10.7 µm, at least 11 µm, at least 11.2 µm, at least 11.5 µm, at least 11.7 µm, or at least 12 µm. In some embodiments, the depth of the first portion of the channel is at most 0.5 µm, at most 1 µm, at most 1.2 µm, at most 1.5 µm, at most 1.7 µm, at most 2 µm, at most 2.2 µm, at most 2.5 µm, at most 2.7 µm, at most 3 µm, at most 3.2 µm, at most 3.5 µm, at most 3.7 µm, at most 4 µm, at most 4.2 µm, at most 4.5 µm, at most 4.7 µm, at most 5 µm, at most 5.2 µm, at most 5.5 µm, at most 5.7 µm, at most 6 µm, at most 6.2 µm, at most 6.5 µm, at most 6.7 µm, at most 7 µm, at most 7.2 µm, at most 7.5 µm, at most 7.7 µm, at most 8 µm, at most 8.2 µm, at most 8.5 µm, at most 8.7 µm, at most 9 µm, at most 9.2 µm, at most 9.5 µm, at most 9.7 µm, at most 10 µm, at most 10.2 µm, at most 10.5 µm, at most 10.7 µm, at most 11 µm, at most 11.2 µm, at most 11.5 µm, at most 11.7 µm, or at most 12 µm.

The channel 320 includes a first width (e.g., D1 of FIG. 3D, D1 of FIG. 4A, etc.). In some embodiments, the first width D1 is a nominal diameter of the channel 320, an outer width of the channel 320, an inner width of the channel 320, or a hydraulic diameter of the channel 320. For instance, in some embodiments, a cross section of the interior volume of the channel 320 includes any regular closed form shape such as a circle or a polygon of the form N-gon, where here N is a positive integer of 3 or greater, or an irregular closed form shape, or the like. In some embodiments, the interior volume of the channel 320 is substantially symmetric or symmetric about an axis of the channel 320, such as a longitudinal axis. For instance, in some embodiments, the interior volume of the channel 320 is that of a right cylinder or an oblique cylinder. In some embodiments the channel is an irregular closed form shape.

In some embodiments, an interior volume of the channel 320 is between 500 cubic microns ($\mu m^3$) and 80 million $\mu m^3$, between 3,000 µm 3 and 50 million $\mu m^3$, between 3,000 µm 3 and 20 million $\mu m^3$, between 3,000 µm 3 and 5 million $\mu m^3$, between 3,000 µm 3 and 1 million $\mu m^3$, between 3,000 µm 3 and 500,000 $\mu m^3$, between 3,000 µm 3 and 100,000 $\mu m^3$, between 3,000 µm 3 and 10,000 $\mu m^3$, between 8,000 µm 3 and 80 million $\mu m^3$, between 8,000 µm 3 and 50 million $\mu m^3$, between 8,000 µm 3 and 20 million $\mu m^3$, between 8,000 µm 3 and 5 million $\mu m^3$, between 8,000 µm 3 and 1 million $\mu m^3$, between 8,000 µm 3 and 500,000 $\mu m^3$, between 8,000 µm 3 and 100,000 $\mu m^3$, between 8,000 µm 3 and 10,000 $\mu m^3$, between 25,000 µm 3 and 80 million $\mu m^3$, between 25,000 µm 3 and 50 million $\mu m^3$, between 25,000 µm 3 and 20 million $\mu m^3$, between 25,000 µm 3 and 5 million $\mu m^3$, between 25,000 µm 3 and 1 million $\mu m^3$, between 25,000 µm 3 and 500,000 $\mu m^3$, between 25,000 µm 3 and 100,000 $\mu m^3$, between 90,000 µm 3 and 80 million $\mu m^3$, between 90,000 µm 3 and 50 million $\mu m^3$, between 90,000 µm 3 and 20 million $\mu m^3$, between 90,000 µm 3 and 5 million $\mu m^3$, between 90,000 µm 3 and 1 million $\mu m^3$, between 90,000 µm 3 and 500,000 $\mu m^3$, between 90,000 µm 3 and 100,000 $\mu m^3$, between 175,000 µm 3 and 80 million $\mu m^3$, between 175,000 µm 3 and 50 million $\mu m^3$, between 175,000 µm 3 and 20 million $\mu m^3$, between 175,000 µm 3 and 5 million $\mu m^3$, between 175,000 µm 3 and 1 million $\mu m^3$, between 175,000 µm 3 and 500,000 $\mu m^3$, between 355,000 µm 3 and 80 million $\mu m^3$, between 355,000 µm 3 and 50 million $\mu m^3$, between 355,000 µm 3 and 20 million $\mu m^3$, between 355,000 µm 3 and 5 million $\mu m^3$, between 355,000 µm 3 and 1 million $\mu m^3$, between 355,000 µm 3 and 500,000 $\mu m^3$, between 2 million µm 3 and 80 million $\mu m^3$, between 2 million µm 3 and 50 million $\mu m^3$, between 2 million µm 3 and 20 million $\mu m^3$, between 2 million µm 3 and 5 million $\mu m^3$, between 7 million µm 3 and 80 million $\mu m^3$, between 7 million µm 3 and 50 million $\mu m^3$, between 7 million µm 3 and 20 million $\mu m^3$, between 17 million µm 3 and 80 million $\mu m^3$, between 17 million µm 3 and 50 million $\mu m^3$, between 17 million µm 3 and 20 million $\mu m^3$, between 40 million µm 3 and 80 million $\mu m^3$, between 40 million µm 3 and 50 million $\mu m^3$, or between 65 million µm 3 and 80 million $\mu m^3$.

In some embodiments, the interior volume of the channel 320 is at least 1,000 $\mu m^3$, 3,000 $\mu m^3$, at least 5,000 $\mu m^3$, at least 8,000 $\mu m^3$, at least 15,000 $\mu m^3$, at least 20,000 $\mu m^3$, at least 30,000 $\mu m^3$, at least 50,000 $\mu m^3$, at least 75,000 $\mu m^3$, at least 125,000 $\mu m^3$, at least 300,000 $\mu m^3$, at least 750,000 $\mu m^3$, at least 1 million $\mu m^3$, at least 3 million $\mu m^3$, at least 6 million $\mu m^3$, at least 1 million $\mu m^3$, at least 10 million $\mu m^3$, at least 17 million µm³, at least 20 million µm³, at least 35 million µm³, at least 50 million µm³, at least 70 million µm³, or at least 80 million µm³. In some embodiments, the interior volume of the channel 320 is at most 3,000 µm³, at most 5,000 µm³, at most 8,000 µm³, at most 15,000 µm³, at most 20,000 µm³, at most 30,000 µm³, at most 50,000 µm³, at most 75,000 µm³, at most 125,000 µm³, at most 300,000 µm³, at most 750,000 µm³, at most 1 million µm³, at most 3 million µm³, at most 6 million µm³, at most 1 million µm³, at most 10 million µm³, at most 17 million µm³, at most 20 million µm³, at most 35 million µm³, at most 50 million µm³, at most 70 million µm³, or at most 80 million µm³.

In some embodiments, the deformable substrate 302 includes one or more materials selected from a variety of materials, including but not limited to silicon (Si), glass, plastic, or polymeric materials (e.g., a plastic film), fabric, synthetic paper, or the like. For instance, in some embodiments, the deformable substrate 302 is made of a semiconductor material (alone or together with other materials). Examples of semiconductor materials include, but are not limited to Si, metal oxide or gallium arsenide (GaAs). In some embodiments, the deformable substrate 302 serves as a foundation (e.g., platform, base, etc.) for manufacture of objects (e.g., one or more circuit components 330), such as transistors and integrated circuits (ICs). In some embodiments, the deformable substrate 302 is made of a polymeric material (e.g., alone, or together with other materials). Examples of polymeric materials include, but are not limited to polyester (PE), polycarbonate (PC), polyimide (PI), polyethylene terephthalate (PET), polyethylene naphthalate (PEN), Acrylic or Polymethyl Methacrylate (PMMA), Polypropylene (PP), Polyvinyl Chloride (PVC), Acrylonitrile-Butadiene-Styrene (ABS), or the like.

In some embodiments, the first layer 310-1 of the circuit (e.g., first layer of deformable substrate 302) includes polyethylene terephthalate (PET). In some embodiments, the first layer 310-1 is loaded with nanoparticles of a first material, such as Au, Ag, Cu, palladium (Pd), or a combination thereof.

In some embodiments, a second layer 310-2 of the circuit 305 (e.g., second layer of deformable substrate 302) is formed overlaying a portion of the first layer 310-1. In some embodiments, the second layer 310-2 includes one or more polyorganosiloxanes, one or more fillers, one or more additives, or a combination thereof.

In some embodiments, the second layer 310-2 includes a silicon solvent. In some embodiments, the silicon solvent includes a first portion of hexamethyldisiloxane and a second portion of octamethyltrisiloxane.

In some embodiments, the second layer 310-2 includes 50 w % of the one or more polyorganosiloxanes, one or more fillers, one or more additives, or the combination thereof. In some embodiments, the deformable substrate 302 includes 50 w % of the first portion of hexamethyldisiloxane and the second portion of octamethyltrisiloxane.

Block 406. Referring to block 406, in some embodiments, the method 400 further includes, prior to the forming the layer of the first metal material 340-1, exposing the first surface of the channel 320 of deformable substrate 302. For instance, in some embodiments, the method 400 utilizes a mechanism, such as a punch mechanism and/or an etch mechanism (e.g., laser etch mechanism) to expose the first surface of the channel 320 as illustrated in FIG. 3C.

Block 408. Referring to block 408, in some embodiments, the forming the layer of the first metal material 340-1 is performed by one or more mechanical surface modification techniques and/or one or more chemical surface modification techniques, such as by disposing the layer of the first metal material 340-1 on the first surface of the channel 320. For instance, in some embodiments, the forming the layer of the first metal material 340-1 is performed by a hydrothermal treatment technique, a micro-arc oxidation technique, a plasma ion implantation (PII) technique, a plasma spraying technique, a selective melting technique, a sol-gel technique, a sputtering technique, an electrochemical deposition technique, or a combination thereof. As a non-limiting example, in some embodiments, includes sputtering technique includes impinging a plurality of ions of the first metal material 340-1 at the first surface of the channel 320. In some embodiments, the sputtering technique is performed in a vacuum environment. Accordingly, in some embodiments and referring to FIG. 3E for illustration, by impinging the plurality of ions of the first metal material 340-1 at the first surface of the channel 320, the thickness L2 of the layer of the first metal material 340-1 is relatively small in comparison to a width D1 (e.g., smallest width in cases where a cross-section of the channel is irregular or other than circular, the diameter in cases where a cross-section of the channel is circular) of the channel 320. However, the present disclosure is not limited thereto.

Block 410. Referring to block 410, in some embodiments, the forming the layer of the first metal material 340-1 includes forming a coating of the layer of the first metal material 340-1 over the first surface of the channel 320. This is illustrated in the transition from FIG. 3D to 3E which shows that layer 310-3 is added over the first metal material 340-1 to seal the channel 320 containing the liquid metal (second metal material).

Block 412. Referring to block 412, in some embodiments, the first metal material 340-1 includes aluminum (Al), copper (Cu), gold (Au), platinum (Pt), nickel (Ni), silver (Ag), any alloy thereof, or a combination thereof. For instance, in some embodiments, the first metal material 340-1 includes gold (Au), nickel (Ni), silver (Ag), or a combination thereof. In some such embodiments, the first metal material is solid material, such as solid Ag, solid Au, solid Cu, or a combination thereof. In some embodiments, the first metal material 340-1 is liquid, such as liquid Au, liquid Ag, or the like. In some embodiments, the first metal material 340-1 is bi-phasic.

Block 414. In some embodiments, a thickness of the layer of the first metal material 340-1 (e.g., L3 of FIG. 6C) is between 1 µm and 5 µm. For instance, in some embodiments, the layer of the first metal material 340-1 has thickness L3 and is overlaid the first portion of the deformable substrate 302, such as a first layer 310-1 of the circuit 305 of the deformable substrate 302.

In some embodiments, the thickness L3 of the layer of the first metal material 340-1 is between 0.5 µm and 6 µm, between 0.5 µm and 5.5 µm, between 0.5 µm and 5 µm, between 0.5 µm and 4.5 µm, between 0.5 µm and 4 µm, between 0.5 µm and 3.5 µm, between 0.5 µm and 3 µm, between 0.5 µm and 2.5 µm, between 0.5 µm and 2 µm, between 0.5 µm and 1.5 µm, between 0.5 µm and 1 µm, between 0.7 µm and 5.5 µm, between 0.7 µm and 5 µm, between 0.7 µm and 4.5 µm, between 0.7 µm and 4 µm, between 0.7 µm and 3.5 µm, between 0.7 µm and 3 µm, between 0.7 µm and 2.5 µm, between 0.7 µm and 2 µm, between 0.7 µm and 1.5 µm, between 0.7 µm and 1 µm, between 1 µm and 5.5 µm, between 1 µm and 5 µm, between 1 µm and 4.5 µm, between 1 µm and 4 µm, between 1 µm and 3.5 µm, between 1 µm and 3 µm, between 1 µm and 2.5 µm, between 1 µm and 2 µm, between 1 µm and 1.5 µm, between 1.2 µm and 5.5 µm, between 1.2 µm and 5 µm, between 1.2 μm and 4.5 μm, between 1.2 μm and 4 μm, between 1.2 μm and 3.5 μm, between 1.2 μm and 3 μm, between 1.2 μm and 2.5 μm, between 1.2 μm and 2 μm, between 1.2 μm and 1.5 μm, between 1.5 μm and 5.5 μm, between 1.5 μm and 5 μm, between 1.5 μm and 4.5 μm, between 1.5 μm and 4 μm, between 1.5 μm and 3.5 μm, between 1.5 μm and 3 μm, between 1.5 μm and 2.5 μm, between 1.5 μm and 2 μm, between 1.7 μm and 5.5 μm, between 1.7 μm and 5 μm, between 1.7 μm and 4.5 μm, between 1.7 μm and 4 μm, between 1.7 μm and 3.5 μm, between 1.7 μm and 3 μm, between 1.7 μm and 2.5 μm, between 1.7 μm and 2 μm, between 2 μm and 5.5 μm, between 2 μm and 5 μm, between 2 μm and 4.5 μm, between 2 μm and 4 μm, between 2 μm and 3.5 μm, between 2 μm and 3 μm, between 2 μm and 2.5 μm, between 2.2 μm and 5.5 μm, between 2.2 μm and 5 μm, between 2.2 μm and 4.5 μm, between 2.2 μm and 4 μm, between 2.2 μm and 3.5 μm, between 2.2 μm and 3 μm, between 2.2 μm and 2.5 μm, between 2.5 μm and 5.5 μm, between 2.5 μm and 5 μm, between 2.5 μm and 4.5 μm, between 2.5 μm and 4 μm, between 2.5 μm and 3.5 μm, between 2.5 μm and 3 μm, between 2.7 μm and 5.5 μm, between 2.7 μm and 5 μm, between 2.7 μm and 4.5 μm, between 2.7 μm and 4 μm, between 2.7 μm and 3.5 μm, between 2.7 μm and 3 μm, between 3 μm and 5.5 μm, between 3 μm and 5 μm, between 3 μm and 4.5 μm, between 3 μm and 4 μm, between 3 μm and 3.5 μm, between 3.2 μm and 5.5 μm, between 3.2 μm and 5 μm, between 3.2 μm and 4.5 μm, between 3.2 μm and 4 μm, between 3.2 μm and 3.5 μm, between 3.5 μm and 5.5 μm, between 3.5 μm and 5 μm, between 3.5 μm and 4.5 μm, between 3.5 μm and 4 μm, between 3.7 μm and 5.5 μm, between 3.7 μm and 5 μm, between 3.7 μm and 4.5 μm, between 3.7 μm and 4 μm, between 4 μm and 5.5 μm, between 4 μm and 5 μm, between 4 μm and 4.5 μm, between 4.2 μm and 5.5 μm, between 4.2 μm and 5 μm, between 4.2 μm and 4.5 μm, between 4.5 μm and 5.5 μm, between 4.5 μm and 5 μm, between 4.7 μm and 5.5 μm, or between 4.7 μm and 5 μm.

In some embodiments, the thickness L3 of the layer of the first metal material 340-1 is at least 0.5 μm, at least 0.6 μm, at least 0.7 μm, at least 0.8 μm, at least 0.9 μm, at least 1.0 μm, at least 1.1 μm, at least 1.2 μm, at least 1.3 μm, at least 1.4 μm, at least 1.5 μm, at least 1.6 μm, at least 1.7 μm, at least 1.8 μm, at least 1.9 μm, at least 2.0 μm, at least 2.1 μm, at least 2.2 μm, at least 2.3 μm, at least 2.4 μm, at least 2.5 μm, at least 2.6 μm, at least 2.7 μm, at least 2.8 μm, at least 2.9 μm, at least 3.0 μm, at least 3.1 μm, at least 3.2 μm, at least 3.3 μm, at least 3.4 μm, at least 3.5 μm, at least 3.6 μm, at least 3.7 μm, at least 3.8 μm, at least 3.9 μm, at least 4.0 μm, at least 4.1 μm, at least 4.2 μm, at least 4.3 μm, at least 4.4 μm, at least 4.5 μm, at least 4.6 μm, at least 4.7 μm, at least 4.8 μm, at least 4.9 μm, at least 5.0 μm, at least 5.1 μm, at least 5.2 μm, at least 5.3 μm, at least 5.4 μm, at least 5.5 μm, at least 5.6 μm, at least 5.7 μm, at least 5.8 μm, at least 5.9 μm, or at least 6 μm. In some embodiments, the thickness L3 of the layer of the first metal material 340-1 is at most 0.5 μm, at most 0.6 μm, at most 0.7 μm, at most 0.8 μm, at most 0.9 μm, at most 1.0 μm, at most 1.1 μm, at most 1.2 μm, at most 1.3 μm, at most 1.4 μm, at most 1.5 μm, at most 1.6 μm, at most 1.7 μm, at most 1.8 μm, at most 1.9 μm, at most 2.0 μm, at most 2.1 μm, at most 2.2 μm, at most 2.3 μm, at most 2.4 μm, at most 2.5 μm, at most 2.6 μm, at most 2.7 μm, at most 2.8 μm, at most 2.9 μm, at most 3.0 μm, at most 3.1 μm, at most 3.2 μm, at most 3.3 μm, at most 3.4 μm, at most 3.5 μm, at most 3.6 μm, at most 3.7 μm, at most 3.8 μm, at most 3.9 μm, at most 4.0 μm, at most 4.1 μm, at most 4.2 μm, at most 4.3 μm, at most 4.4 μm, at most 4.5 μm, at most 4.6 μm, at most 4.7 μm, at most 4.8 μm, at most 4.9 μm, at most 5.0 μm, at most 5.1 μm, at most 5.2 μm, at most 5.3 μm, at most 5.4 μm, at most 5.5 μm, at most 5.6 μm, at most 5.7 μm, at most 5.8 μm, at most 5.9 μm, or at most 6 μm.

In some embodiments, the thickness L3 of the layer of the first metal material 340-1 is between 0.01 mil (e.g., 0.019685 mil) to 0.24 mil (e.g., 0.23622 mil), between 0.01 mil and 0.15 mil, between 0.02 mil and 0.22 mil, between 0.02 mil and 0.18 mil, between 0.02 mil and 0.15 mil, between 0.02 mil and 0.11 mil, between 0.02 mil and 0.10 mil, between 0.04 mil and 0.20 mil, between 0.04 mil and 0.18 mil, between 0.04 mil and 0.15 mil, between 0.04 mil and 0.11 mil, between 0.04 mil and 0.10 mil, between 0.06 mil and 0.18 mil, between 0.06 mil and 0.15 mil, between 0.06 mil and 0.11 mil, between 0.06 mil and 0.10 mil, between 0.08 mil and 0.16 mil, between 0.08 mil and 0.15 mil, between 0.08 mil and 0.11 mil, between 0.08 mil and 0.10 mil, between 0.10 mil and 0.16 mil, between 0.10 mil and 0.15 mil, between 0.10 mil and 0.11 mil, or between 0.11 mil and 0.13 mil.

In some embodiments, the thickness L3 of the layer of the first metal material 340-1 is at least 0.01 mil, at least 0.02 mil, at least 0.03 mil, at least 0.04 mil, at least 0.05 mil, at least 0.06 mil, at least 0.07 mil, at least 0.08 mil, at least 0.09 mil, at least 0.10 mil, at least 0.11 mil, at least 0.12 mil, at least 0.13 mil, at least 0.14 mil, at least 0.15 mil, at least 0.16 mil, at least 0.17 mil, at least 0.18 mil, at least 0.19 mil, at least 0.20 mil, at least 0.21 mil, at least 0.22 mil, at least 0.23 mil, at least 0.24 mil, or at least 0.25 mil.

In some embodiments, the thickness L3 of the layer of the first metal material 340-1 is at most 0.01 mil, at most 0.02 mil, at most 0.03 mil, at most 0.04 mil, at most 0.05 mil, at most 0.06 mil, at most 0.07 mil, at most 0.08 mil, at most 0.09 mil, at most 0.10 mil, at most 0.11 mil, at most 0.12 mil, at most 0.13 mil, at most 0.14 mil, at most 0.15 mil, at most 0.16 mil, at most 0.17 mil, at most 0.18 mil, at most 0.19 mil, at most 0.20 mil, at most 0.21 mil, at most 0.22 mil, at most 0.23 mil, at most 0.24 mil, or at most 0.25 mil.

Block 416. Referring to block 416, in some embodiments, the first circuit component 330-1 includes an exterior surface (e.g., exterior surface 332-1 of FIG. 4A).

In some embodiments, the exterior surface 332 of the first circuit component 330-1 includes electroless nickel immersion gold (ENIG). In some embodiments, the exterior surface 332 of the first circuit component 330-1 includes tin (e.g., immersion tin (ISn)). In some embodiments, the exterior surface 332 of the first circuit component 330-1 includes an electroless nickel immersion silver (ENInAg).

Block 418. Referring to block 418, in some embodiments, the channel is circular and the width D1 of the channel (illustrated in FIG. 3E) is a diameter, and the diameter is between 10 μm and 500 μm. In some embodiments, the channel is not circular and the smallest width D1 of the channel (illustrated in FIG. 3E) is between 10 μm and 500 μm. In some embodiments, the channel is not circular and the largest width D1 of the channel (illustrated in FIG. 3E) is between 10 μm and 500 μm.

In some embodiments, the smallest cross-sectional width, largest cross-sectional width (or in cases where the channel has a circular cross-section, a diameter) D1 of the channel 320 is between 5 μm and 1,000 μm (e.g., 0.1 centimeters (cm)), between 5 μm and 950 μm, between 5 μm and 900 μm, between 5 μm and 850 μm, between 5 μm and 800 μm, between 5 μm and 750 μm, between 5 μm and 700 μm, between 5 μm and 650 μm, between 5 μm and 600 μm, between 5 μm and 550 μm, between 5 μm and 500 μm, between 5 μm and 450 μm, between 5 μm and 400 μm, between 5 µm and 350 µm, between 5 µm and 300 µm, between 5 µm and 250 µm, between 5 µm and 200 µm, between 5 µm and 150 µm, between 5 µm and 100 µm, between 5 µm and 50 µm, between 5 µm and 10 µm, between 75 µm and 1000 µm, between 75 µm and 950 µm, between 75 µm and 900 µm, between 75 µm and 850 µm, between 75 µm and 800 µm, between 75 µm and 750 µm, between 75 µm and 700 µm, between 75 µm and 650 µm, between 75 µm and 600 µm, between 75 µm and 550 µm, between 75 µm and 500 µm, between 75 µm and 450 µm, between 75 µm and 400 µm, between 75 µm and 350 µm, between 75 µm and 300 µm, between 75 µm and 250 µm, between 75 µm and 200 µm, between 75 µm and 150 µm, between 75 µm and 100 µm, between 150 µm and 1000 µm, between 150 µm and 950 µm, between 150 µm and 900 µm, between 150 µm and 850 µm, between 150 µm and 800 µm, between 150 µm and 750 µm, between 150 µm and 700 µm, between 150 µm and 650 µm, between 150 µm and 600 µm, between 150 µm and 550 µm, between 150 µm and 500 µm, between 150 µm and 450 µm, between 150 µm and 400 µm, between 150 µm and 350 µm, between 150 µm and 300 µm, between 150 µm and 250 µm, between 150 µm and 200 µm, between 225 µm and 1000 µm, between 225 µm and 950 µm, between 225 µm and 900 µm, between 225 µm and 850 µm, between 225 µm and 800 µm, between 225 µm and 750 µm, between 225 µm and 700 µm, between 225 µm and 650 µm, between 225 µm and 600 µm, between 225 µm and 550 µm, between 225 µm and 500 µm, between 225 µm and 450 µm, between 225 µm and 400 µm, between 225 µm and 350 µm, between 225 µm and 300 µm, between 225 µm and 250 µm, between 300 µm and 1000 µm, between 300 µm and 950 µm, between 300 µm and 900 µm, between 300 µm and 850 µm, between 300 µm and 800 µm, between 300 µm and 750 µm, between 300 µm and 700 µm, between 300 µm and 650 µm, between 300 µm and 600 µm, between 300 µm and 550 µm, between 300 µm and 500 µm, between 300 µm and 450 µm, between 300 µm and 400 µm, between 300 µm and 350 µm, between 375 µm and 1000 µm, between 375 µm and 950 µm, between 375 µm and 900 µm, between 375 µm and 850 µm, between 375 µm and 800 µm, between 375 µm and 750 µm, between 375 µm and 700 µm, between 375 µm and 650 µm, between 375 µm and 600 µm, between 375 µm and 550 µm, between 375 µm and 500 µm, between 375 µm and 450 µm, between 375 µm and 400 µm, between 450 µm and 1000 µm, between 450 µm and 950 µm, between 450 µm and 900 µm, between 450 µm and 850 µm, between 450 µm and 800 µm, between 450 µm and 750 µm, between 450 µm and 700 µm, between 450 µm and 650 µm, between 450 µm and 600 µm, between 450 µm and 550 µm, between 450 µm and 500 µm, between 525 µm and 1000 µm, between 525 µm and 950 µm, between 525 µm and 900 µm, between 525 µm and 850 µm, between 525 µm and 800 µm, between 525 µm and 750 µm, between 525 µm and 700 µm, between 525 µm and 650 µm, between 525 µm and 600 µm, between 525 µm and 550 µm, between 600 µm and 1000 µm, between 600 µm and 950 µm, between 600 µm and 900 µm, between 600 µm and 850 µm, between 600 µm and 800 µm, between 600 µm and 750 µm, between 600 µm and 700 µm, between 600 µm and 650 µm, between 675 µm and 1000 µm, between 675 µm and 950 µm, between 675 µm and 900 µm, between 675 µm and 850 µm, between 675 µm and 800 µm, between 675 µm and 750 µm, between 675 µm and 700 µm, between 750 µm and 1000 µm, between 750 µm and 950 µm, between 750 µm and 900 µm, between 750 µm and 850 µm, between 750 µm and 800 µm, between 825 µm and 1000 µm, between 825 µm and 950 µm, between 825 µm and 900 µm, between 825 µm and 850 µm, between 900 µm and 1000 µm, or between 900 µm and 950 µm.

In some embodiments the width D1 of the channel changes as a function of depth. For instance, in some embodiments the width D1 is at least 1, 2, 3, 5, 10, 15, 20, or 25 percent larger at one point in the depth of the channel as it is at a second point in the depth of the channel. In some embodiments, the first point in the channel is the first point at which the channel has the largest cross-section and the second point is the point at which the channel has the smallest cross-section. In some embodiments, the width of the channel does not appreciably or measurably change as a function of depth of the channel.

In some embodiments, the smallest cross-sectional width, largest cross-sectional width (or in cases where the channel has a circular cross-section, a diameter) D1 of the channel 320 is at least 5 µm, at least 10 µm, at least 15 µm, at least 20 µm, at least 25 µm, at least 30 µm, at least 35 µm, at least 40 µm, at least 45 µm, at least 50 µm, at least 55 µm, at least 60 µm, at least 65 µm, at least 70 µm, at least 75 µm, at least 80 µm, at least 85 µm, at least 90 µm, at least 95 µm, at least 100 µm, at least 105 µm, at least 110 µm, at least 115 µm, at least 120 µm, at least 125 µm, at least 130 µm, at least 135 µm, at least 140 µm, at least 145 µm, at least 150 µm, at least 155 µm, at least 160 µm, at least 165 µm, at least 170 µm, at least 175 µm, at least 180 µm, at least 185 µm, at least 190 µm, at least 195 µm, at least 200 µm, at least 205 µm, at least 210 µm, at least 215 µm, at least 220 µm, at least 225 µm, at least 230 µm, at least 235 µm, at least 240 µm, at least 245 µm, at least 250 µm, at least 255 µm, at least 260 µm, at least 265 µm, at least 270 µm, at least 275 µm, at least 280 µm, at least 285 µm, at least 290 µm, at least 295 µm, at least 300 µm, at least 305 µm, at least 310 µm, at least 315 µm, at least 320 µm, at least 325 µm, at least 330 µm, at least 335 µm, at least 340 µm, at least 345 µm, at least 350 µm, at least 355 µm, at least 360 µm, at least 365 µm, at least 370 µm, at least 375 µm, at least 380 µm, at least 385 µm, at least 390 µm, at least 395 µm, at least 400 µm, at least 405 µm, at least 410 µm, at least 415 µm, at least 420 µm, at least 425 µm, at least 430 µm, at least 435 µm, at least 440 µm, at least 445 µm, at least 450 µm, at least 455 µm, at least 460 µm, at least 465 µm, at least 470 µm, at least 475 µm, at least 480 µm, at least 485 µm, at least 490 µm, at least 495 µm, at least 500 µm, at least 505 µm, at least 510 µm, at least 515 µm, at least 520 µm, at least 525 µm, at least 530 µm, at least 535 µm, at least 540 µm, at least 545 µm, at least 550 µm, at least 555 µm, at least 560 µm, at least 565 µm, at least 570 µm, at least 575 µm, at least 580 µm, at least 585 µm, at least 590 µm, at least 595 µm, at least 600 µm, at least 605 µm, at least 610 µm, at least 615 µm, at least 620 µm, at least 625 µm, at least 630 µm, at least 635 µm, at least 640 µm, at least 645 µm, at least 650 µm, at least 655 µm, at least 660 µm, at least 665 µm, at least 670 µm, at least 675 µm, at least 680 µm, at least 685 µm, at least 690 µm, at least 695 µm, at least 700 µm, at least 705 µm, at least 710 µm, at least 715 µm, at least 720 µm, at least 725 µm, at least 730 µm, at least 735 µm, at least 740 µm, at least 745 µm, at least 750 µm, at least 755 µm, at least 760 µm, at least 765 µm, at least 770 µm, at least 775 µm, at least 780 µm, at least 785 µm, at least 790 µm, at least 795 µm, at least 800 µm, at least 805 µm, at least 810 µm, at least 815 µm, at least 820 µm, at least 825 µm, at least 830 µm, at least 835 µm, at least 840 µm, at least 845 µm, at least 850 µm, at least 855 µm, at least 860 µm, at least 865 µm, at least 870 µm, at least 875 µm, at least 880 µm, at least 885 µm, at least 890 µm, at least 895 µm, at least 900 µm, at least 905 µm, at least 910 µm, at least 915 µm, at least 920 µm, at least 925 µm, at least 930 µm, at least 935 µm, at least 940 µm, at least 945 µm, at least 950 µm, at least 955 µm, at least 960

μm, at least 965 μm, at least 970 μm, at least 975 μm, at least 980 μm, at least 985 μm, at least 990 μm, at least 995 μm, or at least 1,000 μm.

In some embodiments, the smallest cross-sectional width, largest cross-sectional width (or in cases where the channel has a circular cross-section, a diameter) D1 of the channel 320 is at most 5 μm, at most 10 μm, at most 15 μm, at most 20 μm, at most 25 μm, at most 30 μm, at most 35 μm, at most 40 μm, at most 45 μm, at most 50 μm, at most 55 μm, at most 60 μm, at most 65 μm, at most 70 μm, at most 75 μm, at most 80 μm, at most 85 μm, at most 90 μm, at most 95 μm, at most 100 μm, at most 105 μm, at most 110 μm, at most 115 μm, at most 120 μm, at most 125 μm, at most 130 μm, at most 135 μm, at most 140 μm, at most 145 μm, at most 150 μm, at most 155 μm, at most 160 μm, at most 165 μm, at most 170 μm, at most 175 μm, at most 180 μm, at most 185 μm, at most 190 μm, at most 195 μm, at most 200 μm, at most 205 μm, at most 210 μm, at most 215 μm, at most 220 μm, at most 225 μm, at most 230 μm, at most 235 μm, at most 240 μm, at most 245 μm, at most 250 μm, at most 255 μm, at most 260 μm, at most 265 μm, at most 270 μm, at most 275 μm, at most 280 μm, at most 285 μm, at most 290 μm, at most 295 μm, at most 300 μm, at most 305 μm, at most 310 μm, at most 315 μm, at most 320 μm, at most 325 μm, at most 330 μm, at most 335 μm, at most 340 μm, at most 345 μm, at most 350 μm, at most 355 μm, at most 360 μm, at most 365 μm, at most 370 μm, at most 375 μm, at most 380 μm, at most 385 μm, at most 390 μm, at most 395 μm, at most 400 μm, at most 405 μm, at most 410 μm, at most 415 μm, at most 420 μm, at most 425 μm, at most 430 μm, at most 435 μm, at most 440 μm, at most 445 μm, at most 450 μm, at most 455 μm, at most 460 μm, at most 465 μm, at most 470 μm, at most 475 μm, at most 480 μm, at most 485 μm, at most 490 μm, at most 495 μm, at most 500 μm, at most 505 μm, at most 510 μm, at most 515 μm, at most 520 μm, at most 525 μm, at most 530 μm, at most 535 μm, at most 540 μm, at most 545 μm, at most 550 μm, at most 555 μm, at most 560 μm, at most 565 μm, at most 570 μm, at most 575 μm, at most 580 μm, at most 585 μm, at most 590 μm, at most 595 μm, at most 600 μm, at most 605 μm, at most 610 μm, at most 615 μm, at most 620 μm, at most 625 μm, at most 630 μm, at most 635 μm, at most 640 μm, at most 645 μm, at most 650 μm, at most 655 μm, at most 660 μm, at most 665 μm, at most 670 μm, at most 675 μm, at most 680 μm, at most 685 μm, at most 690 μm, at most 695 μm, at most 700 μm, at most 705 μm, at most 710 μm, at most 715 μm, at most 720 μm, at most 725 μm, at most 730 μm, at most 735 μm, at most 740 μm, at most 745 μm, at most 750 μm, at most 755 μm, at most 760 μm, at most 765 μm, at most 770 μm, at most 775 μm, at most 780 μm, at most 785 μm, at most 790 μm, at most 795 μm, at most 800 μm, at most 805 μm, at most 810 μm, at most 815 μm, at most 820 μm, at most 825 μm, at most 830 μm, at most 835 μm, at most 840 μm, at most 845 μm, at most 850 μm, at most 855 μm, at most 860 μm, at most 865 μm, at most 870 μm, at most 875 μm, at most 880 μm, at most 885 μm, at most 890 μm, at most 895 μm, at most 900 μm, at most 905 μm, at most 910 μm, at most 915 μm, at most 920 μm, at most 925 μm, at most 930 μm, at most 935 μm, at most 940 μm, at most 945 μm, at most 950 μm, at most 955 μm, at most 960 μm, at most 965 μm, at most 970 μm, at most 975 μm, at most 980 μm, at most 985 μm, at most 990 μm, at most 995 μm, or at least 1,000 μm.

In some embodiments, the smallest cross-sectional width, largest cross-sectional width (or in cases where the channel has a circular cross-section, a diameter) D1 of the channel 320 is between 0.1 mil and 40 mil, between 0.2 mil and 40 mil, between 0.2 mil and 35 mil, between 0.2 and 30 mil, between 0.2 mil and 25 mil, between 0.2 and 20 mil, between 0.2 mil and 15 mil, between 0.2 and 10 mil, between 0.2 mil and 5 mil, between 0.2 and 1 mil, between 0.4 mil and 40 mil, between 0.4 mil and 35 mil, between 0.4 and 30 mil, between 0.4 mil and 25 mil, between 0.4 and 20 mil, between 0.4 mil and 15 mil, between 0.4 and 10 mil, between 0.4 mil and 5 mil, between 0.4 and 1 mil, between 0.6 mil and 40 mil, between 0.6 mil and 35 mil, between 0.6 and 30 mil, between 0.6 mil and 25 mil, between 0.6 and 20 mil, between 0.6 mil and 15 mil, between 0.6 and 10 mil, between 0.6 mil and 5 mil, between 0.6 and 1 mil, between 0.8 mil and 40 mil, between 0.8 mil and 35 mil, between 0.8 and 30 mil, between 0.8 mil and 25 mil, between 0.8 and 20 mil, between 0.8 mil and 15 mil, between 0.8 and 10 mil, between 0.8 mil and 5 mil, between 0.8 and 1 mil, between 1.2 mil and 40 mil, between 1.2 mil and 35 mil, between 1.2 and 30 mil, between 1.2 mil and 25 mil, between 1.2 and 20 mil, between 1.2 mil and 15 mil, between 1.2 and 10 mil, between 1.2 mil and 5 mil, between 1.2 and 3 mil, between 1.7 mil and 40 mil, between 1.7 mil and 35 mil, between 1.7 and 30 mil, between 1.7 mil and 25 mil, between 1.7 and 20 mil, between 1.7 mil and 15 mil, between 1.7 and 10 mil, between 1.7 mil and 5 mil, between 1.7 and 3 mil, between 2.2 mil and 40 mil, between 2.2 mil and 35 mil, between 2.2 and 30 mil, between 2.2 mil and 25 mil, between 2.2 and 20 mil, between 2.2 mil and 15 mil, between 2.2 and 10 mil, between 2.2 mil and 5 mil, between 2.2 and 3 mil, between 2.7 mil and 40 mil, between 2.7 mil and 35 mil, between 2.7 and 30 mil, between 2.7 mil and 25 mil, between 2.7 and 20 mil, between 2.7 mil and 15 mil, between 2.7 and 10 mil, between 2.7 mil and 5 mil, between 2.7 and 3 mil, between 3.2 mil and 40 mil, between 3.2 mil and 35 mil, between 3.2 and 30 mil, between 3.2 mil and 25 mil, between 3.2 and 20 mil, between 3.2 mil and 15 mil, between 3.2 and 10 mil, between 3.2 mil and 5 mil, between 3.7 mil and 40 mil, between 3.7 mil and 35 mil, between 3.7 and 30 mil, between 3.7 mil and 25 mil, between 3.7 and 20 mil, between 3.7 mil and 15 mil, between 3.7 and 10 mil, between 3.7 mil and 5 mil, between 4.2 mil and 40 mil, between 4.2 mil and 35 mil, between 4.2 and 30 mil, between 4.2 mil and 25 mil, between 4.2 and 20 mil, between 4.2 mil and 15 mil, between 4.2 and 10 mil, between 4.2 mil and 5 mil, between 4.7 mil and 40 mil, between 4.7 mil and 35 mil, between 4.7 and 30 mil, between 4.7 mil and 25 mil, between 4.7 and 20 mil, between 4.7 mil and 15 mil, between 4.7 and 10 mil, between 4.7 mil and 5 mil, between 5.2 mil and 40 mil, between 5.2 mil and 35 mil, between 5.2 and 30 mil, between 5.2 mil and 25 mil, between 5.2 and 20 mil, between 5.2 mil and 15 mil, between 5.2 and 10 mil, between 5.7 mil and 40 mil, between 5.7 mil and 35 mil, between 5.7 and 30 mil, between 5.7 mil and 25 mil, between 5.7 and 20 mil, between 5.7 mil and 15 mil, between 5.7 and 10 mil, between 6.2 mil and 40 mil, between 6.2 mil and 35 mil, between 6.2 and 30 mil, between 6.2 mil and 25 mil, between 6.2 and 20 mil, between 6.2 mil and 15 mil, between 6.2 and 10 mil, between 6.7 mil and 40 mil, between 6.7 mil and 35 mil, between 6.7 and 30 mil, between 6.7 mil and 25 mil, between 6.7 and 20 mil, between 6.7 mil and 15 mil, between 6.7 and 10 mil, between 7.2 mil and 40 mil, between 7.2 mil and 35 mil, between 7.2 and 30 mil, between 7.2 mil and 25 mil, between 7.2 and 20 mil, between 7.2 mil and 15 mil, between 7.2 and 10 mil, between 7.7 mil and 40 mil, between 7.7 mil and 35 mil, between 7.7 and 30 mil, between 7.7 mil and 25 mil, between 7.7 and 20 mil, between 7.7 mil and 15 mil, between 7.7 and 10 mil, between 8.2 mil and 40 mil, between 8.2 mil and 35 mil, between 8.2 and 30 mil, between 8.2 mil and 25 mil, between 8.2 and 20 mil, between 8.2 mil and 15 mil, between 8.2 and 10 mil, between 8.7 mil and 40 mil, between 8.7 mil and 35 mil, between 8.7 and 30 mil, between 8.7 mil and 25 mil, between 8.7 and 20 mil, between 8.7 mil and 15 mil, between 8.7 and 10 mil, between 9.2 mil and 40 mil, between 9.2 mil and 35 mil, between 9.2 and 30 mil, between 9.2 mil and 25 mil, between 9.2 and 20 mil, between 9.2 mil and 15 mil, between 9.2 and 10 mil, between 9.7 mil and 40 mil, between 9.7 mil and 35 mil, between 9.7 and 30 mil, between 9.7 mil and 25 mil, between 9.7 and 20 mil, between 9.7 mil and 15 mil, between 9.7 and 10 mil, between 11.2 mil and 40 mil, between 11.2 mil and 35 mil, between 11.2 and 30 mil, between 11.2 mil and 25 mil, between 11.2 and 20 mil, between 11.2 mil and 15 mil, between 11.7 mil and 40 mil, between 11.7 mil and 35 mil, between 11.7 and 30 mil, between 11.7 mil and 25 mil, between 11.7 and 20 mil, between 11.7 mil and 15 mil, between 12.2 mil and 40 mil, between 12.2 mil and 35 mil, between 12.2 and 30 mil, between 12.2 mil and 25 mil, between 12.2 and 20 mil, between 12.2 mil and 15 mil, between 12.7 mil and 40 mil, between 12.7 mil and 35 mil, between 12.7 and 30 mil, between 12.7 mil and 25 mil, between 12.7 and 20 mil, between 12.7 mil and 15 mil, between 13.2 mil and 40 mil, between 13.2 mil and 35 mil, between 13.2 and 30 mil, between 13.2 mil and 25 mil, between 13.2 and 20 mil, between 13.2 mil and 15 mil, between 13.7 mil and 40 mil, between 13.7 mil and 35 mil, between 13.7 and 30 mil, between 13.7 mil and 25 mil, between 13.7 and 20 mil, between 13.7 mil and 15 mil, between 14.2 mil and 40 mil, between 14.2 mil and 35 mil, between 14.2 and 30 mil, between 14.2 mil and 25 mil, between 14.2 and 20 mil, between 14.2 mil and 15 mil, between 14.7 mil and 40 mil, between 14.7 mil and 35 mil, between 14.7 and 30 mil, between 14.7 mil and 25 mil, between 14.7 and 20 mil, between 14.7 mil and 15 mil, between 15.2 mil and 40 mil, between 15.2 mil and 35 mil, between 15.2 and 30 mil, between 15.2 mil and 25 mil, between 15.2 and 20 mil, between 15.7 mil and 40 mil, between 15.7 mil and 35 mil, between 15.7 and 30 mil, between 15.7 mil and 25 mil, between 15.7 and 20 mil, between 16.2 mil and 40 mil, between 16.2 mil and 35 mil, between 16.2 and 30 mil, between 16.2 mil and 25 mil, between 16.2 and 20 mil, between 16.7 mil and 40 mil, between 16.7 mil and 35 mil, between 16.7 and 30 mil, between 16.7 mil and 25 mil, between 16.7 and 20 mil, between 17.2 mil and 40 mil, between 17.2 mil and 35 mil, between 17.2 and 30 mil, between 17.2 mil and 25 mil, between 17.2 and 20 mil, between 17.7 mil and 40 mil, between 17.7 mil and 35 mil, between 17.7 and 30 mil, between 17.7 mil and 25 mil, between 17.7 and 20 mil, between 18.2 mil and 40 mil, between 18.2 mil and 35 mil, between 18.2 and 30 mil, between 18.2 mil and 25 mil, between 18.2 and 20 mil, between 18.7 mil and 40 mil, between 18.7 mil and 35 mil, between 18.7 and 30 mil, between 18.7 mil and 25 mil, between 18.7 and 20 mil, between 19.2 mil and 40 mil, between 19.2 mil and 35 mil, between 19.2 and 30 mil, between 19.2 mil and 25 mil, between 19.2 and 20 mil, between 19.7 mil and 40 mil, between 19.7 mil and 35 mil, between 19.7 and 30 mil, between 19.7 mil and 25 mil, between 19.7 and 20 mil, between 21.2 mil and 40 mil, between 21.2 mil and 35 mil, between 21.2 and 30 mil, between 21.2 mil and 25 mil, between 21.7 mil and 40 mil, between 21.7 mil and 35 mil, between 21.7 and 30 mil, between 21.7 mil and 25 mil, between 22.2 mil and 40 mil, between 22.2 mil and 35 mil, between 22.2 and 30 mil, between 22.2 mil and 25 mil, between 22.7 mil and 40 mil, between 22.7 mil and 35 mil, between 22.7 and 30 mil, between 22.7 mil and 25 mil, between 23.2 mil and 40 mil, between 23.2 mil and 35 mil, between 23.2 and 30 mil, between 23.2 mil and 25 mil, between 23.7 mil and 40 mil, between 23.7 mil and 35 mil, between 23.7 and 30 mil, between 23.7 mil and 25 mil, between 24.2 mil and 40 mil, between 24.2 mil and 35 mil, between 24.2 and 30 mil, between 24.2 mil and 25 mil, between 24.7 mil and 40 mil, between 24.7 mil and 35 mil, between 24.7 and 30 mil, between 24.7 mil and 25 mil, between 25.2 mil and 40 mil, between 25.2 mil and 35 mil, between 25.2 and 30 mil, between 25.7 mil and 40 mil, between 25.7 mil and 35 mil, between 25.7 and 30 mil, between 26.2 mil and 40 mil, between 26.2 mil and 35 mil, between 26.2 and 30 mil, between 26.7 mil and 40 mil, between 26.7 mil and 35 mil, between 26.7 and 30 mil, between 27.2 mil and 40 mil, between 27.2 mil and 35 mil, between 27.2 and 30 mil, between 27.7 mil and 40 mil, between 27.7 mil and 35 mil, between 27.7 and 30 mil, between 28.2 mil and 40 mil, between 28.2 mil and 35 mil, between 28.2 and 30 mil, between 28.7 mil and 40 mil, between 28.7 mil and 35 mil, between 28.7 and 30 mil, between 29.2 mil and 40 mil, between 29.2 mil and 35 mil, between 29.2 and 30 mil, between 29.7 mil and 40 mil, between 29.7 mil and 35 mil, between 29.7 and 30 mil, between 31.2 mil and 40 mil, between 31.2 mil and 35 mil, between 31.7 mil and 40 mil, between 31.7 mil and 35 mil, between 32.2 mil and 40 mil, between 32.2 mil and 35 mil, between 32.7 mil and 40 mil, between 32.7 mil and 35 mil, between 33.2 mil and 40 mil, between 33.2 mil and 35 mil, between 33.7 mil and 40 mil, between 33.7 mil and 35 mil, between 34.2 mil and 40 mil, between 34.2 mil and 35 mil, between 34.7 mil and 40 mil, between 34.7 mil and 35 mil, between 35.2 mil and 40 mil, between 35.7 mil and 40 mil, between 36.2 mil and 40 mil, between 36.7 mil and 40 mil, between 37.2 mil and 40 mil, between 37.7 mil and 40 mil, between 38.2 mil and 40 mil, between 38.7 mil and 40 mil, between 39.2 mil and 40 mil, or between 39.7 mil and 40 mil.

In some embodiments, the smallest cross-sectional width, largest cross-sectional width (or in cases where the channel has a circular cross-section, a diameter) D1 of the channel 320 is at least 0.1 mil, at least 0.3 mil, at least 0.6 mil, at least 0.9 mil, at least 1.1 mil, at least 1.3 mil, at least 1.6 mil, at least 1.9 mil, at least 2.1 mil, at least 2.3 mil, at least 2.6 mil, at least 2.9 mil, at least 3.1 mil, at least 3.3 mil, at least 3.6 mil, at least 3.9 mil, at least 4.1 mil, at least 4.3 mil, at least 4.6 mil, at least 4.9 mil, at least 5.1 mil, at least 5.3 mil, at least 5.6 mil, at least 5.9 mil, at least 6.1 mil, at least 6.3 mil, at least 6.6 mil, at least 6.9 mil, at least 7.1 mil, at least 7.3 mil, at least 7.6 mil, at least 7.9 mil, at least 8.1 mil, at least 8.3 mil, at least 8.6 mil, at least 8.9 mil, at least 9.1 mil, at least 9.3 mil, at least 9.6 mil, at least 9.9 mil, at least 10.1 mil, at least 10.3 mil, at least 10.6 mil, at least 10.9 mil, at least 11.1 mil, at least 11.3 mil, at least 11.6 mil, at least 11.9 mil, at least 12.1 mil, at least 12.3 mil, at least 12.6 mil, at least 12.9 mil, at least 13.1 mil, at least 13.3 mil, at least 13.6 mil, at least 13.9 mil, at least 14.1 mil, at least 14.3 mil, at least 14.6 mil, at least 14.9 mil, at least 15.1 mil, at least 15.3 mil, at least 15.6 mil, at least 15.9 mil, at least 16.1 mil, at least 16.3 mil, at least 16.6 mil, at least 16.9 mil, at least 17.1 mil, at least 17.3 mil, at least 17.6 mil, at least 17.9 mil, at least 18.1 mil, at least 18.3 mil, at least 18.6 mil, at least 18.9 mil, at least 19.1 mil, at least 19.3 mil, at least 19.6 mil, at least 19.9 mil, at least 20.1 mil, at least 20.3 mil, at least 20.6 mil, at least 20.9 mil, at least 21.1 mil, at least 21.3 mil, at least 21.6 mil, at least 21.9 mil, at least 22.1 mil, at least 22.3 mil, at least 22.6 mil, at least 22.9 mil, at least 23.1 mil, at least 23.3 mil, at least 23.6 mil, at least 23.9 mil, at least 24.1 mil, at least 24.3 mil, at least 24.6 mil, at least 24.9 mil, at least 25.1 mil, at least 25.3 mil, at least 25.6 mil, at least 25.9 mil, at least 26.1 mil, at least 26.3 mil, at least 26.6 mil, at least 26.9 mil, at least 27.1 mil, at least 27.3 mil, at least 27.6 mil, at least 27.9 mil, at least 28.1 mil, at least 28.3 mil, at least 28.6 mil, at least 28.9 mil, at least 29.1 mil, at least 29.3 mil, at least 29.6 mil, at least 29.9 mil, at least 30.1 mil, at least 30.3 mil, at least 30.6 mil, at least 30.9 mil, at least 31.1 mil, at least 31.3 mil, at least 31.6 mil, at least 31.9 mil, at least 32.1 mil, at least 32.3 mil, at least 32.6 mil, at least 32.9 mil, at least 33.1 mil, at least 33.3 mil, at least 33.6 mil, at least 33.9 mil, at least 34.1 mil, at least 34.3 mil, at least 34.6 mil, at least 34.9 mil, at least 35.1 mil, at least 35.3 mil, at least 35.6 mil, at least 35.9 mil, at least 36.1 mil, at least 36.3 mil, at least 36.6 mil, at least 36.9 mil, at least 37.1 mil, at least 37.3 mil, at least 37.6 mil, at least 37.9 mil, at least 38.1 mil, at least 38.3 mil, at least 38.6 mil, at least 38.9 mil, at least 39.1 mil, at least 39.3 mil, at least 39.6 mil, or at least 39.9 mil.

In some embodiments, the smallest cross-sectional width, largest cross-sectional width (or in cases where the channel has a circular cross-section, a diameter) D1 of the channel 320 is at most 0.1 mil, at most 0.3 mil, at most 0.6 mil, at most 0.9 mil, at most 1.1 mil, at most 1.3 mil, at most 1.6 mil, at most 1.9 mil, at most 2.1 mil, at most 2.3 mil, at most 2.6 mil, at most 2.9 mil, at most 3.1 mil, at most 3.3 mil, at most 3.6 mil, at most 3.9 mil, at most 4.1 mil, at most 4.3 mil, at most 4.6 mil, at most 4.9 mil, at most 5.1 mil, at most 5.3 mil, at most 5.6 mil, at most 5.9 mil, at most 6.1 mil, at most 6.3 mil, at most 6.6 mil, at most 6.9 mil, at most 7.1 mil, at most 7.3 mil, at most 7.6 mil, at most 7.9 mil, at most 8.1 mil, at most 8.3 mil, at most 8.6 mil, at most 8.9 mil, at most 9.1 mil, at most 9.3 mil, at most 9.6 mil, at most 9.9 mil, at most 10.1 mil, at most 10.3 mil, at most 10.6 mil, at most 10.9 mil, at most 11.1 mil, at most 11.3 mil, at most 11.6 mil, at most 11.9 mil, at most 12.1 mil, at most 12.3 mil, at most 12.6 mil, at most 12.9 mil, at most 13.1 mil, at most 13.3 mil, at most 13.6 mil, at most 13.9 mil, at most 14.1 mil, at most 14.3 mil, at most 14.6 mil, at most 14.9 mil, at most 15.1 mil, at most 15.3 mil, at most 15.6 mil, at most 15.9 mil, at most 16.1 mil, at most 16.3 mil, at most 16.6 mil, at most 16.9 mil, at most 17.1 mil, at most 17.3 mil, at most 17.6 mil, at most 17.9 mil, at most 18.1 mil, at most 18.3 mil, at most 18.6 mil, at most 18.9 mil, at most 19.1 mil, at most 19.3 mil, at most 19.6 mil, at most 19.9 mil, at most 20.1 mil, at most 20.3 mil, at most 20.6 mil, at most 20.9 mil, at most 21.1 mil, at most 21.3 mil, at most 21.6 mil, at most 21.9 mil, at most 22.1 mil, at most 22.3 mil, at most 22.6 mil, at most 22.9 mil, at most 23.1 mil, at most 23.3 mil, at most 23.6 mil, at most 23.9 mil, at most 24.1 mil, at most 24.3 mil, at most 24.6 mil, at most 24.9 mil, at most 25.1 mil, at most 25.3 mil, at most 25.6 mil, at most 25.9 mil, at most 26.1 mil, at most 26.3 mil, at most 26.6 mil, at most 26.9 mil, at most 27.1 mil, at most 27.3 mil, at most 27.6 mil, at most 27.9 mil, at most 28.1 mil, at most 28.3 mil, at most 28.6 mil, at most 28.9 mil, at most 29.1 mil, at most 29.3 mil, at most 29.6 mil, at most 29.9 mil, at most 30.1 mil, at most 30.3 mil, at most 30.6 mil, at most 30.9 mil, at most 31.1 mil, at most 31.3 mil, at most 31.6 mil, at most 31.9 mil, at most 32.1 mil, at most 32.3 mil, at most 32.6 mil, at most 32.9 mil, at most 33.1 mil, at most 33.3 mil, at most 33.6 mil, at most 33.9 mil, at most 34.1 mil, at most 34.3 mil, at most 34.6 mil, at most 34.9 mil, at most 35.1 mil, at most 35.3 mil, at most 35.6 mil, at most 35.9 mil, at most 36.1 mil, at most 36.3 mil, at most 36.6 mil, at most 36.9 mil, at most 37.1 mil, at most 37.3 mil, at most 37.6 mil, at most 37.9 mil, at most 38.1 mil, at most 38.3 mil, at most 38.6 mil, at most 38.9 mil, at most 39.1 mil, at most 39.3 mil, at most 39.6 mil, or at most 39.9 mil.

Block 420. Referring to block 420 of FIG. 5B, and as illustrated in FIG. 3D, in some embodiments, the method 400 includes disposing a volume of a second metal material (e.g., second metal material 340-2 of FIG. 3D, second metal material 340-2 of FIG. 4A, second metal material 340-2 of FIG. 6E, second metal material 340-2 of FIG. 7D, etc.). In some embodiments, the volume of the second metal material 340-2 is disposed at a first pressure proximate to the first surface of the channel.

Figure 4B:
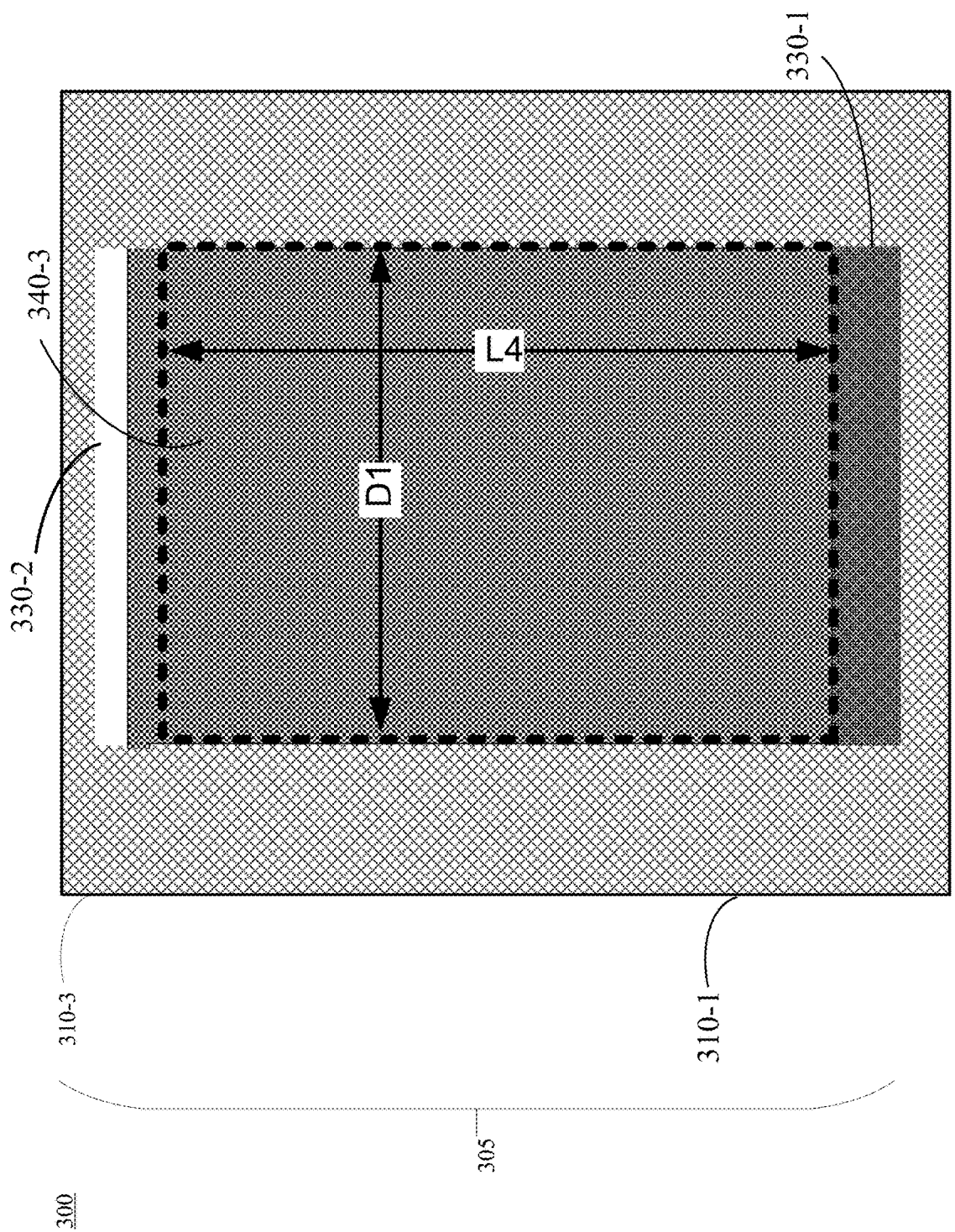
FIG. 4B illustrates yet another cross-sectional side view of an electronic device, in accordance with an embodiment of the present disclosure.

In some embodiments, the disposing of the volume of the second metal material 340-2 forms a partial interface in the channel 320 between the first metal material 340-1 and the second metal material 340-2 (e.g., partial interface 340-3 of FIG. 4B). In some embodiments, the partial interface 340-3 includes a second pressure less than the first pressure of the volume of the of the second metal material 340-2. Accordingly, in some such embodiments, the second pressure of the partial interface 340-3 allows the volume of the second metal material 340-2 to be drawn into the interior volume of the channel 320. In some embodiments, the interface with the first metal material and the second metal material is an intermetallic interface. In some embodiments, the intermetallic interface is an intermetallic matrix. In some embodiments, the intermetallic interface includes a first interfacial tension that is less than a second interfacial tension of the second metal material 340-2. In some embodiments, the intermetallic interface includes a first surface tension that is less than a second surface tension of the second metal material 340-2. Accordingly, by reducing the tension, of the second metal material 340-2 through the partial interface, the second metal material 340-2 is enabled to occupy the interior volume of the channel 320.

In some embodiments, the second metal material 340-2 includes liquid metal. In some embodiments, the liquid metal is a metal material that exists at a liquid phase at or near room temperature (e.g., at or near between 18° C. and 22° C.). In some embodiments, the second metal material 340-2 includes a gallium-based (Ga-based) alloy. For instance, in some embodiments, the second metal material 340-2 includes a gallium indium alloy (e.g., eutectic GaIn), a gallium tin alloy, a gallium indium tin alloy (e.g., Galinstan), a gallium indium tin zinc alloy, or any combination thereof. In some embodiments, the second metal material 340-2 includes more than one alloys. For instance, in some embodiments, the second metal material 340-2 includes eutectic GaIn and/or Galinstan.

In some embodiments, the second metal material 340-2 includes Ga between 25 weight percent (w %) and 95 w %, between 25 w % and 75 w %, between 25 w % and 50 w %, 50 w % and 95 w %, between 50 w % and 75 w %, or 75 w % and 95 w %. In some embodiments, the second metal material 340-2 includes Ga in at least 25 w %, at least 30 w %, at least 35 w %, at least 40 w %, at least 45 w %, at least 50 w %, at least 55 w %, at least 60 w %, at least 65 w %, at least 70 w %, at least 75 w %, at least 80 w %, at least 85 w %, at least 90 w %, or at least 95 w % of the second metal material 340-2. In some embodiments, the second metal material 340-2 includes Ga in at most 25 w %, at most 30 w %, at most 35 w %, at most 40 w %, at most 45 w %, at most 50 w %, at most 55 w %, at most 60 w %, at most 65 w %, at most 70 w %, at most 75 w %, at most 80 w %, at most 85 w %, at most 90 w %, or at most 95 w % of the second metal material 340-2.

Furthermore, in some embodiments, the second metal material 340-2 includes a metal composite polymer. In some embodiments, the second metal material 340-2 is a filament solution.

In some embodiments, the second metal material 340-2 includes an ink solution. In some embodiments, the second metal material 340-2 ink solution includes styrene isoprene styrene (SIS), styrene ethylene butylene styrene (SEBS), silicones or any combination thereof (e.g., SIS, SEBS, or the combination thereof is a solute of the ink solution of the second metal material 340-2). In some embodiments, the second metal material 340-2 ink solution includes toluene, tetrahydrofuran (THF), cycolohexane, xylene, decane, octyle acelate, or a combination thereof (e.g., toluene, THF, cycolohexane, xylene, decane, octyle acelate, or the combination thereof is a solvent of the ink solution of the second metal material 340-2).

In some embodiments, the first metal material 340-1 includes between 0.5 w % and 25 w % of the interface with the first metal material 340-1 and the second metal material 340-2. For instance, in some embodiments, the interface with the first metal material 340-1 and the second metal material 340-2 includes a composition formed by the first metal material 340-1 combined with the second metal material, in which the first metal material 340-1 includes between 0.5 w % and 25 w % of the composition formed at the interface.

For instance, in some embodiments, the first metal material 340-1 includes a w % of the interface with the first metal material 340-1 and the second metal material 340-2 between 0.5 w % and 24 w %, between 0.5 w % and 23 w %, between 0.5 w % and 22 w %, between 0.5 w % and 21 w %, between 0.5 w % and 20 w %, between 0.5 w % and 19 w %, between 0.5 w % and 18 w %, between 0.5 w % and 17 w %, between 0.5 w % and 16 w %, between 0.5 w % and 15 w %, between 0.5 w % and 14 w %, between 0.5 w % and 13 w %, between 0.5 w % and 12 w %, between 0.5 w % and 11 w %, between 0.5 w % and 10 w %, between 0.5 w % and 9 w %, between 0.5 w % and 8 w %, between 0.5 w % and 7 w %, between 0.5 w % and 6 w %, between 0.5 w % and 5 w %, between 0.5 w % and 4 w %, between 0.5 w % and 3 w %, between 0.5 w % and 2 w %, between 0.5 w % and 1 w %, between 2 w % and 24 w %, between 2 w % and 23 w %, between 2 w % and 22 w %, between 2 w % and 21 w %, between 2 w % and 20 w %, between 2 w % and 19 w %, between 2 w % and 18 w %, between 2 w % and 17 w %, between 2 w % and 16 w %, between 2 w % and 15 w %, between 2 w % and 14 w %, between 2 w % and 13 w %, between 2 w % and 12 w %, between 2 w % and 11 w %, between 2 w % and 10 w %, between 2 w % and 9 w %, between 2 w % and 8 w %, between 2 w % and 7 w %, between 2 w % and 6 w %, between 2 w % and 5 w %, between 2 w % and 4 w %, between 2 w % and 3 w %, between 4 w % and 24 w %, between 4 w % and 23 w %, between 4 w % and 22 w %, between 4 w % and 21 w %, between 4 w % and 20 w %, between 4 w % and 19 w %, between 4 w % and 18 w %, between 4 w % and 17 w %, between 4 w % and 16 w %, between 4 w % and 15 w %, between 4 w % and 14 w %, between 4 w % and 13 w %, between 4 w % and 12 w %, between 4 w % and 11 w %, between 4 w % and 10 w %, between 4 w % and 9 w %, between 4 w % and 8 w %, between 4 w % and 7 w %, between 4 w % and 6 w %, between 4 w % and 5 w %, between 6.5 w % and 24 w %, between 6.5 w % and 23 w %, between 6.5 w % and 22 w %, between 6.5 w % and 21 w %, between 6.5 w % and 20 w %, between 6.5 w % and 19 w %, between 6.5 w % and 18 w %, between 6.5 w % and 17 w %, between 6.5 w % and 16 w %, between 6.5 w % and 15 w %, between 6.5 w % and 14 w %, between 6.5 w % and 13 w %, between 6.5 w % and 12 w %, between 6.5 w % and 11 w %, between 6.5 w % and 10 w %, between 6.5 w % and 9 w %, between 6.5 w % and 8 w %, between 6.5 w % and 7 w %, between 9 w % and 24 w %, between 9 w % and 23 w %, between 9 w % and 22 w %, between 9 w % and 21 w %, between 9 w % and 20 w %, between 9 w % and 19 w %, between 9 w % and 18 w %, between 9 w % and 17 w %, between 9 w % and 16 w %, between 9 w % and 15 w %, between 9 w % and 14 w %, between 9 w % and 13 w %, between 9 w % and 12 w %, between 9 w % and 11 w %, between 9 w % and 10 w %, between 13 w % and 24 w %, between 13 w % and 23 w %, between 13 w % and 22 w %, between 13 w % and 21 w %, between 13 w % and 20 w %, between 13 w % and 19 w %, between 13 w % and 18 w %, between 13 w % and 17 w %, between 13 w % and 16 w %, between 13 w % and 15 w %, between 13 w % and 14 w %, between 16 w % and 24 w %, between 16 w % and 23 w %, between 16 w % and 22 w %, between 16 w % and 21 w %, between 16 w % and 20 w %, between 16 w % and 19 w %, between 16 w % and 18 w %, between 16 w % and 17 w %, between 18 w % and 24 w %, between 18 w % and 23 w %, between 18 w % and 22 w %, between 18 w % and 21 w %, between 18 w % and 20 w %, between 18 w % and 19 w %, between 21 w % and 24 w %, between 21 w % and 23 w %, between 21 w % and 22 w %, or between 23 w % and 24 w %.

In some embodiments, the first metal material 340-1 includes a w % of the interface with the first metal material 340-1 and the second metal material 340-2 of at least 0.5 w %, at least 1 w %, at least 1.5 w %, at least 2 w %, at least 2.5 w %, at least 3 w %, at least 3.5 w %, at least 4 w %, at least 4.5 w %, at least 5 w %, at least 5.5 w %, at least 6 w %, at least 6.5 w %, at least 7 w %, at least 7.5 w %, at least 8 w %, at least 8.5 w %, at least 9 w %, at least 9.5 w %, at least 10 w %, at least 10.5 w %, at least 11 w %, at least 11.5 w %, at least 12 w %, at least 12.5 w %, at least 13 w %, at least 13.5 w %, at least 14 w %, at least 14.5 w %, at least 15 w %, at least 15.5 w %, at least 16 w %, at least 16.5 w %, at least 17 w %, at least 17.5 w %, at least 18 w %, at least 18.5 w %, at least 19 w %, at least 19.5 w %, at least 20 w %, at least 20.5 w %, at least 21 w %, at least 21.5 w %, at least 22 w %, at least 22.5 w %, at least 23 w %, at least 23.5 w %, at least 24 w %, at least 24.5 w %, or at least 25 w % of the interface with the first metal material 340-1 and the second metal material 340-2. In some embodiments, the first metal material 340-1 includes a w % of the interface with the first metal material 340-1 and the second metal material 340-2 of at most 0.5 w %, at most 1 w %, at most 1.5 w %, at most 2 w %, at most 2.5 w %, at most 3 w %, at most 3.5 w %, at most 4 w %, at most 4.5 w %, at most 5 w %, at most 5.5 w %, at most 6 w %, at most 6.5 w %, at most 7 w %, at most 7.5 w %, at most 8 w %, at most 8.5 w %, at most 9 w %, at most 9.5 w %, at most 10 w %, at most 10.5 w %, at most 11 w %, at most 11.5 w %, at most 12 w %, at most 12.5 w %, at most 13 w %, at most 13.5 w %, at most 14 w %, at most 14.5 w %, at most 15 w %, at most 15.5 w %, at most 16 w %, at most 16.5 w %, at most 17 w %, at most 17.5 w %, at most 18 w %, at most 18.5 w %, at most 19 w %, at most 19.5 w %, at most 20 w %, at most 20.5 w %, at most 21 w %, at most 21.5 w %, at most 22 w %, at most 22.5 w %, at most 23 w %, at most 23.5 w %, at most 24 w %, at most 24.5 w %, or at most 25 w % of the interface with the first metal material 340-1 and the second metal material 340-2.

Block 422. Referring to block 422, in some embodiments, a second width of the volume of the second metal material 340-2 is greater than, or greater than or equal to, a first with D1 of the channel 320. For instance, in some such embodiments, the second width of the volume of the second metal material 340-2 is greater than, or greater than or equal to, the first with D1 of the channel 320 due to a contact angle between the second metal material 340-2 and a surface of the channel 320, which prevents the volume of the second metal material 340-2 from being drawn into the interior volume of the channel 320. In some embodiments, the second metal material 340-2 is prevented from being drawn into the interior volume of the channel 320 until the second metal material 340-2 interfaces with the first metal material 340-1 in order to decrease the width of the volume of the second metal material 340-2, such as by reducing a surface tension of the volume of the second metal material 340-2.

Block 424. Referring to block 424, in some embodiments, the first pressure is a laplace pressure of the second metal material 340-2. For instance, in some embodiments, the laplace pressure of the second metal material 340-2 is a difference between an internal pressure of the second metal material 340-2, such as an interior pressure of the second metal material 340-2, and an external pressure of the second metal material 340-2, such as an exterior pressure applied to a boundary of the second metal material 340-2.

Block 426. Referring to block 426, in some embodiments, the second pressure is a laplace pressure of the partial interface 340-3 between the first metal material 340-1 and the second metal material 340-2. For instance, in some embodiments, the laplace pressure of the partial interface 340-3 is a difference between the internal pressure of the second metal material 340-2, the external pressure of the second metal material 340-2, an internal pressure of the first metal material 340-1, an external pressure of the first metal material 340-1, or a combination thereof. Accordingly, this partial interface 340-3 removes, or inhibits, a laplace barrier formed by the laplace pressure, such that a surface energy of the second metal material 340-2 is reduced, which allows the second metal material 340-2 to be drawn into the channel 320.

Block 428. Referring to block 428, in some embodiments, the disposing the volume of the second metal material 340-2 utilizes an additive manufacture apparatus (e.g., additive manufacture apparatus 250 of FIG. 1).

As a non-limiting example, in some embodiments, the volume of the second metal material 340-2 is disposed by the additive manufacture apparatus 250 at a traverse rate (e.g., nozzle velocity) between 0.5 millimeters per second (mm/s) and 100 mm/s, between 0.5 mm/s and 90 mm/s, between 0.5 mm/s and 80 mm/s, between 0.5 mm/s and 70 mm/s, between 0.5 mm/s and 60 mm/s, between 0.5 mm/s and 50 mm/s, between 0.5 mm/s and 40 mm/s, between 0.5 mm/s and 30 mm/s, between 0.5 mm/s and 20 mm/s, between 0.5 mm/s and 15 mm/s, between 0.5 mm/s and 10 mm/s, between 0.5 mm/s and 5 mm/s, between 2 mm/s and 100 mm/s, between 2 mm/s and 90 mm/s, between 2 mm/s and 80 mm/s, between 2 mm/s and 70 mm/s, between 2 mm/s and 60 mm/s, between 2 mm/s and 50 mm/s, between 2 mm/s and 40 mm/s, between 2 mm/s and 30 mm/s, between 2 mm/s and 20 mm/s, between 2 mm/s and 15 mm/s, between 2 mm/s and 10 mm/s, between 2 mm/s and 5 mm/s, between 8 mm/s and 100 mm/s, between 8 mm/s and 90 mm/s, between 8 mm/s and 80 mm/s, between 8 mm/s and 70 mm/s, between 8 mm/s and 60 mm/s, between 8 mm/s and 50 mm/s, between 8 mm/s and 40 mm/s, between 8 mm/s and 30 mm/s, between 8 mm/s and 20 mm/s, between 8 mm/s and 15 mm/s, between 8 mm/s and 10 mm/s, between 18 mm/s and 100 mm/s, between 18 mm/s and 90 mm/s, between 18 mm/s and 80 mm/s, between 18 mm/s and 70 mm/s, between 18 mm/s and 60 mm/s, between 18 mm/s and 50 mm/s, between 18 mm/s and 40 mm/s, between 18 mm/s and 30 mm/s, between 18 mm/s and 20 mm/s, between 25 mm/s and 100 mm/s, between 25 mm/s and 90 mm/s, between 25 mm/s and 80 mm/s, between 25 mm/s and 70 mm/s, between 25 mm/s and 60 mm/s, between 25 mm/s and 50 mm/s, between 25 mm/s and 40 mm/s, between 25 mm/s and 30 mm/s, between 40 mm/s and 100 mm/s, between 40 mm/s and 90 mm/s, between 40 mm/s and 80 mm/s, between 40 mm/s and 70 mm/s, between 40 mm/s and 60 mm/s, between 40 mm/s and 50 mm/s, between 50 mm/s and 100 mm/s, between 50 mm/s and 90 mm/s, between 50 mm/s and 80 mm/s, between 50 mm/s and 70 mm/s, between 50 mm/s and 60 mm/s, between 60 mm/s and 100 mm/s, between 60 mm/s and 90 mm/s, between 60 mm/s and 80 mm/s, between 60 mm/s and 70 mm/s, between 85 mm/s and 100 mm/s, or between 85 mm/s and 90 mm/s.

In some embodiments, the volume of the second metal material 340-2 is disposed by the additive manufacture apparatus 250 at a traverse rate of at least 1 mm/s, at least 2 mm/s, at least 4 mm/s, at least 6 mm/s, at least 8 mm/s, at least 10 mm/s, at least 10 mm/s, at least 12 mm/s, at least 14 mm/s, at least 16 mm/s, at least 18 mm/s, at least 20 mm/s, at least 22 mm/s, at least 24 mm/s, at least 26 mm/s, at least 28 mm/s, at least 30 mm/s, at least 32 mm/s, at least 34 mm/s, at least 36 mm/s, at least 38 mm/s, at least 40 mm/s, at least 42 mm/s, at least 44 mm/s, at least 46 mm/s, at least 48 mm/s, at least 50 mm/s, at least 52 mm/s, at least 54 mm/s, at least 56 mm/s, at least 58 mm/s, at least 60 mm/s, at least 62 mm/s, at least 64 mm/s, at least 66 mm/s, at least 68 mm/s, at least 70 mm/s, at least 72 mm/s, at least 74 mm/s, at least 76 mm/s, at least 78 mm/s, at least 80 mm/s, at least 82 mm/s, at least 84 mm/s, at least 86 mm/s, at least 88 mm/s, at least 90 mm/s, at least 92 mm/s, at least 94 mm/s, at least 96 mm/s, at least 98 mm/s, or at least 100 mm/s. In some embodiments, the volume of the second metal material 340-2 is disposed by the additive manufacture apparatus 250 at a traverse rate of at most 1 mm/s, at most 2 mm/s, at most 4 mm/s, at most 6 mm/s, at most 8 mm/s, at most 10 mm/s, at most 10 mm/s, at most 12 mm/s, at most 14 mm/s, at most 16 mm/s, at most 18 mm/s, at most 20 mm/s, at most 22 mm/s, at most 24 mm/s, at most 26 mm/s, at most 28 mm/s, at most 30 mm/s, at most 32 mm/s, at most 34 mm/s, at most 36 mm/s, at most 38 mm/s, at most 40 mm/s, at most 42 mm/s, at most 44 mm/s, at most 46 mm/s, at most 48 mm/s, at most 50 mm/s, at most 52 mm/s, at most 54 mm/s, at most 56 mm/s, at most 58 mm/s, at most 60 mm/s, at most 62 mm/s, at most 64 mm/s, at most 66 mm/s, at most 68 mm/s, at most 70 mm/s, at most 72 mm/s, at most 74 mm/s, at most 76 mm/s, at most 78 mm/s, at most 80 mm/s, at most 82 mm/s, at most 84 mm/s, at most 86 mm/s, at most 88 mm/s, at most 90 mm/s, at most 92 mm/s, at most 94 mm/s, at most 96 mm/s, at most 98 mm/s, or at most 100 mm/s.

Block 430. Referring to block 430, in some embodiments, the additive manufacture apparatus 250 includes a binder jetting mechanism, a material extrusion mechanism, a material jetting mechanism, a polyjet mechanism, a powder bed mechanism, a sheet lamination mechanism, vat photopolymerization mechanism, or a combination thereof.

In some embodiments, a first additive manufacture apparatus 250-1 is utilized to dispose the volume of the second metal material 340-2 via a direct writing printing pattern, a stencil printing pattern, a screen-printing pattern, or a combination thereof. In some embodiments, a second additive manufacture apparatus 250-2 is utilized to dispose a volume of the first metal material 340-1 via a direct writing printing pattern, a stencil printing pattern, a screen-printing pattern, or a combination thereof. In some embodiments, the second additive manufacture apparatus 250-2 is different than the first additive manufacture apparatus 250-1.

Block 432. Referring to block 432 of FIG. 5C, in some embodiments, the method 400 includes sealing the channel 320. In some embodiments, the sealing of the channel 320 form a deformable electrical communication between the first circuit component 310-1 and the second circuit component 310-2, such as through the second metal material 340-2 drawn into the interior volume of the channel 320 by the partial interface 340-3 when disposed proximate to the first metal material 340-1.

Block 434. Referring to block 434, in some embodiments, the method 400 further includes, prior to the sealing the channel 320, disrupting a second surface of the partial interface 340-3 between the first metal material 340-1 and the second metal material 340-2. In some embodiments, this disrupting causes a layer of an oxidized second metal material 340-2 that is formed at the second surface to disperse, such as within an interior (e.g., body) of the second metal material 340-2. In some embodiments, the layer of the oxidized second metal material 340-2 is disrupted by disposing a volume of an acidic or basic solution to the second metal material 340-2. For instance, in some embodiments, a sodium hydroxide (NaOH) solution was utilized to disrupt the layer of the oxidized second metal material 340-2. In some embodiments, the NaOH solution was utilized at concentration of about 1 mol per Liter.

Block 436. Referring to block 436, in some embodiments, a first thermal resistance per unit area of the oxide second metal material 340-2 is greater than a second thermal resistance per unit area of the second metal material 340-1. Accordingly, a conductivity of the deformable electrical communication between the first circuit component 310-1 and the second circuit component 310-2 is improved by the method 400.

Block 438. Referring to block 438, in some embodiments, the sealing the channel 320 includes encapsulating the channel 320 with a third material different than the first metal material 340-1 and the second metal material 340-2. For instance, in some embodiments, the third material is a metal or metalloid material. In some embodiments, the third material includes Si.

Now that details regarding processes for forming a deformable electronic communication have been described in accordance with various embodiments of the present disclosure above, details regarding some processes in accordance with FIGS. 14 through 27 are described. Specifically, FIGS. 14 through 27 illustrate a flow chart of methods for forming circuit with a deformable electrical communication, in accordance with embodiments of the present disclosure.

Figure 14:
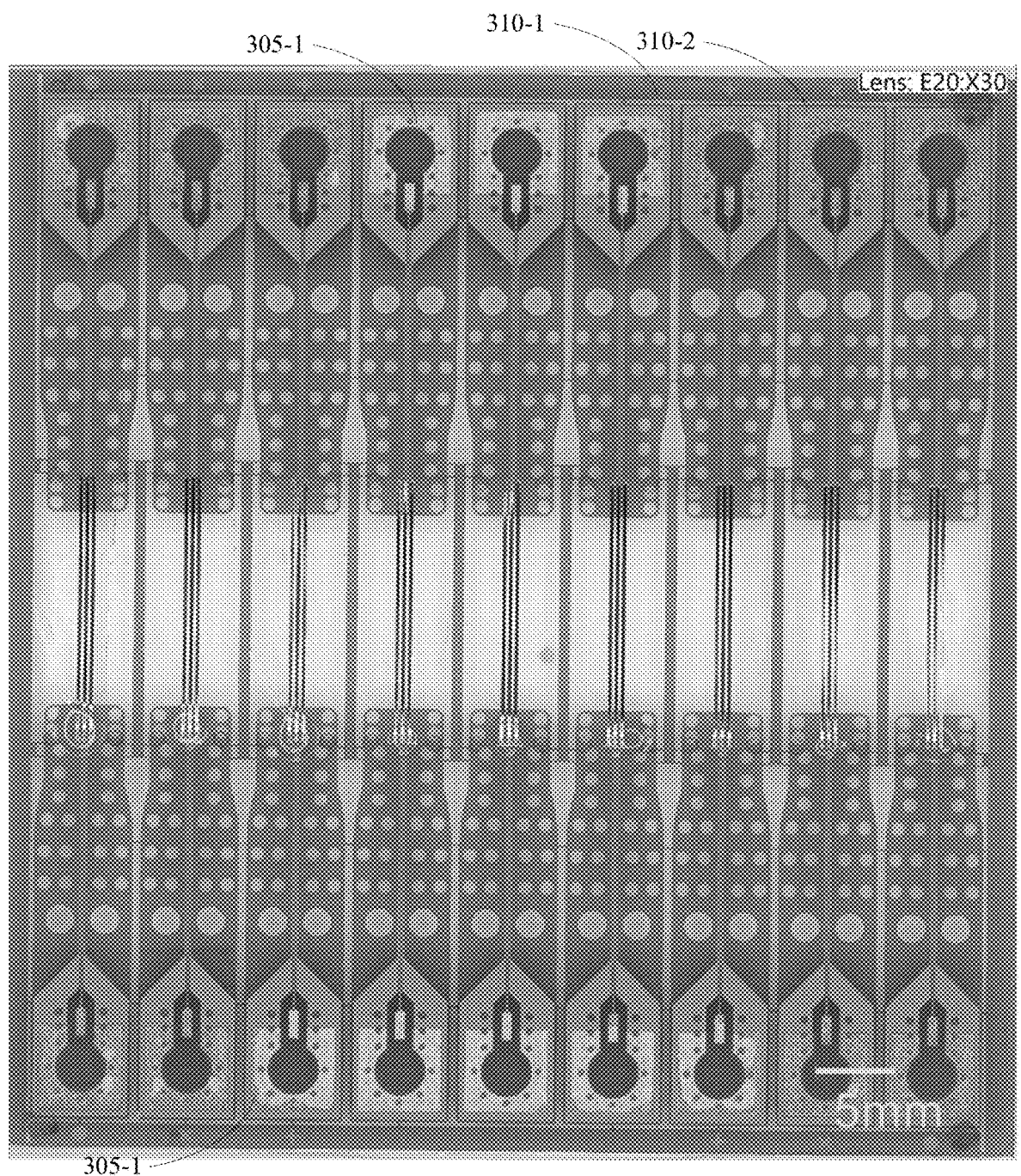
FIG. 14 illustrates a view of a circuit of a deformable substrate of an electronic device, in accordance with an embodiment of the present disclosure.

Referring to FIG. 14, a view of an electronic device 300 is provided, in which the electronic device 300 includes a circuit 305 with a deformable substrate 302, in accordance with an embodiment of the present disclosure.

In some embodiments, the systems and methods of the present disclosure provide for fabrication of the electronic device 300, such that high density liquid metal circuit components (e.g., interconnects, traces, etc.) are provided to interface with FPCs 306 to achieve stretchability of the electronic device 300.

Figure 15:
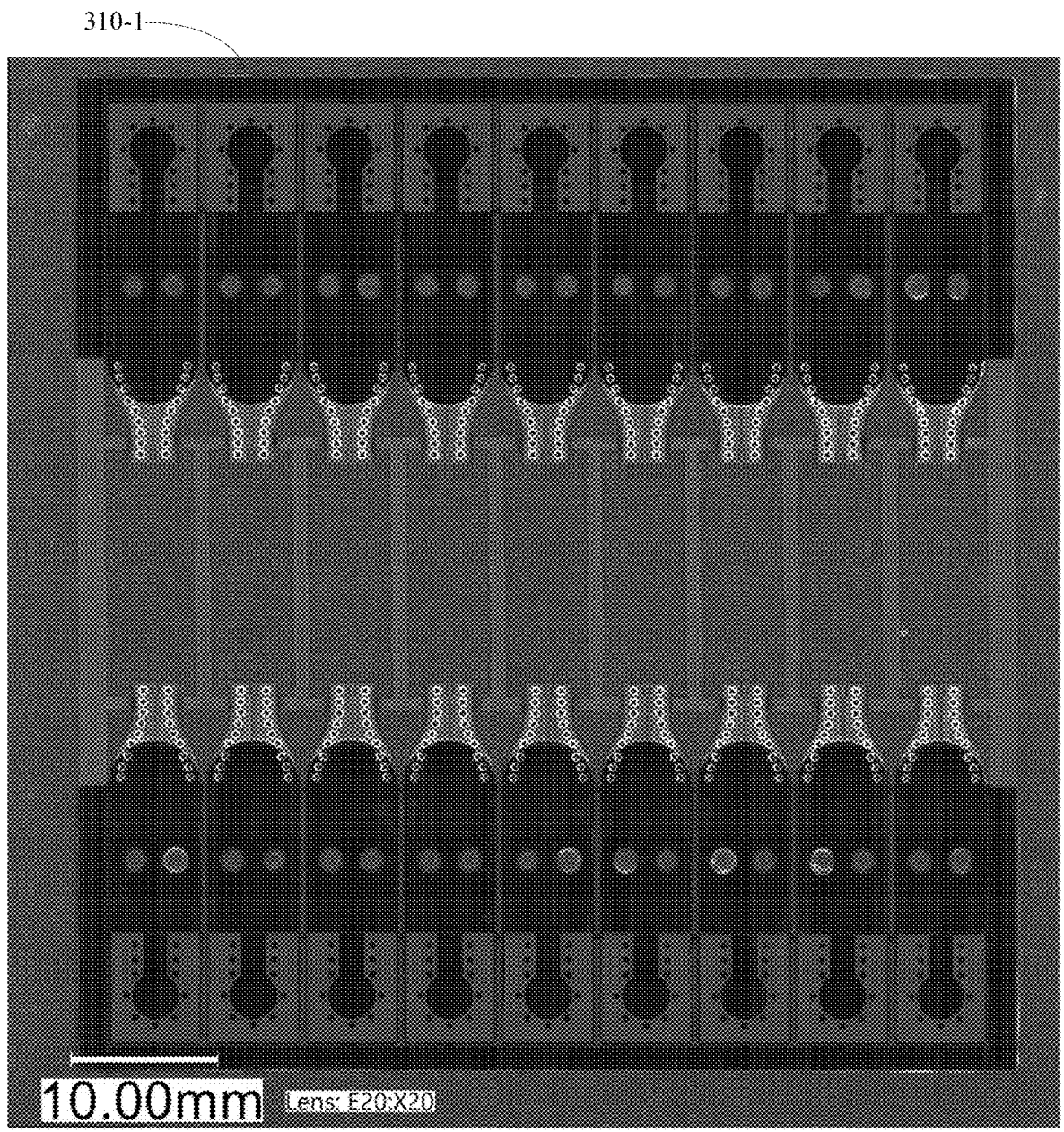
FIG. 15 illustrates a view of a first layer of a circuit of a deformable substrate of electronic device, in accordance with an embodiment of the present disclosure.
Figure 16C:
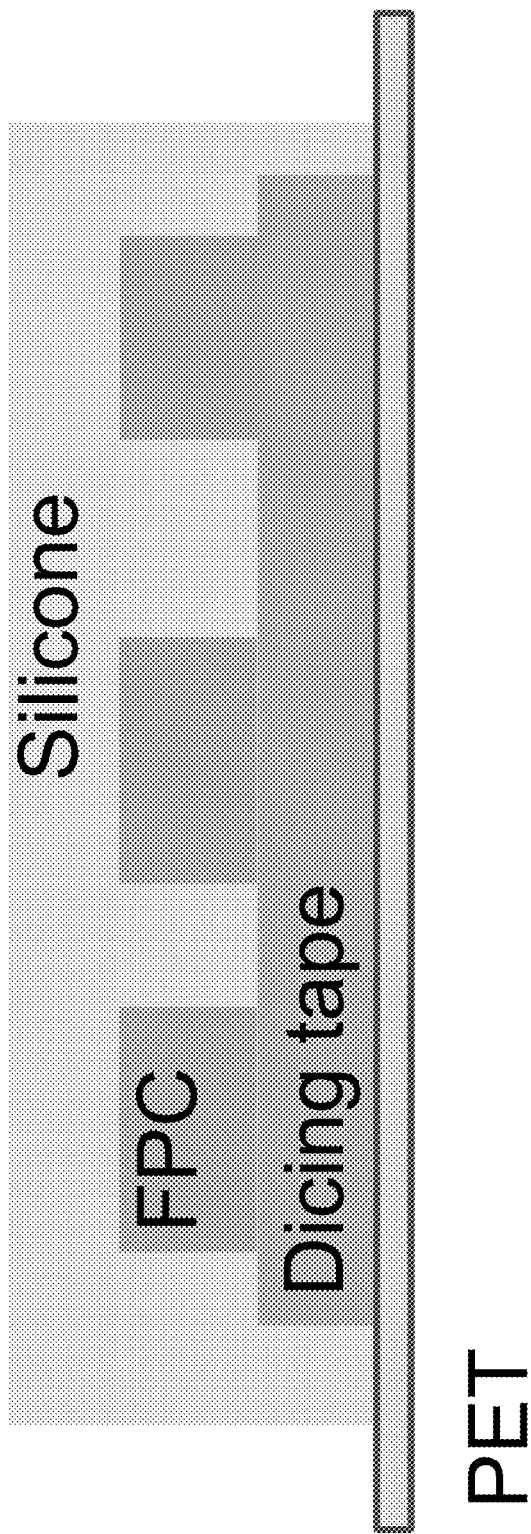
Figure 16D:
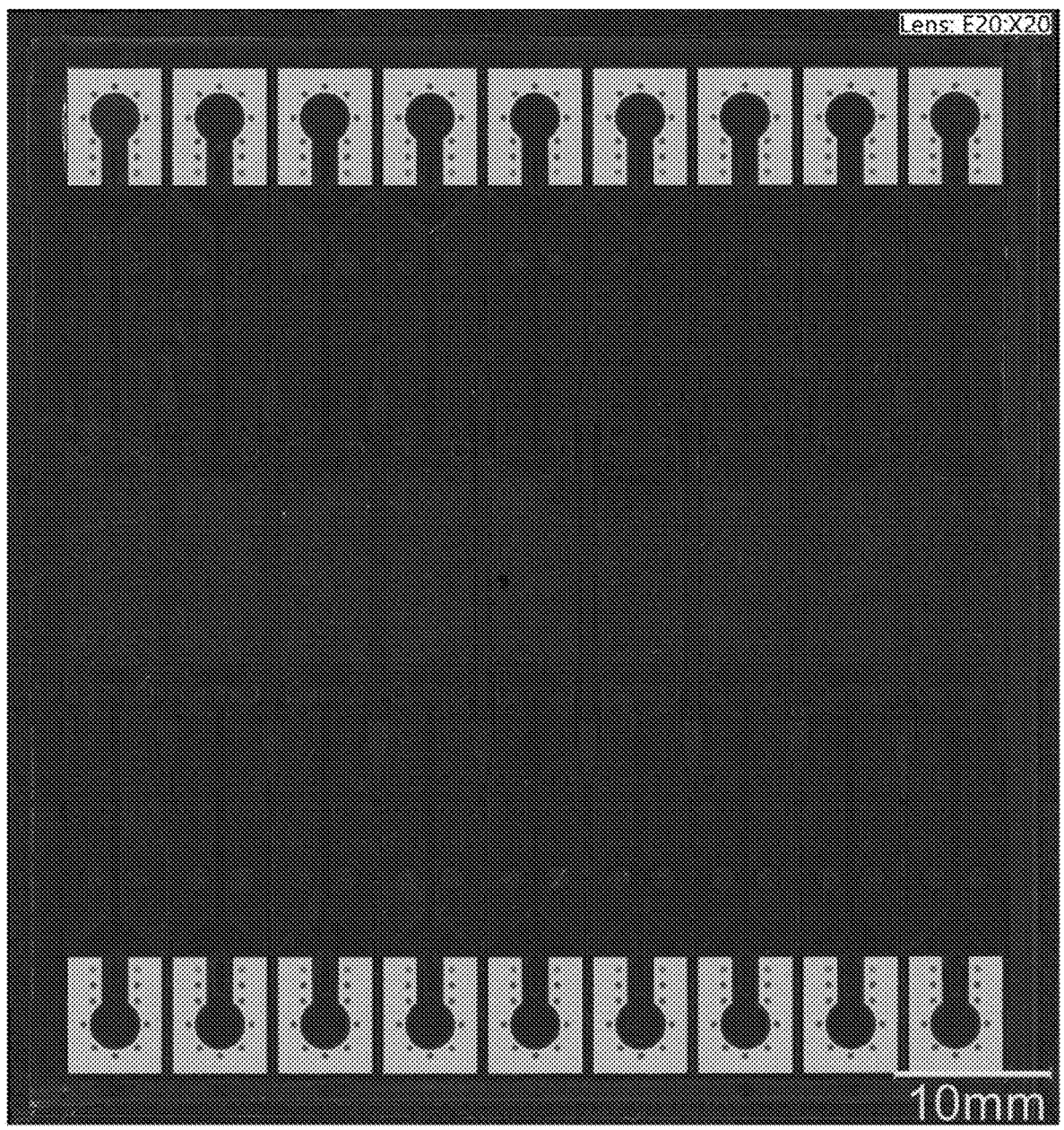

Referring to FIG. 15, a view of a first layer 310-1 of the circuit 305 with the deformable substrate 302 for the electronic device 300 is provided, in accordance with an embodiment of the present disclosure.

In some embodiments, the first layer 310-1 of the circuit is formed as a wafer. In some embodiments, the first layer 310-1 of the circuit 305 is utilized to encapsulate an FPC 306.

In some embodiments, the first layer 310-1 is formed by dehydrating polyimide for a first period of time at a first temperature. In some embodiments, the first period of time is about 20 minutes. In some embodiments, the first temperature is about 130° C.

In some embodiments, the dehydrated polyimide exposed to plasma. For instance, in some embodiments, the dehydrated polyimide is exposed to a plasma oven mechanism that is configured to expel plasma at a first wattage for a second period of time at first flow rate. In some embodiments, the first wattage is about 250 watts (W). In some embodiments the first wattage is between 100 W and 500 W. In some embodiments, the second period of time is about 10 minutes. In some embodiments, the second period of time is between 5 minutes and 20 minutes. In some embodiments, the first flow rate is about 12 standard cubic centimeters per minute (SCCM) or about 3 SCCM. In some embodiments, the first flow rate is between 2 SCCM and 5 SCCM. In some embodiments, the plasma includes oxygen ($O_2$) and tetrafluoromethane ($CF_4$). As a non-limiting example, in some embodiments, the dehydrated polyimide is exposed to the plasma oven mechanism that is configured to expel plasma including $O_2$ at 12 SCCM and $CF_4$ at 3 SCCM a first wattage of 250 W for a second period of time of 10 minutes, which forms an exposed PI.

In some embodiments, some or all of the exposed PI is submerged in a solution for a third period of time in order to silanization a surface of the exposed PI. In some embodiments, the solution includes 3-mercaptopropyl)trimethoxysilane (MPTMS). In some embodiments, the solution includes a concentration of 1% MPTMS. In some embodiments, the third period of time is about 50 minutes. In some embodiments the third period of time is between 30 minutes and 70 minutes. In some embodiments, the submerging of the exposed PI forms a silanized PI.

In some embodiments, the silanized PI is laminated on a first surface and/or a second surface, which forms a laminated layer 310. For instance, in some embodiments, the salinized PI is laminated using double-sided dicing tape. In some embodiments, the double dicing tape is UC-228 W-110, which is provided by Furukawa Electric Co., LTD, Chiyoda City, Tokyo, Japan.

In some embodiments, the laminated layer 310 is disposed in an oven (e.g., heater mechanism) for a fourth period of time at a third temperature, which produced a heated layer 310. In some embodiments, the fourth period of time is about 20 minutes. In some embodiments the fourth period of time is between 10 minutes and 35 minutes. In some embodiments, the third temperature is about 80° C. In some embodiments, the third temperature is between 70° C. and 90° C.

In some embodiments, the heated layer 310 is exposed to plasma. For instance, in some embodiments, the heated layer is exposed to a plasma oven mechanism that is configured to expel plasma at a second wattage for a fifth period of time at first flow rate. In some embodiments, the second wattage is about 60 W. In some embodiments, the second wattage is between 40 W and 80 W. In some embodiments, the fifth period of time is about 30 seconds. In some embodiments, the fifth period of time is between 10 second and 55 seconds. In some embodiments, the plasma includes oxygen ($O_2$). As a non-limiting example, in some embodiments, the heated layer is exposed to the plasma oven mechanism that is configured to expel plasma including $O_2$ at the second wattage of 60 W for the fifth period of time of 30 second, which forms a baked layer 310.

In some embodiments, the baked layer 310 has a layer of a material disposed on a surface of the baked layer 310, which forms a coated layer 310. For instance, in some embodiments, the baked layer 310 is coated with a single layer of a solution. In some embodiments, the single layer is about 250 μm thick. In some embodiments, the single layer is between 50 μm and 150 μm thick. In some embodiments, the solution includes a first portion of silicon solute. In some embodiments, the solution includes a second part of solvent. For instance, in some embodiments, the solution includes a first portion of Bluesil and a second portion of OS-2.

In some embodiments, the coated layer is cured for a sixth period of time at a second temperature. In some embodiments, the second temperature is room temperature or ambient temperature. For instance, in some such embodiments, the room temperature or ambient temperature is from about 20° C. to about 25° C. In some embodiments, the sixth period of time in a number of minutes, hours or days.

Referring to FIGS. 16A, 16B, 16C, and 16D, an exemplary method for fabricating a first layer 310-1 of a circuit 305 with a deformable substrate 3052 for an electronic device 300 is provided, in accordance with an embodiment of the present disclosure.

In some embodiments, the first layer 310-1 of the circuit is formed as a wafer. In some embodiments, the first layer 310-1 of the circuit 305 is utilized to encapsulate an FPC 306.

In some embodiments, the first layer 310-1 is formed by dehydrating polyimide for a first period of time at a first temperature. In some embodiments, the first period of time is about 20 minutes. In some embodiments, the first period of time is between 10 minutes and 35 minutes. In some embodiments, the first temperature is about 130° C. In some embodiments, the first temperature between 110° C. and 140° C.

In some embodiments, the dehydrated polyimide is exposed to plasma. For instance, in some embodiments, the dehydrated polyimide is exposed to a plasma oven mechanism that is configured to expel plasma at a first wattage for a second period of time at first flow rate. In some embodiments, the first wattage is about 250 watts (W). In some embodiments, the first wattage is between 100 W and 500 W. In some embodiments, the second period of time is about 10 minutes. In some embodiments, the second period of time is between 5 minutes and 20 minutes. In some embodiments, the first flow rate is about 12 standard cubic centimeters per minute (SCCM) or about 3 SCCM. In some embodiments, the first flow rate is between 2 SCCM and 5 SCCM. In some embodiments, the plasma includes oxygen ($O_2$) and tetrafluoromethane ($CF_4$). As a non-limiting example, in some embodiments, the dehydrated polyimide is exposed to the plasma oven mechanism that is configured to expel plasma including $O_2$ at 12 SCCM and $CF_4$ at 3 SCCM a first wattage of 250 W for a second period of time of 10 minutes, which forms an exposed PI.

In some embodiments, some or all of the exposed PI is submerged in a solution for a third period of time in order to silanization a surface of the exposed PI. In some embodiments, the solution includes 3-mercaptopropyl)trimethoxysilane (MPTMS). In some embodiments, the solution includes a concentration of 1% of MPTMS. In some embodiments, the third period of time is about 50 minutes. In some embodiments, the third period of time is between 30 minutes and 70 minutes. In some embodiments, the submerging of the exposed PI forms a silanized PI.

In some embodiments, the silanized PI is laminated on a first surface and/or a second surface, which forms a laminated layer 310. For instance, in some embodiments, the salinized PI is laminated using double-sided dicing tape. For instance, in some embodiments, the double dicing tape is UC-228 W-110, which is provided by Furukawa Electric Co., LTD, Chiyoda City, Tokyo, Japan.

In some embodiments, the laminated layer 310 has a layer of a material disposed on a surface of the laminated layer 310, which forms a coated layer 310. For instance, in some embodiments, the laminated layer 310 is coated with a single layer of a material. In some embodiments, the single layer is about 100 μm thick. In some embodiments, the single layer is between 50 μm and 150 μm thick. In some embodiments, the material includes a first portion of Bluesil.

In some embodiments, the coated layer 310 is cured for a sixth period of time at a second temperature. In some embodiments, the second temperature is room temperature or ambient temperature. For instance, in some such embodiments, the room temperature or ambient temperature is from about 20° C. to about 25° C. In some embodiments the sixth period of time in a number of minutes, hours or days.

Figure 17A:
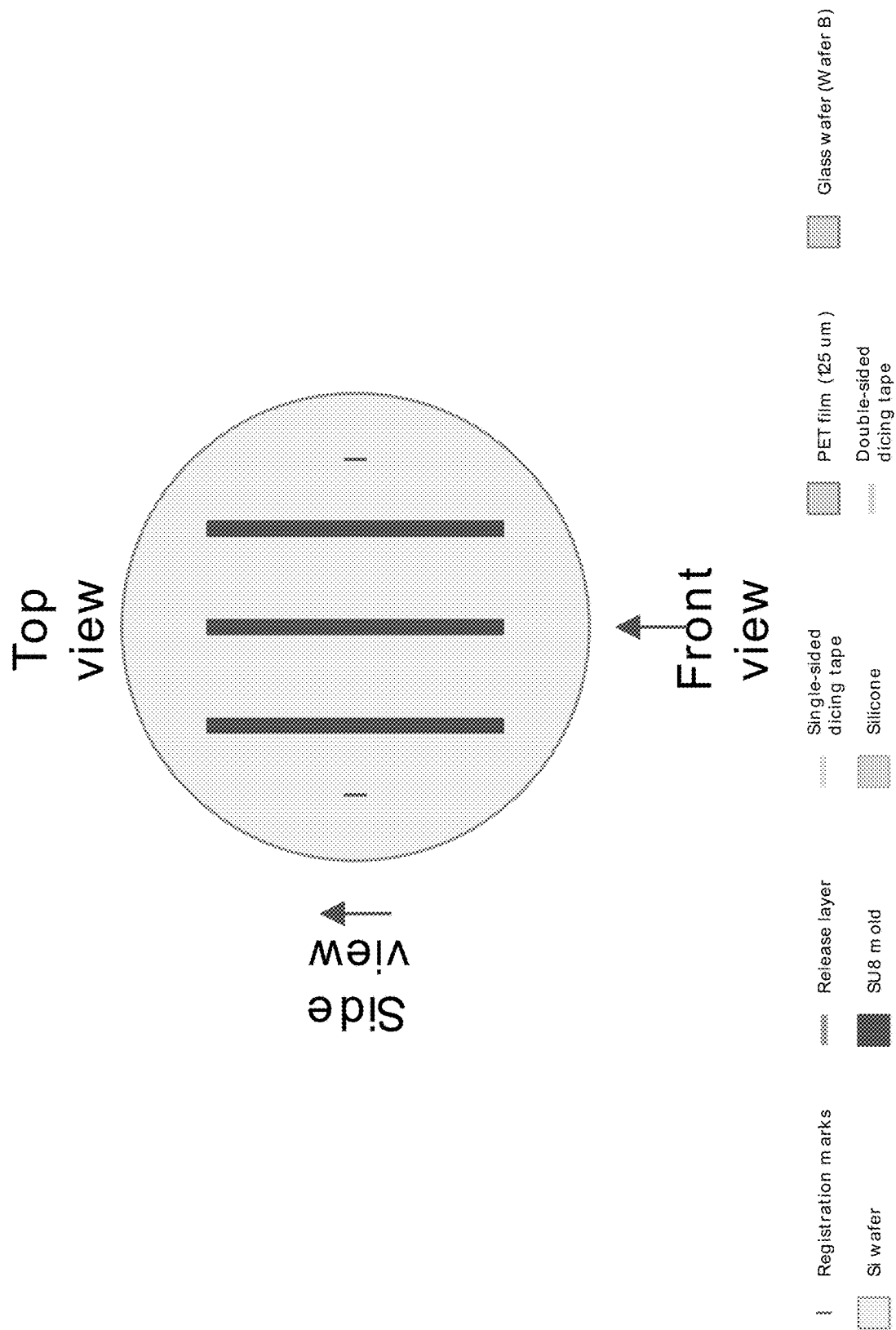
FIGS. 17A, 17B, and 17C collectively illustrate an exemplary method for fabricating a second layer of a circuit of a deformable substrate of an electronic device, in accordance with an embodiment of the present disclosure.
Figure 17B:
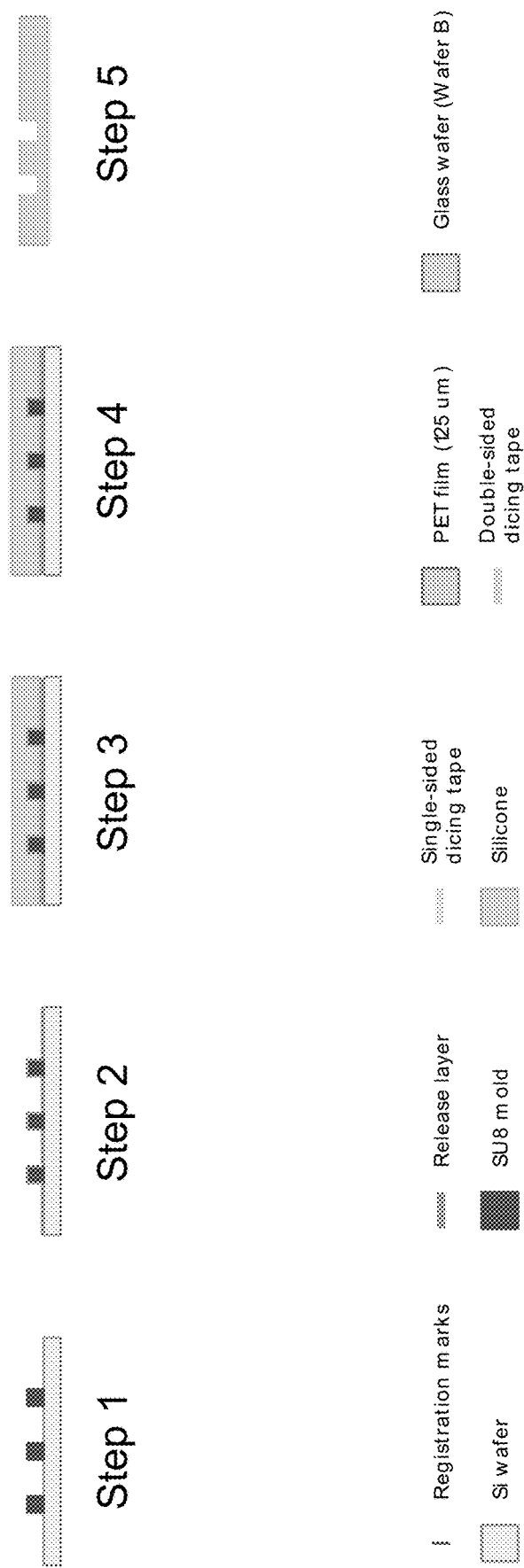
Figure 17C:
Figure 18A:
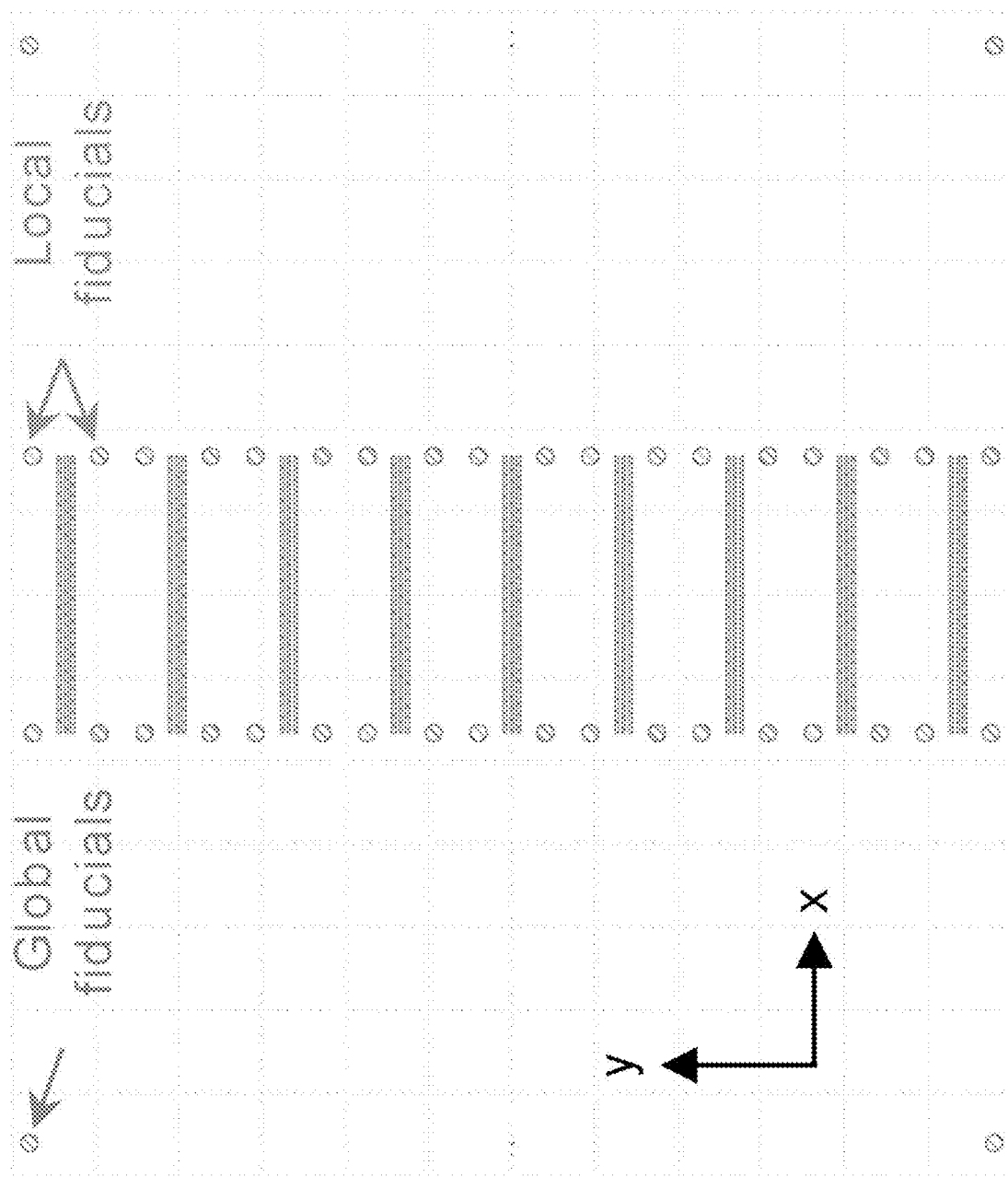
FIGS. 18A, 18B, 18C, and 18D collectively illustrate an exemplary method for fabricating one or more circuit components of a circuit of a deformable substrate of an electronic device, in accordance with an embodiment of the present disclosure.
Figure 18B:
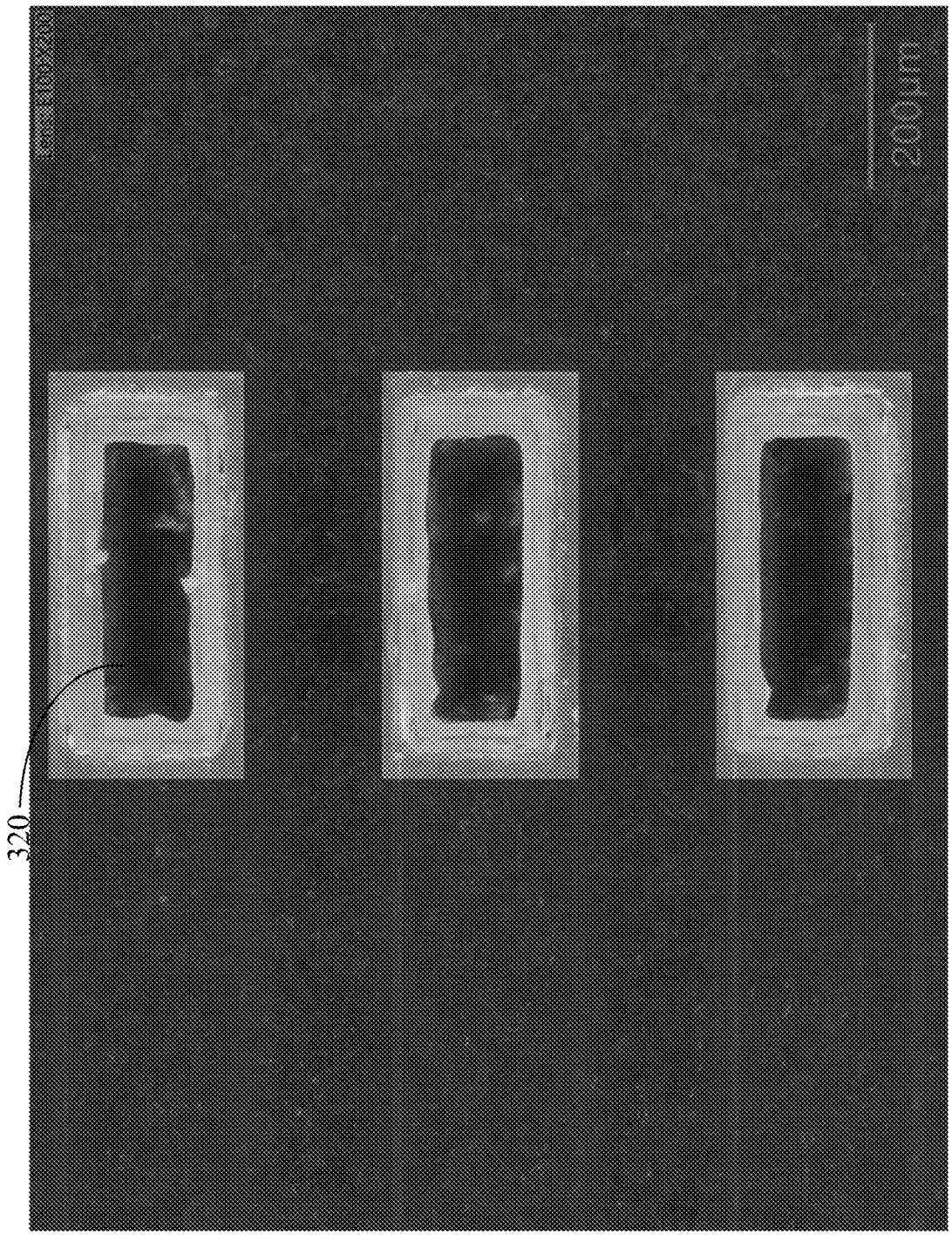
Figure 18C:
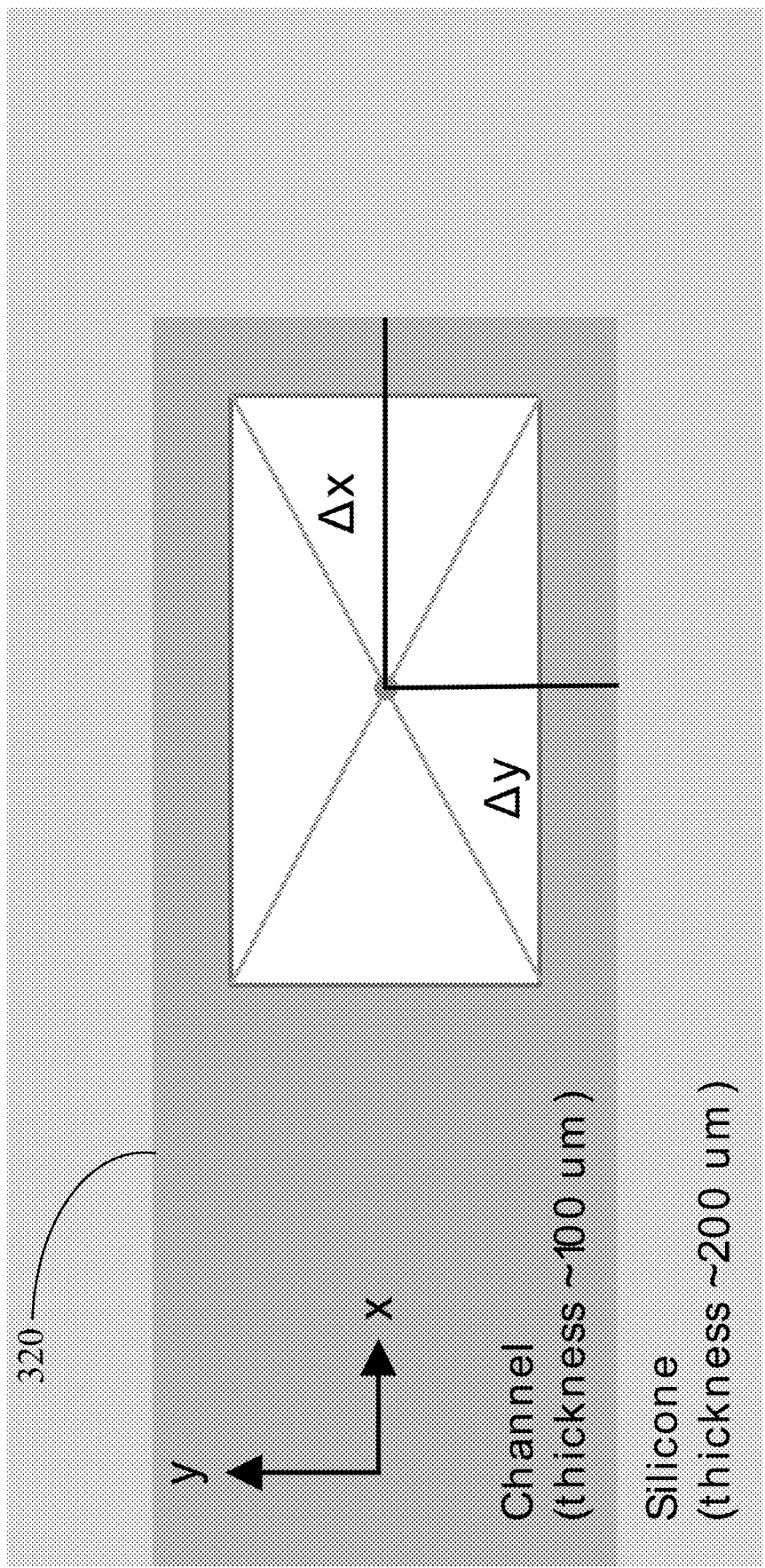
Figure 18D:
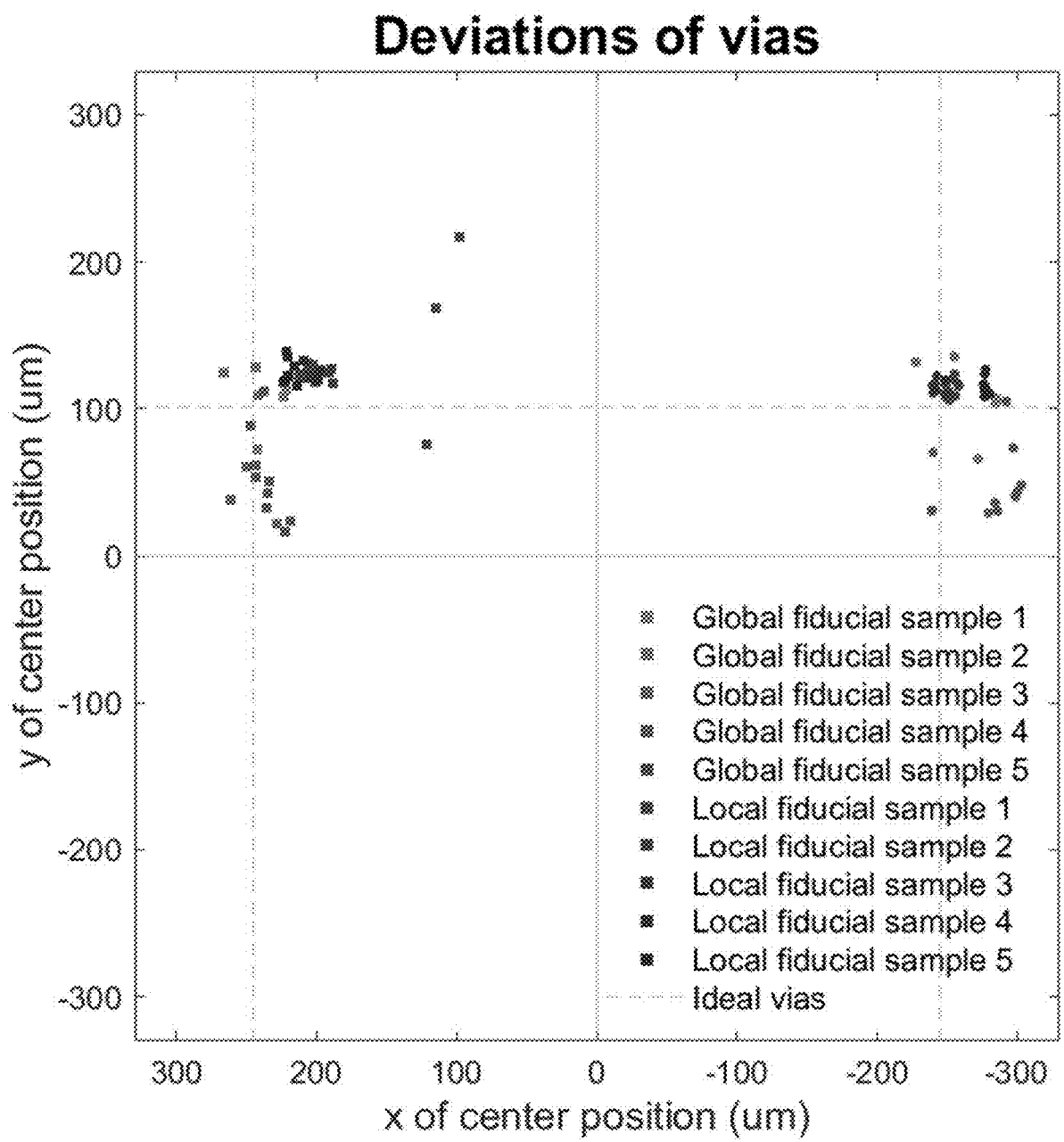

Referring to FIGS. 17A, 17B, and 17C, an exemplary method for fabricating a second layer 310-2 of a circuit 305 with a deformable substrate 302 for an electronic device 300 is provided, in accordance with an embodiment of the present disclosure.

Referring to step 1 of FIG. 17B, in some embodiments, the second layer 310-2 is formed as a wafer. For instance, in some embodiments, the second layer 310-2 is formed using a mold fabrication technique, such as an SU-8 mold fabrication technique, which forms a base of the second layer 310-2. Additional details and information regarding the SU-8 mold technique is found at Elveflow, "How to Make an Expoxy Su-8 Mold? The SU-8 mold fabrication process: Tips and Tricks," Elveflow, available at elveflow.com/microfluidic-reviews/soft-lithography-microfabrication/su-8-mold-lithography/ (accessed Sep. 27, 2023), which is hereby incorporated by reference in its entirety.

Referring to step 2, in some embodiments, a second layer of material is disposed on an upper surface of the base of the second layer 310-2, which forms a coated second layer 310-2. For instance, in some embodiments, the second layer of material is configured to selectively decouple from the upper surface of the base of the second layer 310-2 or another surface.

Referring to step 3, in some embodiments, a third layer of material is disposed on an upper surface of the coated second layer 310-2, which forms a cured second layer 310-2. For instance, in some embodiments, the third layer of material includes silicon, which is applied with a thickness of about 200 μm to the upper surface of the coated second layer 310-2. In some embodiments, the third layer of material is configured to cure on the upper surface of the coated second layer 310-2, such as via uninhibited curing. However, the present disclosure is not limited thereto.

Referring to step 4, in some embodiments, a layer of carrier material is disposed on an upper surface of the cured second layer 310-2. For instance, in some embodiments, the layer of carrier material includes single-sided dicing tape. In some embodiments, the layer of carrier material is disposed on the upper surface of the cured second layer 310-2 when the third later of material is fully cured.

Referring to step 5, in some embodiments, the cured second layer 310-2 is decoupled (e.g., from the based layer of the second layer 310-2, which was formed via the SU8 mold.

Referring to steps 6 and 7, in some embodiments, one or more end portions of a channel is formed using a drilling technique, which allows for creating vias that correspond with one or more circuit components 330. For instance, in some embodiments, a first end portion of a first channel is formed and a second end portion of the first channel is formed opposing the first end portion of the channel. In some embodiments, the drilling technique includes exposing a portion of a surface of the second layer 310-2 to a laser pulse (e.g., a picosecond-short laser pulse), which forms the one or more end portions of the channel. In some embodiments, the laser pulse has a wavelength of about 515 nanometers (nm). Additional details and information regarding the drilling technique is found at LPFK, "Specialist for Material-Friendly Processing: LPKF ProtoLaser R4," LPKF Laser & Electronics, available at lpkf.com/fileadmin/media-files/user_upload/products/pdf/DQ/flyer_lpkf_protolaser_r4_en.pdf (accessed Sep. 27, 2023).

Referring to step 8, in some embodiments, the channel 320 is sealed by displaying a fourth layer of material, which forms a sealed second layer 310-1. For instance, in some embodiments, the fourth layer of material includes silicon (e.g., inhibited silicon) disposed on a PET film.

Referring to step 9, in some embodiments, the sealed second layer 310-2 is disposed in an oven (e.g., a heater mechanism) that is configured to cure the sealed second layer 310-2, thereby forming a cured second layer 310-2. In some embodiments, the sealed second layer 310-2 is disposed in the over for a period of time at a predetermined temperature. In some embodiments, the period of time is about 20 minutes. In some embodiments, the predetermined temperature is about 100° C.

In some embodiments, the layer of carrier material is decoupled from the cured second layer 310-2. For instance, in some embodiments, after curing in the oven, the layer of carrier material that includes the single sided dicing tape is removed from the surface of the second layer 310-2, which forms an exposed surface of the second layer 310-2.

Referring to step 10, in some embodiments, one or more filling ports of each channel and/or one or more posts is formed on, or through, the second layer 310-1. In some embodiments, the one or more filling portions and/or the one or more posts is formed using a drilling technique, such as the LPKF R4 drilling technique. In some embodiments, the one or more filling ports are configured to receive a liquid metal material. In some embodiments, the one or more posts is configured to couple with a corresponding mating mechanism of a mechanical jig (e.g., mechanical jig 1910 of FIG. 19B).

Referring to step 11, in some embodiments, once the one or more ports and/or the one or more posts is formed, the second layer 310-2 is disposed on a second layer of carrier double-sided dicing tape/glass wafer (Wafer B) using the mechanical jig 1910. In some embodiments, excessive material at an edge portion of the second layer 310-1 is removed from the second layer 310-2, which forms the second layer 310-1 in the wafer shape. For instance, in some embodiments, excess PET is trimmed from around the edge portion of the second layer 310-2.

Referring to FIGS. 18A, 18B, 18C, and 18D, an exemplary method for fabricating one or more circuit components 330 of a circuit 305 with a deformable substrate 302 for an electronic device 300 is provided, in accordance with an embodiment of the present disclosure.

In some embodiments, the one or more circuit components 330 include the channel 320. In some embodiments, the one or more circuit components 330 include one or more lines, one or more vias or any combination of one or more lines and one or more vias that form an interconnect. However, the present disclosure is not limited thereto.

In some embodiments, one or more vias is formed on the second layer 310-2 using a drilling technique, such as the LPKF R4 drilling technique. In some embodiments, an upper surface of the second layer 310-2 is exposed to one or more laser pulses. For instance, in some embodiments, the one or more vias is formed by exposing the upper surface of the second layer 310-2 to a laser having a laser power of 0.5 W and a pulse frequency of 150 kilohertz (kHz). In some embodiments, the one or more vias is formed by exposing the upper surface of the second layer 310-2 to about 180 pulses of the laser having the laser power of 0.5 W and the pulse frequency of 150 kHz. However, the present disclosure is not limited thereto.

In some embodiments, the systems and methods of the present disclosure provide for quantifying an alignment of the one or more vias of the channel 320.

In some embodiments, the systems and methods of the present disclosure quantify the alignment of the one or more vias by determining a bounding box that surrounds a corresponding via.

In some embodiments, the systems and methods of the present disclosure quantify the alignment of the one or more vias by determining a center point of the bounding box that surrounds the corresponding via.

In some embodiments, the systems and methods of the present disclosure quantify the alignment of the one or more vias by determining a distance between a first edge portion of the channel 320 and a second edge portion of the channel 320. In some embodiments, the first edge portion opposes the second edge portion of the channel 320.

Figure 19A:
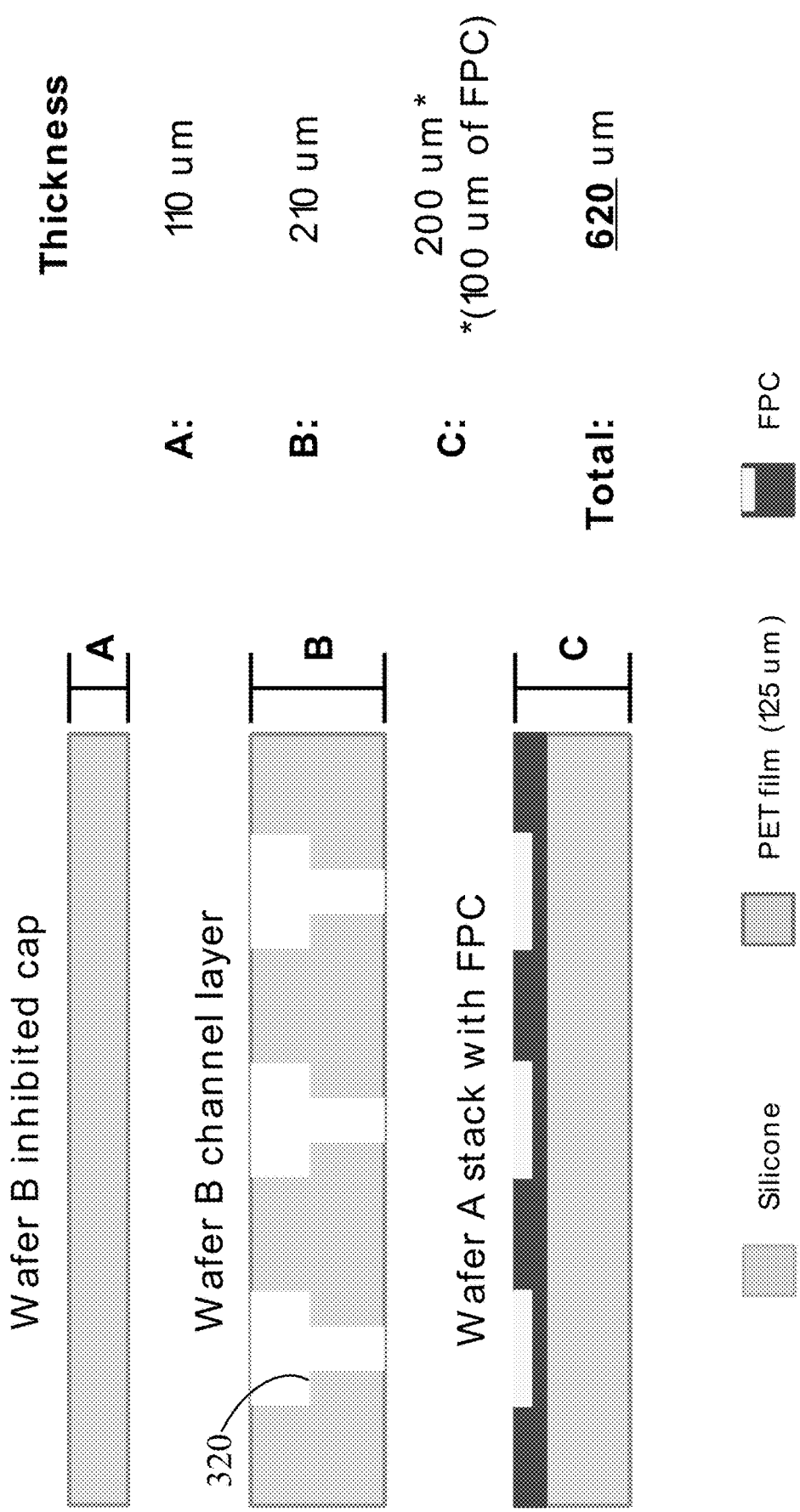
FIGS. 19A, 19B, and 19C collectively illustrate an exemplary method for coupling a plurality of layers of a circuit of a deformable substrate in order to form an electronic device, in accordance with an embodiment of the present disclosure.
Figure 19B:
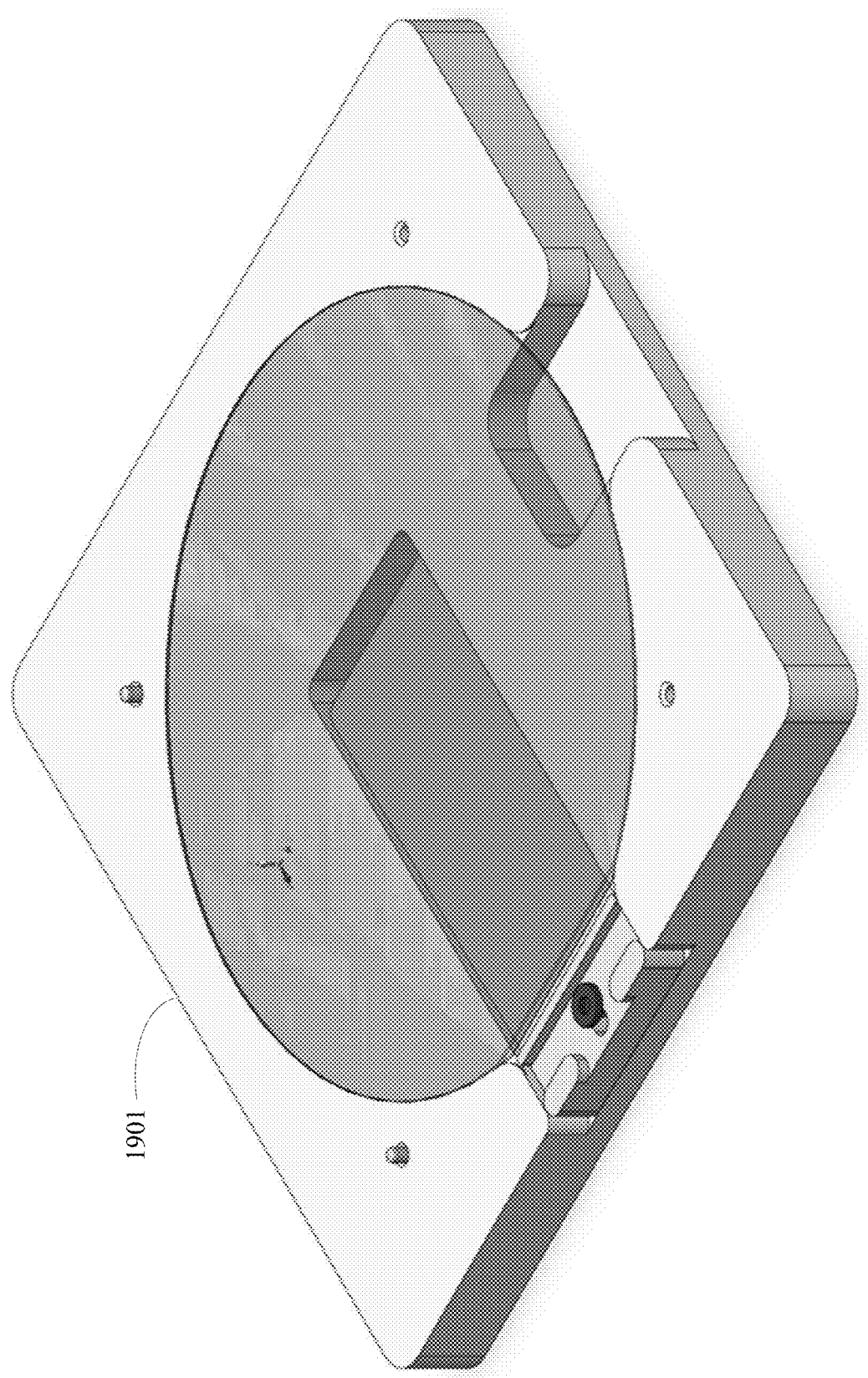
Figure 19C:
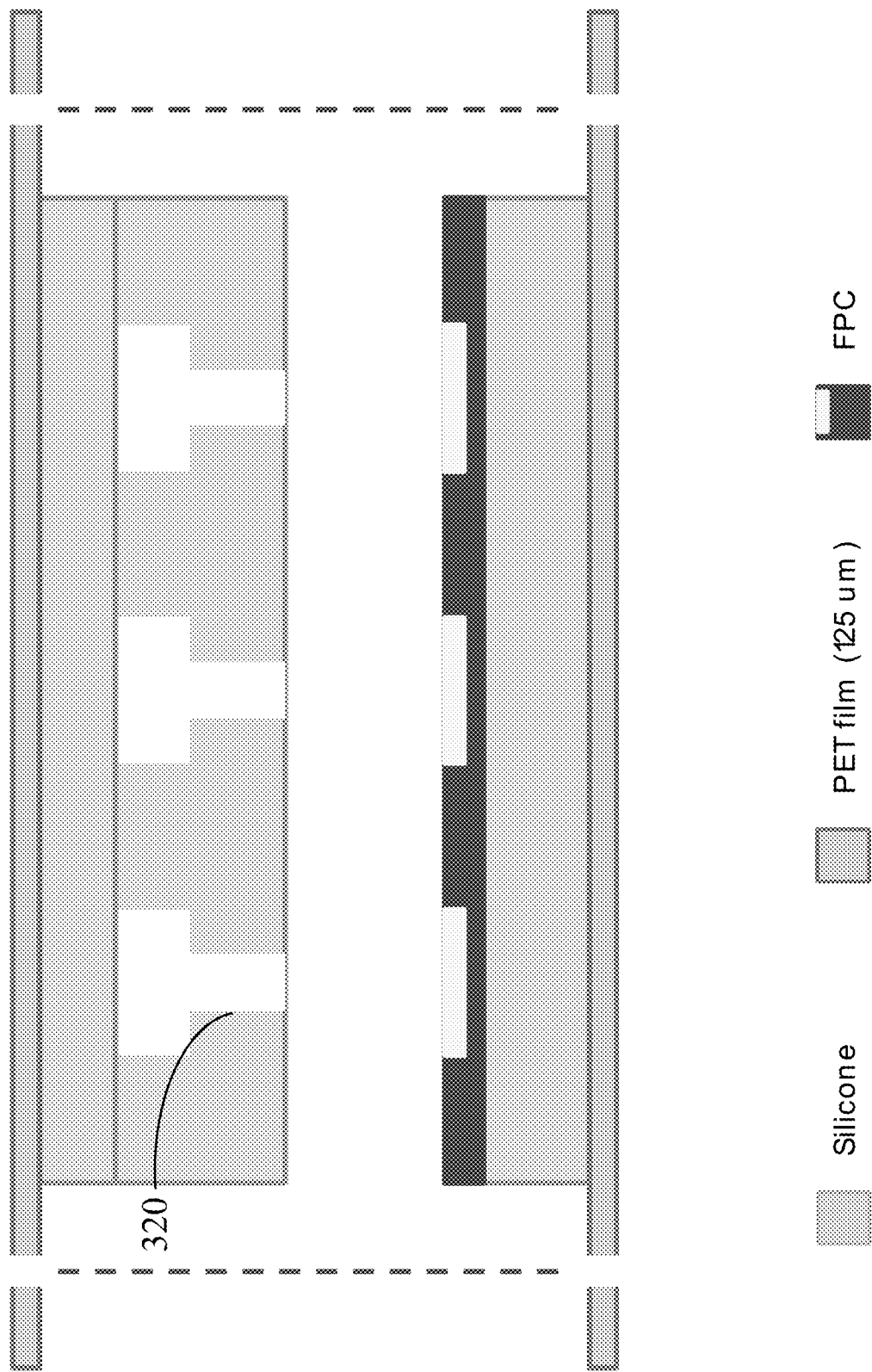

Referring to FIGS. 19A, 19B, and 19C, an exemplary method for coupling a plurality of layers (e.g., first layer 310-1 of FIGS. 14 through 16D, second layer 310-2 of FIGS. 17A through 18D, etc.) of a circuit 305 with a deformable substrate 302 for an electronic device 300 is provided, in accordance with an embodiment of the present disclosure.

In some embodiments, the first layer 310-1 is exposed to plasma, which forms an exposed first layer 310-1. For instance, in some embodiments, the first layer 310-1 is exposed to a plasma oven mechanism that is configured to expel plasma at a wattage for a period of time. In some embodiments, the wattage is about 200 W. In some embodiments the wattage is between 150 W and 250 W. In some embodiments, the period of time is about 3 minutes. In some embodiments, the period of time is between 1 minute and 6 minutes. In some embodiments, the plasma includes oxygen ($O_2$). As a non-limiting example, in some embodiments, the first layer 310-1 of the circuit 305 is exposed to the plasma oven mechanism that is configured to expel plasma including $O_2$ at the wattage of 200 W for the period of time of 3 minutes, which forms the exposed first layer 310-1.

In some embodiments, some or all of the exposed first layer 310-1 is submerged in a solution for a period of time in order to silanization a surface of the exposed first layer 310-1. In some embodiments, the solution includes 3-mercaptopropyl)trimethoxysilane (MPTMS). In some embodiments, the solution includes about 1% concentration of MPTMS. In some embodiments, the period of time is about 60 minutes. In some embodiments, the submerging of the exposed first layer 310-1 forms a silanized first layer 310-1.

In some embodiments, the second layer 310-2 is exposed to plasma, which forms an exposed second layer 310-2. For instance, in some embodiments, the second layer 310-2 is exposed to a plasma oven mechanism that is configured to expel plasma at a wattage for a period of time. In some embodiments, the wattage is about 50 W. In some embodiments the wattage is between 25 W and 75 W. In some embodiments, the period of time is about 1 minutes. In some embodiments, the period of time is between 30 seconds and 90 seconds. In some embodiments, the plasma includes oxygen ($O_2$). As a non-limiting example, in some embodiments, the second layer 310-2 of the circuit 305 is exposed to the plasma oven mechanism that is configured to expel plasma including $O_2$ at a wattage of 50 W for the period of time of 1 minutes, which forms the exposed second layer 310-2.

In some embodiments, some or all of the exposed second layer 310-2 is submerged in a solution for a period of time in order to silanization a surface of the exposed second layer 310-2. In some embodiments, the solution includes 3-mercaptopropyl)trimethoxysilane (MPTMS). In some embodiments, the solution includes about 1% concentration of 3-Glycidoxypropyltrimethoxysilane (GPTMS). In some embodiments, the period of time is about 40 minutes. In some embodiments the period of time is between 30 minutes and 50 minutes. In some embodiments, the submerging of the exposed second layer 310-2 forms a silanized second layer 310-2.

In some embodiments, the silanized first layer 310-1 and the silanized second layer 310-2 are disposed on the mechanical jig 1920, which aligns the silanized first layer 310-1 and the silanized second layer 310-2 in order to form a plurality of aligned layers 310 of the circuit 305. For instance, in some embodiments, a portion of the silanized first layer 310-1 and a portion of the silanized second layer 310-2 are aligned in accordance with a mating to the one or more posts of the mechanism job 1910. However, the present disclosure is not limited thereto.

In some embodiments, the plurality of aligned layers 310 is coupled by bonding a first surface of the silanized first layer 310-1 and a second surface of the silanized second layer 310-2. In some such embodiments, the first surface of the silanized first layer 310-1 and the second surface of the silanized second layer 310-2 are opposing surfaces. However, the present disclosure is not limited thereto. In some embodiments, the bonding of the silanized first layer 310-1 and the silanized second layer 310-2 is performed by exposing the plurality of aligned layers 310 to a pressure and a temperature for a period of time. In some embodiments, the pressure is about 60 pounds per square inch (PSI). In some embodiments, the pressure is between 40 PSI and 80 PSI. In some embodiments, the temperature is about 80° C. In some embodiments, the temperature between 60° C. and 100° C. In some embodiments, the period of time is about 24 hours. In some embodiments, the period of time is between 12 hours and 36 hours.

Figure 20:
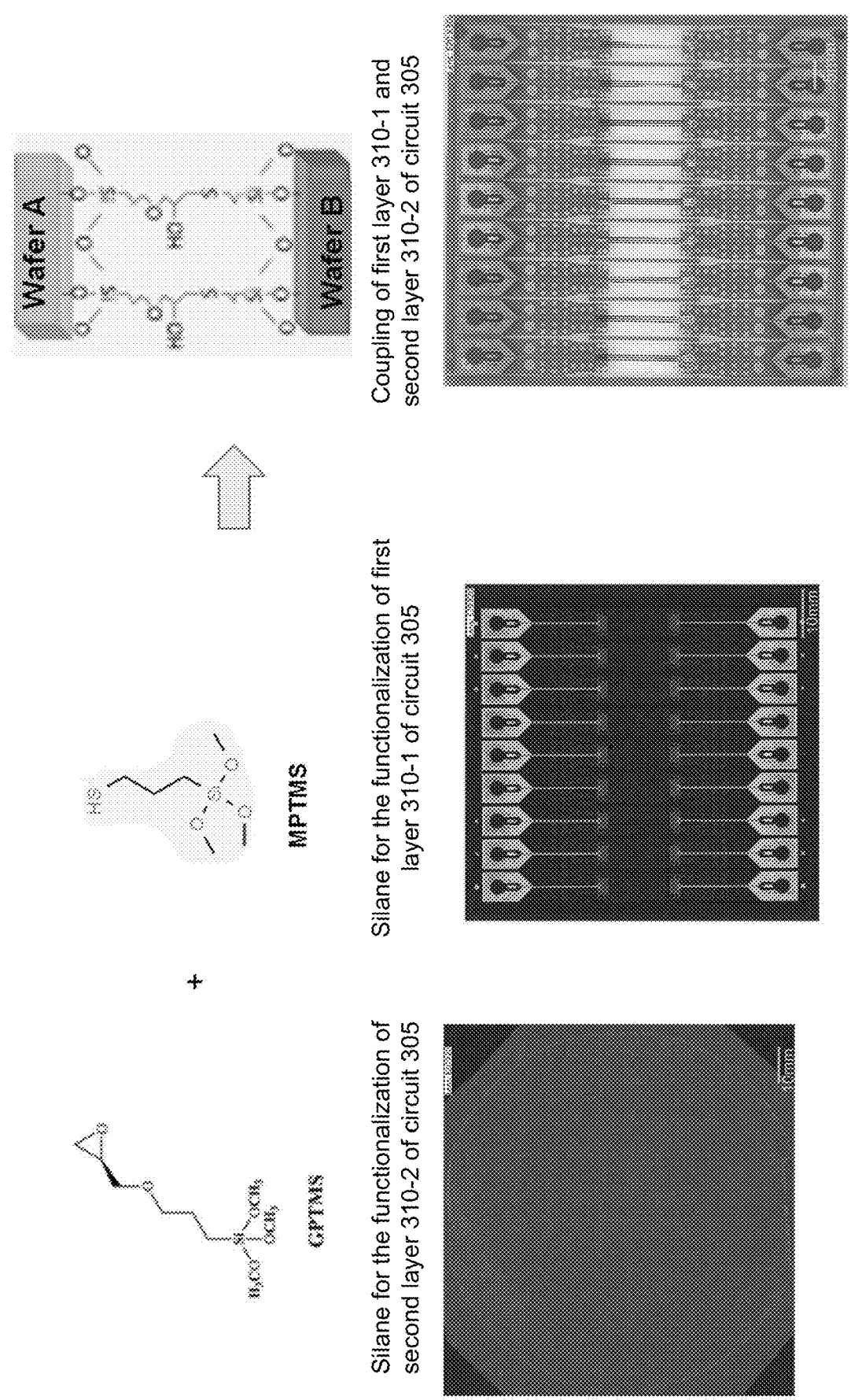
FIG. 20 illustrates another exemplary method for coupling a plurality of layers of a circuit of a deformable substrate in order to form an electronic device, in accordance with an embodiment of the present disclosure.

Referring to FIG. 20, an exemplary method for coupling a plurality of layers (e.g., first layer 310-1 of FIGS. 14 through 16D, second layer 310-2 of FIGS. 17A through 18D, layers 310 of FIGS. 19A through 19C, etc.) of a circuit 305 with a deformable substrate 302 for an electronic device 300 is provided, in accordance with an embodiment of the present disclosure.

Figure 21A:
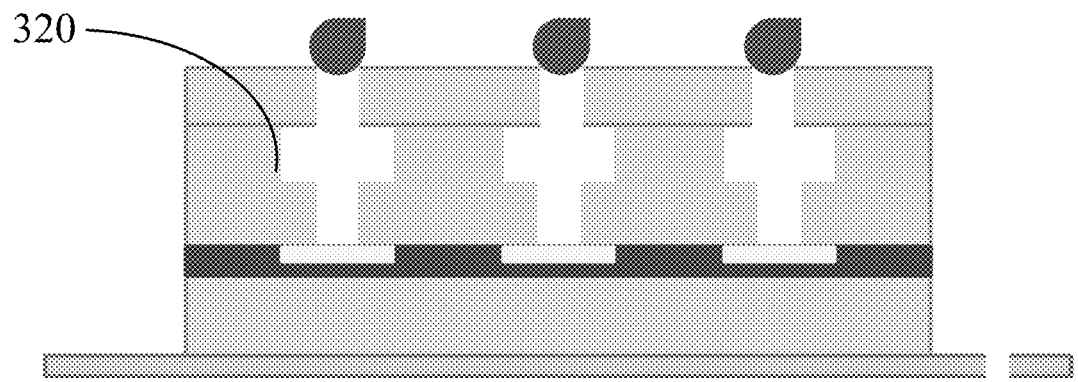
FIGS. 21A and 21B collectively illustrate an exemplary method for forming an interface between a first circuit component and a second circuit component of a circuit of a deformable substrate of an electronic device, in accordance with an embodiment of the present disclosure.
Figure 21B:
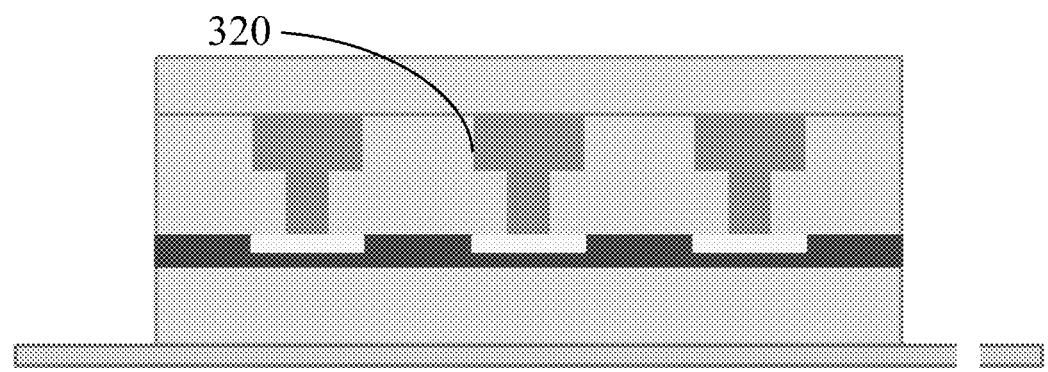

Referring to FIGS. 21A and 21B, an exemplary method for forming an interface between a first circuit component 330-1 and a second circuit component 330-2 of a circuit 305 with a deformable substrate 302 for an electronic device 300 is provided, in accordance with an embodiment of the present disclosure.

In some embodiments, after coupling the plurality of layers 310 together (e.g., bonding of the silanized first layer 310-1 and the silanized second layer 310-2 of FIGS. 19A through 19C, coupling of first layer 310-1 and second layer 310-2 of FIG. 20, etc.), the circuit 305 is disposed in a sealed chamber. In some embodiments, the sealed chamber has an interior pressure that is less than atmospheric pressure. In some embodiments, the sealed chamber is maintained at a vacuum or substantially at a vacuum.

In some embodiments, a second material is disposed at an upper portion of the circuit, such as an edge portion of a via and/or a respective filling port in the one or more filing ports. For instance, in some embodiments, the second material includes gallium, which is disposed on the upper portion of the via and/or the respective filling port.

In some embodiments, after a predetermined period of time being maintained at the first pressure, gas accommodated by the channel 320 of the circuit 305 is removed from an interior of the channel 320. Accordingly, when the chamber is opened (e.g., the interior pressure is brought to equilibrium with the atmospheric pressure), the second material is drawn into the volume of the channel 320 in order to substantially occupy the volume of the channel. However, the present disclosure is not limited thereto. In some embodiments, the predetermined period of time is about 30 minutes. In some embodiments, the predetermined period of time between 15 minutes and 45 minutes.

In some embodiments, some or all of the second material that is above an opening of the via and/or the respective filing port is removed from the circuit 305. For instance, in some embodiments, excess of the second material is removed from the circuit. In some embodiments, once the excess of the second material is removed, the filling ports and/or the via is sealed by disposing a silicon material over the opening, such as by disposing a layer of Bluesil having a thickness of about 200 μm. In some embodiments, once the excess of the second material is removed, the filling ports and/or the via is sealed by disposing a silicon material over the opening, such as by disposing a layer of Bluesil having a thickness of between 100 μm and 300 μm.

Figure 22A:
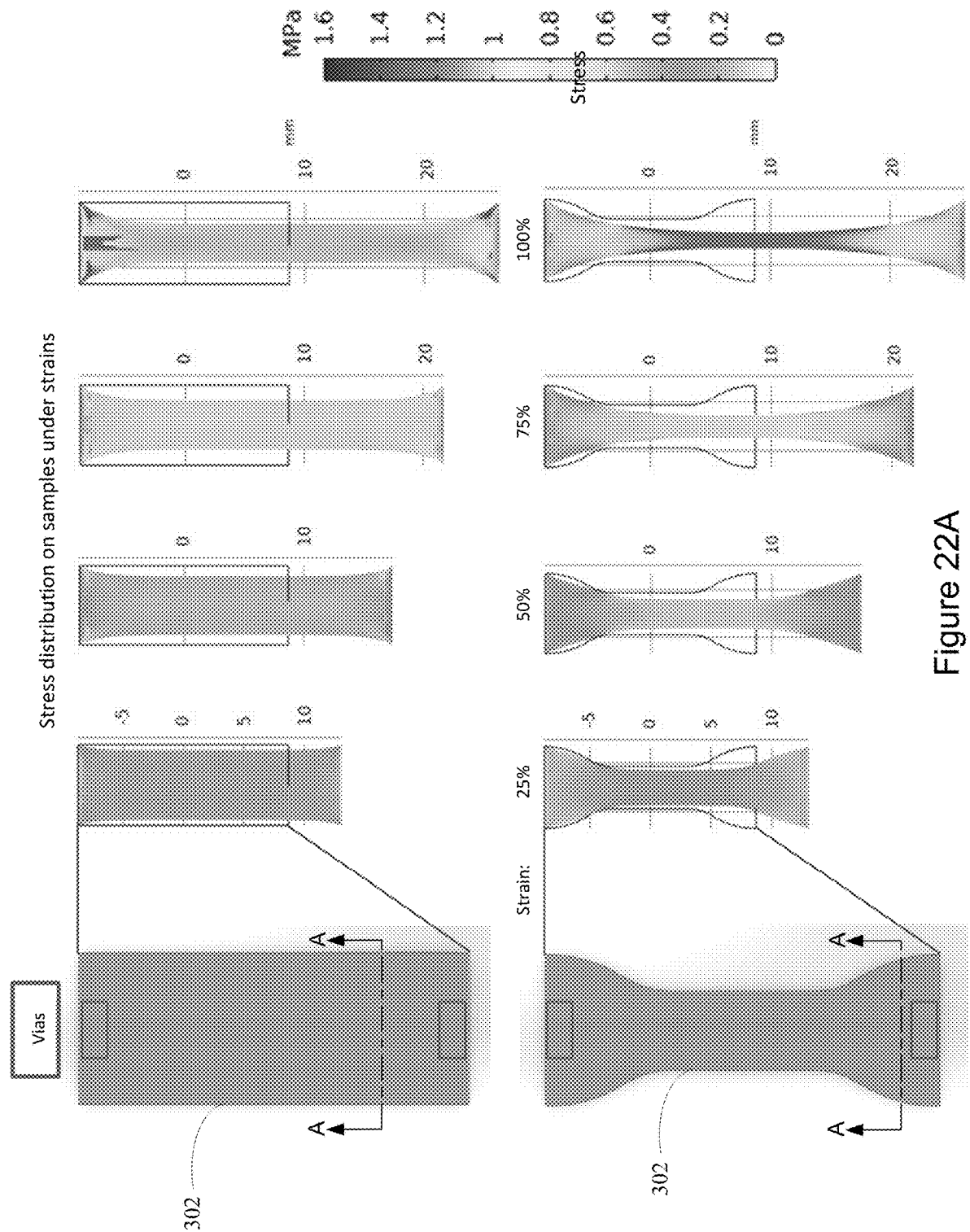
FIG. 22A illustrates a chart depicting a stress distribution of various interfaces between a first circuit component and a second circuit component of a circuit of a deformable substrate of an electronic device, in accordance with an embodiment of the present disclosure.
Figure 22B:
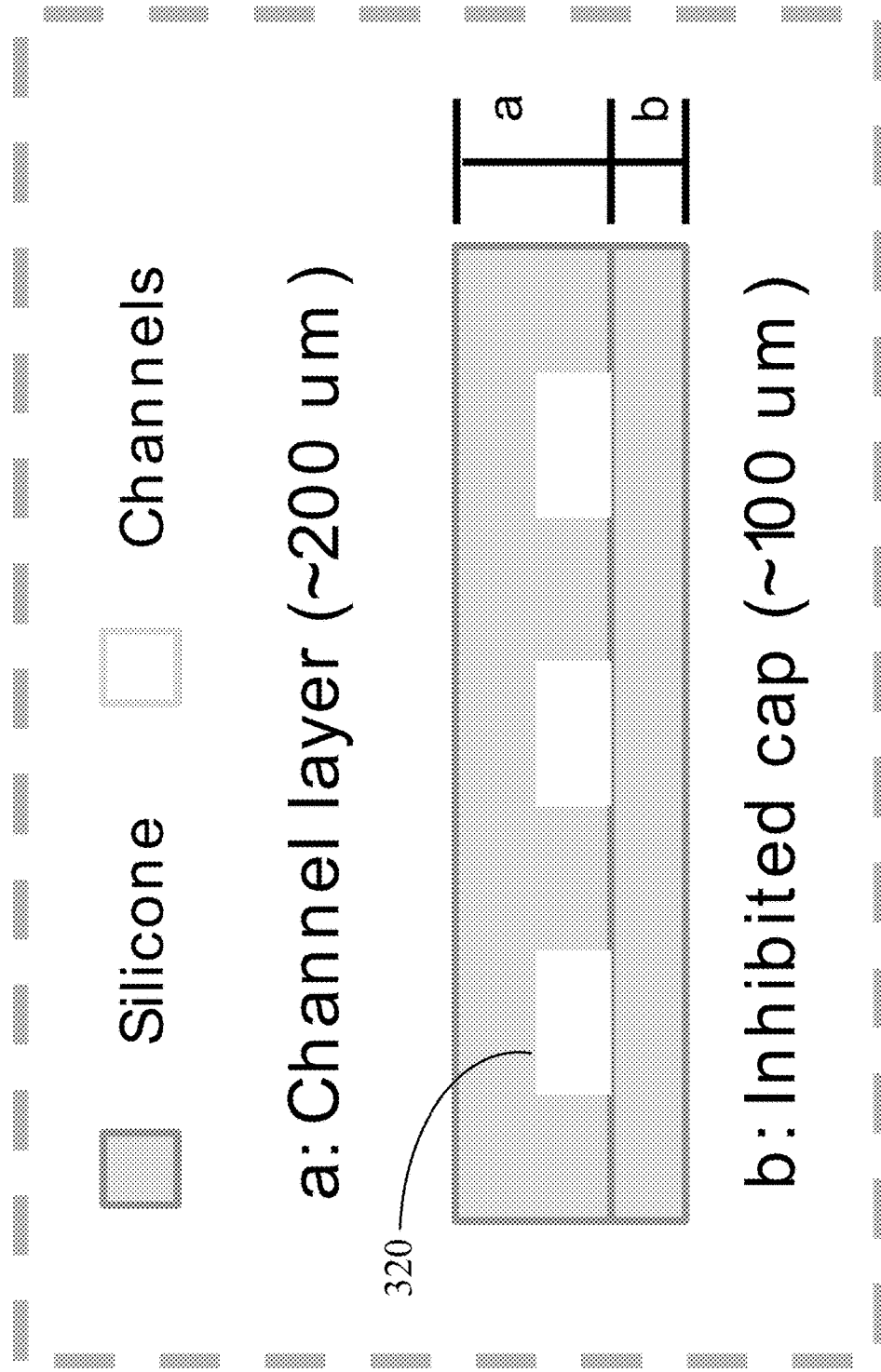
FIG. 22B is a cross-sectional view along line A-A of FIG. 22A.

Referring to FIG. 22A, a chart depicting a stress distribution of various interfaces between a first circuit component 330-1 and a second circuit component 330-2 of a circuit 305 with a deformable substrate 302 for an electronic device 300 is provided, in accordance with an embodiment of the present disclosure. Moreover, FIG. 22B is a cross-sectional view along line A-A of FIG. 22A. $(x^2+y^2-ax)=b^2(x^2+y^2)$ In some embodiments, the deformable substrate 302 includes a first surface that is formed having a rectangular shape. For instance, in some embodiments, the deformable substrate 302 includes a rectangular shape, such that the deformable substrate 302 has a rectangular cross section. In some embodiments, the deformable substrate 302 includes a dogbone shape, in which a center portion of the deformable substrate 302 has a first size and a first end portion and a second end portion of the deformable substrate has a second size greater than the first size (e.g., a narrow center portion and larger end portions), which contributes to decrease mechanical stress around vias when the deformable substrate 302 is elongated (e.g., stretched). For instance, in some embodiments, the dogbone shape of the deformable substrate 302 includes a first bulbous end portion and a second bulbous end portion. In some embodiments, a side surface of the deformable substrate 302 having the dogbone shape includes a first convex curvature at a first portion of the side surface and a second concave curvature at a second portion of the side surface. In some embodiments, the deformable substrate 302 having the dogbone shape includes alternative side, or axial, cross sectional geometries. However, the present disclosure is not limited thereto.

Figure 23:
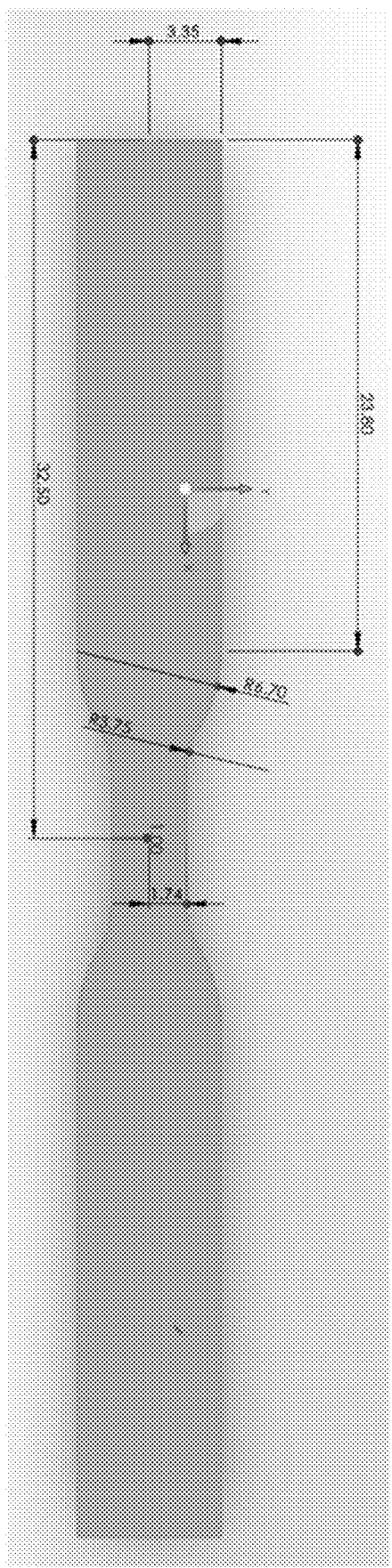
FIG. 23 illustrates an interface between a first circuit component and a second circuit component of a circuit of a deformable substrate of an electronic device, in accordance with an embodiment of the present disclosure.

Referring to FIG. 23, an interface between a first circuit component 330-1 and a second circuit component 330-2 of a circuit 305 with a deformable substrate 302 for an electronic device 300 is provided, in accordance with an embodiment of the present disclosure. For instance, in some embodiments, the first circuit component 330-1 includes a first metal material of copper, gold, nickel, silver, platinum, or a combination thereof and the second circuit component 330-2 includes the second metal material of copper, gold, nickel, silver, platinum, or another combination thereof. Moreover, the interface includes third metal material that includes gallium. According, the systems and methods of the present disclosure provide the interface between the first circuit component 330-1 and the second circuit component 330-2 through the deformable substrate 302, which allows for physical deformation of the circuit 305 while maintain conductivity free of degradation throughout the interface. However, the present disclosure is not limited thereto.

Figure 24A:
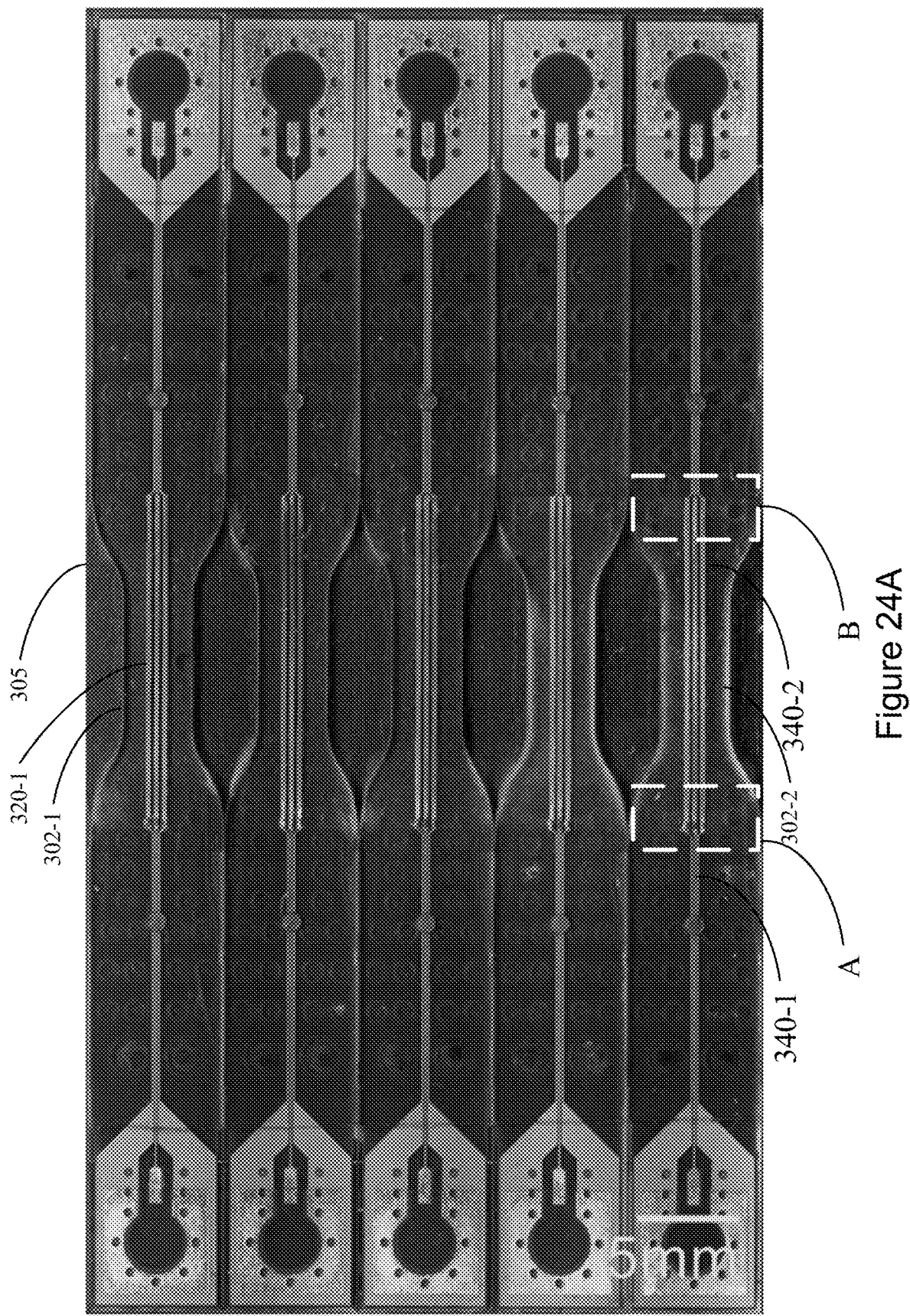
FIG. 24A illustrates a circuit of a deformable substance of an electronic device, in accordance with an embodiment of the present disclosure.
Figure 24B:
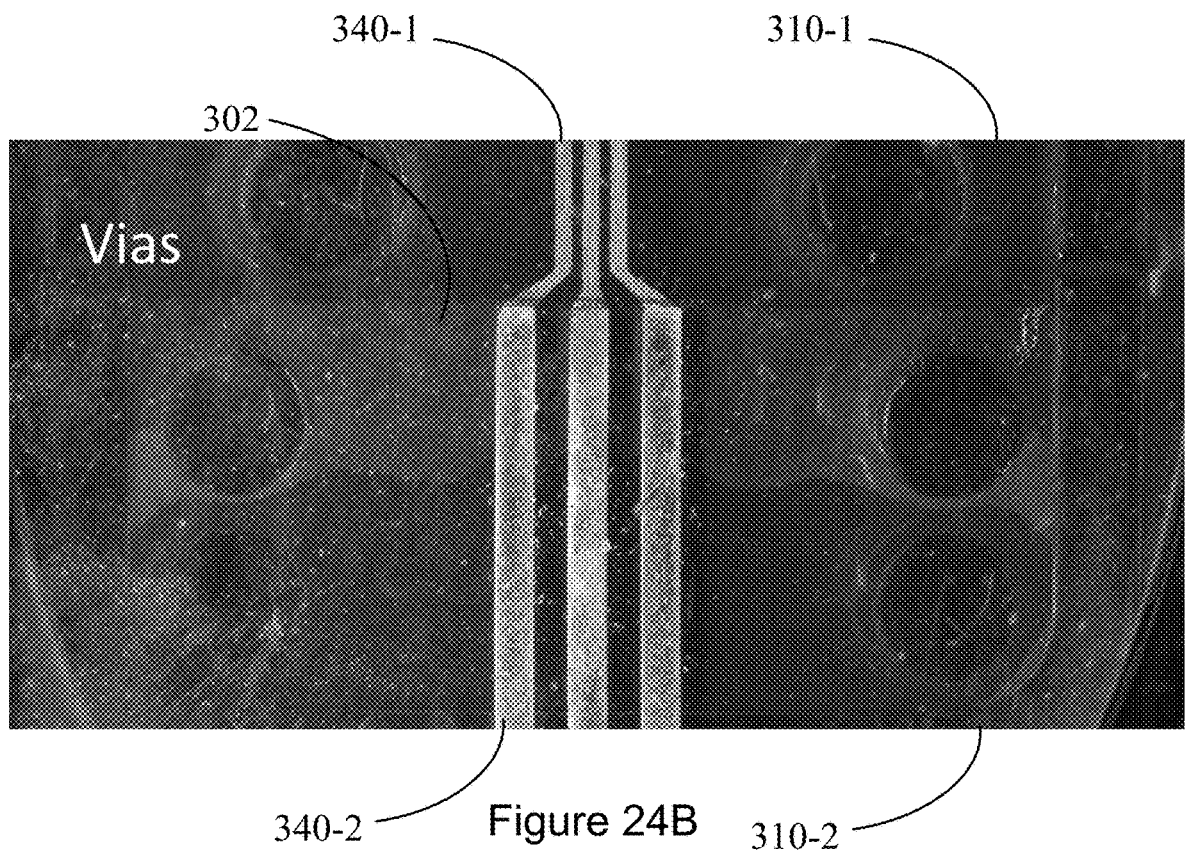
FIGS. 24B and 24C are enlarged views of region B and region C, respectively, of FIG. 24A.
Figure 24C:
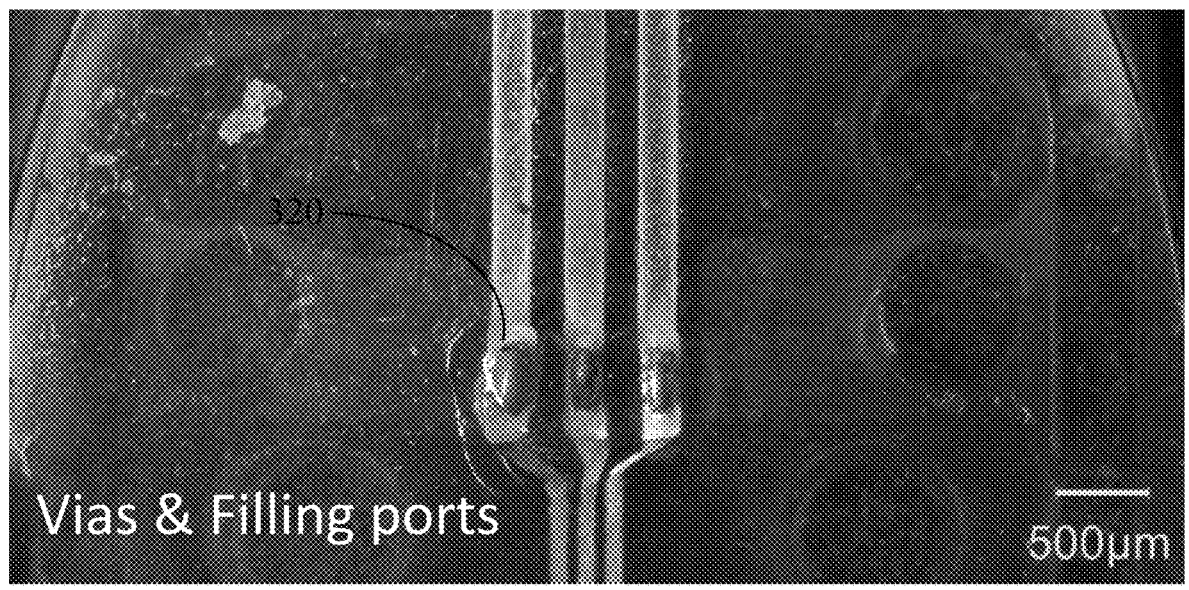

Referring to FIG. 24A, a circuit 305 with a deformable substrate 302 for an electronic device 300 is provided, in accordance with an embodiment of the present disclosure. FIGS. 24B and 24C depict enlarged views of region B and region C, respectively, of FIG. 24A. In some embodiments, the deformable substrate is formed by exposing a sheet of the deformable substrate 302 to a drilling technique, which forms the deformable substrate 302 is a desired shape. In some embodiments, the deformable substrate 302 is formed in a particular shape by exposing the deformable substrate 302 to a laser pulse having a first laser power. In some embodiments, the first laser power is 3.5 W. In some embodiments, the first laser power is between 1 W and 5 W.

Figure 25:
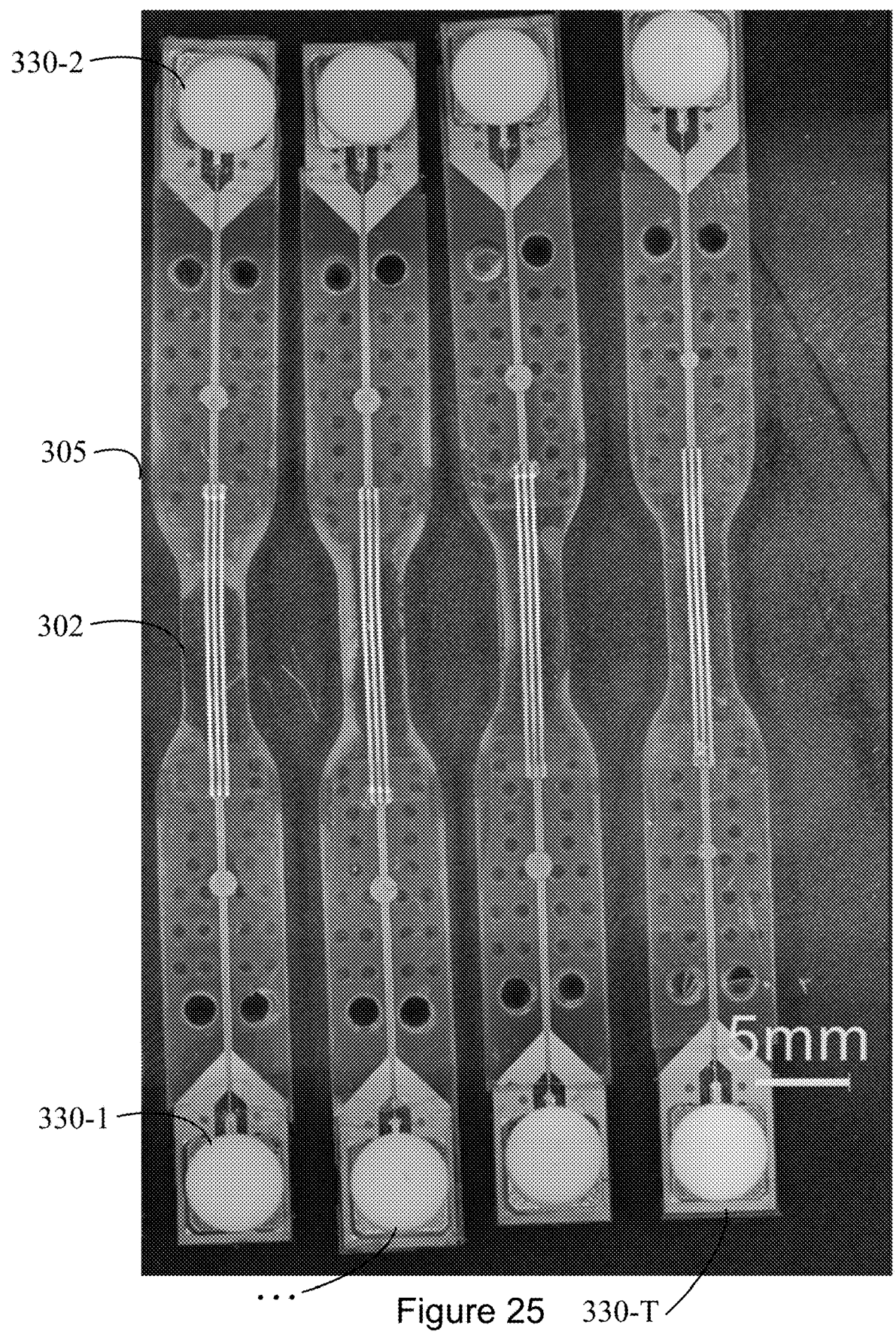
FIG. 25 illustrates another circuit of a deformable substance of an electronic device, in accordance with an embodiment of the present disclosure.
Figure 26:
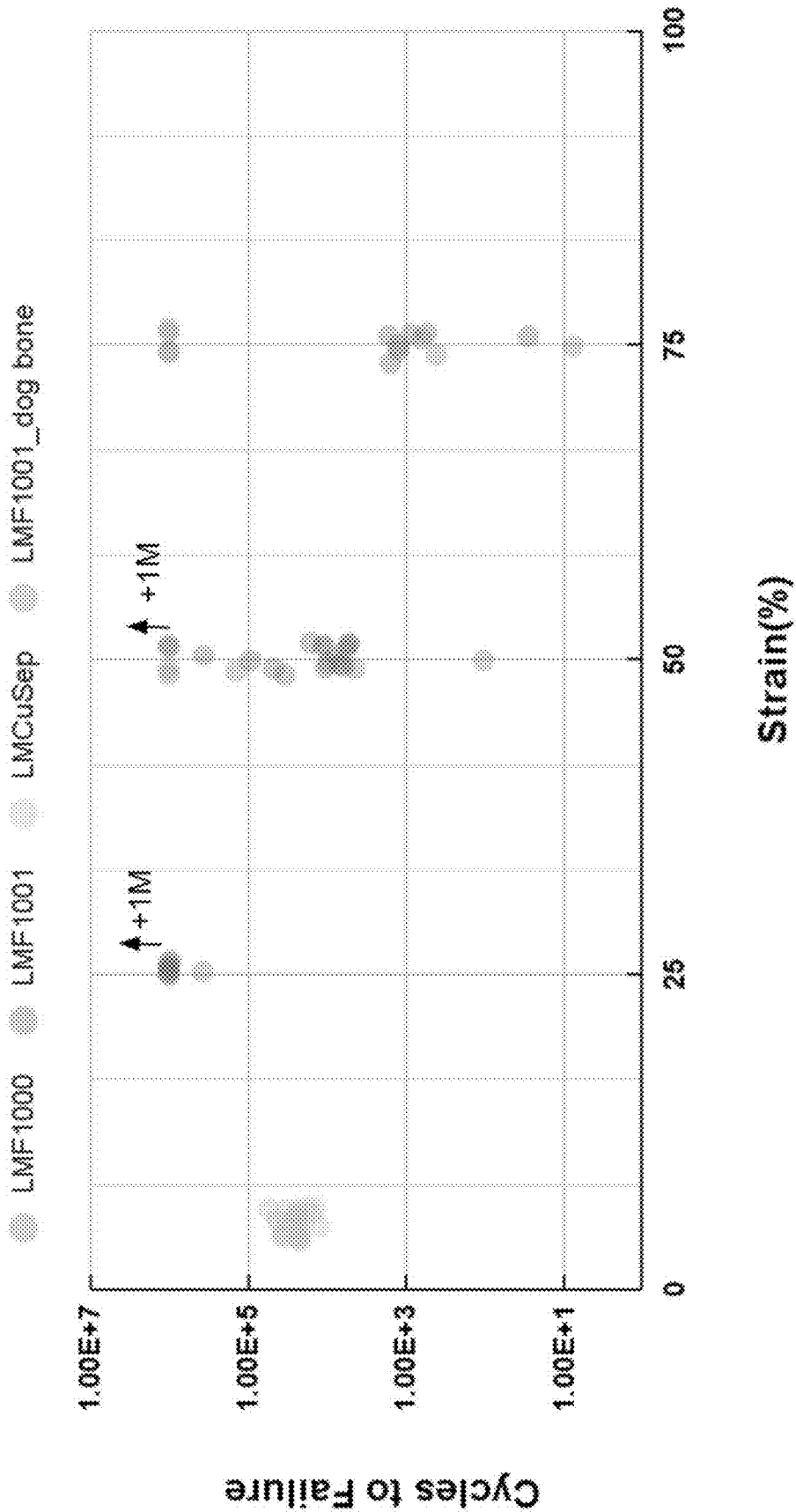
FIG. 26 illustrates a chart depicting a summary of tensile fatigue of a variety of metal materials, in accordance with an embodiment of the present disclosure.

Referring to FIG. 25, a circuit 305 with a deformable substrate 302 for an electronic device 300 is provided, in accordance with an embodiment of the present disclosure.

In some embodiments, a low temperature soldering technique is utilized to couple one or more circuit components 330 to the circuit, such as to the first layer 310-1 of the circuit 305. However, the present disclosure is not limited thereto.

FIG. 27 illustrates various logic functions that are used in some embodiments of the present disclosure.

Example 1: Manufacture of a First Deformable Electronic Device

Referring to FIGS. 6A through 6F, an exemplary method 500 is provided that was utilized for manufacture of an electronic device 300.

Referring to FIG. 6A, in some embodiments, the electronic device 300 included a deformable substrate that further included a circuit 305. In some embodiments, the circuit 305 was an FPC.

In some embodiments, the circuit 305 included a second layer 310-2 and a third layer 310-3 of the FPC. In some embodiments, the circuit 305 includes a third layer 310-3 configured to encapsulate (e.g., overlay) some or all of the first layer 310-1 and/or the second layer 310-2 of the circuit. In some embodiments, the first layer 310-1 of the circuit 305 included Si.

In some embodiments, the circuit 305 included a first circuit component 330-1 disposed in a channel 320. In some embodiments, the channel 320 was formed interposing between the second layer 310-2 and the third layer 310-3 of the circuit 305.

In some embodiments, the first circuit component 330-1 included Cu. In some embodiments, the first circuit component 330-1 includes a first Cu layer (e.g., a core Cu layer) and a second ENIG layer overlaid the first Cu layer.

Referring to FIG. 6B, in some embodiments, an exterior surface 332 of the first circuit component 330-1 was exposed by applying a first mechanism to the first layer 310-1 of the circuit 305. In some embodiments, the first mechanism is a laser etch mechanism or a mechanical punch mechanism.

In some embodiments, the exterior surface 332 of the first circuit component 330-1 was recessed within a surface of the second layer 310-2 of the circuit 305. In some embodiments, the exposing of the exterior surface 332 of the first circuit component 330-1 formed a channel 320 of the circuit 305 that extended from a first portion of the deformable substrate 302 to a second portion of the deformable substrate 302 (e.g., from a first portion of the first layer 310-1 to a second portion of the second layer 310-2 or a third portion of the third layer 310-3 of the circuit 305).

Referring to FIG. 6C, in some embodiments, a layer of a first metal material 340-1 was formed on a first surface of the channel 320. In some embodiments, the first metal material 340-1 includes Au and/or Cu (e.g., Au, Cu, or Au and Cu).

In some embodiments, the first surface of the channel 320 includes an interior surface of the channel 320, an edge of the channel 320, a rim of the channel 320, a brim of the channel 320, or a combination thereof.

In some embodiments, the layer of the first metal material 340-1 was formed by impinging a plurality of ions of the first metal material 340-1 at (e.g., towards) the first surface of the channel 320. For instance, in some embodiments, the layer of the first metal material 340-1 was formed by a selective sputter technique.

In some embodiments, the layer of the first metal material 340-1 was formed by forming a coating of the layer of the first metal material 340-1 over the first surface of the channel 320. For instance, in some embodiments, the layer of the first metal material 340-1 is formed by coating a layer over the interior surface of the channel 320 and/or an exterior surface 332 of the first circuit component 330-1.

In some embodiments, the layer of the first metal material 340-1 formed on the first surface of the channel 320 assist with wetting the first surface of the channel 320.

Referring to FIG. 6D, in some embodiments, a volume of a second metal material 340-2 was disposed at a first pressure proximate to the first surface of the channel 320. Form this, a partial interface 340-3 between the first metal material 340-1 and the second metal material 340-2 (e.g., an interface between the first layer of the first metal material 340-1 and the volume of the second metal material 340-2) was formed in the channel 320. In some embodiments, the partial interface 340-3 was formed at the interior surface of the channel 320, the edge of the channel 320, the rim of the channel 320, the brim of the channel 320, or a combination thereof. Accordingly, in some embodiments, the first metal material 340-1 selectively wets the first surface of the channel 320 in order to form an attractive force to draw the second metal material 340-2 into the channel 320.

In some embodiments, the partial interface 340-3 included a second pressure less than the first pressure. For instance, in some embodiments, the partial interface 340-3 was configured to yield a material (e.g., an intermetallic matrix of the first metal material 340-1 and the second metal material 340-2, etc.) that had a first surface energy lower than a second surface energy of the second metal material 340-2. In some embodiments, the first surface energy lower of the partial interface 340-3 had the first surface energy that was lower than the second surface energy of the second metal material 340-2 and a third surface energy of the first metal material 340-1. However, the present disclosure is not limited thereto.

In some embodiments, the surface tension of the partial interface 340-3 at a temperature between 18° C. and 22° C. is between 70 milliNewtons per meter (mN/m) and 700 mN/m, between 70 mN/m and 650 mN/m, between 70 mN/m and 600 mN/m, between 70 mN/m and 550 mN/m, between 70 mN/m and 500 mN/m, between 70 mN/m and 450 mN/m, between 70 mN/m and 400 mN/m, between 70 mN/m and 350 mN/m, between 70 mN/m and 300 mN/m, between 70 mN/m and 250 mN/m, between 70 mN/m and 200 mN/m, between 70 mN/m and 150 mN/m, between 70 mN/m and 100 mN/m, between 150 mN/m and 700 mN/m, between 150 mN/m and 650 mN/m, between 150 mN/m and 600 mN/m, between 150 mN/m and 550 mN/m, between 150 mN/m and 500 mN/m, between 150 mN/m and 450 mN/m, between 150 mN/m and 400 mN/m, between 150 mN/m and 350 mN/m, between 150 mN/m and 300 mN/m, between 150 mN/m and 250 mN/m, between 150 mN/m and 200 mN/m, between 250 mN/m and 700 mN/m, between 250 mN/m and 650 mN/m, between 250 mN/m and 600 mN/m, between 250 mN/m and 550 mN/m, between 250 mN/m and 500 mN/m, between 250 mN/m and 450 mN/m, between 250 mN/m and 400 mN/m, between 250 mN/m and 350 mN/m, between 250 mN/m and 300 mN/m, between 350 mN/m and 700 mN/m, between 350 mN/m and 650 mN/m, between 350 mN/m and 600 mN/m, between 350 mN/m and 550 mN/m, between 350 mN/m and 500 mN/m, between 350 mN/m and 450 mN/m, between 350 mN/m and 400 mN/m, between 450 mN/m and 700 mN/m, between 450 mN/m and 650 mN/m, between 450 mN/m and 600 mN/m, between 450 mN/m and 550 mN/m, between 450 mN/m and 500 mN/m, between 550 mN/m and 700 mN/m, between 550 mN/m and 650 mN/m, between 550 mN/m and 600 mN/m, or between 600 mN/m and 650 mN/m.

In some embodiments, the surface tension of the partial interface 340-3 at a temperature between 18° C. and 22° C. is at least 70 mN/m, at least 100 mN/m, at least 125 mN/m, at least 150 mN/m, at least 175 mN/m, at least 200 mN/m, at least 225 mN/m, at least 250 mN/m, at least 275 mN/m, at least 300 mN/m, at least 325 mN/m, at least 350 mN/m, at least 375 mN/m, at least 400 mN/m, at least 425 mN/m, at least 450 mN/m, at least 475 mN/m, at least 500 mN/m, at least 525 mN/m, at least 550 mN/m, at least 575 mN/m, at least 600 mN/m, at least 625 mN/m, at least 650 mN/m, at least 675 mN/m, or at least 700 mN/m. In some embodiments, the surface tension of the partial interface 340-3 at a temperature between 18° C. and 22° C. is at most 70 mN/m, at most 100 mN/m, at most 125 mN/m, at most 150 mN/m, at most 175 mN/m, at most 200 mN/m, at most 225 mN/m, at most 250 mN/m, at most 275 mN/m, at most 300 mN/m, at most 325 mN/m, at most 350 mN/m, at most 375 mN/m, at most 400 mN/m, at most 425 mN/m, at most 450 mN/m, at most 475 mN/m, at most 500 mN/m, at most 525 mN/m, at most 550 mN/m, at most 575 mN/m, at most 600 mN/m, at most 625 mN/m, at most 650 mN/m, at most 675 mN/m, or at most 700 mN/m.

In some embodiments, a first volume of the second metal material 340-2 was disposed proximate to the first surface of the channel 320 (e.g., a first layer of the second metal material 340-2 disposed by an additive manufacture apparatus 250) and a second volume of the second metal material 340-2 was disposed proximate to the first volume of the second metal material 340-2 (e.g., a second layer of the second metal material 340-2 disposed by an additive manufacture apparatus 250 overlaying, at least in part, the first layer of the second metal material 340-2). For instance, in some embodiments, the additive manufacture apparatus 250 was utilized to dispose a layer of the second metal material 340-2 via a direct writing printing pattern, a stencil printing pattern, a screen printing pattern, or a combination thereof.

In some embodiments, the second metal material 340-2 included liquid metal. In some embodiments, the second metal material 340-2 included a gallium-based (Ga-based) alloy. For instance, in some embodiments, the second metal material 340-2 includes a gallium indium alloy (e.g., eutectic GaIn), a gallium tin alloy, a gallium indium tin alloy (e.g., Galinstan), a gallium indium tin zinc alloy, or any combination thereof. In some embodiments, the second metal material 340-2 includes gallium between about 75 and 95 percent by weight, between about 50 and 75 percent by weight, between about 25 and 50 percent by weight, or less than about 25 percent by weight. In some embodiments, the second metal material 340-2 included more than one alloys. For instance, in some embodiments, the second metal material 340-2 included eutectic GaIn and/or Galinstan.

In some embodiments, the partial interface 340-3 formed a via interconnect of the circuit 305.

Referring to FIG. 6E, in some embodiments, the channel 320 was sealed. For instance, in some embodiments, the channel 320 was sealed by encapsulating the channel 320 with a third material different than the first metal material 340-1 and the second metal material 340-2. In some embodiments, the third material is the same material as the deformable substrate 302 and/or the first layer 310-1 of the circuit 305. For instance, in some embodiments, the channel 320 was sealed by encapsulating the channel 320 with silicon.

In some embodiments, prior to the sealing of the channel 320, a second surface of the partial interface 340-3 between the first metal material 340-1 and the second metal material 340-2 was disrupted in order to dispersing a layer of an oxidized second metal material 340-2 that formed at the second surface. For instance, in some embodiments, the second surface of the partial interface 340-3 was agitated by a vibration mechanism. In some embodiments, the second surface of the partial interface 340-3 was a surface of the partial interface 340-3 exposed to an environment (e.g., atmospheric environment). Accordingly, by disrupting the layer of an oxidized second metal material 340-2, a conductivity of the partial interface 340-3 was improved (e.g., increased) since the oxidized second metal material 340-2 would otherwise provide insulating properties.

Referring to FIG. 6F, in some embodiments, a force was applied to the deformable substrate 302 in order to deform at least a part of the circuit 305. For instance, in some embodiments, the force included a tensile force, a compressive force, a shear force, a torsional force, or a combination thereof.

Example 2: Manufacture of a Second Deformable Electronic Device

Referring to FIGS. 7A through 7D, an exemplary method 600 is provided that was utilized for manufacture of an electronic device 300.

Referring to FIG. 7A, in some embodiments, a circuit 305 included a first layer 310-1. In some embodiments, the circuit included a second layer 310-2. In some embodiment, the first layer 310-1 and the second layer 310-2 of the circuit formed an FPC.

In some embodiments, the circuit 305 included a first circuit component 330-1 disposed in a channel 320 of the circuit 305. In some embodiments, the first circuit component 330-1 was an object formed by an additive manufacture apparatus 250. As a non-limiting example, in some embodiments, the first circuit component 330-1 was disposed in the channel 320 by extruding a material of the first circuit component 330-1 in the form of a filament solution. However, the present disclosure is not limited thereto. For instance, in some embodiments, the additive manufacture apparatus 250 is utilized to dispose first circuit component 330-1 via a direct writing printing pattern, a stencil printing pattern, a screen printing pattern, or a combination thereof.

In some embodiments, the channel 320 was interposing between the first layer 310-1 and the second layer 310-2 of the circuit 305.

In some embodiments, an exterior surface 332 of the first circuit component 330-1 was protruding from a surface of the first layer 310-1 and/or the second layer 310-2 of the circuit 305. In some embodiments, the exterior surface 332 of the first circuit component 330-1 was coplanar, or substantially coplanar, with the surface of the first layer 310-1 and/or the second layer 310-2 of the circuit 305.

In some embodiments, the first circuit component 330-1 included Cu. In some embodiments, the first circuit component 330-1 included a first Cu layer (e.g., a core Cu layer) and a second ENIG layer overlaid the first Cu layer. For instance, in some embodiments, the first circuit component 330-1 was ENIG plated.

Referring to FIG. 7B, in some embodiments, the first layer 310-1 of the circuit 305, the second layer 310-2 of the circuit 305, the first circuit component 330-1, or a combination thereof was encapsulated, at least in part, by a third material in the form of a third layer 310-3 of the circuit 305. In some embodiments, the third material of the third layer 310-3 of the circuit 305 included Si.

Referring to FIG. 7C, in some embodiments, a volume of a second metal material 340-2 was disposed at a first pressure proximate to the exterior surface 332 of the first circuit component and/or proximate to a surface of the channel 320. In some embodiments, this formed a partial interface 340-3 between the first circuit component 330-1 and the second metal material 340-2 (e.g., an interface between the ENIG layer of the first circuit component 330-1 and the volume of the second metal material 340-2).

In some embodiments, the volume of the second material spanned a second length of the circuit 305 greater than a first length of the first circuit component 330-1.

In some embodiments, the second metal material 340-2 included liquid metal. In some embodiments, the second metal material 340-2 included a gallium-based (Ga-based) alloy. For instance, in some embodiments, the second metal material 340-2 included a gallium indium alloy (e.g., eutectic GaIn), a gallium tin alloy, a gallium indium tin alloy (e.g., Galinstan), a gallium indium tin zinc alloy, or any combination thereof. In some embodiments, the second metal material 340-2 includes gallium between about 75 and 95 percent by weight, between about 50 and 75 percent by weight, between about 25 and 50 percent by weight, or less than about 25 percent by weight. In some embodiments, the second metal material 340-2 includes more than one alloys. For instance, in some embodiments, the second metal material 340-2 includes eutectic GaIn and/or Galinstan.

In some embodiments, the partial interface 340-3 formed a via interconnect of the circuit 305.

Referring to FIG. 7D, in some embodiments, the first layer 310-1 of the circuit 305, the second layer 310-2 of the circuit 305, the third layer 310-3 of the circuit 305, the first circuit component 330-1, the second metal material 340-2, or a combination thereof was encapsulated with a fourth material of a fourth layer 310-4 of the circuit 305. In some embodiments, the fourth material was the same as the third material. In some embodiments, the fourth material was Si.

Example 3: Manufacture of a Third Deformable Electronic Device

Referring to FIG. 8, an exemplary method 700 is provided that was utilized for manufacture of an electronic device 300.

In some embodiments, a first layer 310-1 of a circuit 305 of a deformable substrate 302 was provided.

A first set of first circuit components 330-1 was disposed on a first surface of the first layer 310-1 of the circuit 305. In some embodiments, each first circuit components 330-1 included a first metal material 340-1, such as Cu, Au, Ag, or a combination thereof.

In some embodiments, the first set of first circuit components 330-1 includes between 1 first circuit component 330-1 and 50 first circuit components 330-1, between 2 first circuit components 330-1 and 50 first circuit components 330-1, between 2 first circuit components 330-1 and 40 first circuit components 330-1, between 2 first circuit components 330-1 and 30 first circuit components 330-1, between 2 first circuit components 330-1 and 20 first circuit components 330-1, between 2 first circuit components 330-1 and 16 first circuit components 330-1, between 2 first circuit components 330-1 and 12 first circuit components 330-1, between 2 first circuit components 330-1 and 5 first circuit components 330-1, between 5 first circuit components 330-1 and 50 first circuit components 330-1, between 5 first circuit components 330-1 and 40 first circuit components 330-1, between 5 first circuit components 330-1 and 30 first circuit components 330-1, between 5 first circuit components 330-1 and 50 first circuit components 330-1, between 5 first circuit components 330-1 and 16 first circuit components 330-1, between 5 first circuit components 330-1 and 12 first circuit components 330-1, between 12 first circuit components 330-1 and 50 first circuit components 330-1, between 12 first circuit components 330-1 and 40 first circuit components 330-1, between 12 first circuit components 330-1 and 30 first circuit components 330-1, between 12 first circuit components 330-1 and 120 first circuit components 330-1, between 12 first circuit components 330-1 and 16 first circuit components 330-1.

In some embodiments, the first set of first circuit components 330-1 includes at least 1 first circuit components 330-1, at least 2 first circuit components 330-1, at least 4 first circuit components 330-1, at least 6 first circuit components 330-1, at least 8 first circuit components 330-1, at least 10 first circuit components 330-1, at least 12 first circuit components 330-1, at least 14 first circuit components 330-1, at least 16 first circuit components 330-1, at least 18 first circuit components 330-1, at least 20 first circuit components 330-1, at least 22 first circuit components 330-1, at least 24 first circuit components 330-1, at least 26 first circuit components 330-1, at least 28 first circuit components 330-1, at least 30 first circuit components 330-1, at least 32 first circuit components 330-1, at least 34 first circuit components 330-1, at least 36 first circuit components 330-1, at least 38 first circuit components 330-1, at least 40 first circuit components 330-1, at least 42 first circuit components 330-1, at least 44 first circuit components 330-1, at least 46 first circuit components 330-1, at least 48 first circuit components 330-1, or at least 50 first circuit components 330-1. In some embodiments, the first set of first circuit components 330-1 includes at most 1 first circuit components 330-1, at most 2 first circuit components 330-1, at most 4 first circuit components 330-1, at most 6 first circuit components 330-1, at most 8 first circuit components 330-1, at most 10 first circuit components 330-1, at most 12 first circuit components 330-1, at most 14 first circuit components 330-1, at most 16 first circuit components 330-1, at most 18 first circuit components 330-1, at most 20 first circuit components 330-1, at most 22 first circuit components 330-1, at most 24 first circuit components 330-1, at most 26 first circuit components 330-1, at most 28 first circuit components 330-1, at most 30 first circuit components 330-1, at most 32 first circuit components 330-1, at most 34 first circuit components 330-1, at most 36 first circuit components 330-1, at most 38 first circuit components 330-1, at most 40 first circuit components 330-1, at most 42 first circuit components 330-1, at most 44 first circuit components 330-1, at most 46 first circuit components 330-1, at most 48 first circuit components 330-1, or at most 50 first circuit components 330-1.

In some embodiments, a second set of second circuit components 330-2 was disposed on a first surface of the first layer 310-1 of the circuit 305. In some embodiments, the first set of first circuit components 330-1 and the second set of second circuit components 330-2 had a one-to-one relationship. In some embodiments, the first set of first circuit components 330-1 and the second set of second circuit components 330-2 had a one-to-many relationship or a many-to-one relationship.

In some embodiments, a volume of a second metal material 340-2 was disposed on the first layer 310-1 of the circuit 305. For instance, in some embodiments, the volume of the second metal material 340-2 was disposed at a first pressure proximate to an exterior surface 332 of a first circuit component 330-1 in the first set of first circuit components 330-1 and/or proximate to a surface of first layer 310-1 of the channel 320. In some embodiments, this formed a partial interface 340-3 between the first circuit component 330-1 and the second metal material 340-2 (e.g., an interface between the ENIG layer of the first circuit component 330-1 and the volume of the second metal material 340-2).

In some embodiments, the volume of the second material 340-2 spanned a second length of the circuit 305 greater than a first length of the first circuit component 330-1.

In some embodiments, the second metal material 340-2 included liquid metal. In some embodiments, the second metal material 340-2 includes a gallium-based (Ga-based) alloy. For instance, in some embodiments, the second metal material 340-2 includes a gallium indium alloy (e.g., eutectic GaIn), a gallium tin alloy, a gallium indium tin alloy (e.g., Galinstan), a gallium indium tin zinc alloy, or any combination thereof. In some embodiments, the second metal material 340-2 includes gallium between about 75 and 95 percent by weight, between about 50 and 75 percent by weight, between about 25 and 50 percent by weight, or less than about 25 percent by weight. In some embodiments, the second metal material 340-2 included more than one alloys. For instance, in some embodiments, the second metal material 340-2 included eutectic GaIn and/or Galinstan.

In some embodiments, the partial interface 340-3 formed a line interconnect of the circuit 305.

In some embodiments, the second metal material 340-2 was used to create one or more patterns on a surface of the circuit 305, such as one or more line interconnect patterns on a first surface of a second layer 310-2 of the circuit 305.

In some embodiments, a second layer 310-2 of the circuit 305 was utilized to encapsulate a first portion of the first layer 310-1 of the circuit 305, a second portion of the first set of first electronic components 330-1, a third portion of the second set of second electronic components 330-2, or a combination thereof. In some embodiments, the second layer 310-2 of the circuit 305 encapsulated the first portion of the first layer 310-1 of the circuit 305, the second portion of the first set of first electronic components 330-1, the third portion of the second set of second electronic components 330-2, or the combination thereof through a slot-die coating technique.

In some embodiments, a second material of the second layer 310-2 of the circuit 305 included Si.

Example 4: Deformable Substrate 302

Figure 11:
FIG. 11 illustrates a deformable substrate including a first layer of a circuit and a second layer of the circuit, in accordance with an exemplary embodiment of the present disclosure.

Referring to FIG. 11, an exemplary deformable substrate 302 is depicted. In some embodiments, the deformable substrate 302 included a first layer 310-1 of a circuit 305 and a second layer 310-2 of the circuit 305.

In some embodiments, the thickness of layer 310 is between 0.01 centimeters (cm) and 50 cm, between 0.01 cm and 45 cm, between 0.01 cm and 40 cm, between 0.01 cm and 35 cm, between 0.01 cm and 30 cm, between 0.01 cm and 25 cm, between 0.01 cm and 20 cm, between 0.01 cm and 15 cm, between 0.01 cm and 10 cm, between 0.01 cm and 5 cm, between 0.01 cm and 3 cm, between 0.01 cm and 1 cm, between 0.01 cm and 0.1 cm, between 0.1 cm and 50 cm, between 0.1 cm and 45 cm, between 0.1 cm and 40 cm, between 0.1 cm and 35 cm, between 0.1 cm and 30 cm, between 0.1 cm and 25 cm, between 0.1 cm and 20 cm, between 0.1 cm and 15 cm, between 0.1 cm and 10 cm, between 0.1 cm and 5 cm, between 0.1 cm and 3 cm, between 0.1 cm and 1 cm, between 0.5 cm and 50 cm, between 0.5 cm and 45 cm, between 0.5 cm and 40 cm, between 0.5 cm and 35 cm, between 0.5 cm and 30 cm, between 0.5 cm and 25 cm, between 0.5 cm and 20 cm, between 0.5 cm and 15 cm, between 0.5 cm and 10 cm, between 0.5 cm and 5 cm, between 0.5 cm and 3 cm, between 0.5 cm and 1 cm, between 1 cm and 50 cm, between 1 cm and 45 cm, between 1 cm and 40 cm, between 1 cm and 35 cm, between 1 cm and 30 cm, between 1 cm and 25 cm, between 1 cm and 20 cm, between 1 cm and 15 cm, between 1 cm and 10 cm, between 1 cm and 5 cm, between 3 cm and 50 cm, between 3 cm and 45 cm, between 3 cm and 40 cm, between 3 cm and 35 cm, between 3 cm and 30 cm, between 3 cm and 25 cm, between 3 cm and 20 cm, between 3 cm and 15 cm, between 3 cm and 10 cm, between 3 cm and 5 cm, between 10 cm and 50 cm, between 10 cm and 45 cm, between 10 cm and 40 cm, between 10 cm and 35 cm, between 10 cm and 30 cm, between 10 cm and 25 cm, between 10 cm and 20 cm, between 10 cm and 15 cm, between 15 cm and 50 cm, between 15 cm and 45 cm, between 15 cm and 40 cm, between 15 cm and 35 cm, between 15 cm and 30 cm, between 15 cm and 25 cm, between 15 cm and 20 cm, between 20 cm and 50 cm, between 20 cm and 45 cm, between 20 cm and 40 cm, between 20 cm and 35 cm, between 20 cm and 30 cm, between 20 cm and 25 cm, between 25 cm and 50 cm, between 25 cm and 45 cm, between 25 cm and 40 cm, between 25 cm and 35 cm, between 25 cm and 30 cm, between 30 cm and 50 cm, between 30 cm and 45 cm, between 30 cm and 40 cm, between 30 cm and 35 cm, between 35 cm and 50 cm, between 35 cm and 45 cm, between 35 cm and 40 cm, between 40 cm and 50 cm, between 40 cm and 45 cm, or between 45 cm and 50 cm.

In some embodiments, the thickness of layer 310 is at least 0.01 cm, at least 0.03 cm, at least 0.05 cm, at least 0.08 cm, at least 0.1 cm, at least 0.3 cm, at least 0.5 cm, at least 0.8 cm, at least 1 cm, at least 3 cm, at least 5 cm, at least 8 cm, at least 10 cm, at least 13 cm, at least 15 cm, at least 18 cm, at least 20 cm, at least 23 cm, at least 25 cm, at least 28 cm, at least 30 cm, at least 33 cm, at least 35 cm, at least 38 cm, at least 40 cm, at least 43 cm, at least 45 cm, at least 48 cm, or at least 50 cm. In some embodiments, the thickness of layer 310 is at most 0.01 cm, at most 0.03 cm, at most 0.05 cm, at most 0.08 cm, at most 0.1 cm, at most 0.3 cm, at most 0.5 cm, at most 0.8 cm, at most 1 cm, at most 3 cm, at most 5 cm, at most 8 cm, at most 10 cm, at most 13 cm, at most 15 cm, at most 18 cm, at most 20 cm, at most 23 cm, at most 25 cm, at most 28 cm, at most 30 cm, at most 33 cm, at most 35 cm, at most 38 cm, at most 40 cm, at most 43 cm, at most 45 cm, at most 48 cm, or at most 50 cm.

For instance, in some embodiments, the first layer 310-1 has a first length L5 of about 30 cm, a first width W1 of about 14 cm, a first thickness of about 0.0125 cm, or a combination thereof. In some embodiments, the second layer 310-2 has a second length L6 of about 26 cm, a second width W2 of about 10 cm, the first thickness of about 0.0125 cm, or a combination thereof. In some embodiments, the second layer 310-2 had a second thickness different than the first thickness.

In some embodiments, the deformable substrate 302 was translucent or transparent.

In some embodiments, the first layer 310-1 includes polyethylene terephthalate (PET). In some embodiments, the first layer 310-1 is loaded with nanoparticles of a first material, such as Au, Ag, Pt, Cu, palladium (Pd), or a combination thereof.

In some embodiments, the second layer 310-2 includes one or more polyorganosiloxanes, one or more fillers, one or more additives, or a combination thereof.

In some embodiments, the second layer 310-2 includes a silicon solvent. In some embodiments, the silicon solvent includes a first portion of hexamethyldisiloxane and a second portion of octamethyltrisiloxane.

In some embodiments, the second layer 310-2 includes 50 w % of the one or more polyorganosiloxanes, one or more fillers, one or more additives, or the combination thereof. In some embodiments, the deformable substrate 302 includes 50 w % of the first portion of hexamethyldisiloxane and the second portion of octamethyltrisiloxane.

Example 5: Strain of First Metal Material and a Second Metal Material

Figure 12A:
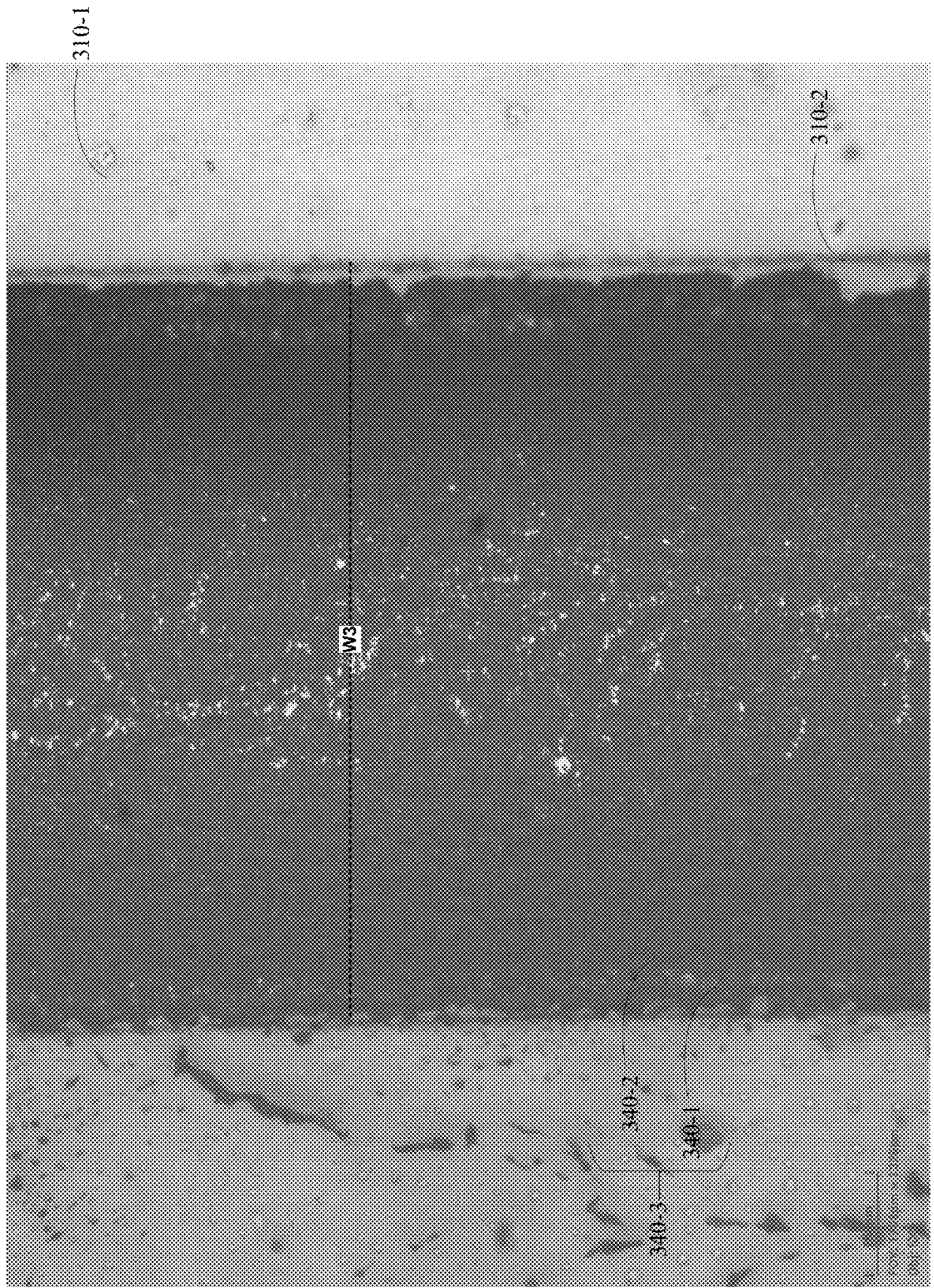
FIG. 12A illustrates an enlarged view of an electronic device prior to a force applied to a substrate of the electronic device, in accordance with an exemplary embodiment of the present disclosure.
Figure 12B:
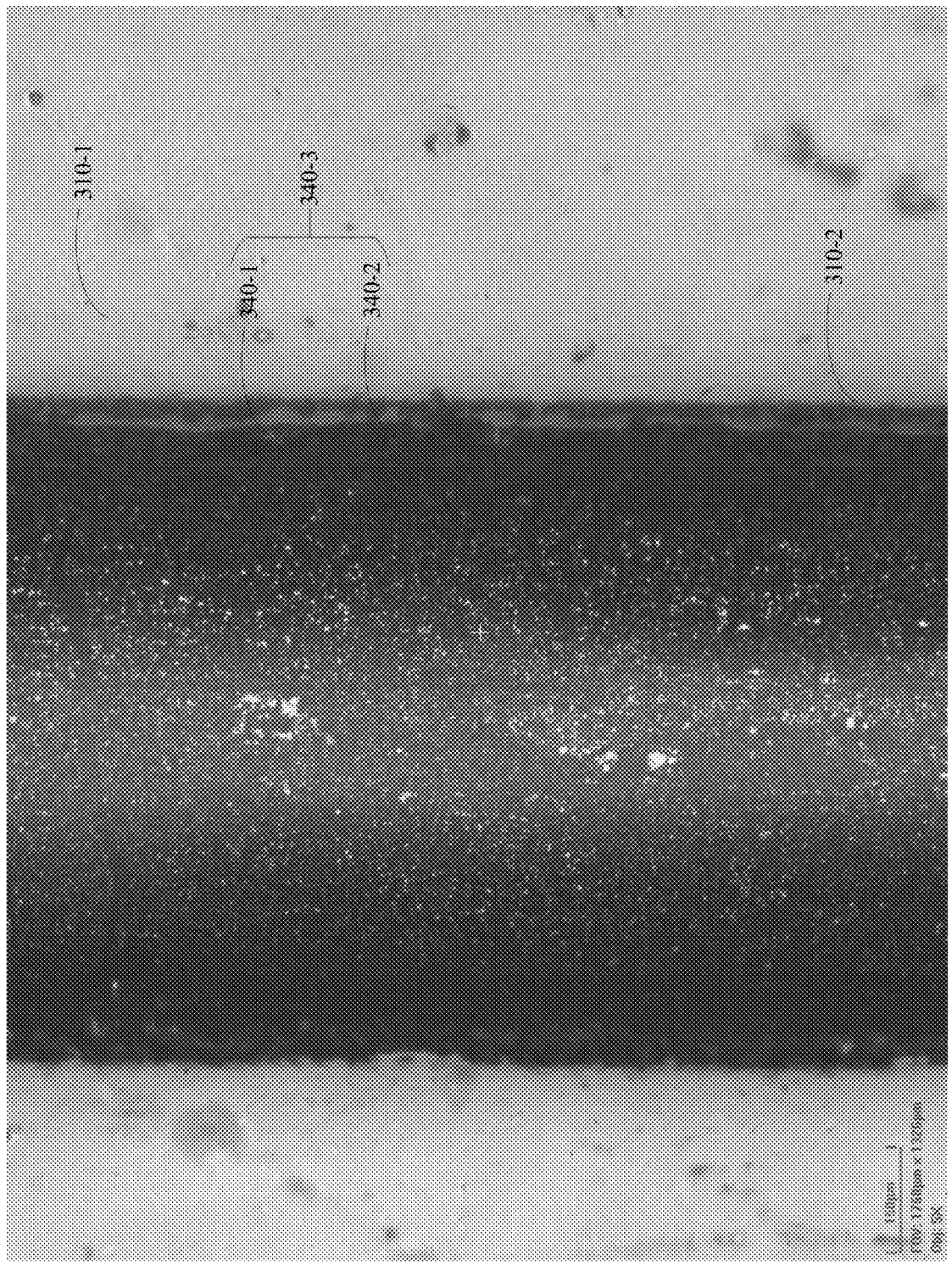
FIG. 12B illustrates another enlarged view of the electronic device of FIG. 12B after to a force is applied to a substrate of the electronic device.

Referring to FIGS. 12A and 12B, a deformable substrate 302 included a first layer 310-1 of a circuit 305 having a first metal material 340-1 of the present disclosure disposed on a surface of the first layer 310-1 of the circuit 305.

In some embodiments, the first layer 310-1 included polyethylene terephthalate (PET). In some embodiments, the first layer 310-1 is loaded with nanoparticles of a first material, such as Au, Ag, Cu, palladium (Pd), or a combination thereof.

In some embodiments, a second layer 310-2 of the circuit 305 was formed overlaying a portion of the first layer 310-1. In some embodiments, the second layer 31-2 includes one or more polyorganosiloxanes, one or more fillers, one or more additives, or a combination thereof.

In some embodiments, the second layer 310-2 included a silicon solvent. In some embodiments, the silicon solvent included a first portion of hexamethyldisiloxane and a second portion of octamethyltrisiloxane.

In some embodiments, the second layer 310-2 includes 50 w % of the one or more polyorganosiloxanes, one or more fillers, one or more additives, or the combination thereof. In some embodiments, the deformable substrate 302 includes 50 w % of the first portion of hexamethyldisiloxane and the second portion of octamethyltrisiloxane.

In some embodiments, the deformable substrate 302 included a channel, which formed an interconnect (e.g., a trace), interposing between the first layer 310-1 and the second layer 310-2, that represented a coupling between a first circuit component 330-1 and a second circuit component 330-2 of the circuit 305. The interconnected included a partial interface 340-3 of the first metal material 340-1 and the second metal material 340-2 of the present disclosure. In some embodiments, the second metal material 340-2 encapsulated the first metal material 340-2. In some embodiments, a size (e.g., width) W3 of the channel 320 was about 0.1 cm.

In some embodiments, the partial interface forms one or more lines, one or more vias, or any combination of one or more lines and one or more vias. In some embodiments, the first metal material 340-1, the second metal material 340-2, or the partial interface was traced to form the interconnect.

In some embodiments, the deformable substrate 302 was subjected to 100% strain at a first strain cycle of at least 16,000 cycles. The first strain cycle strains the deformable substrate 302 at a rate of about 20% per second. FIG. 12A illustrates the deformable substrate 302 and the interconnect that included the composition 340 formed on a Cu layer of the interconnect. FIG. 12B illustrates the deformable substrate 302 and the interconnect that included the partial interface 340-3 after subjected to the first strain cycle. Accordingly, the partial interface 340-3 provides a resistance between 0.2 Ω/cm and 0.7 Ω/cm between about 2,000 cycles and about 16,000 cycles of the first strain cycle.

Example 6: Forming a Layer of a Metal Material 340 Using an Additive Manufacture Apparatus 250

In some embodiments, a first circuit component 330-1 and a second circuit component 330-2 of a circuit 305 of a deformable substrate 302 was coupled using a first metal material 340-1 as a selective wetting layer in order to attract a second metal material 340-2 in order to form electronical communication through the circuit 305 between the first circuit component 330-1 and the second circuit component 330-2. One or more additive manufacture apparatuses 250 was utilized in order to dispose a volume of the first metal material 340-1 and/or the second metal material 340-2.

In some embodiments, a first additive manufacture apparatus 250 was utilized to form the first circuit component 330-1, the second circuit component 330-2, the interconnect provided by the partial interface, or a combination thereof.

Referring to FIG. 8, in some embodiments, the first additive manufacture apparatus was utilized to dispose a first volume of the second metal material 340-2 using a stencil printing pattern technique.

Figure 9:
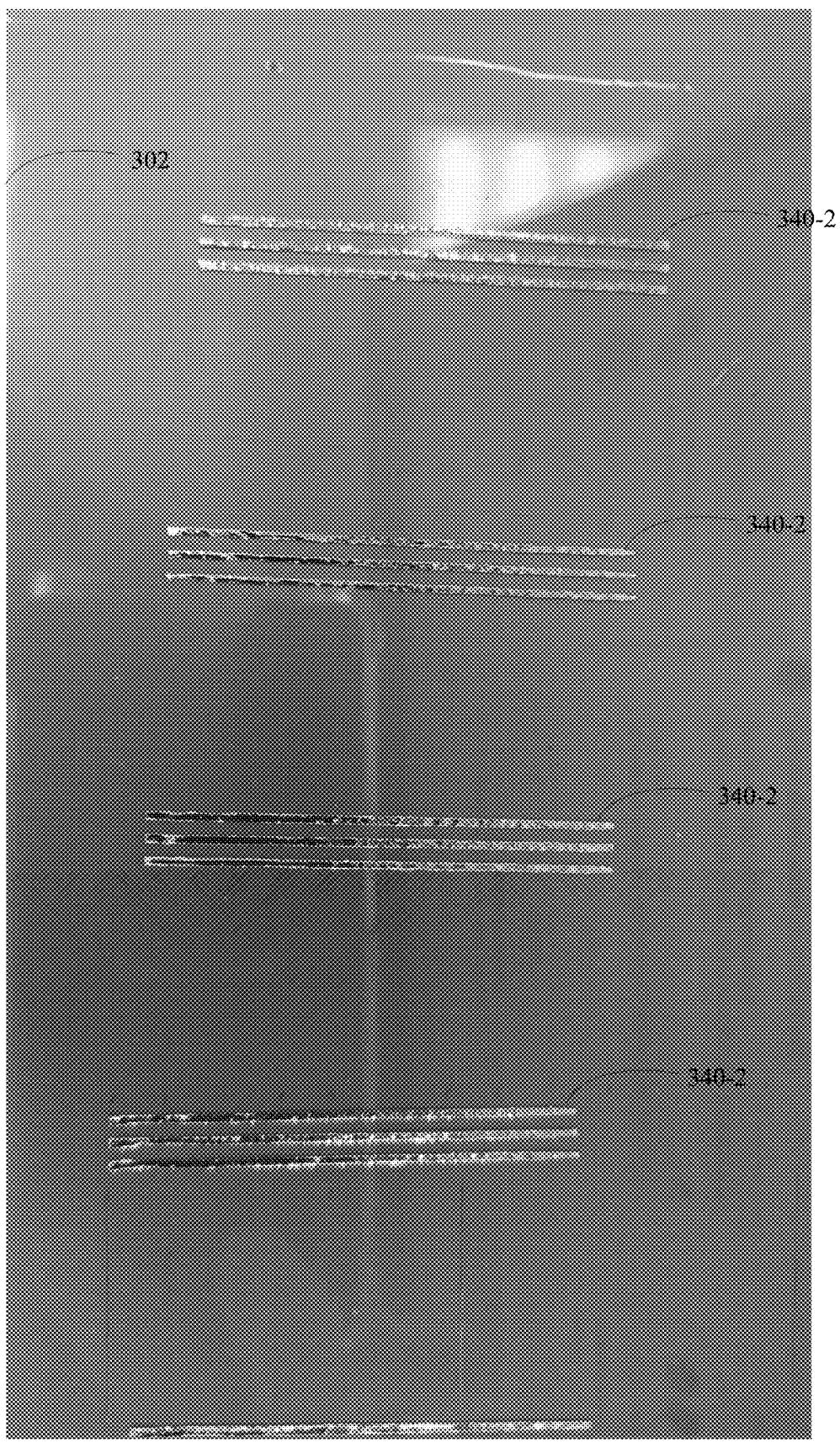
FIG. 9 illustrates disposing an embodiment of a second metal material using various additive manufacture apparatuses, in accordance with some embodiments of the present disclosure.
Figure 10:
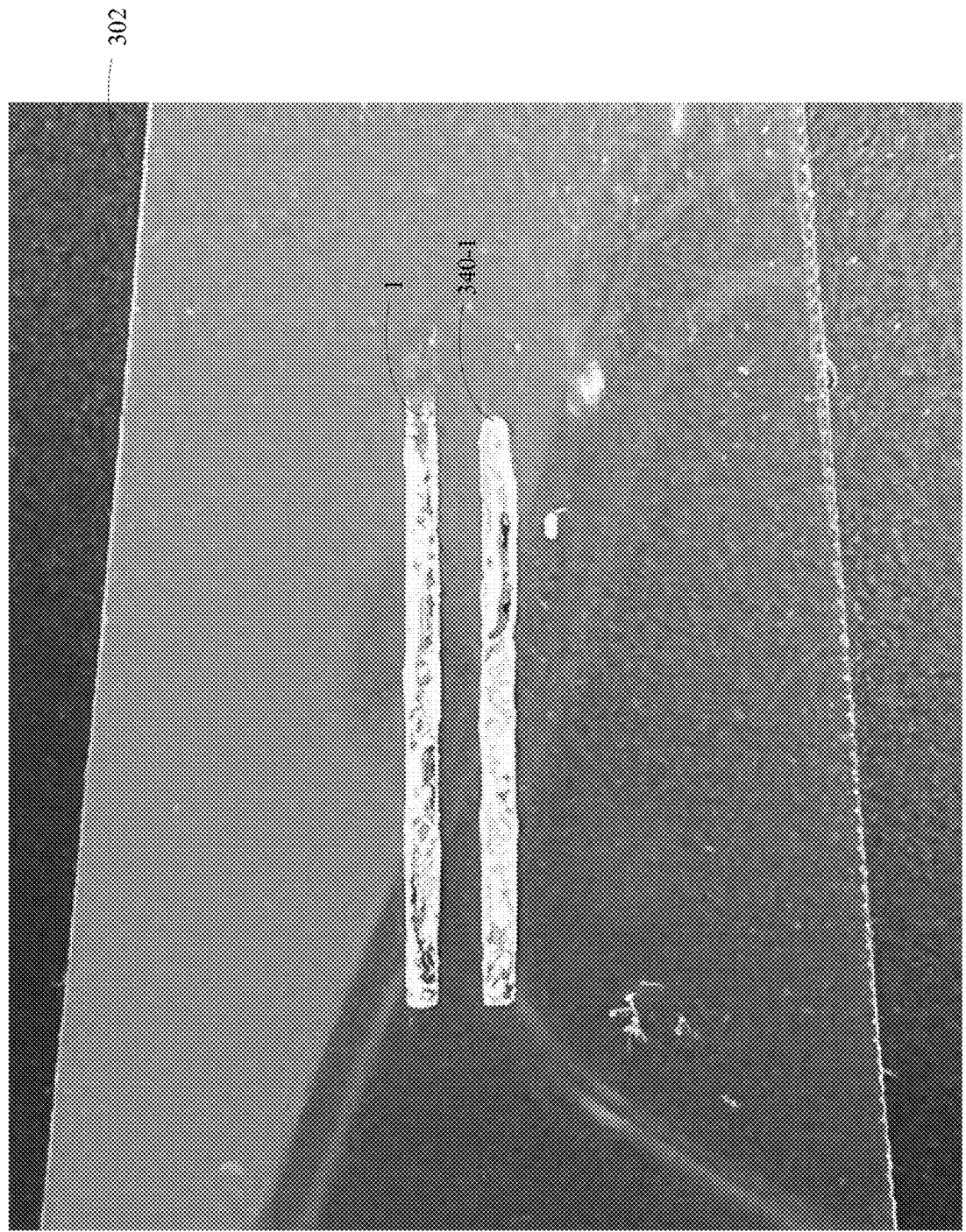
FIG. 10 illustrates disposing another embodiment of a second metal material using various additive manufacture apparatuses, in accordance with some embodiments of the present disclosure.

Referring to FIG. 9, in some embodiments, the first additive manufacture apparatus was utilized to dispose a second volume of the second metal material 340-2 using a screen printing pattern technique. In some embodiments, the first volume was different than the second volume.

Accordingly, the second metal material 340-2 of the present disclosure was utilized with various additive manufacture apparatus 250 and pattern techniques in order to dispose the second metal material 340-2 at a portion of the deformable substrate 302.

Example 7: Disposing a Volume of a Second Metal Material 340-2 Using an Additive Manufacture Apparatus 250

Figure 13A:
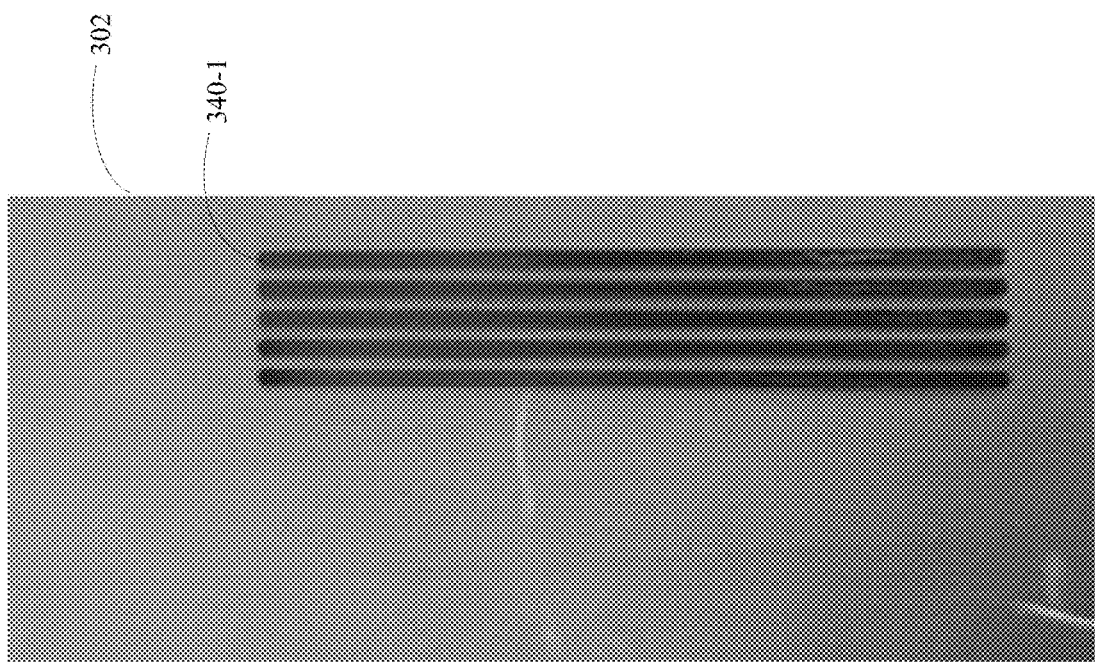
FIG. 13A illustrates a first layer of a first metal material disposed on a surface of a deformable substrate, in accordance with some embodiments of the present disclosure.

Referring to FIG. 13A, a layer of a first metal material 340-1 was formed on a first surface of a deformable substrate 302. In some embodiments, the deformable substrate 302 included a channel configured to receive the first metal material 340-1.

In some embodiments, the deformable substrate 302 included one or more polyorganosiloxanes, one or more fillers, one or more additives, or a combination thereof.

In some embodiments, the deformable substrate 302 included a silicon solvent. In some embodiments, the silicon solvent includes a first portion of hexamethyldisiloxane and a second portion of octamethyltrisiloxane.

In some embodiments, the deformable substrate 302 includes 50 w % of the one or more polyorganosiloxanes, one or more fillers, one or more additives, or the combination thereof. In some embodiments, the deformable substrate 302 includes 50 w % of the first portion of hexamethyldisiloxane and the second portion of octamethyltrisiloxane.

In some embodiments, the layer of the first metal material 340-1 is about 1 μm in size (e.g., about 1 μm thick and/or 1 μm width). In some embodiments, the first metal material 340-1 was Cu. In some embodiments, the layer of first metal material 340-1 was formed by a sputtering technique.

Figure 13B:
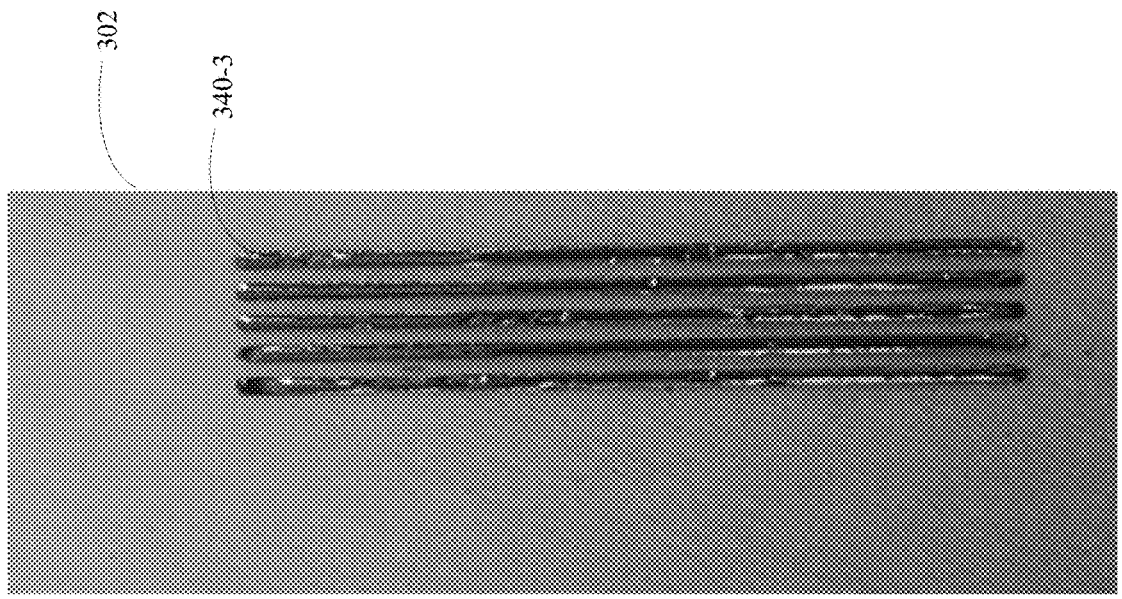
FIG. 13B illustrates a second layer of a second metal material disposed on the first layer of the first metal material of FIG. 13A.

Referring to FIG. 13B, in some embodiments, a volume of a second metal material 340-2 was disposed on a portion of the layer of the first metal material 340-1. In some embodiments, the volume of the second metal material 340-2 was disposed using a first additive manufacture apparatus at a first pressure proximate.

In some embodiments, the disposing of the second metal material 340-2 proximate to the first metal material 340-1 formed a partial interface 340-3 between the first metal material 340-1 and the second metal material 340-2 that included a second surface tension less than a first surface tension of the second metal material 340-2.

Example 7: A Wearable Deformable Electronic Device

Figure 28:
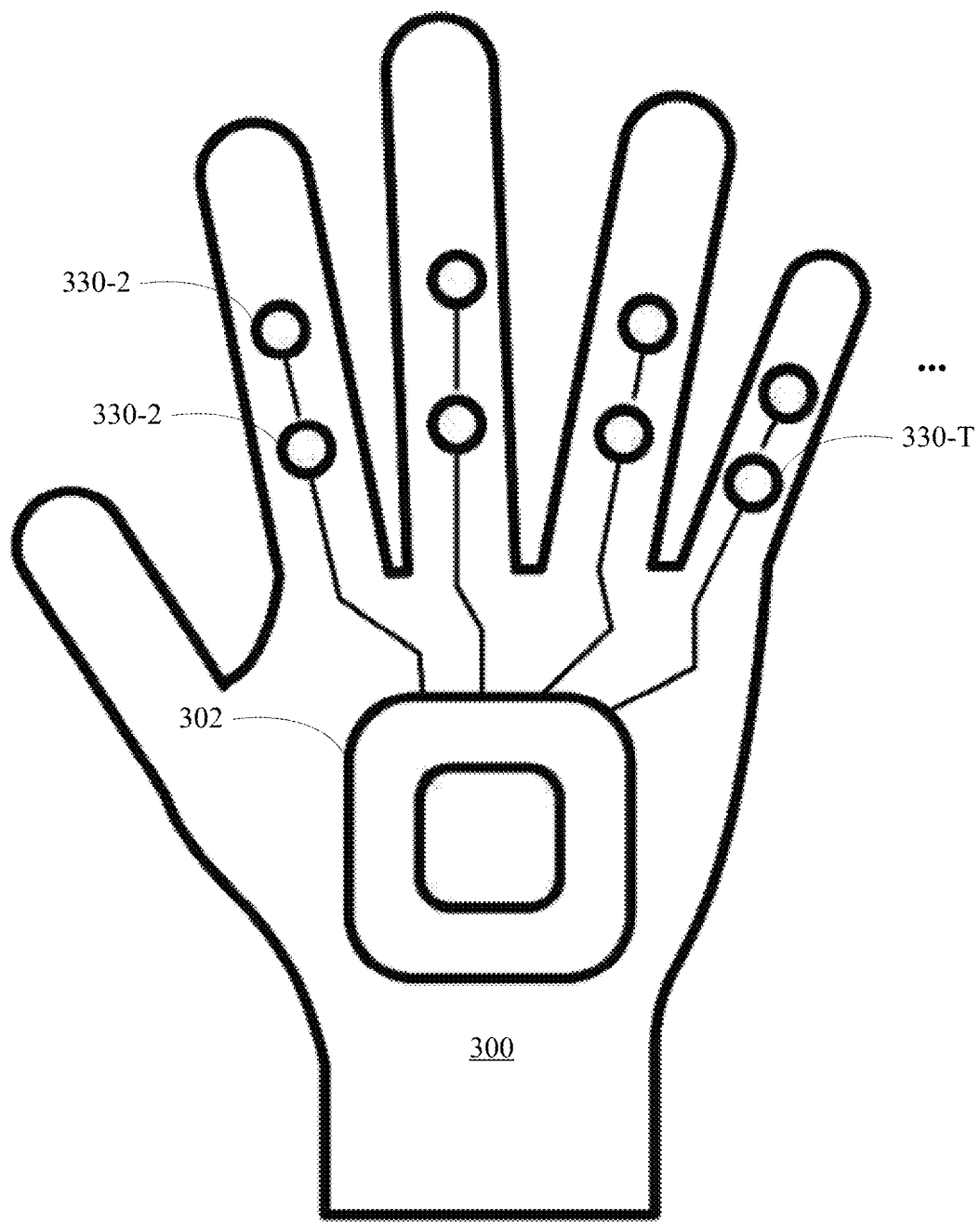
FIG. 28 illustrates an electronic device including a deformable substrate, in accordance with an embodiment of the present disclosure.

In some embodiments, the present disclosure provided an electronic device (e.g., electronic device 300 of FIG. 28). The electronic device 300 included a deformable substrate 302 that further included a circuit 305. Moreover, the circuit 305 included a channel 320 that extended from a first portion of the deformable 302 substrate to a second portion of the deformable substrate 302. The circuit 305 further included a first circuit component 330-1 that was disposed adjacent to the first portion of the deformable substrate 302. The circuit 305 included a second circuit component 330-2 that was disposed adjacent to the second portion of the deformable substrate 302. Furthermore, the circuit 305 included a first metal material 340-1 that was formed overlaying a first portion of the deformable substrate 302. The first portion of the deformable substrate 302 included a first portion of the channel 320. Additionally, the circuit 305 included a second metal material 340-2 that interfaced with the first metal material 340-1, which substantially occupied an interior volume of the channel 320 and formed an interconnect through the channel 320. Moreover, the interconnect is free of degradation in conductivity when the deformable substrate 320 was bent around a cylinder that had a radius of between 14 cm and 25 cm for a period of time between 10 seconds and 1 hour and then released. In some embodiments, this cylinder was sized to resemble a size of an adult human wrist. In some embodiments, the first circuit component 330-1 is a CPU (e.g., CPU 274 of FIG. 2). In some embodiments, the first circuit component 330-1 is a sensor. In some embodiments, the second circuit component 330-2 was a sensor. In some embodiments, the first circuit component 330-1 is a first sensor and the second circuit component 330-2 was a second sensor different from the first sensor.

EXEMPLARY IMPLEMENTATIONS

Implementation 1. An electronic device includes a deformable substrate that further includes a circuit. Moreover, the circuit includes a channel that extends from a first portion of the deformable substrate to a second portion of the deformable substrate. The circuit further includes a first circuit component adjacent to the first portion of the deformable substrate. The circuit includes a second circuit component that is adjacent to the second portion of the deformable substrate. Furthermore, the circuit includes a first metal material that is formed overlaying a first portion of the deformable substrate. The first portion of the deformable substrate includes a first portion of the channel. Additionally, the circuit includes a second metal material interfacing with the first metal material, thereby substantially occupying an interior volume of the channel.

Implementation 2. The electronic device of Implementation 1, in which the circuit includes a flexible printed circuit (FPC).

Implementation 3. The electronic device of Implementation 1 or Implementation 2, in which the deformable substrate includes silicon.

Implementation 4. The electronic device of any one of Implementations 1-3, in which the circuit includes at least two layers including a first layer and a second layer. The first layer includes the first portion of the deformable substrate. Moreover, the second layer includes the second portion of the deformable substrate. The channel extends from a first terminal of the first layer to a second terminal of the second layer.

Implementation 5. The electronic device of any one of Implementations 1-4, in which the first portion of the deformable substrate and the second portion of the deformable substrate form part of a planar surface of the deformable substrate.

Implementation 6. The electronic device of any one of Implementations 1-5, in which the at least two layers further includes a third layer configured to overlay an opening of the channel, thereby sealing an end portion of the channel.

Implementation 7. The electronic device of any one of Implementations 1-6, in which the channel includes a diameter between 10 microns (μm) and 500 μm.

Implementation 8. The electronic device of any one of Implementations 1-7, in which the length of the channel is between 50 μm and 100 μm.

Implementation 9. The electronic device of any one of Implementations 1-8, in which the first circuit component includes an exterior surface that includes an electroless nickel immersion gold (ENIG).

Implementation 10. The electronic device of any one of Implementations 1-9, in which the first metal material includes copper, gold, nickel, platinum, silver, or a combination thereof.

Implementation 11. The electronic device of any one of Implementations 1-10, in which the thickness of the first metal material overlayed the first portion of the deformable substrate is between 1 μm and 5 μm.

Implementation 12. The electronic device of any one of Implementations 1-11, in which the first metal material includes between 0.5 weight percent (w %) and 25 w % of the interface with the first metal material and the second metal material.

Implementation 13. The electronic device of any one of Implementations 1-12, in which the interface with the first metal material and the second metal material is an intermetallic interface.

Implementation 14. The electronic device of any one of Implementations 1-13, in which the first metal material is solid, liquid, or bi-phasic.

Implementation 15. The electronic device of any one of Implementations 1-14, in which the second metal material includes a liquid metal.

Implementation 16. The electronic device of any one of Implementations 1-15, in which the second metal material includes a metal composite polymer.

Implementation 17. The electronic device of any one of Implementations 1-16, in which the second metal material includes gallium.

Implementation 18. The electronic device of any one of Implementations 1-17, in which the second metal material includes gallium indium alloy, gallium tin alloy, gallium indium tin alloy, gallium indium tin zinc alloy, or a combination thereof.

Implementation 19. The electronic device of any one of Implementations 1-18, in which the deformable substrate is configured to maintain conductivity through the circuit with a resistance under at most 100 Ohms per cm when subjected to 100% strain.

Implementation 20. The electronic device of any one of Implementations 1-19, in which the deformable substrate is configured to maintain conductivity through the circuit when subjected to at least 15,000 strain cycles.

Implementation 21. The electronic device of any one of Implementations 1-20, in which the first portion of the channel overlaid by the first metal material includes an interior surface of the channel and/or an edge portion of the channel.

Implementation 22. The electronic device of any one of Implementations 1-21, in which the thickness of the first metal material on the interior surface of the first portion of the channel is between 1 μm and 25 μm.

Implementation 23. The electronic device of any one of Implementations 1-22, in which the depth of the first portion of the channel is between 0.5 μm and 10 μm.

Implementation 24. The electronic device of any one of Implementations 1-23, in which the electronic device is a display device.

Implementation 25. The electronic device of any one of Implementations 1-24, in which the channel including the first metal material and the second metal material form an interconnect that has a width of less than 500 μm, less than 400 μm, less than 300 μm, less than 200 μm, less than 100 μm, less than 90 μm, less than 80 μm, less than 70 μm, less than 60 μm less than 50 μm, less than 40 μm, less than 30 μm, less than 20 μm, less than 10 μm, less than 5 μm or less than 1 μm.

Implementation 26. The electronic device of any one of Implementations 1-25, in which the interconnect has a width of between 1 and 500 μm, between 2 and 400 μm, between 3 and 300 μm, between 4 and 200 μm, between 6 and 100 μm, or between 10 and 90 μm.

Implementation 27. The electronic device of any one of Implementations 1-26, in which the channel including the first metal material and the second metal material form an interconnect that has a thickness of less than 500 μm, less than 400 μm, less than 300 μm, less than 200 μm, less than 100 μm, less than 90 μm, less than 80 μm, less than 70 μm, less than 60 μm less than 50 μm, less than 40 μm, less than 30 μm, less than 20 μm, less than 10 μm, less than 5 μm or less than 1 μm.

Implementation 28. The electronic device of any one of Implementations 1-27, in which the channel including the first metal material and the second metal material form an interconnect that has a thickness of between 1 and 500 μm, between 2 and 400 μm, between 3 and 300 μm, between 4 and 200 μm, between 6 and 100 μm, or between 10 and 90 μm.

Implementation 29. The electronic device of any one of Implementations 1-28, in which the electronic device is a display.

Implementation 30. The electronic device of any one of Implementations 1-29, in which the first circuit component and the second circuit component form part of an active-matrix array.

Implementation 31. The electronic device of any one of Implementations 1-30, in which the partial interface is free of degradation in conductivity when the deformable substrate is bent around a cylinder that has a radius of between 2 centimeters (cm) and 10 cm for a period of time and then released.

Implementation 32. The electronic device of any one of Implementations 1-31, in which the period of time is between 10 seconds and five minutes.

Implementation 33. The electronic device of any one of Implementations 1-32, in which the first circuit component and the second circuit component are part of a transistor switch.

Implementation 34. The electronic device of any one of Implementations 1-33, in which the interconnect is formed by tracing out one or more lines, one or more vias, or any combination of one or more lines and one or more vias to form the interconnect between the first circuit component and the second circuit component using the first metal material and/or the second metal material.

Implementation 34. A method for forming a deformable electrical communication is provided, such as between a first circuit component and a second circuit component of a circuit. The method includes forming a layer of a first metal material on a first surface of a channel. The channel interposes between the first circuit component and the second circuit component of a deformable substrate. Moreover, the channel includes a first diameter. The method includes disposing a volume of a second metal material at a first pressure proximate to the first surface of the channel, thereby forming a partial interface in the channel between the first metal material and the second metal material. The partial interface includes a second pressure less than the first pressure. The method further includes sealing the channel, thereby forming the deformable electrical communication between the first circuit component and the second circuit component.

Implementation 35. The method of Implementation 34, in which the method includes, prior to the forming the layer of the first metal material, exposing the first surface of the channel of deformable substrate.

Implementation 36. The method of Implementations 34 or 35, in which the forming the layer of the first metal material includes impinging a plurality of ions of the first metal material at the first surface of the channel.

Implementation 37. The method of any one of Implementations 34-36, in which the forming the layer of the first metal material includes forming a coating of the layer of the first metal material over the first surface of the channel.

Implementation 38. The method of any one of Implementations 34-37, in which the first metal material includes copper, gold, silver, platinum, nickel, or a combination thereof.

Implementation 39. The method of any one of Implementations 34-38, in which the thickness of the layer of the first metal material overlayed the first portion of the deformable substrate is between 1 µm and 5 µm.

Implementation 40. The method of any one of Implementations 34-39, in which the first circuit component includes an exterior surface that includes ENIG.

Implementation 41. The method of any one of Implementations 34-40, in which the first diameter of the channel is between 10 µm and 500 µm.

Implementation 42. The method of any one of Implementations 34-41, in which the method includes disposing a volume of a second metal material at a first pressure proximate to the first surface of the channel, thereby forming a partial interface in the channel between the first metal material and the second metal material. The partial interface includes a second pressure less than the first pressure.

Implementation 43. The method of any one of Implementations 34-42, in which a second diameter of the volume of the second metal material is greater than the first diameter of the channel.

Implementation 44. The method of any one of Implementations 34-43, in which the first pressure is a laplace pressure of the second metal material. In some embodiments, the second pressure is a laplace pressure of the partial interface between the first metal material and the second metal material.

Implementation 45. The method of any one of Implementations 34-44, in which the disposing the volume of the second metal material utilizes an additive manufacture apparatus. In some such embodiments, the additive manufacture mechanism includes a binder jetting mechanism, a material extrusion mechanism, a material jetting mechanism, a polyjet mechanism, a powder bed mechanism, a sheet lamination mechanism, vat photopolymerization mechanism, or a combination thereof.

Implementation 46. The method of any one of Implementations 34-45, in which the method further includes, prior to the sealing the channel, disrupting a second surface of the partial interface between the first metal material and the second metal material, thereby dispersing a layer of an oxidized second metal material formed at the second surface.

Implementation 47. The method of any one of Implementations 34-46, in which a first thermal resistance per unit area of the oxide second metal material is greater than a second thermal resistance per unit area of the second metal material.

Implementation 48. The method of any one of Implementations 34-47, in which the sealing the channel includes encapsulating the channel with a third material different than the first metal material and the second metal material.

Implementation 49. The method of any one of Implementations 34-48, in which the channel including the first metal material and the second metal material form an interconnect that has a width of less than 500 µm, less than 400 µm, less than 300 µm, less than 200 µm, less than 100 µm, less than 90 µm, less than 80 µm, less than 70 µm, less than 60 µm less than 50 µm, less than 40 µm, less than 30 µm, less than 20 µm, less than 10 µm, less than 5 µm or less than 1 µm.

Implementation 50. The method of any one of Implementations 34-49, in which the interconnect has a width of between 1 and 500 µm, between 2 and 400 µm, between 3 and 300 µm, between 4 and 200 µm, between 6 and 100 µm, or between 10 and 90 µm.

Implementation 51. The method of any one of Implementations 34-50, in which the channel including the first metal material and the second metal material form an interconnect that has a thickness of less than 500 µm, less than 400 µm, less than 300 µm, less than 200 µm, less than 100 µm, less than 90 µm, less than 80 µm, less than 70 µm, less than 60 µm less than 50 µm, less than 40 µm, less than 30 µm, less than 20 µm, less than 10 µm, less than 5 µm or less than 1 µm.

Implementation 52. The method of any one of Implementations 34-51, in which the channel including the first metal material and the second metal material form an interconnect that has a thickness of between 1 and 500 µm, between 2 and 400 µm, between 3 and 300 µm, between 4 and 200 µm, between 6 and 100 µm, or between 10 and 90 µm.

Implementation 53. The method of any one of Implementations 34-52, in which the first circuit component and the second circuit component form part of an active-matrix array.

Implementation 54. The method of any one of Implementations 34-53, in which the partial interface is free of degradation in conductivity when the deformable substrate is bent around a cylinder that has a radius of between 2 cm and 10 cm for a period of time and then released.

Implementation 55. The method of any one of Implementations 34-54, in which the period of time is between 10 seconds and five minutes.

Implementation 56. The method of any one of Implementations 34-55, in which, the first circuit component and the second circuit component are part of a transistor switch.

Implementation 57. The method of any one of Implementations 34-57, in which, the interconnect is formed by tracing out one or more lines, one or more vias, or any combination of one or more lines and one or more vias to form the interconnect between the first circuit component and the second circuit component using the first metal material and/or the second metal material.

REFERENCES CITED AND ALTERNATIVE EMBODIMENTS

All references cited herein are incorporated herein by reference in their entirety and for all purposes to the same extent as if each individual publication or patent or patent application was specifically and individually indicated to be incorporated by reference in its entirety for all purposes.

The present invention can be implemented as a computer program product that includes a computer program mechanism embedded in a non-transitory computer-readable storage medium. For instance, the computer program product could contain instructions for operating the user interfaces described with respect to FIG. 2. These program modules can be stored on a CD-ROM, DVD, magnetic disk storage product, USB key, or any other non-transitory computer readable data or program storage product.

Many modifications and variations of this invention can be made without departing from its spirit and scope, as will be apparent to those skilled in the art. The specific embodiments described herein are offered by way of example only. The embodiments were chosen and described in order to best explain the principles of the invention and its practical applications, to thereby enable others skilled in the art to best utilize the invention and various embodiments with various modifications as are suited to the particular use contemplated. The invention is to be limited only by the terms of the appended claims, along with the full scope of equivalents to which such claims are entitled.

What is claimed is:

1. An electronic device, comprising:
    a deformable substrate comprising a circuit, wherein the circuit comprises:
        a channel extending from a first portion of the deformable substrate to a second portion of the deformable substrate;
        a first circuit component adjacent to the first portion of the deformable substrate;
        a second circuit component adjacent to the second portion of the deformable substrate;
        a first metal material formed overlaying the first portion of the deformable substrate comprising a first portion of the channel; and
        a second metal material interfacing with the first metal material, thereby substantially occupying an interior volume of the channel.

2. The electronic device of claim 1, wherein the circuit comprises a flexible printed circuit (FPC).

3. The electronic device of claim 1, wherein the deformable substrate comprises silicon.

4. The electronic device of claim 1, wherein the circuit comprises at least two layers including a first layer and a second layer, wherein the first layer comprises the first portion of the deformable substrate and the second layer comprises the second portion of the deformable substrate, and wherein the channel extends from a first terminal of the first layer to a second terminal of the second layer.

5. The electronic device of claim 4, wherein the at least two layers further comprise a third layer configured to overlay an opening of the channel, thereby sealing an end portion of the channel.

6. The electronic device of claim 1, wherein the channel has a diameter between 10 microns (μm) and 500 μm and a length that is between 50 μm and 100 μm.

7. The electronic device of claim 1, wherein the first circuit component comprises an exterior surface comprising an electroless nickel immersion gold (ENIG).

8. The electronic device of claim 1, wherein the first metal material comprises copper, gold, nickel, silver, platinum, or a combination thereof.

9. The electronic device of claim 1, wherein the first metal material comprises between 0.5 weight percent (w %) and 25 w % of the interface with the first metal material and the second metal material.

10. The electronic device of claim 1, wherein the interface with the first metal material and the second metal material is an intermetallic interface.

11. The electronic device of claim 1, wherein the second metal material comprises a metal composite polymer.

12. The electronic device of claim 11, wherein the second metal material comprises gallium.

13. The electronic device of claim 12, wherein the second metal material comprises gallium indium alloy, gallium tin alloy, gallium indium tin alloy, gallium indium tin zinc alloy, or a combination thereof.

14. The electronic device of claim 1, wherein the deformable substrate is configured to maintain conductivity through the circuit with a resistance under at most 100 Ohms per centimeter (cm) when subjected to at least 15,000 cycles of 100% strain.

15. The electronic device of claim 1, wherein the first portion of the channel overlaid by the first metal material comprises an interior surface of the channel and/or an edge portion of the channel.

16. The electronic device of claim 1, wherein the channel including the first metal material and the second metal material forms an interconnect comprising:
    a width of less than 500 microns (μm), less than 400 μm, less than 300 μm, less than 200 μm, less than 100 μm, less than 90 μm, less than 80 μm, less than 70 μm, less than 60 μm, less than 50 μm, less than 40 μm, less than 30 μm, less than 20 μm, less than 10 μm, less than 5 μm or less than 1 μm; and
    a thickness of less than 500 μm, less than 400 μm, less than 300 μm, less than 200 μm, less than 100 μm, less than 90 μm, less than 80 μm, less than 70 μm, less than 60 μm, less than 50 μm, less than 40 μm, less than 30 μm, less than 20 μm, less than 10 μm, less than 5 μm or less than 1 μm.

17. The electronic device of claim 16, wherein the interface comprises one or more lines, one or more vias, or any combination of one or more lines and one or more vias traced to form the interconnect.

18. The electronic device of claim 16, wherein the interconnect is free of degradation in conductivity when the deformable substrate is bent around a cylinder that has a radius of between 2 cm and 10 cm for a period of time between 10 seconds and 5 minutes and then released.

19. The electronic device of claim 1, wherein the first circuit component and the second circuit component form part of an active-matrix array.

20. An electronic device, comprising:
    a deformable substrate comprising a circuit, wherein the circuit comprises:
        a channel extending from a first portion of the deformable substrate to a second portion of the deformable substrate;
        a first circuit component adjacent to the first portion of the deformable substrate;
        a second circuit component adjacent to the second portion of the deformable substrate;
        a first metal material formed overlaying a first portion of the deformable substrate comprising a first portion of the channel; and
        a second metal material interfacing with the first metal material, thereby substantially occupying an interior volume of the channel and forming an interconnect through the channel, wherein the interconnect is free of degradation in conductivity when the deformable substrate is bent around a cylinder that has a radius of between 14 cm and 25 cm for a period of time between 10 seconds and 1 hour and then released.

* * * * *